(12) United States Patent
Yu et al.

(10) Patent No.: US 11,951,571 B2
(45) Date of Patent: *Apr. 9, 2024

(54) METHOD OF FORMING PACKAGE STRUCTURE

(71) Applicant: Integrated Silicon Solution Inc., Milpitas, CA (US)

(72) Inventors: Cheng-Fu Yu, Milpitas, CA (US); Kai-Jih Shih, Milpitas, CA (US); Yi-Jung Liu, Milpitas, CA (US)

(73) Assignee: INTEGRATED SILICON SOLUTION INC., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/163,338

(22) Filed: Feb. 2, 2023

(65) Prior Publication Data

US 2023/0173615 A1    Jun. 8, 2023

Related U.S. Application Data

(63) Continuation of application No. 17/109,264, filed on Dec. 2, 2020, now Pat. No. 11,612,965.

(60) Provisional application No. 63/000,545, filed on Mar. 27, 2020.

(30) Foreign Application Priority Data

Sep. 3, 2020 (TW) ................. 109130277

(51) Int. Cl.
*B23K 26/38* (2014.01)
*B23K 26/364* (2014.01)
*H01L 21/78* (2006.01)
*H01L 23/544* (2006.01)

(52) U.S. Cl.
CPC ............ *B23K 26/38* (2013.01); *B23K 26/364* (2015.10); *H01L 21/78* (2013.01); *H01L 23/544* (2013.01)

(58) Field of Classification Search
CPC .. B23K 26/38; B23K 26/364; B23K 2101/36; B23K 26/362; H01L 21/78; H01L 23/544; H01L 2224/97; H01L 21/4842; H01L 21/561; H01L 23/49541; H01L 23/49548; H01L 23/49582; H01L 23/3107
See application file for complete search history.

(56) References Cited

U.S. PATENT DOCUMENTS

| | | | |
|---|---|---|---|
| 9,997,676 B2 | 6/2018 | Hung | |
| 11,612,965 B2 * | 3/2023 | Yu | .......... H01L 21/561 |
| | | | 438/462 |
| 2009/0243097 A1 * | 10/2009 | Koroku | ............. H01L 23/3114 |
| | | | 257/737 |
| 2015/0235845 A1 * | 8/2015 | Sekita | ................ H01L 23/3114 |
| | | | 438/667 |

(Continued)

*Primary Examiner* — Thanh T Nguyen
(74) *Attorney, Agent, or Firm* — McClure, Qualey & Rodack, LLP

(57) ABSTRACT

A method of forming a package structure includes an etching step, a laser step, a plating step and a singulation step. In the etching step, a plurality of cutting streets of a leadframe are etched. In the laser step, a plastic package material covering on each of the cutting streets is removed via a laser beam. In the plating step, a plurality of plating surfaces are disposed on a plurality of areas of the leadframe without the plastic package material. In the singulation step, the cutting streets of the leadframe are cut to form the package structure.

6 Claims, 95 Drawing Sheets

(56) References Cited

U.S. PATENT DOCUMENTS

| | | |
|---|---|---|
| 2018/0144981 A1 | 5/2018 | Tateishi |
| 2019/0304838 A1* | 10/2019 | Saeki ................ H01L 21/30655 |
| 2020/0144120 A1* | 5/2020 | Suzuki ................ H01L 21/304 |
| 2021/0028122 A1 | 1/2021 | Son |

* cited by examiner

S800

METHOD OF FORMING PACKAGE STRUCTURE

RELATED APPLICATIONS

The present application is a continuation of the application Ser. No. 17/109,264, filed Dec. 2, 2020, now U.S. Pat. No. 11,612,965, which claims priority to U.S. Provisional Application Ser. No. 63/000,545, filed Mar. 27, 2020 and Taiwan Application Serial Number 109130277, filed Sep. 3, 2020, all of which are herein incorporated by reference.

BACKGROUND

Technical Field

The present disclosure relates to a method of forming a package structure.

Description of Related Art

General speaking, a quad flat no leads (QFN) has the less solderable area on sides of leads thereof. Hence, the QFN has worse solderable effect when the QFN is disposed on a circuit board.

Nowadays, a structure of a portion of a bottom of each of leads of a QFN being concave has been developed, so a solderable area of sides of the leads can be enhanced. In general, the aforementioned structure is obtained by cutting, etching or laser. However, an area of the bottom of the leads of the aforementioned structure disposed on the circuit board is smaller. Hence, the lifetime of the aforementioned structure disposed on the circuit board is lowered.

SUMMARY

According to one aspect of the present disclosure, a method of forming a package structure includes an etching step, a laser step, a plating step and a singulation step. In the etching step, a plurality of cutting streets of a leadframe are etched. In the laser step, a plastic package material covering on each of the cutting streets is removed via a laser beam. In the plating step, a plurality of plating surfaces are disposed on a plurality of areas of the leadframe without the plastic package material. In the singulation step, the cutting streets of the leadframe are cut to form the package structure.

BRIEF DESCRIPTION OF THE DRAWINGS

FIG. 120 is a schematic view of the first laser step according to the 9th embodiment in FIG. 115.

FIG. 121 is a cross-sectional schematic view of the leadframe along a 121-121' line in FIG. 120.

FIG. 122 is a schematic view of the second laser step according to the 9th embodiment in FIG. 115.

FIG. 123 is a cross-sectional schematic view of the leadframe along a 123-123' line in FIG. 122.

FIG. 124 is a schematic view of the plating step according to the 9th embodiment in FIG. 115.

FIG. 125 is a cross-sectional schematic view of the leadframe along a 125-125' line in FIG. 124.

FIG. 126 is a schematic view of the singulation step according to the 9th embodiment in FIG. 115.

FIG. 127 is a cross-sectional schematic view of the package structure along a 127-127' line in FIG. 126.

FIG. 128 is a cross-sectional schematic view of the package structure along a 128-128' line in FIG. 126.

FIG. 129 is a side view of the package structure according to the 9th embodiment in FIG. 115.

FIG. 130 is a partial schematic view of the package structure according to the 9th embodiment in FIG. 115.

FIG. 131 is a step flow chart of a method of forming a package structure according to the 10th embodiment of the present disclosure.

Figure 131:
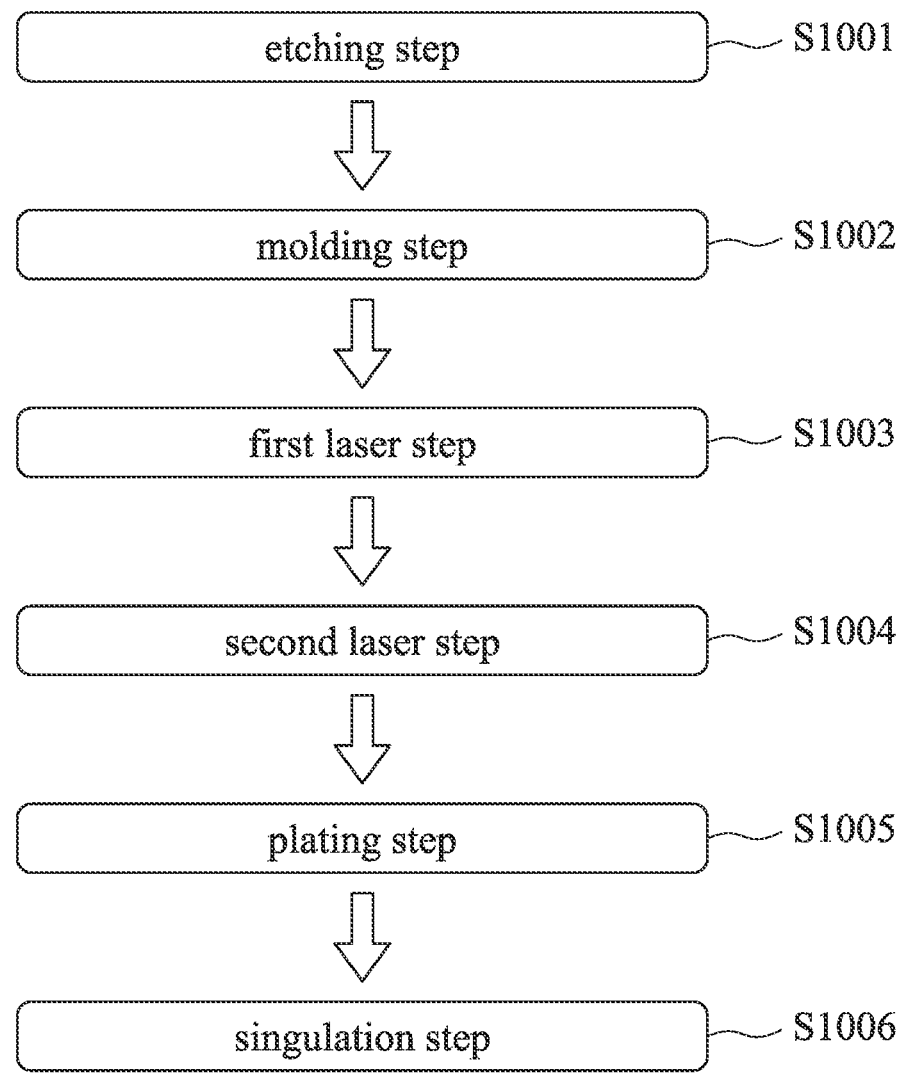
Figure 132:
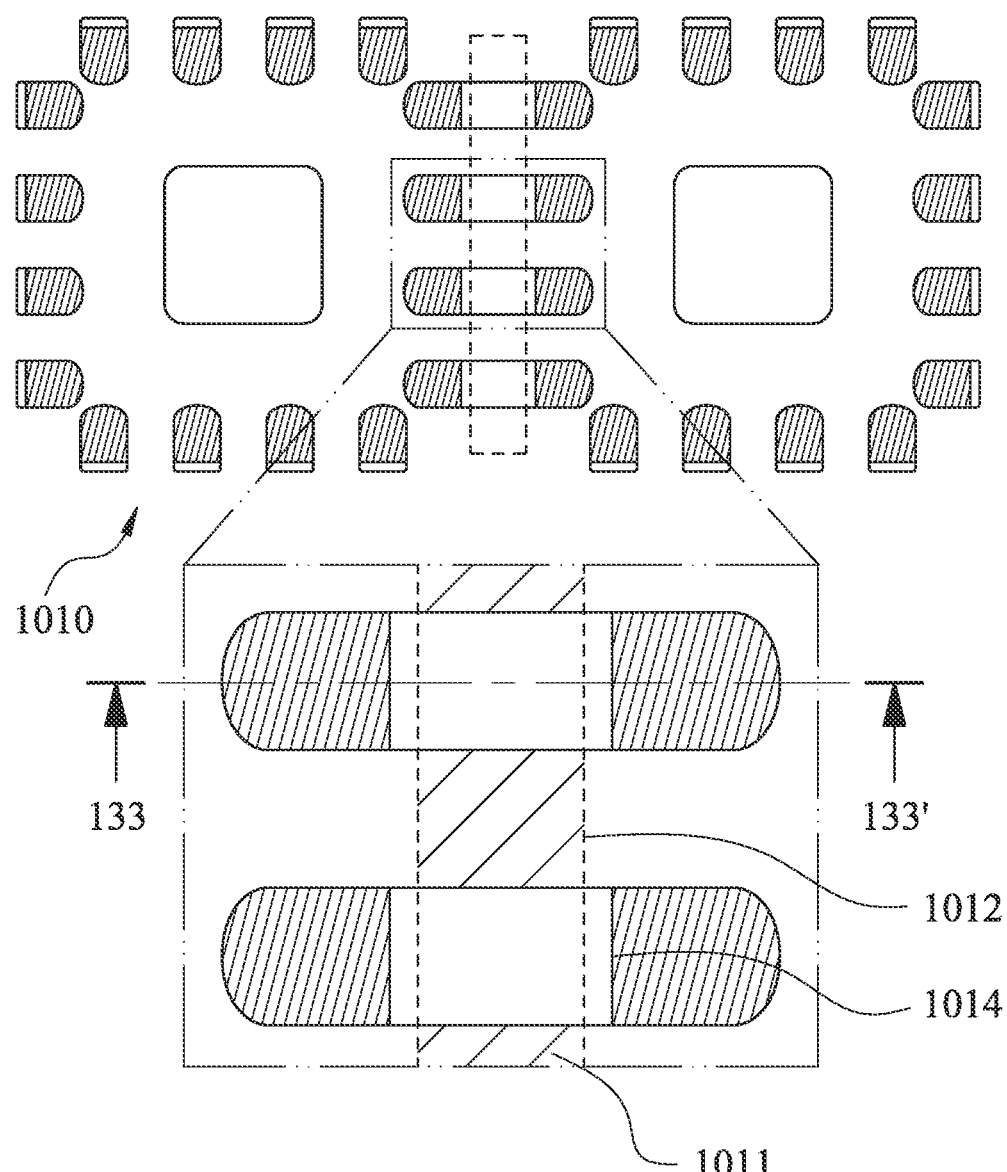

FIG. 132 is a schematic view of the etching step according to the 10th embodiment in FIG. 131.

Figure 133:
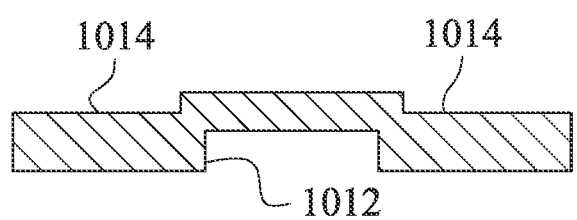

FIG. 133 is a cross-sectional schematic view of the leadframe along a 133-133' line in FIG. 132.

Figure 134:
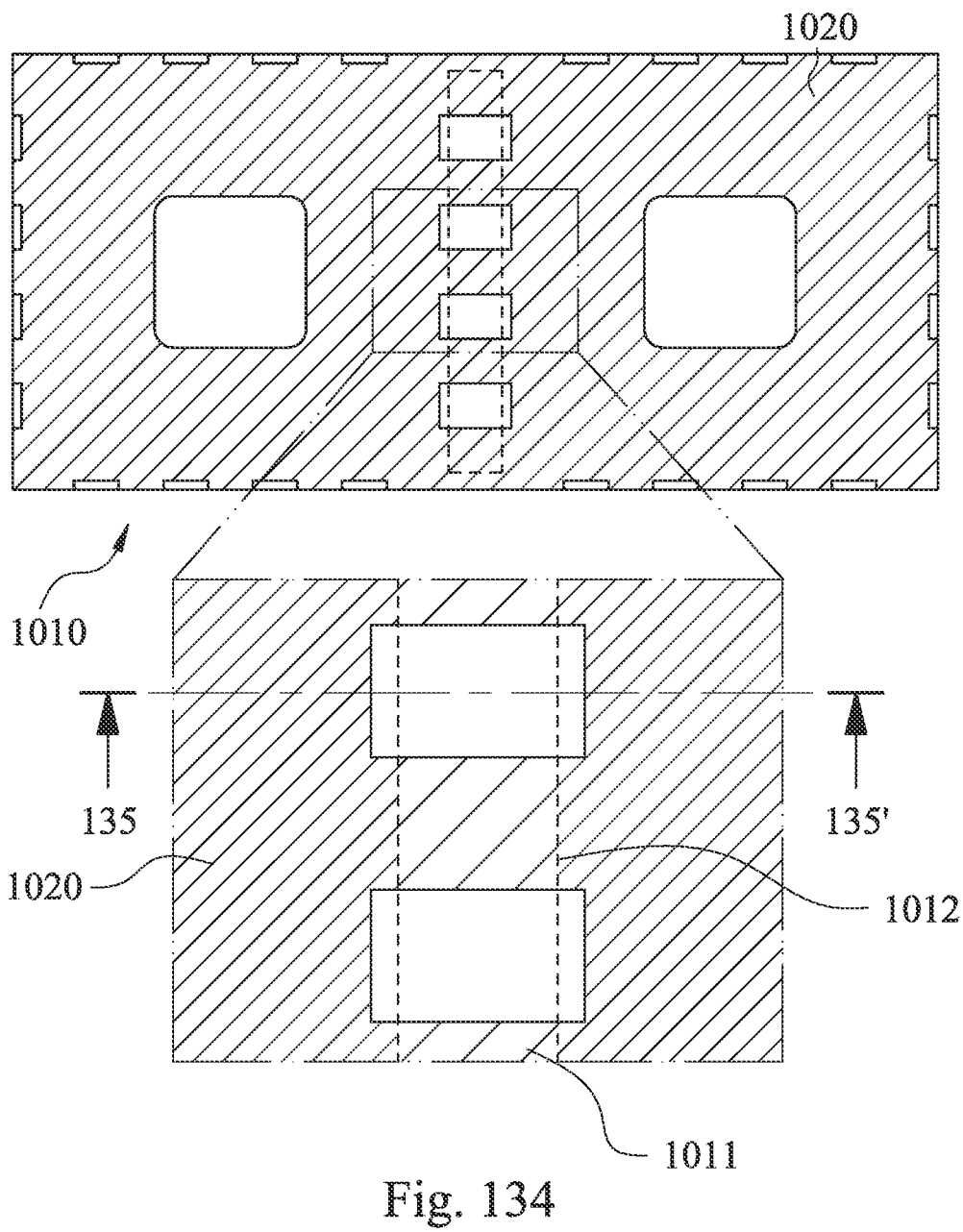

FIG. 134 is a schematic view of the molding step according to the 10th embodiment in FIG. 131.

Figure 135:
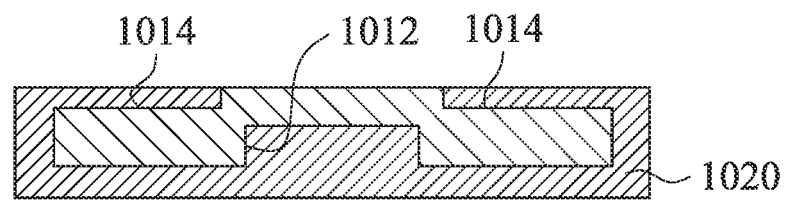

FIG. 135 is a cross-sectional schematic view of the leadframe along a 135-135' line in FIG. 134.

Figure 136:
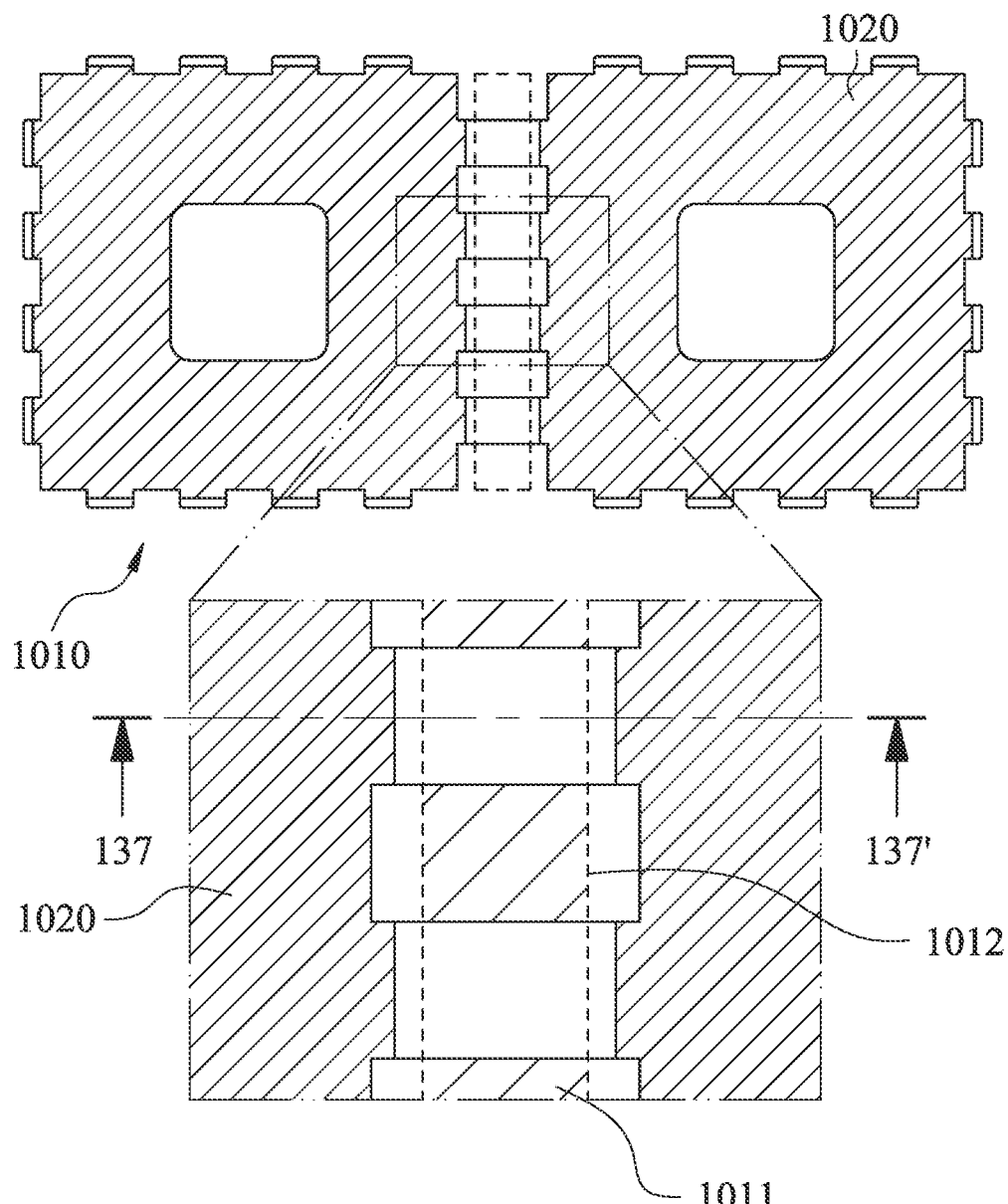

FIG. 136 is a schematic view of the first laser step according to the 10th embodiment in FIG. 131.

Figure 137:
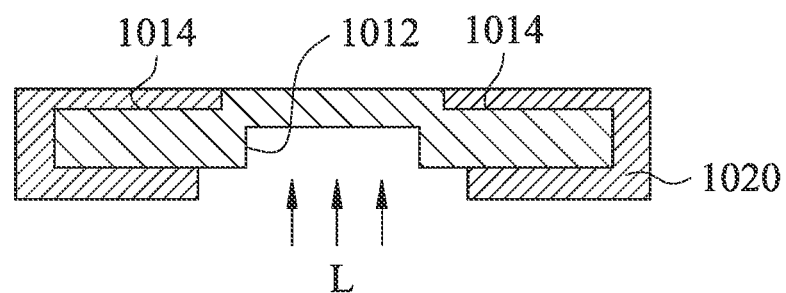

FIG. 137 is a cross-sectional schematic view of the leadframe along a 137-137' line in FIG. 136.

Figure 138:
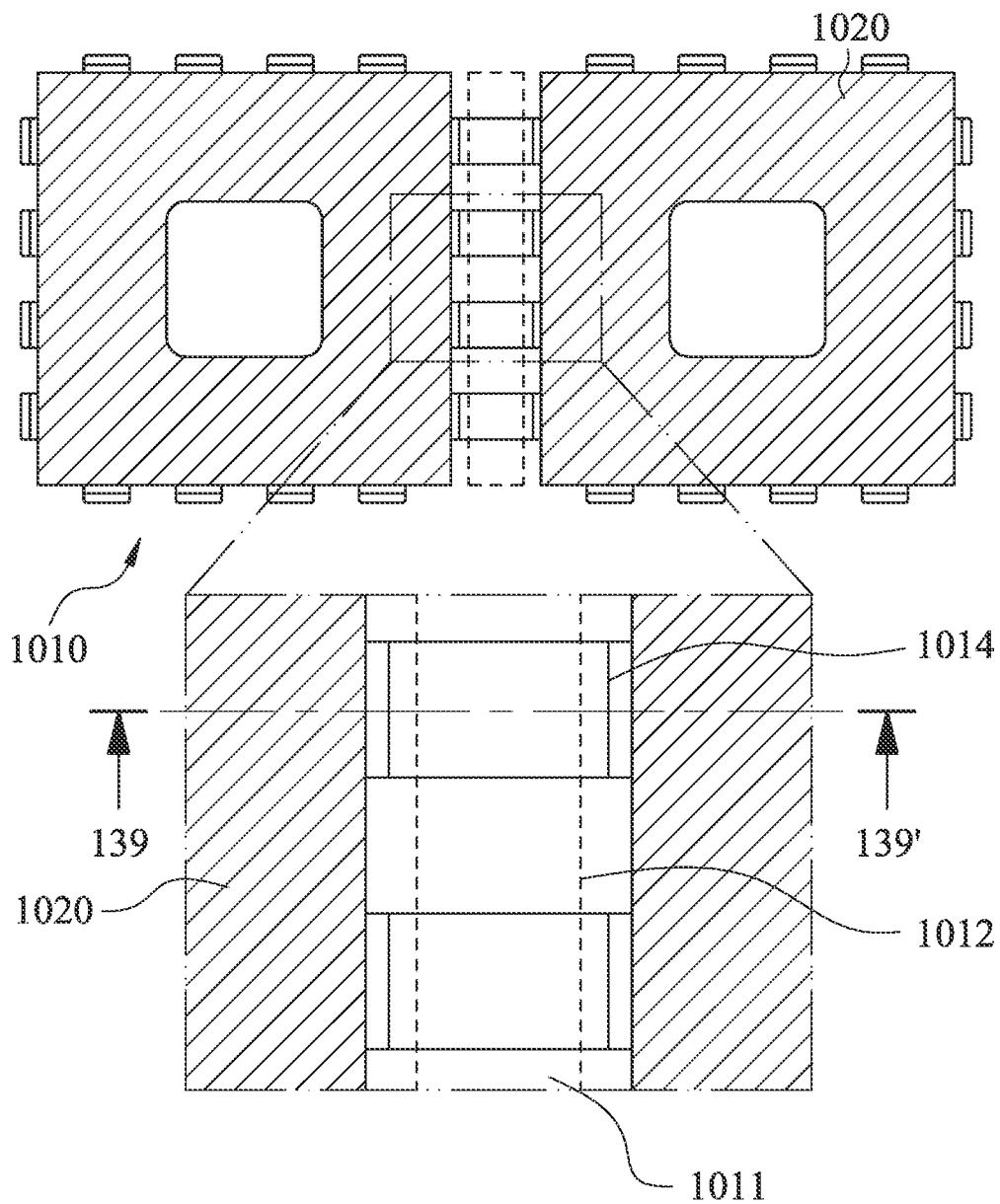

FIG. 138 is a schematic view of the second laser step according to the 10th embodiment in FIG. 131.

Figure 139:
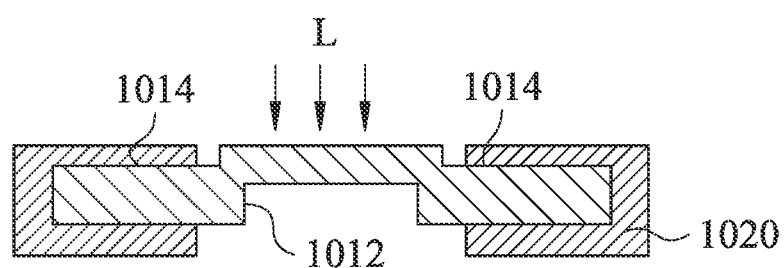

FIG. 139 is a cross-sectional schematic view of the leadframe along a 139-139' line in FIG. 138.

Figure 140:
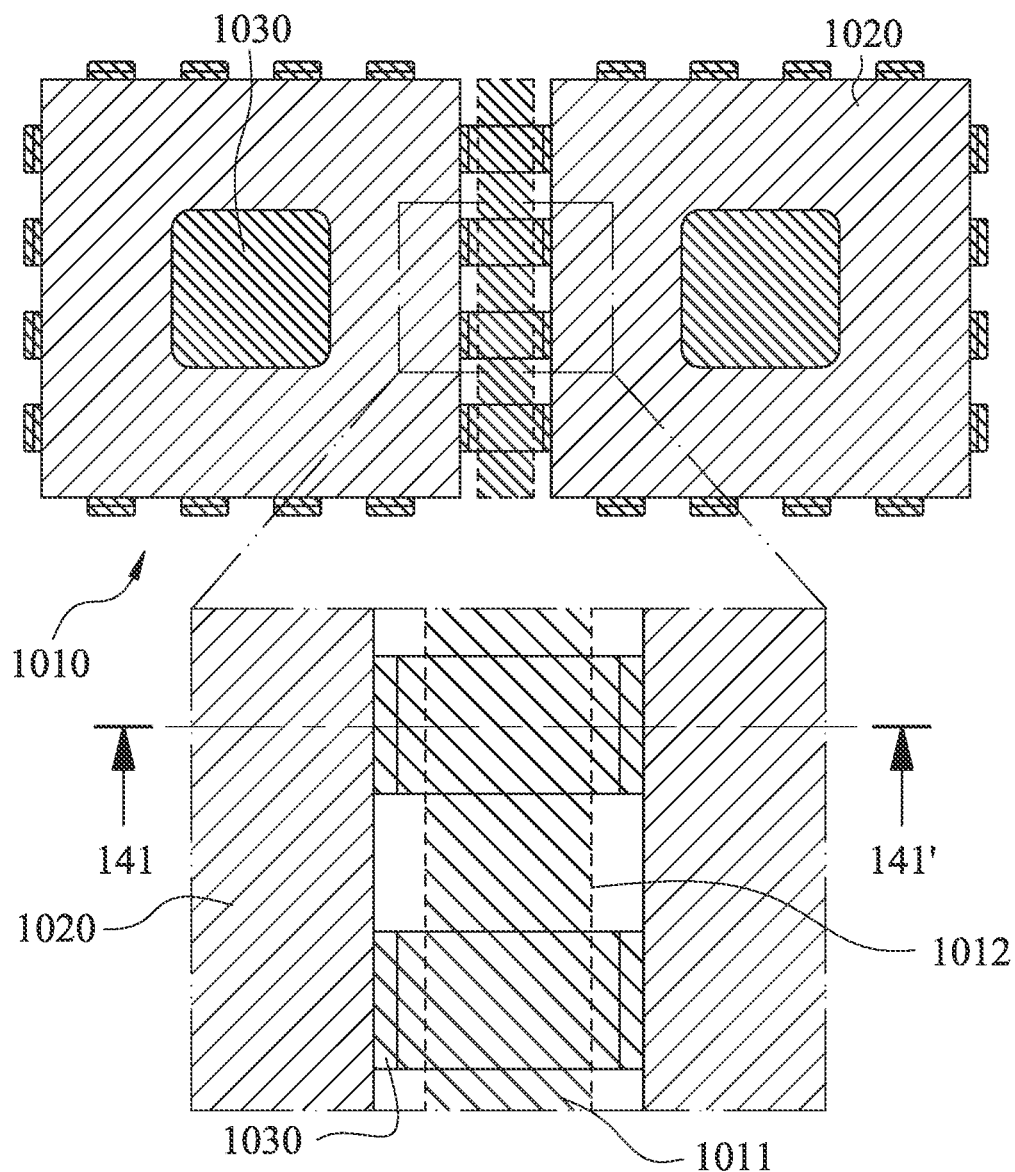

FIG. 140 is a schematic view of the plating step according to the 10th embodiment in FIG. 131.

Figure 141:
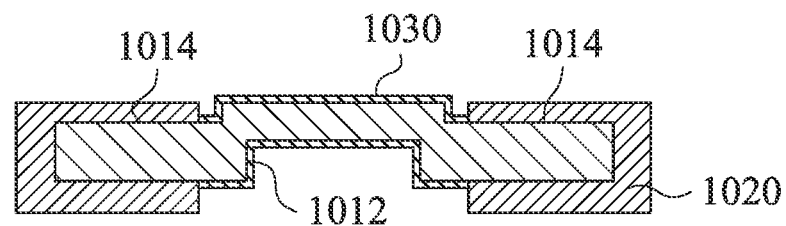

FIG. 141 is a cross-sectional schematic view of the leadframe along a 141-141' line in FIG. 140.

Figure 142:
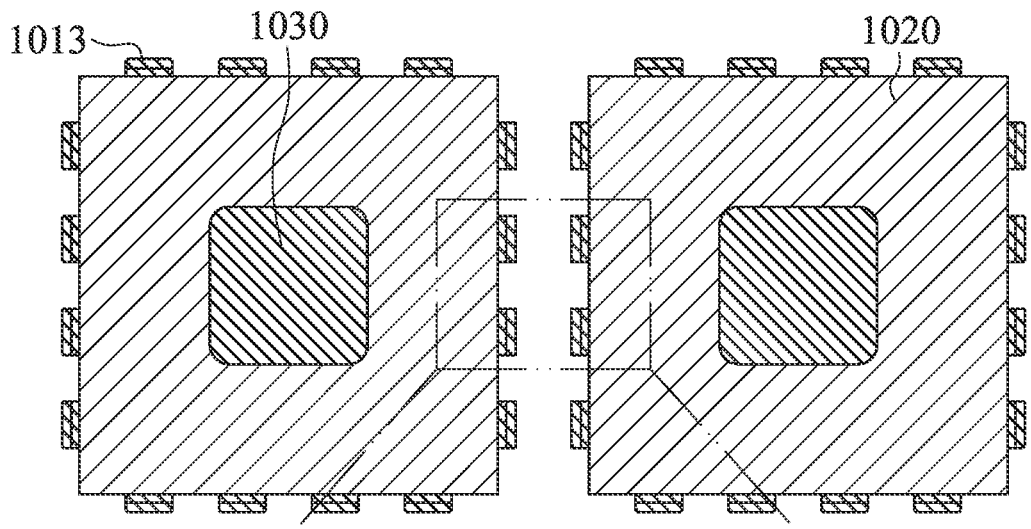
Figure 142:
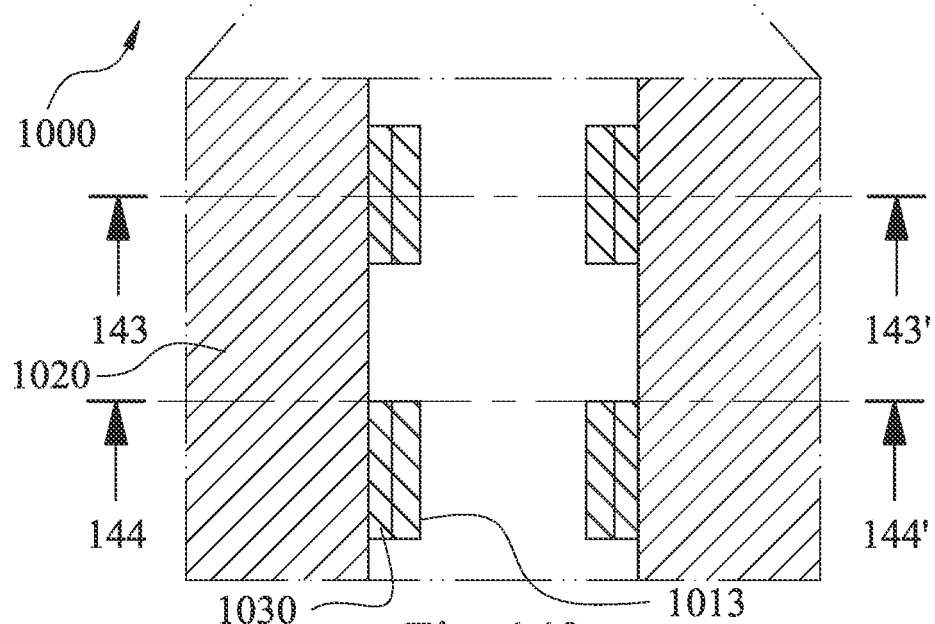

FIG. 142 is a schematic view of the singulation step according to the 10th embodiment in FIG. 131.

Figure 143:
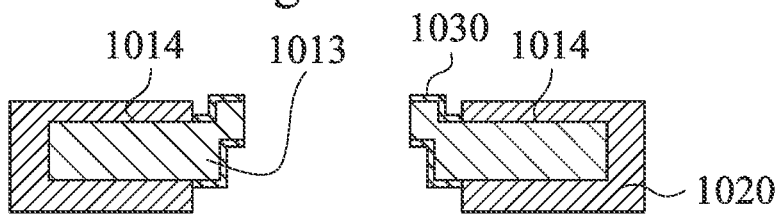

FIG. 143 is a cross-sectional schematic view of the package structure along a 143-143' line in FIG. 142.

Figure 144:
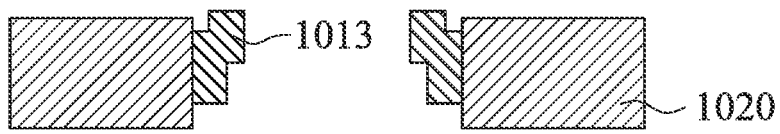

FIG. 144 is a cross-sectional schematic view of the package structure along a 144-144' line in FIG. 142.

Figure 145:
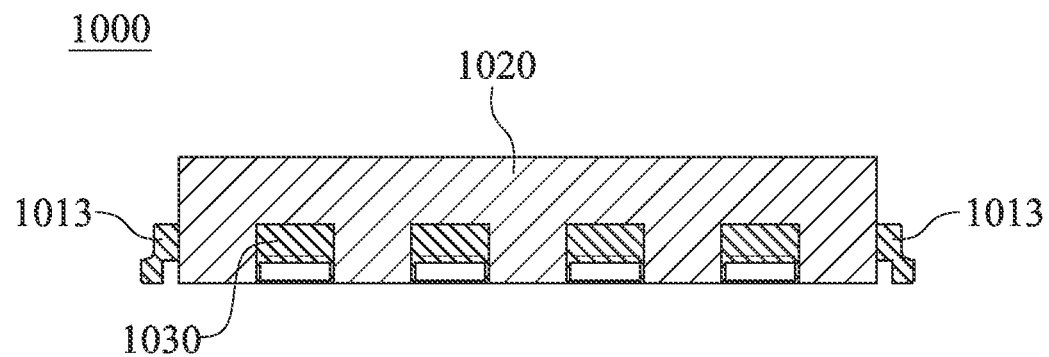

FIG. 145 is a side view of the package structure according to the 10th embodiment in FIG. 131.

Figure 146:
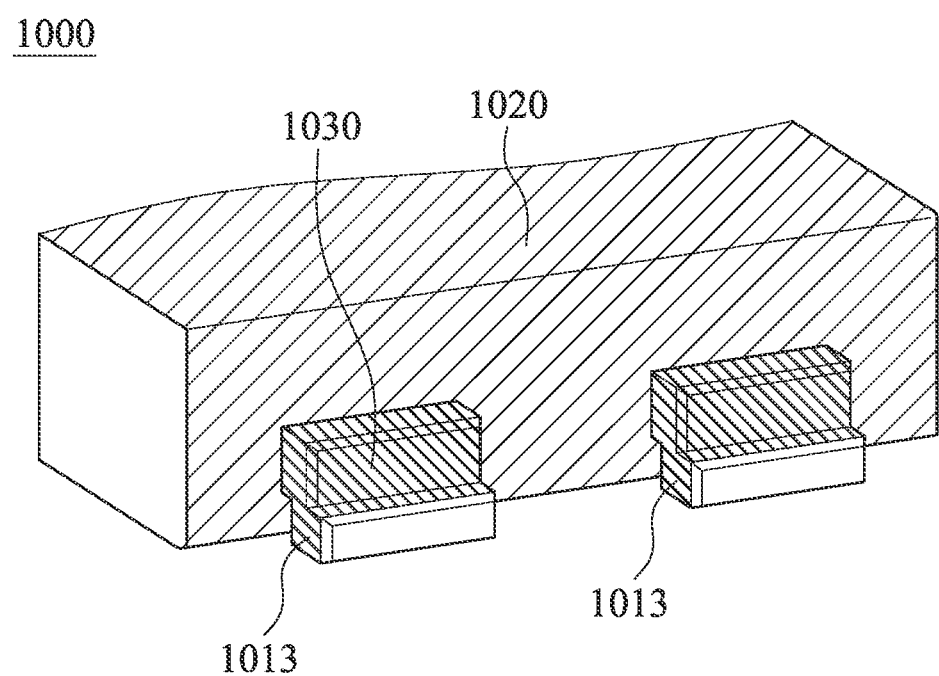

FIG. 146 is a partial schematic view of the package structure according to the 10th embodiment in FIG. 131.

Figure 147:
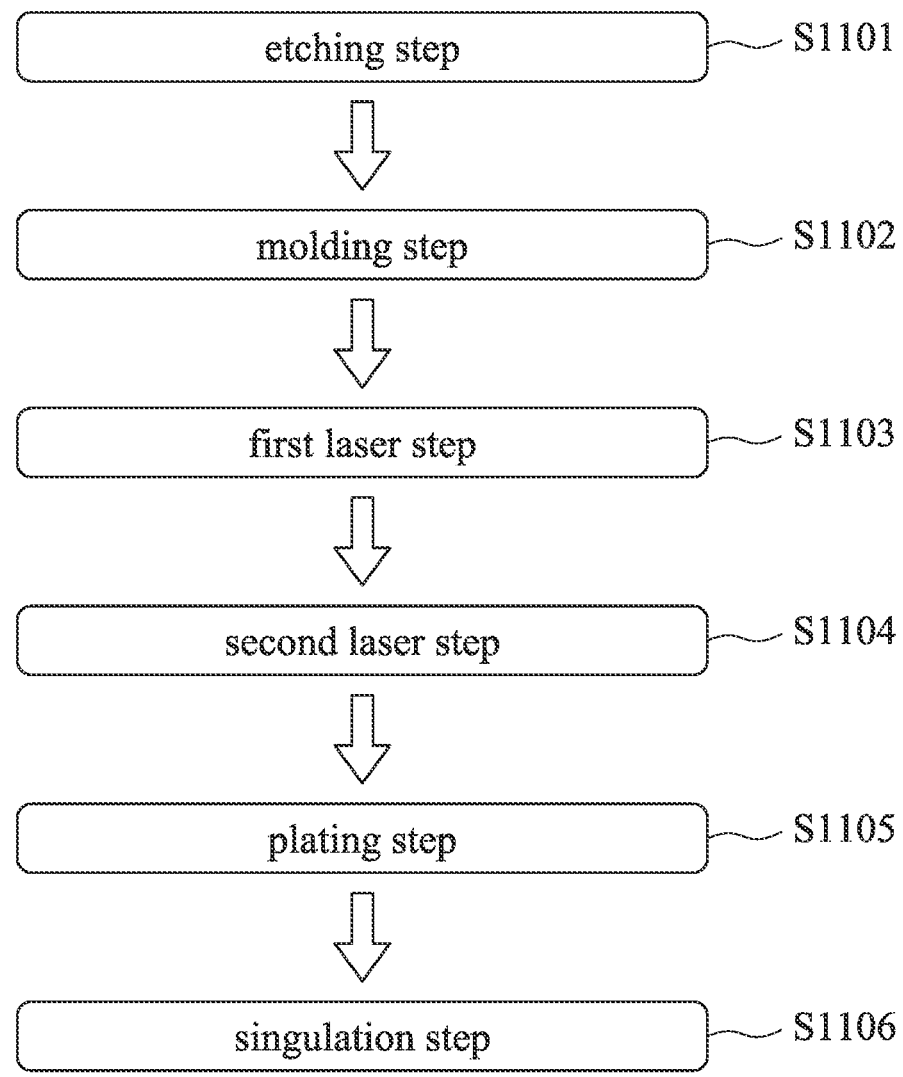

FIG. 147 is a step flow chart of a method of forming a package structure according to the 11th embodiment of the present disclosure.

Figure 148:
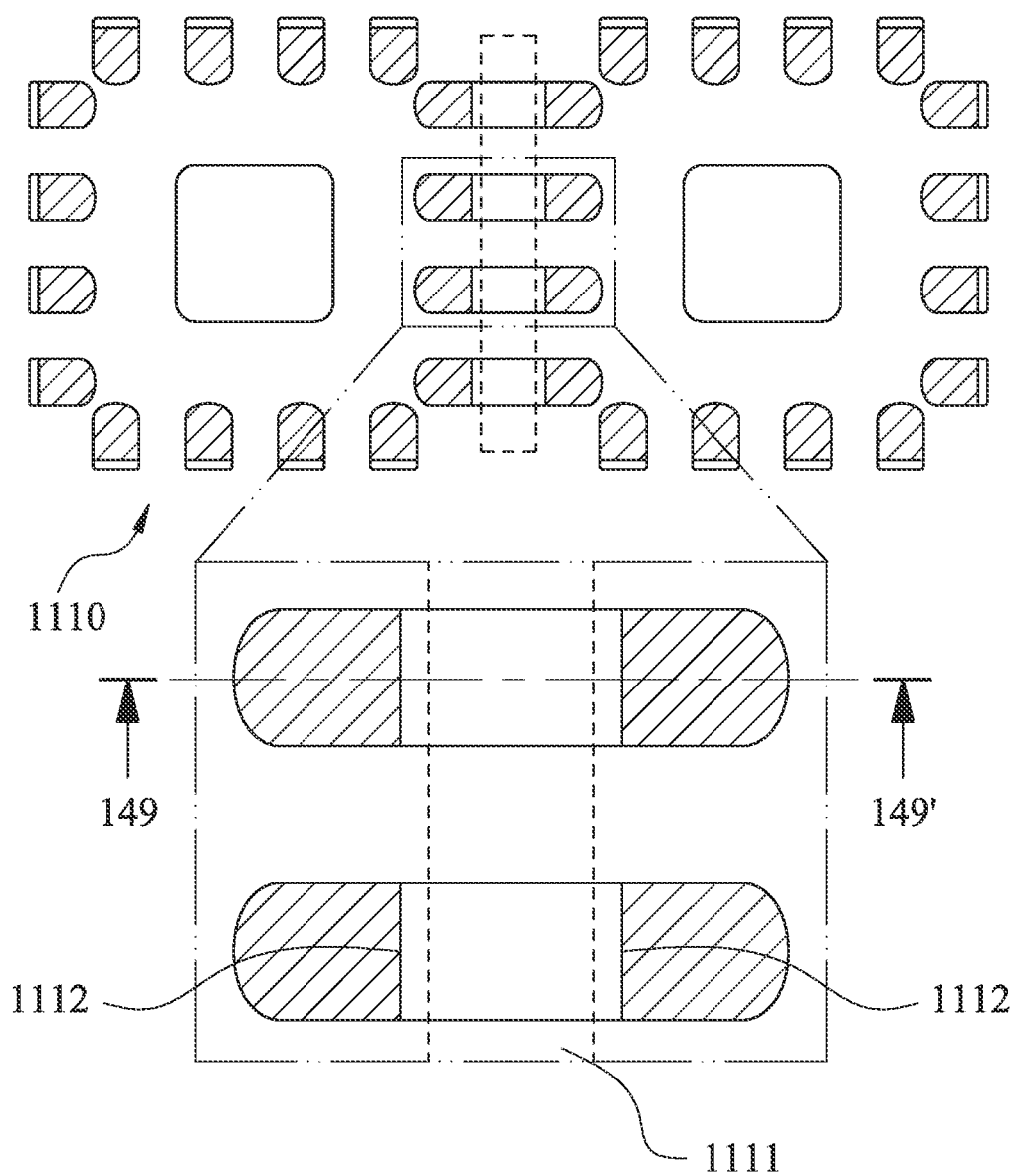

FIG. 148 is a schematic view of the etching step according to the 11th embodiment in FIG. 147.

Figure 149:
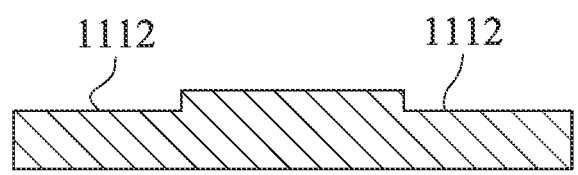

FIG. 149 is a cross-sectional schematic view of the leadframe along a 149-149' line in FIG. 148.

Figure 150:
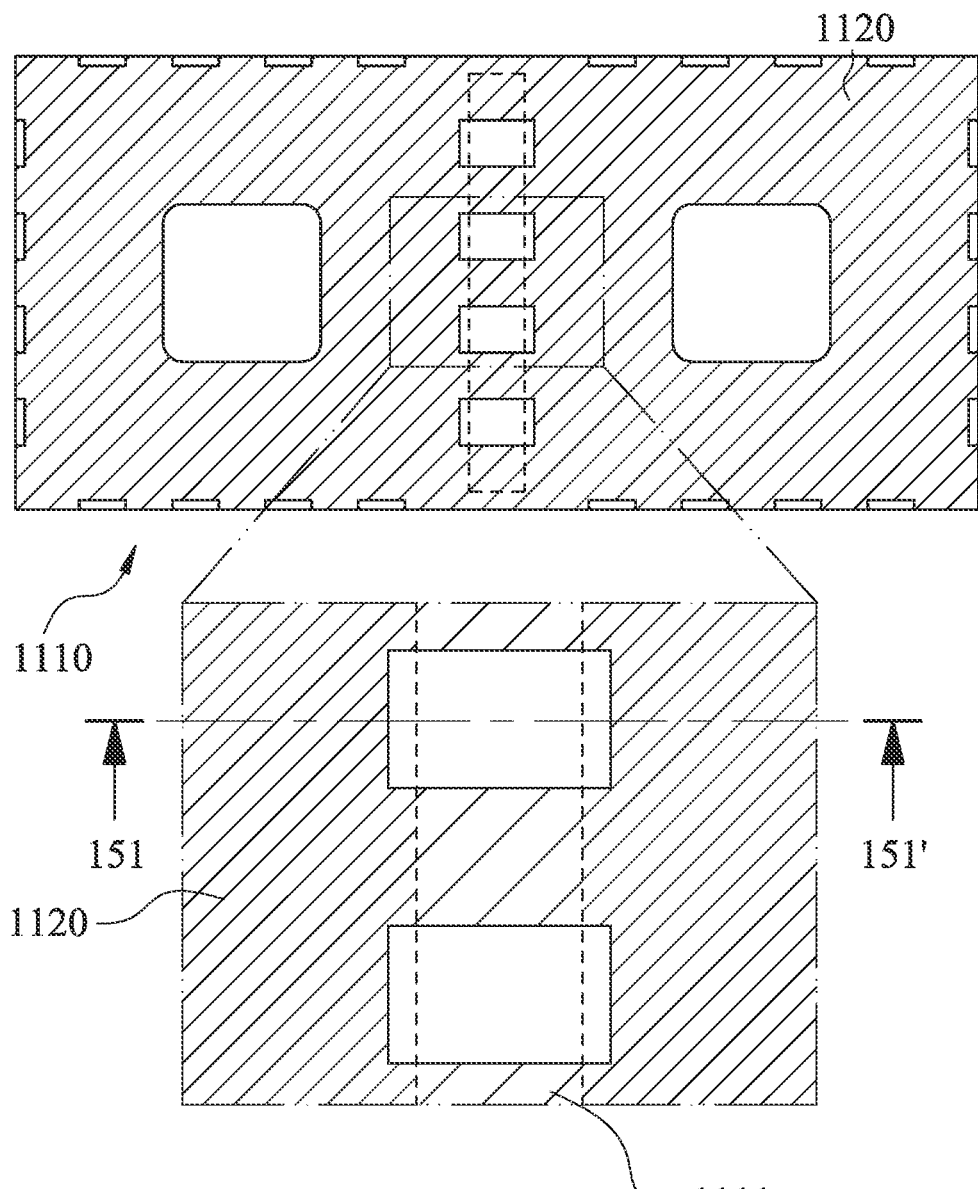

FIG. 150 is a schematic view of the molding step according to the 11th embodiment in FIG. 147.

Figure 151:
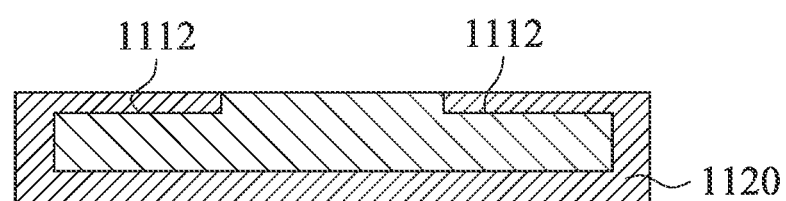

FIG. 151 is a cross-sectional schematic view of the leadframe along a 151-151' line in FIG. 150.

Figure 152:
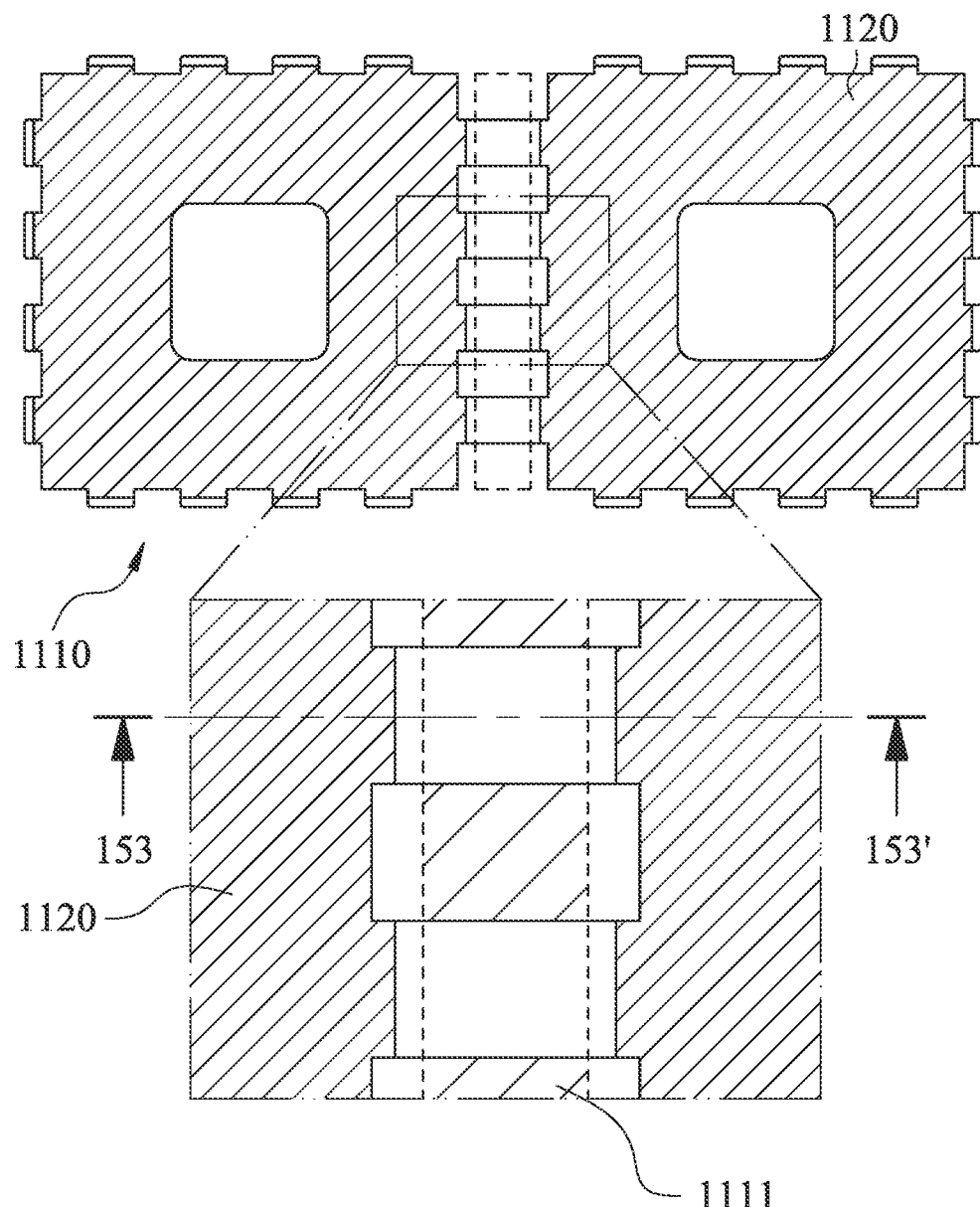

FIG. 152 is a schematic view of the first laser step according to the 11th embodiment in FIG. 147.

Figure 153:
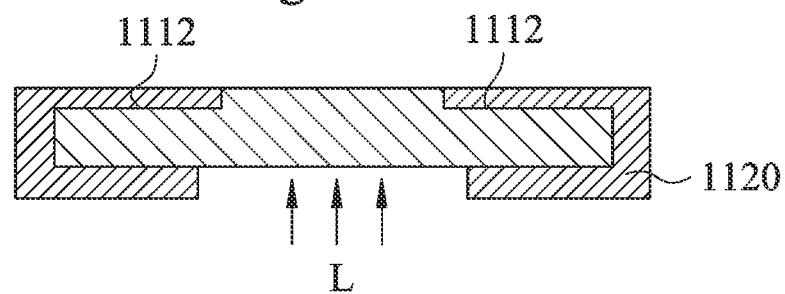

FIG. 153 is a cross-sectional schematic view of the leadframe along a 153-153' line in FIG. 152.

Figure 154:
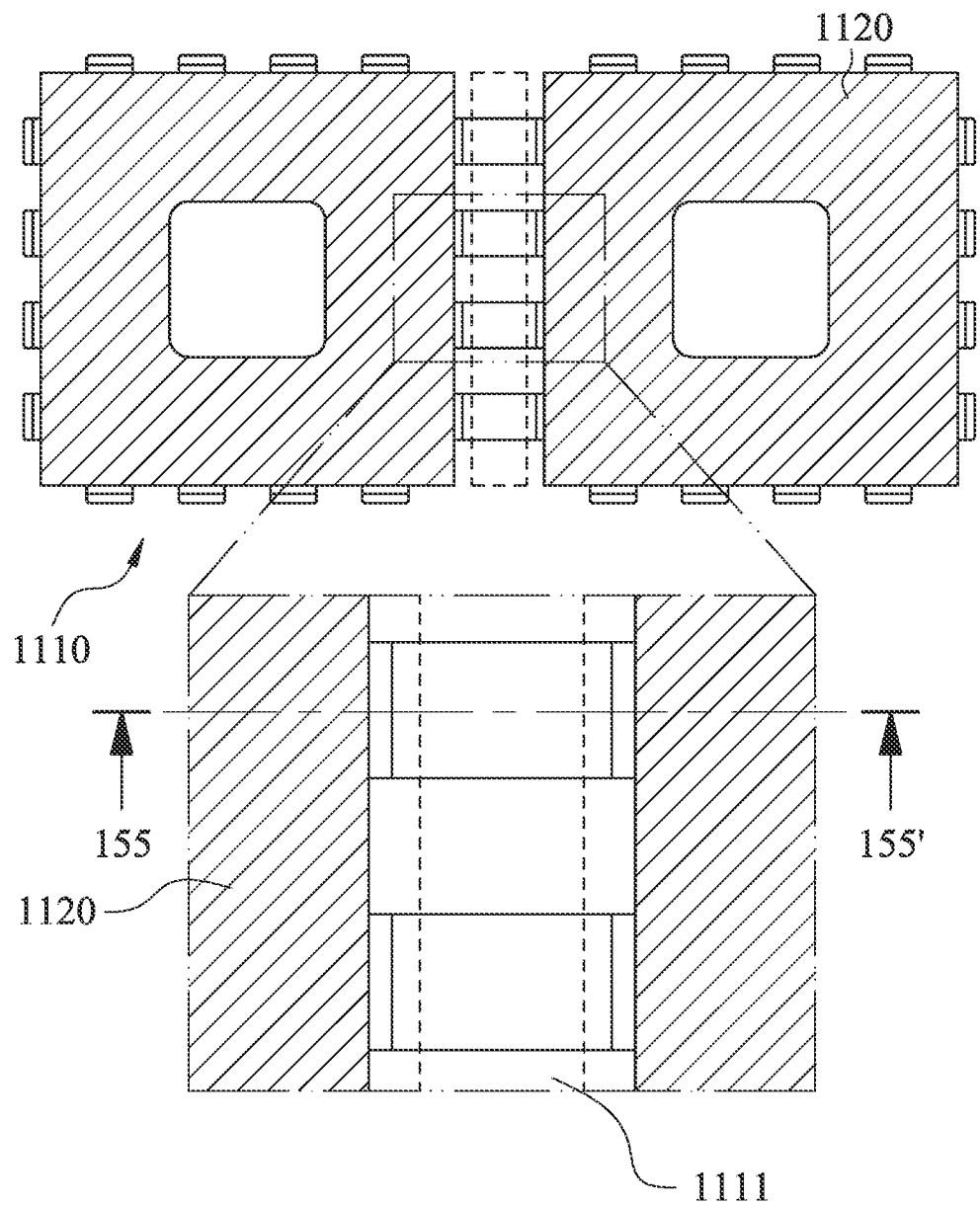

FIG. 154 is a schematic view of the second laser step according to the 11th embodiment in FIG. 147.

Figure 155:
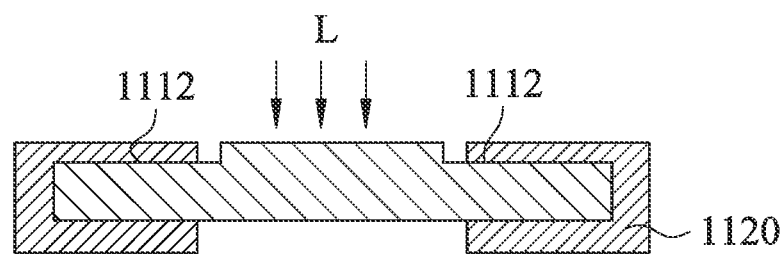

FIG. 155 is a cross-sectional schematic view of the leadframe along a 155-155' line in FIG. 154.

Figure 156:
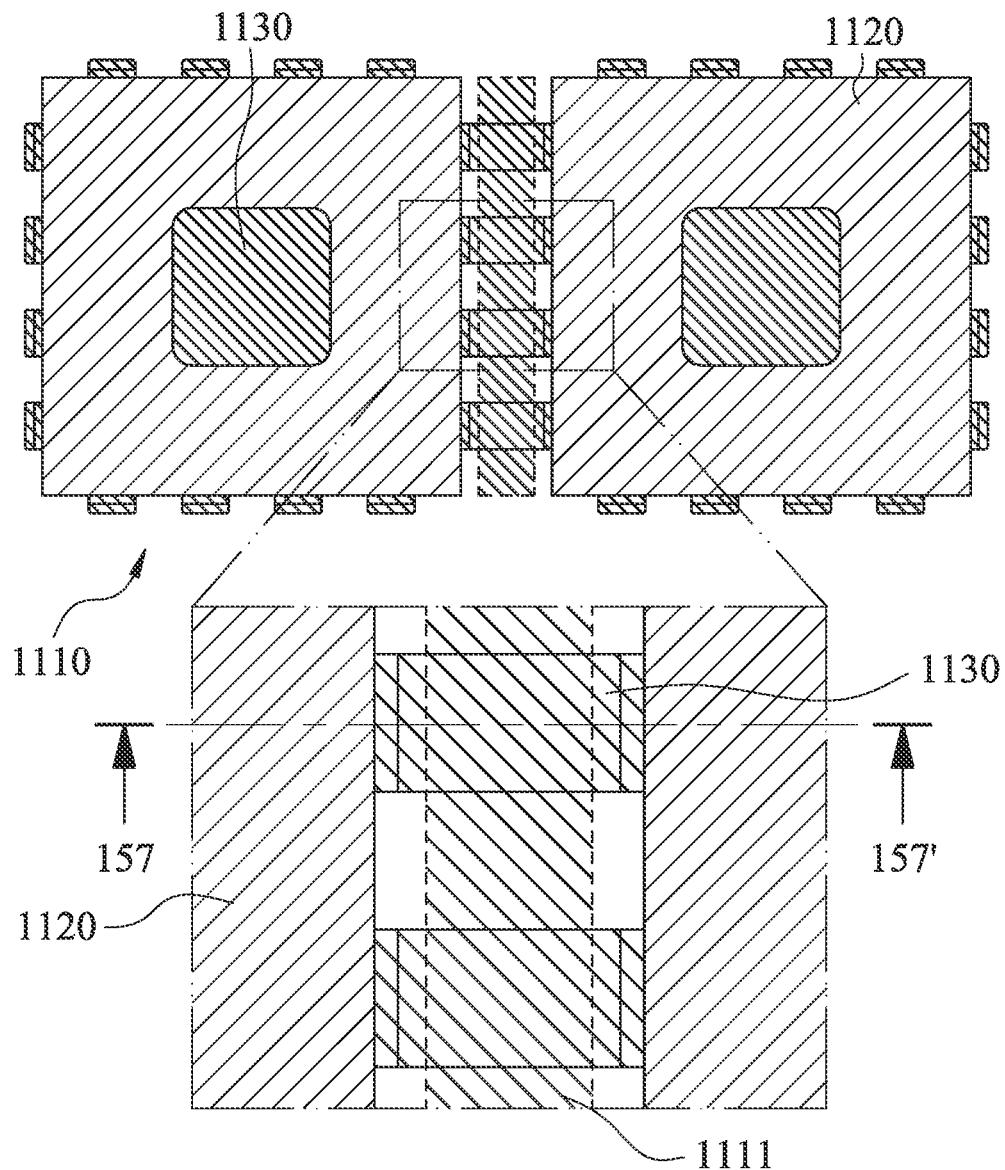

FIG. 156 is a schematic view of the plating step according to the 11th embodiment in FIG. 147.

Figure 157:
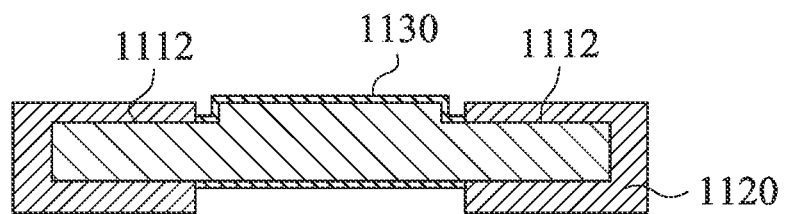

FIG. 157 is a cross-sectional schematic view of the leadframe along a 157-157' line in FIG. 156.

Figure 158:
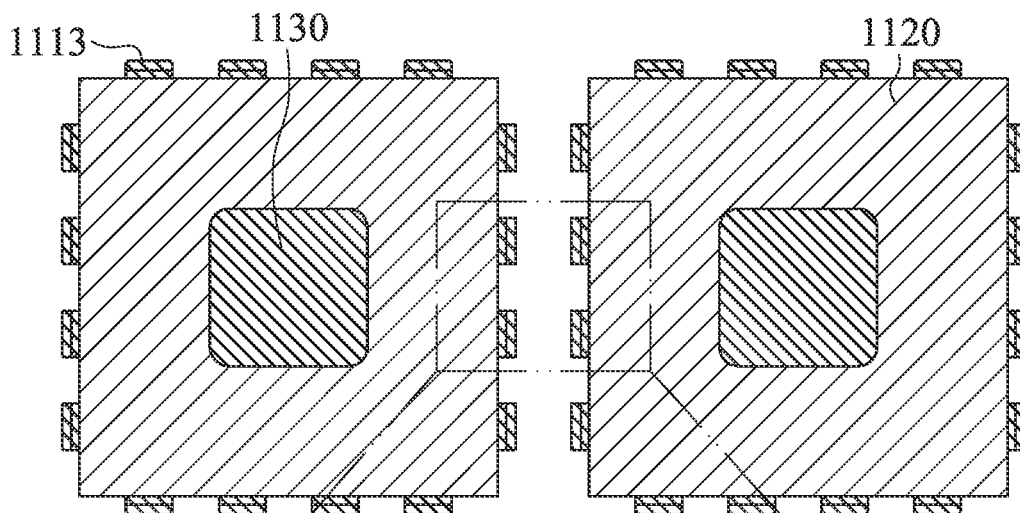
Figure 158:
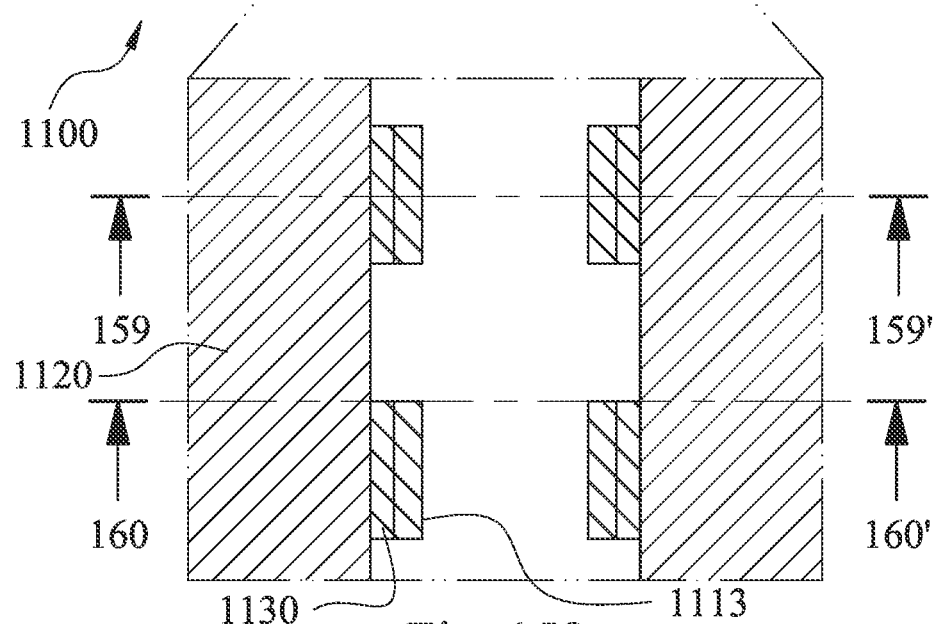

FIG. 158 is a schematic view of the singulation step according to the 11th embodiment in FIG. 147.

Figure 159:
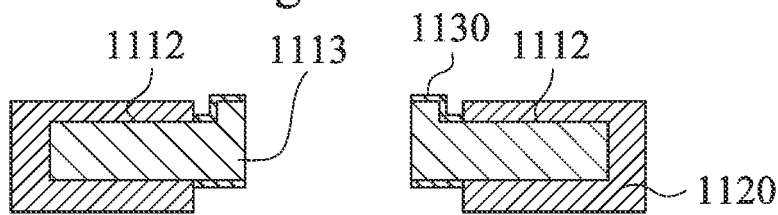

FIG. 159 is a cross-sectional schematic view of the package structure along a 159-159' line in FIG. 158.

Figure 160:
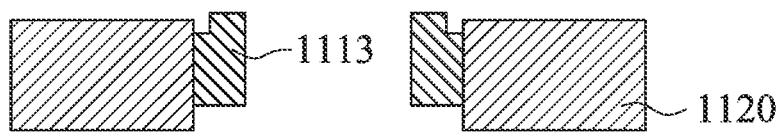

FIG. 160 is a cross-sectional schematic view of the package structure along a 160-160' line in FIG. 158.

Figure 161:
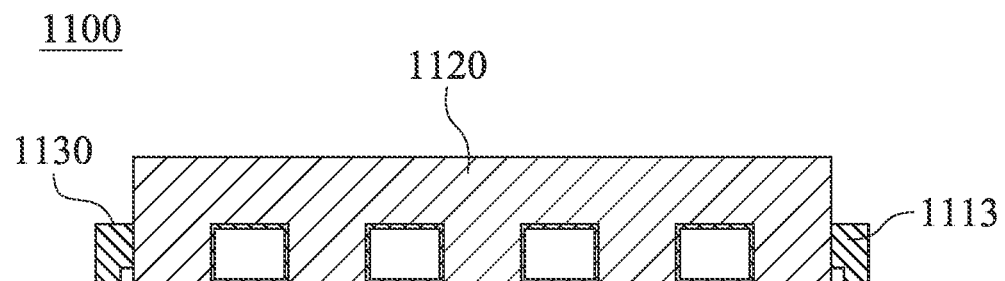

FIG. 161 is a side view of the package structure according to the 11th embodiment in FIG. 147.

Figure 162:
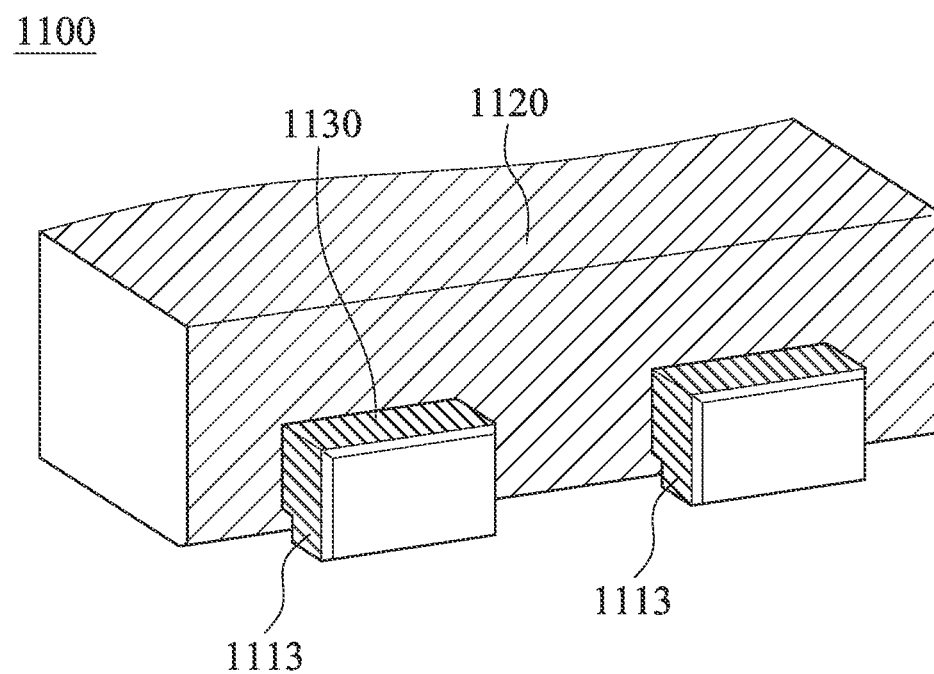

FIG. 162 is a partial schematic view of the package structure according to the 11th embodiment in FIG. 147.

Figure 163:
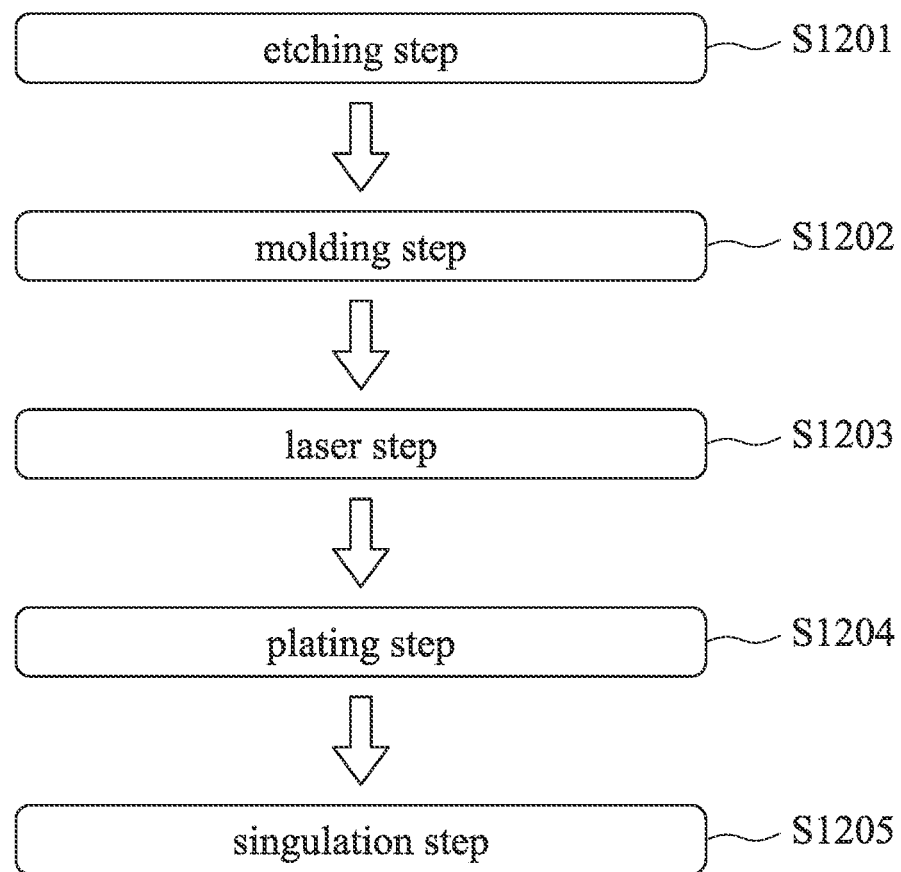

FIG. 163 is a step flow chart of a method of forming a package structure according to the 12th embodiment of the present disclosure.

Figure 164:
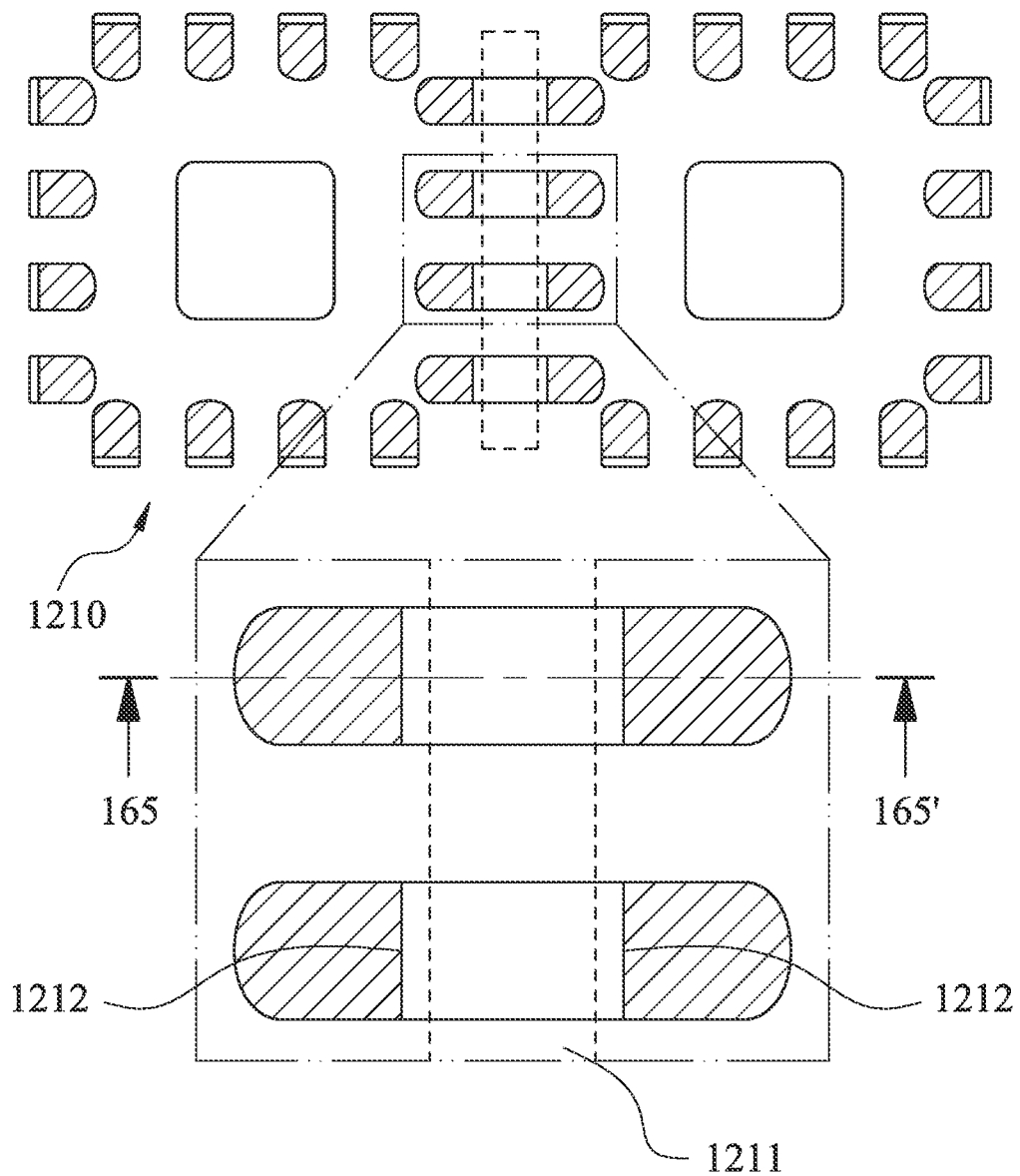

FIG. 164 is a schematic view of the etching step according to the 12th embodiment in FIG. 163.

Figure 165:
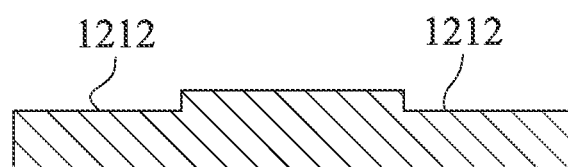

FIG. 165 is a cross-sectional schematic view of the leadframe along a 165-165' line in FIG. 164.

Figure 166:
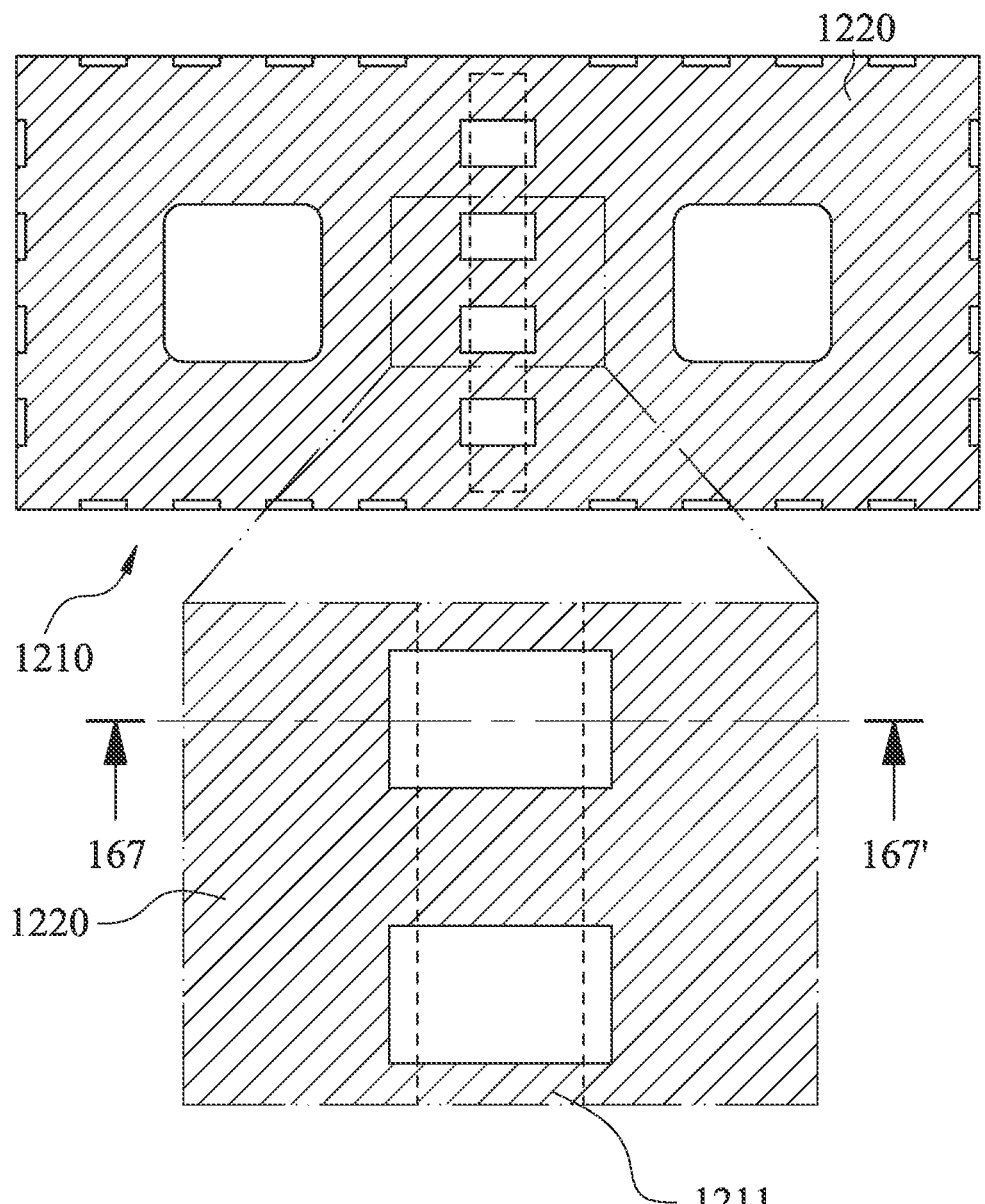

FIG. 166 is a schematic view of the molding step according to the 12th embodiment in FIG. 163.

Figure 167:
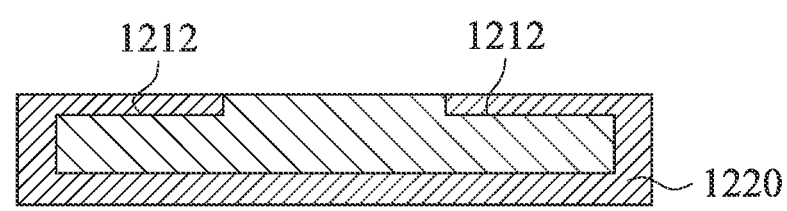

FIG. 167 is a cross-sectional schematic view of the leadframe along a 167-167' line in FIG. 166.

Figure 168:
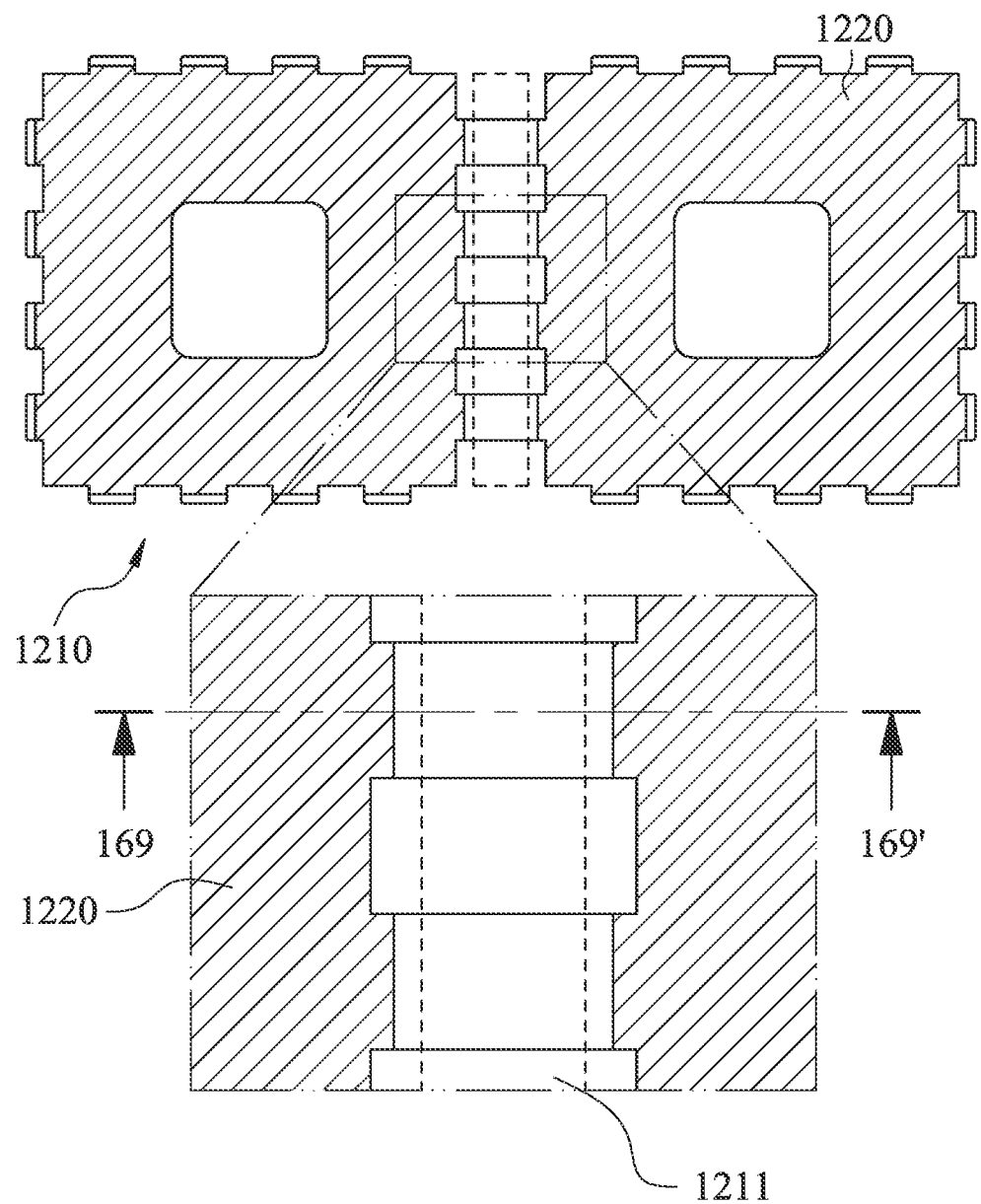

FIG. 168 is a schematic view of the laser step according to the 12th embodiment in FIG. 163.

Figure 169:
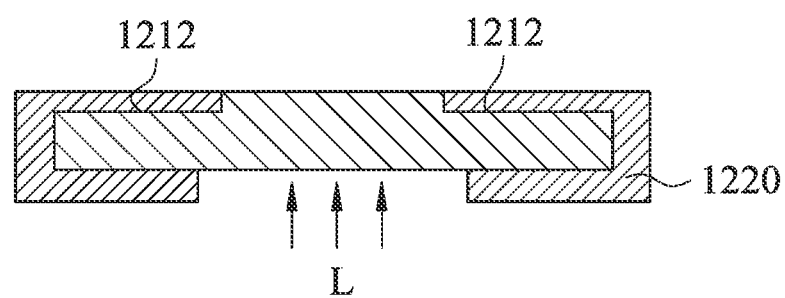

FIG. 169 is a cross-sectional schematic view of the leadframe along a 169-169' line in FIG. 168.

Figure 170:
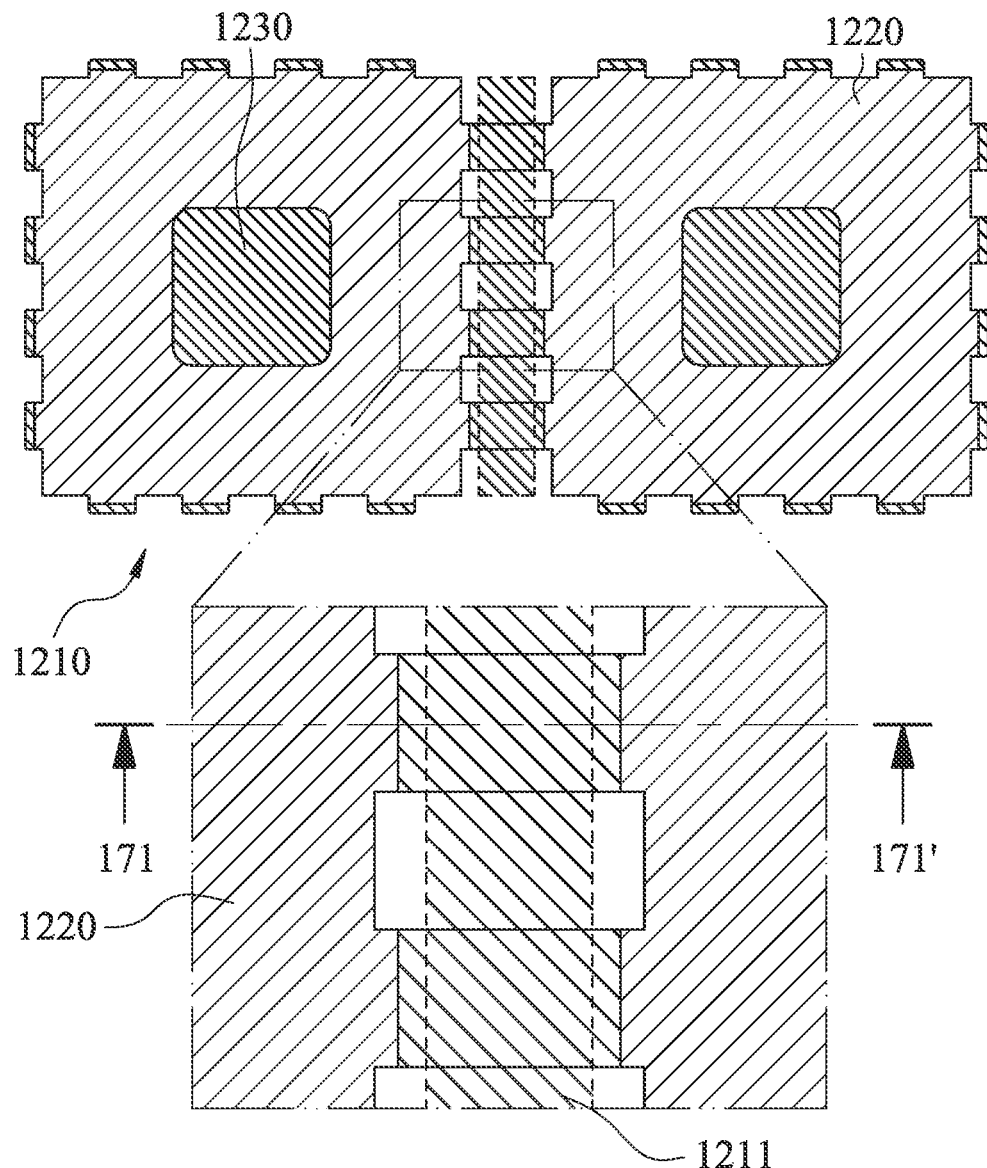

FIG. 170 is a schematic view of the plating step according to the 12th embodiment in FIG. 163.

Figure 171:
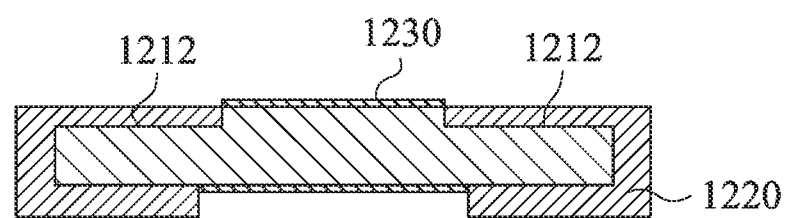

FIG. 171 is a cross-sectional schematic view of the leadframe along a 171-171' line in FIG. 170.

Figure 172:
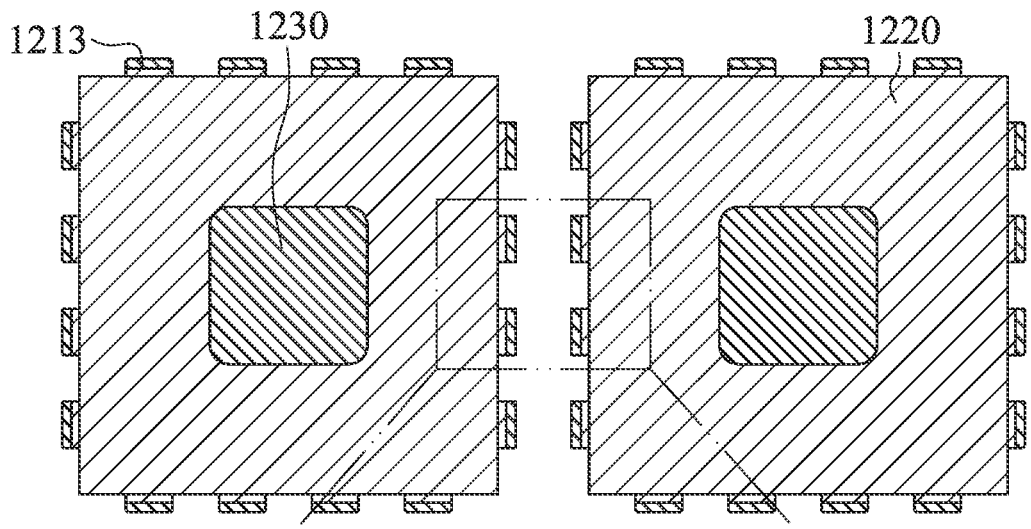
Figure 172:
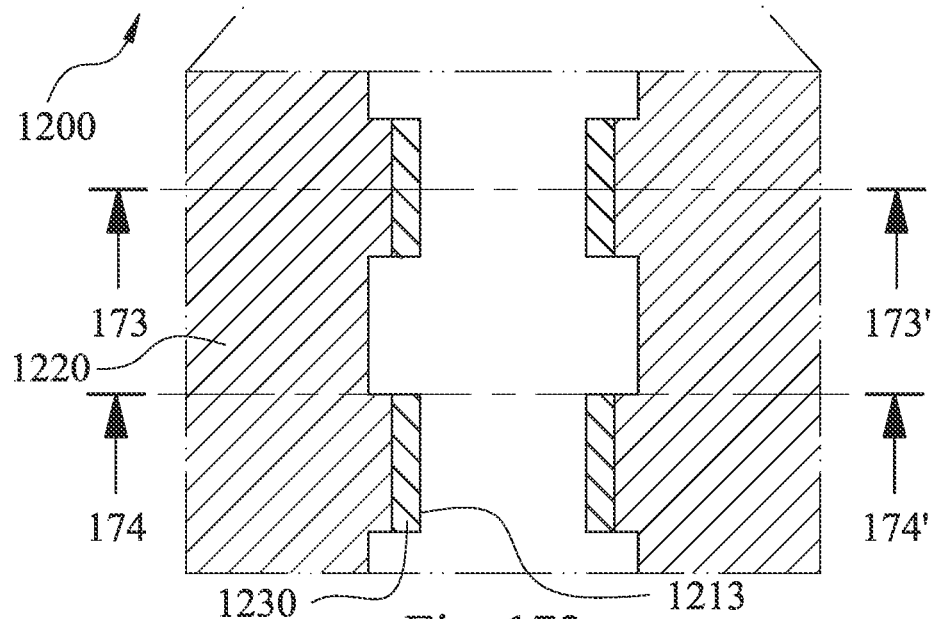

FIG. 172 is a schematic view of the singulation step according to the 12th embodiment in FIG. 163.

Figure 173:
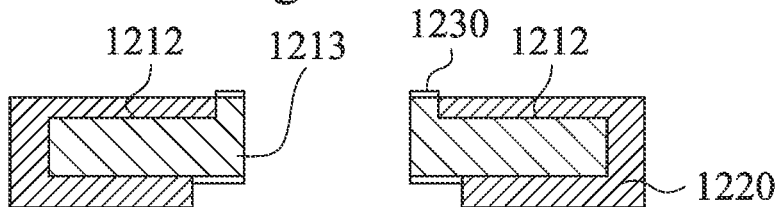

FIG. 173 is a cross-sectional schematic view of the package structure along a 173-173' line in FIG. 172.

Figure 174:
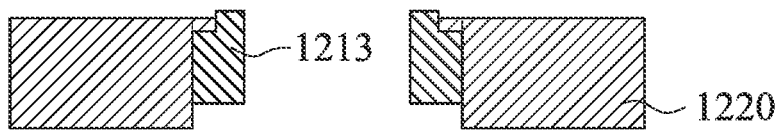

FIG. 174 is a cross-sectional schematic view of the package structure along a 174-174' line in FIG. 172.

Figure 175:
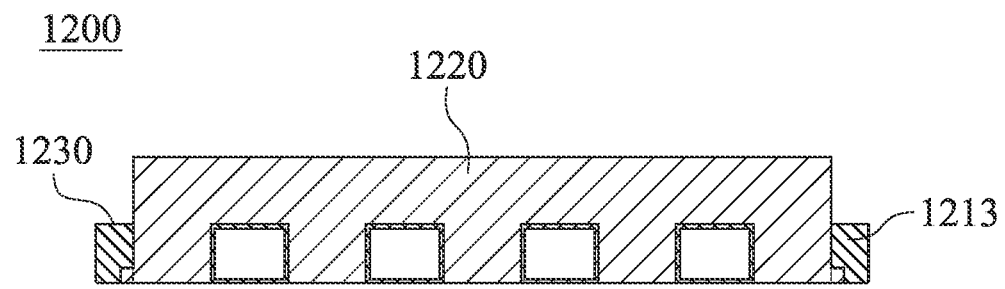

FIG. 175 is a side view of the package structure according to the 12th embodiment in FIG. 163.

Figure 176:
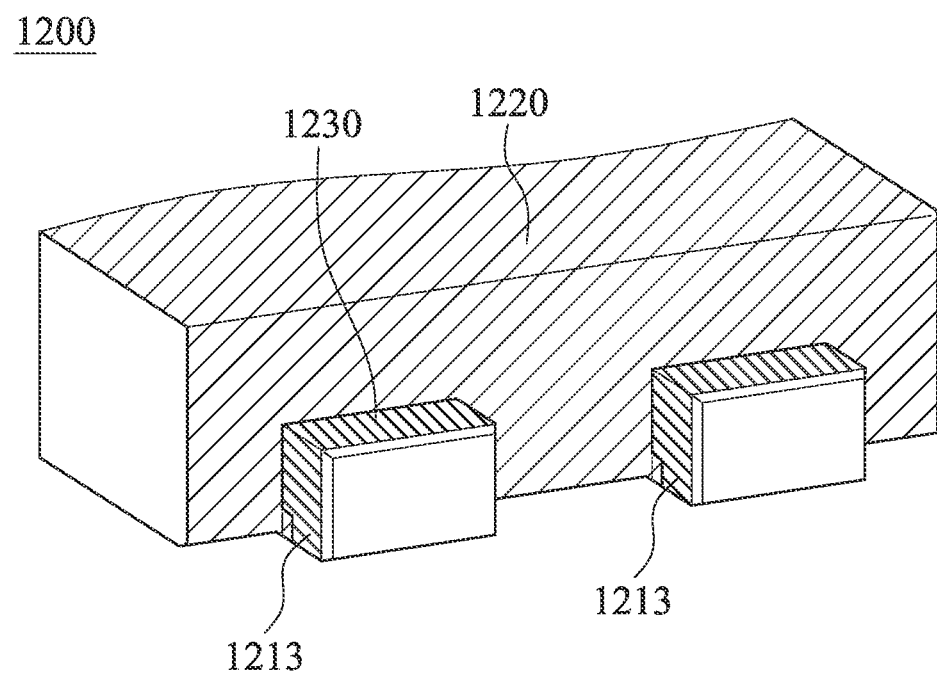

FIG. 176 is a partial schematic view of the package structure according to the 12th embodiment in FIG. 163.

Figure 177:
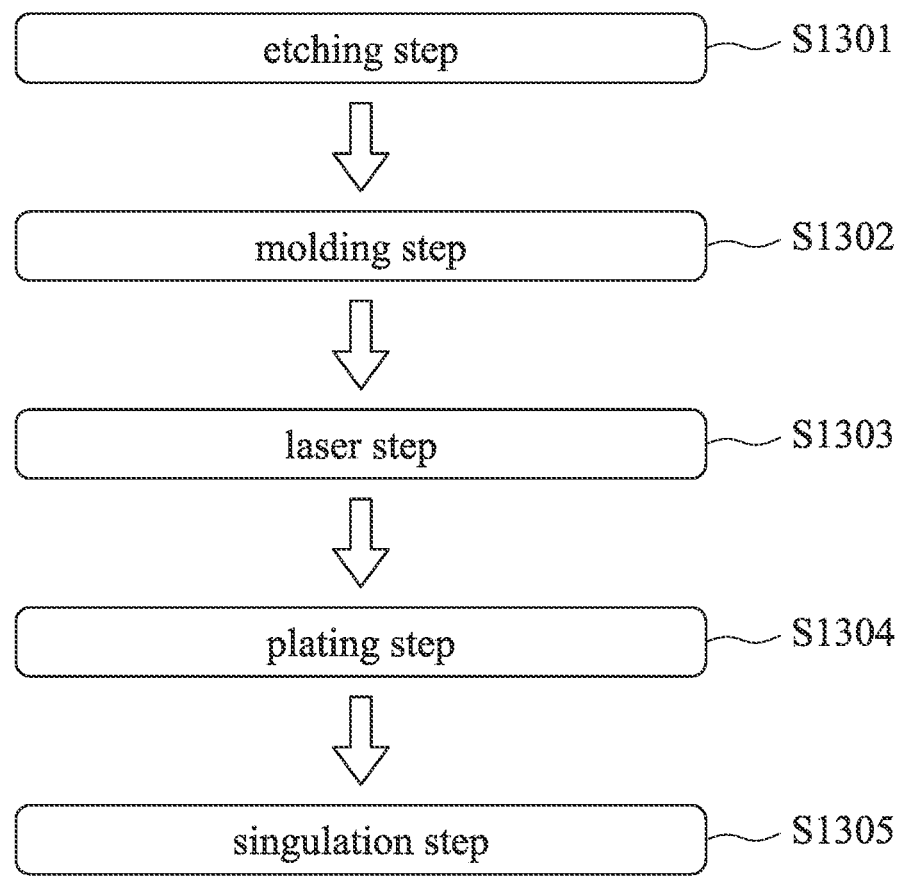

FIG. 177 is a step flow chart of a method of forming a package structure according to the 13th embodiment of the present disclosure.

Figure 178:
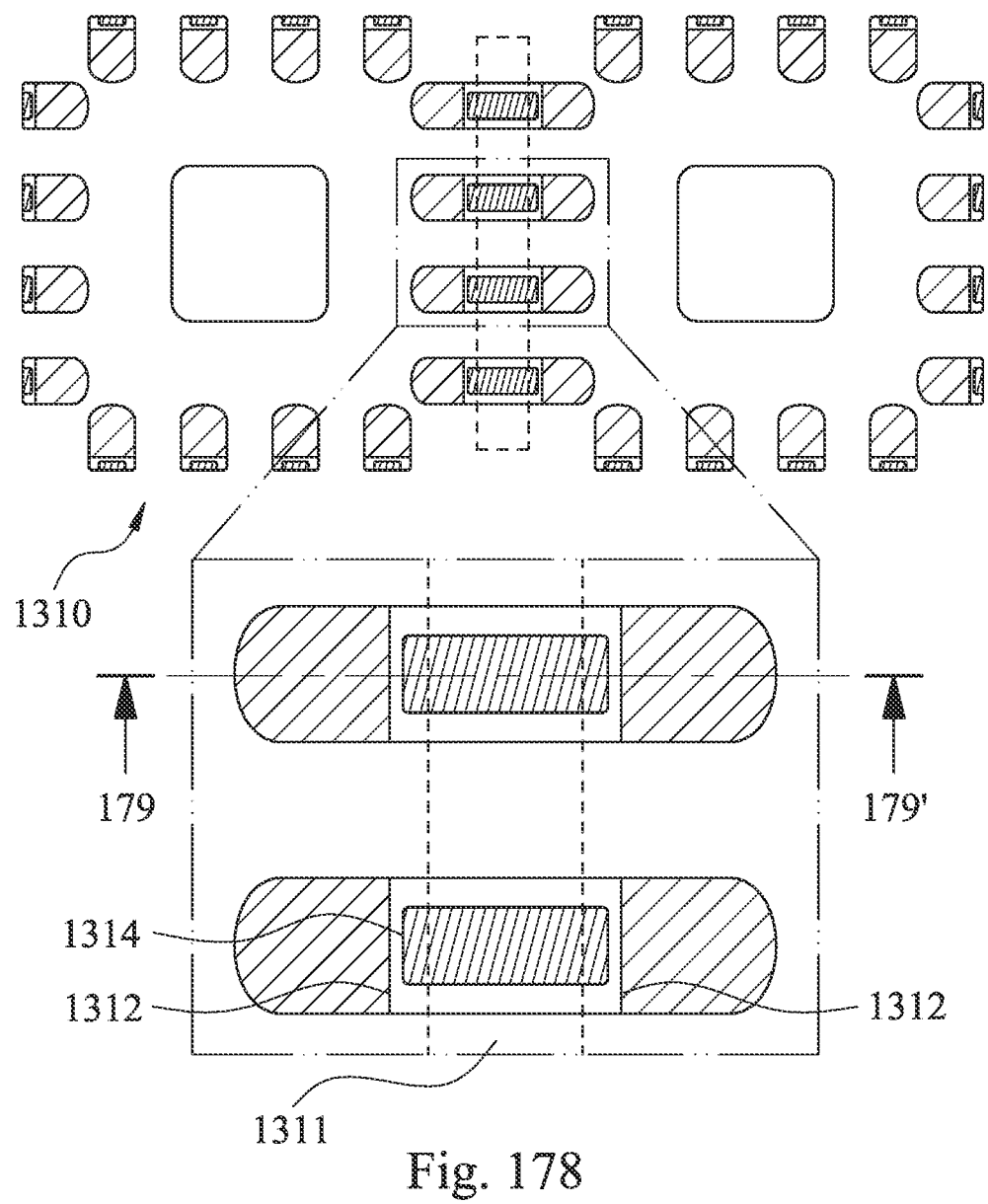

FIG. 178 is a schematic view of the etching step according to the 13th embodiment in FIG. 177.

Figure 179:
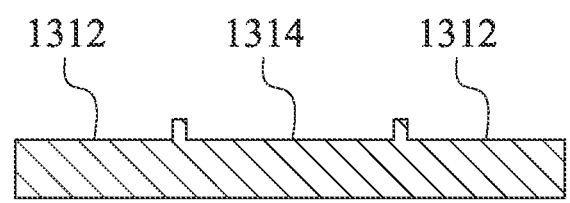

FIG. 179 is a cross-sectional schematic view of the leadframe along a 179-179' line in FIG. 178.

Figure 180:
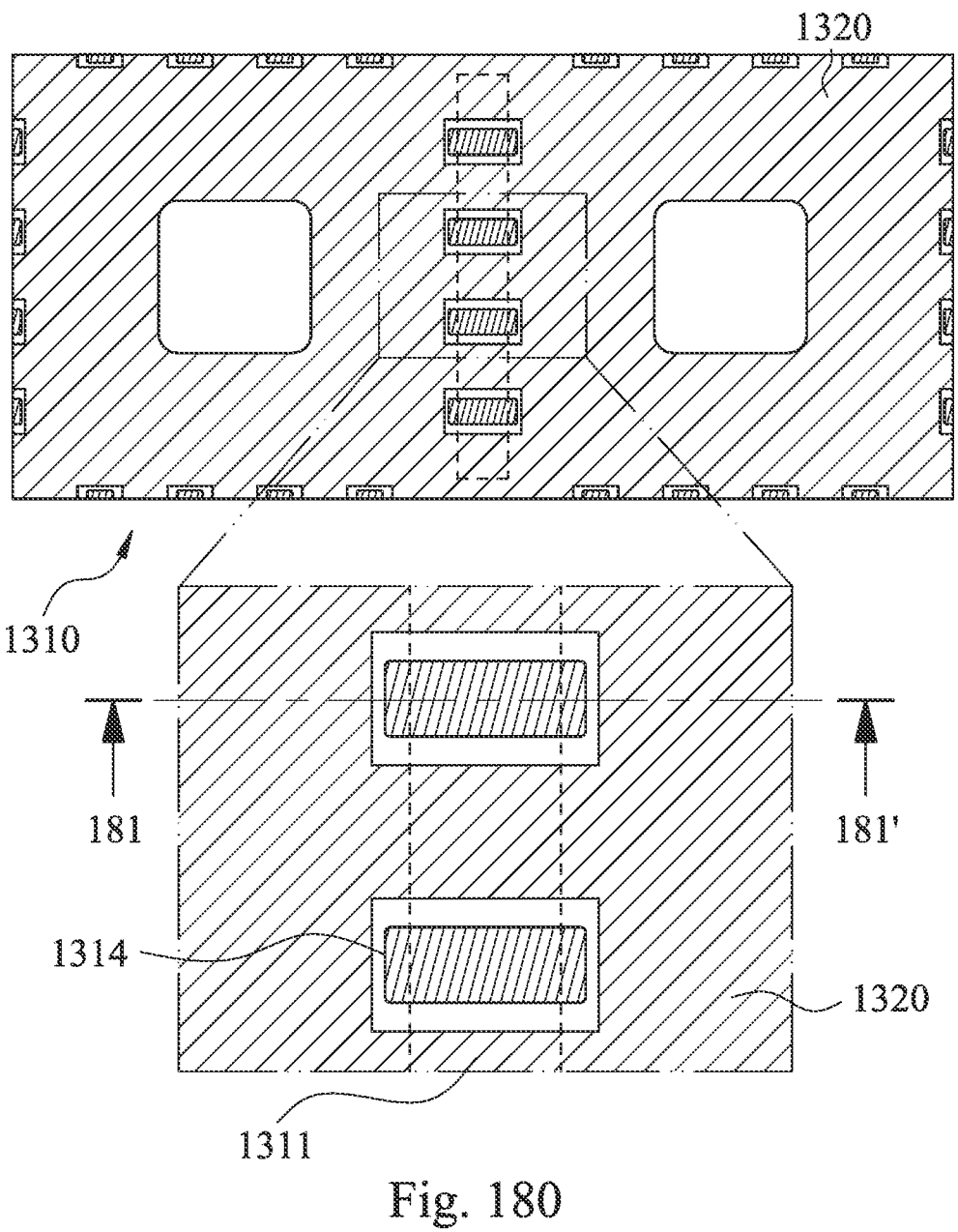

FIG. 180 is a schematic view of the molding step according to the 13th embodiment in FIG. 177.

Figure 181:
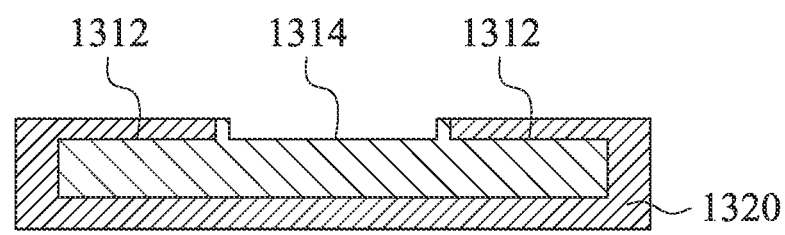

FIG. 181 is a cross-sectional schematic view of the leadframe along a 181-181' line in FIG. 180.

Figure 182:
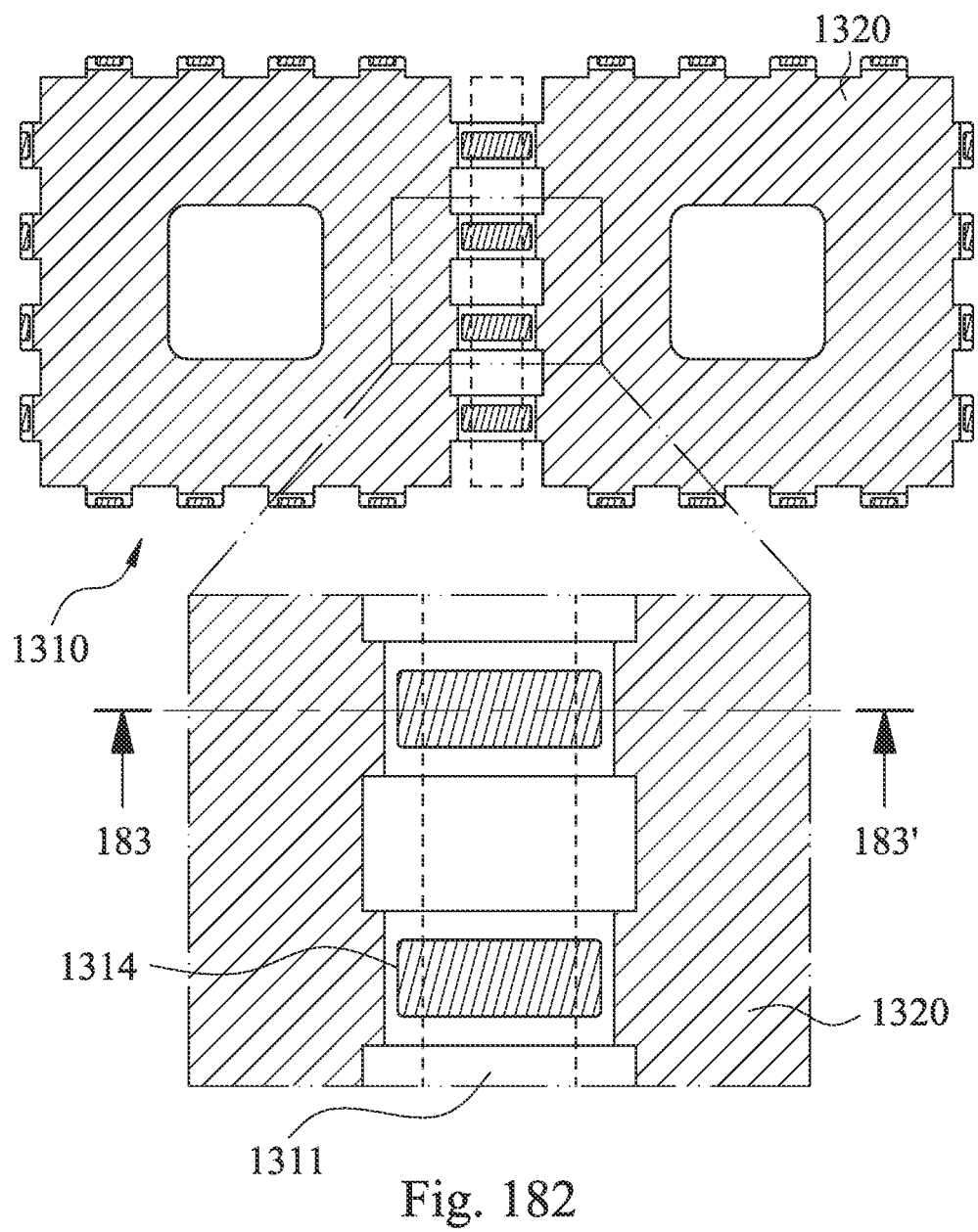

FIG. 182 is a schematic view of the laser step according to the 13th embodiment in FIG. 177.

Figure 183:
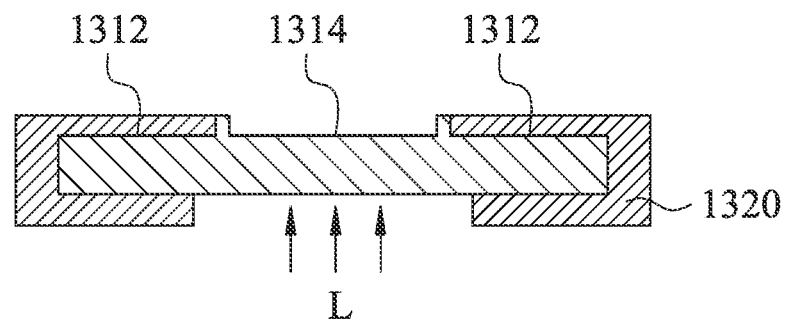

FIG. 183 is a cross-sectional schematic view of the leadframe along a 183-183' line in FIG. 182.

Figure 184:
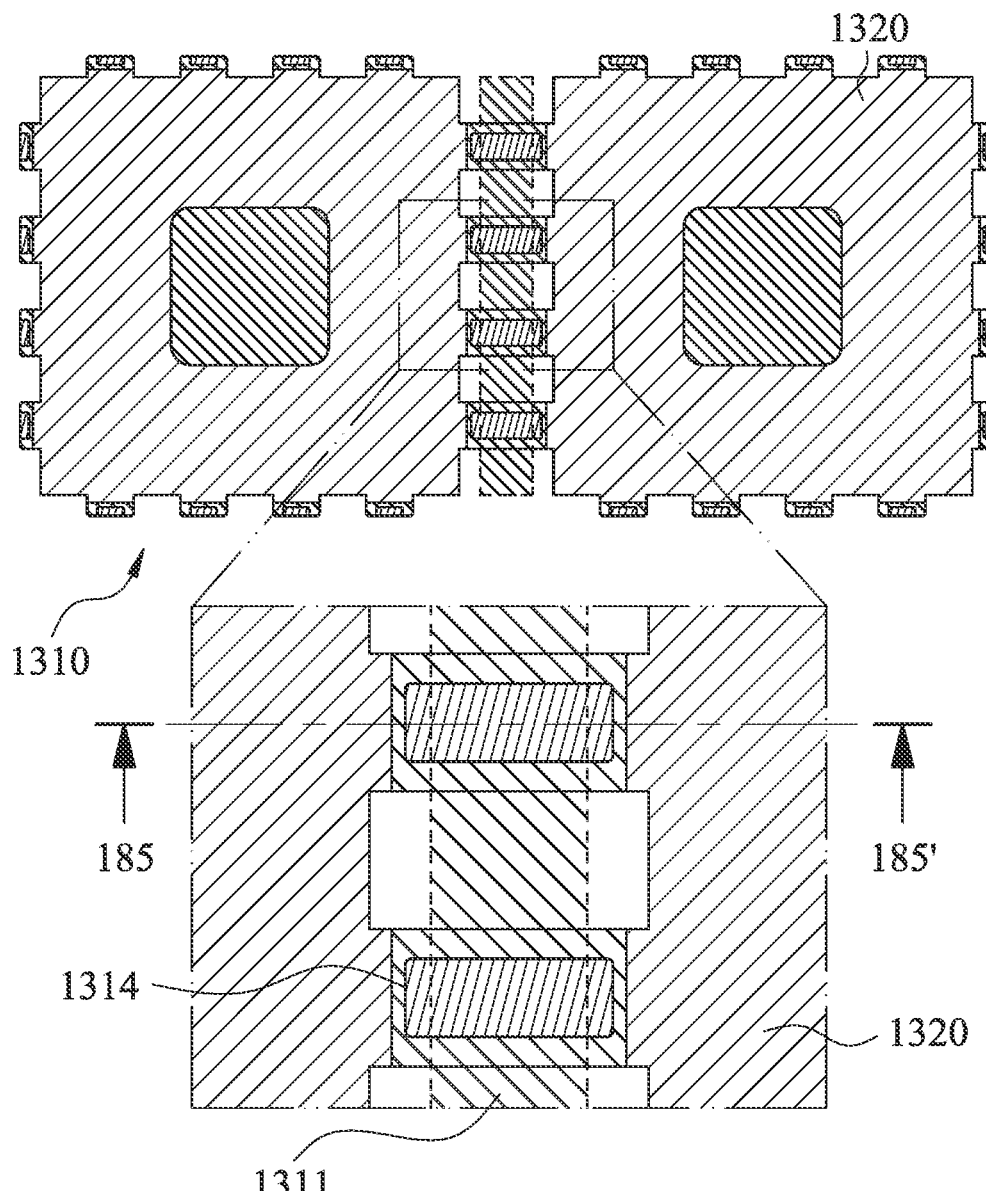

FIG. 184 is a schematic view of the plating step according to the 13th embodiment in FIG. 177.

Figure 185:
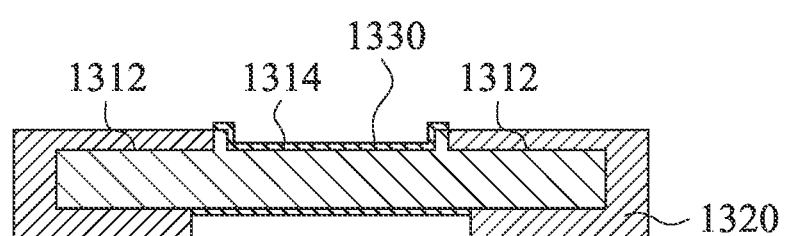

FIG. 185 is a cross-sectional schematic view of the leadframe along a 185-185' line in FIG. 184.

Figure 186:
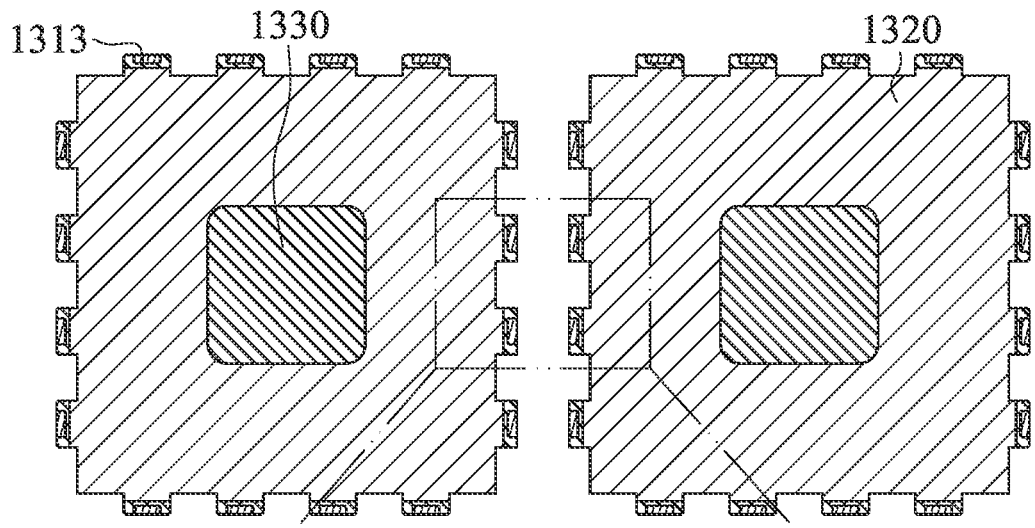
Figure 186:
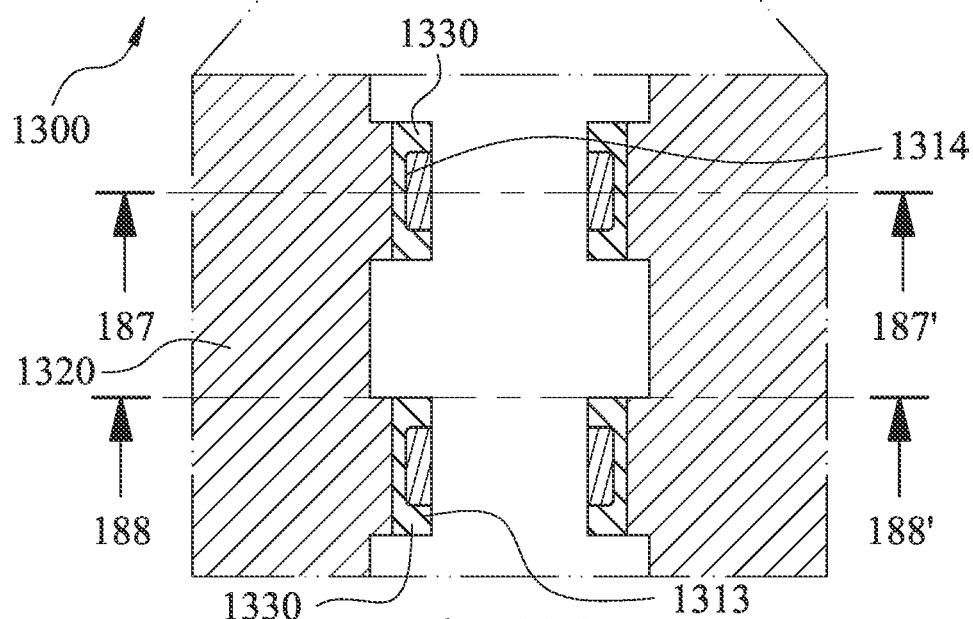

FIG. 186 is a schematic view of the singulation step according to the 13th embodiment in FIG. 177.

Figure 187:
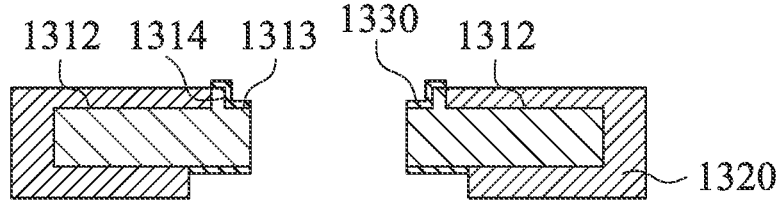

FIG. 187 is a cross-sectional schematic view of the package structure along a 187-187' line in FIG. 186.

Figure 188:
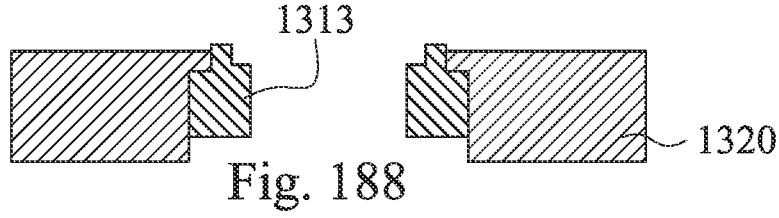

FIG. 188 is a cross-sectional schematic view of the package structure along a 188-188' line in FIG. 186.

Figure 189:
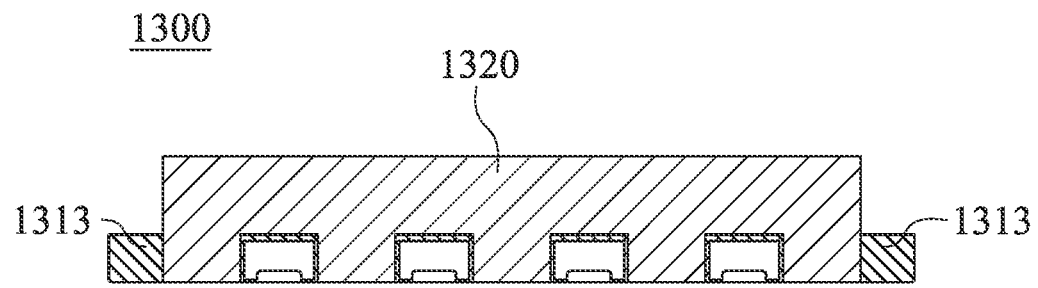

FIG. 189 is a side view of the package structure according to the 13th embodiment in FIG. 177.

Figure 190:
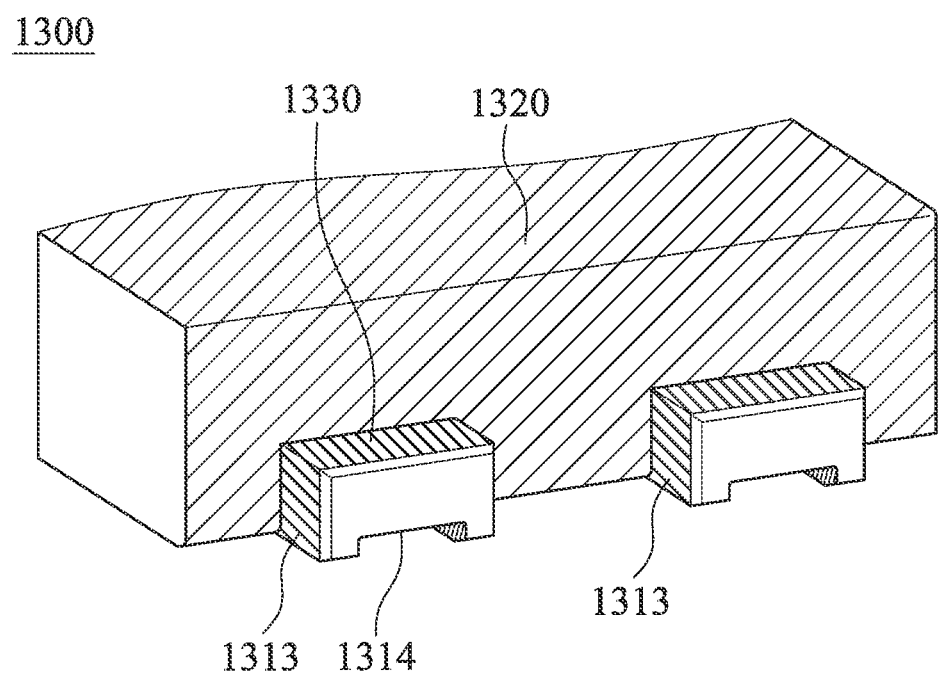

FIG. 190 is a partial schematic view of the package structure according to the 13th embodiment in FIG. 177.

DETAILED DESCRIPTION

Figure 1:
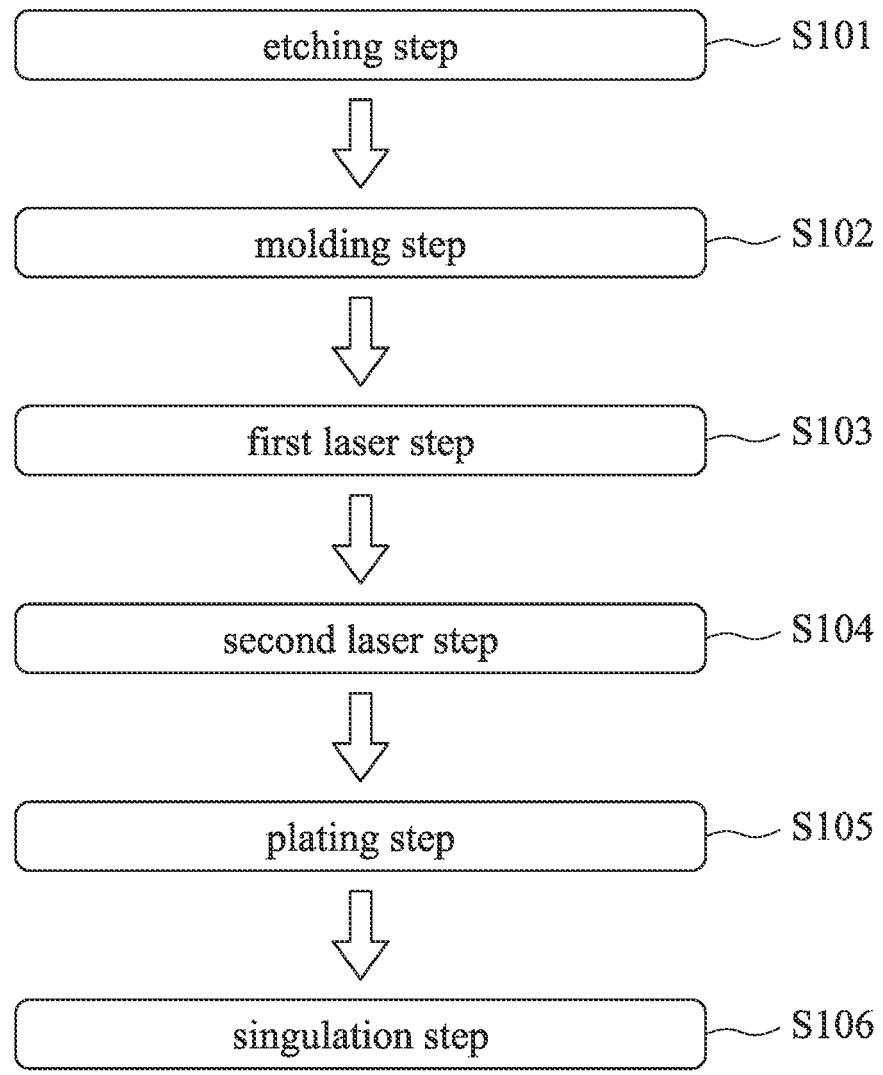
FIG. 1 is a step flow chart of a method of forming a package structure according to the 1st embodiment of the present disclosure.

FIG. 1 is a step flow chart of a method of forming a package structure S100 according to the 1st embodiment of the present disclosure. In FIG. 1, the method of forming the package structure S100 includes an etching step S101, a molding step S102, a laser step, a plating step S105 and a singulation step S106, wherein the laser step includes a first laser step S103 and a second laser step S104, and the second laser step S104 is performed after the first laser step S103.

Figure 2:
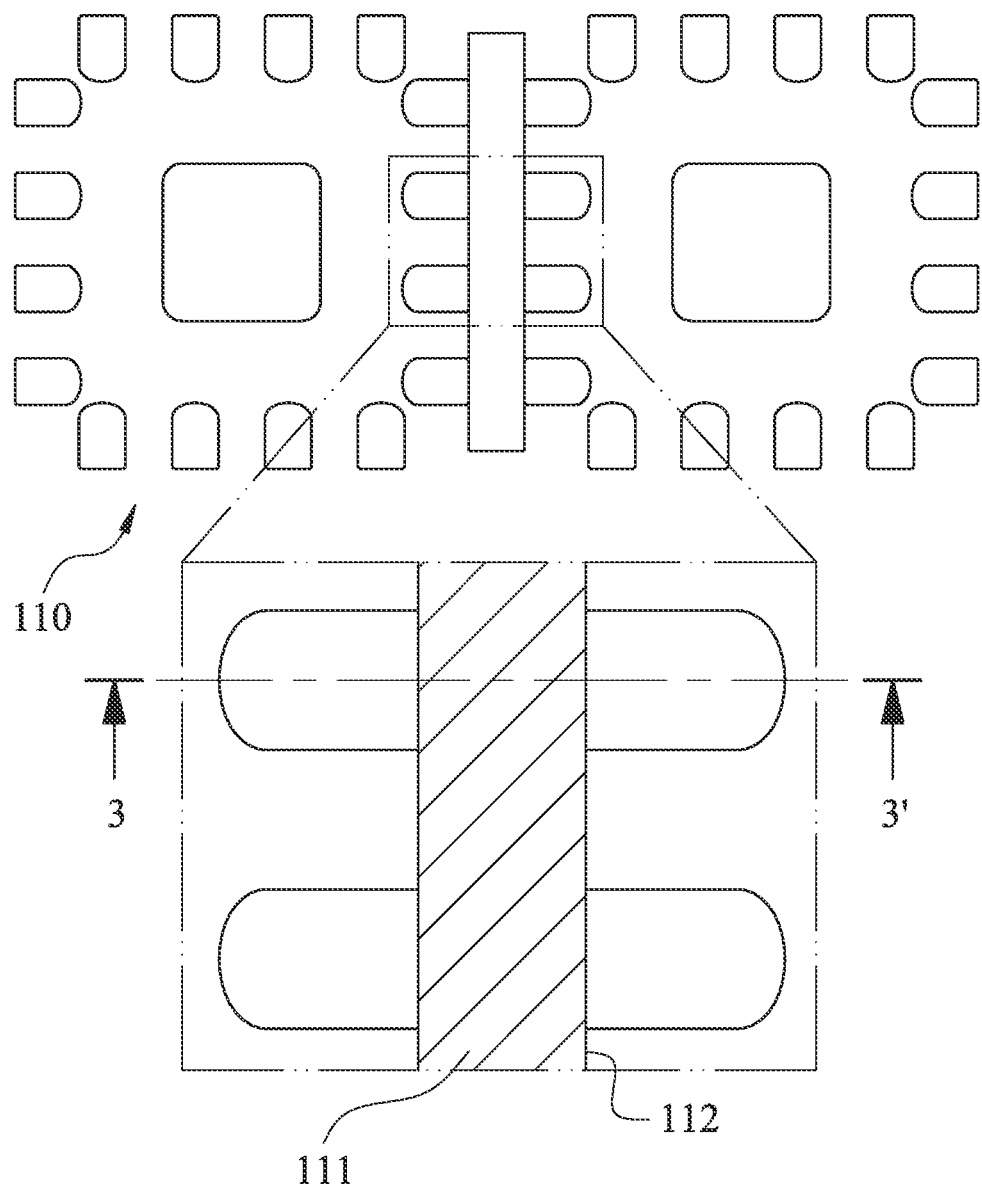
FIG. 2 is a schematic view of the etching step according to the 1st embodiment in FIG. 1.
Figure 3:
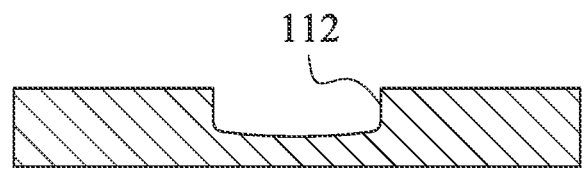
FIG. 3 is a cross-sectional schematic view of the leadframe along a 3-3' line in FIG. 2.

FIG. 2 is a schematic view of the etching step S101 according to the 1st embodiment in FIG. 1. FIG. 3 is a cross-sectional schematic view of the leadframe 110 along a 3-3' line in FIG. 2. In FIGS. 2 and 3, a plurality of cutting streets 111 of the leadframe 110 are etched in the etching step S101. According to the 1st embodiment, a lower surface of each of the cutting streets 111 of the leadframe 110 is etched to form an etching groove 112, and an etching depth can be equal to half of a thickness of the leadframe 110, but is not limited thereto.

Figure 4:
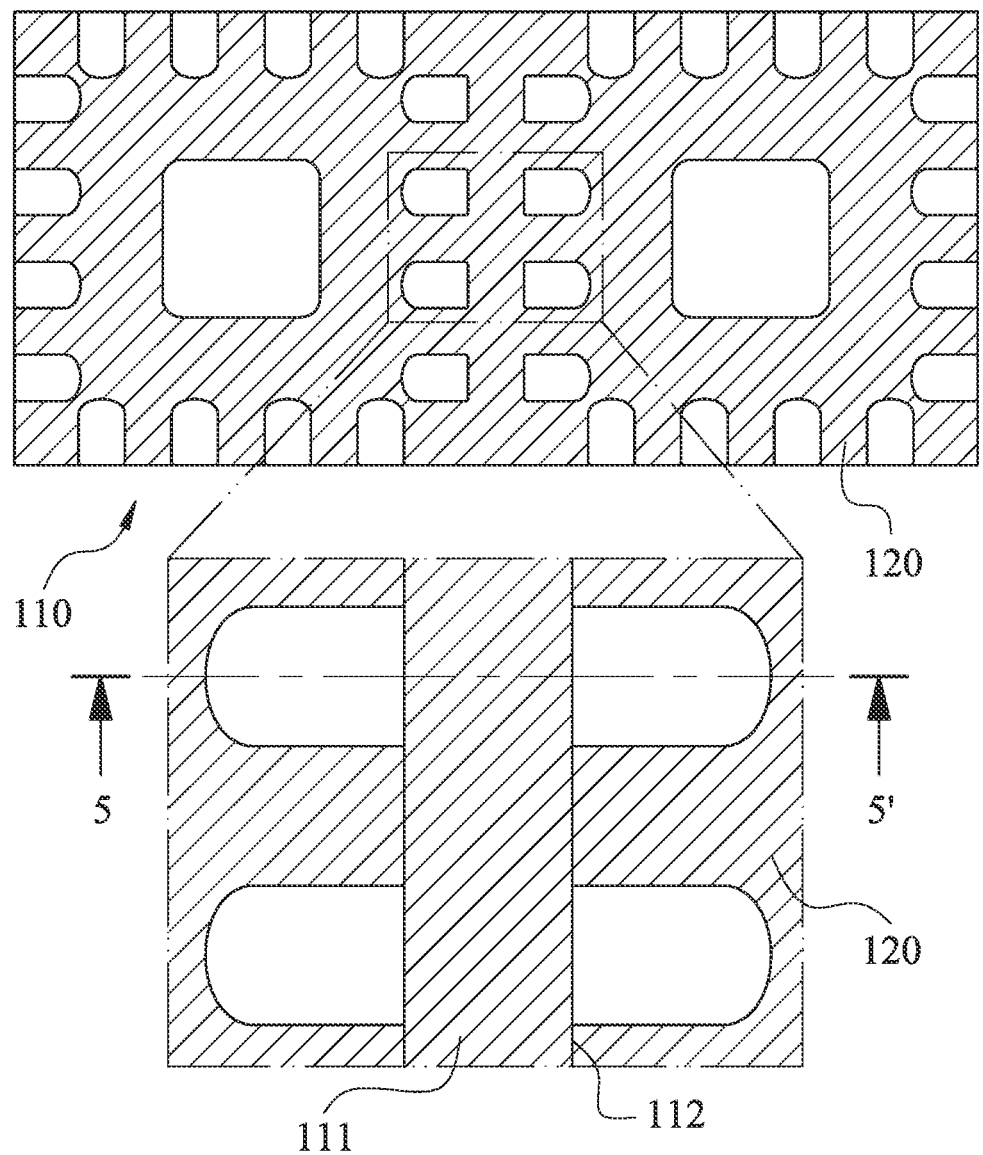
FIG. 4 is a schematic view of the molding step according to the 1st embodiment in FIG. 1.
Figure 5:
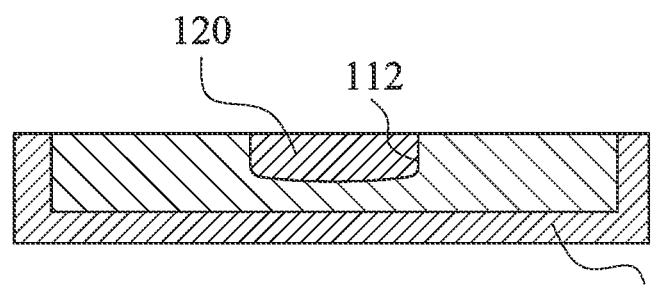
FIG. 5 is a cross-sectional schematic view of the leadframe along a 5-5' line in FIG. 4.

FIG. 4 is a schematic view of the molding step S102 according to the 1st embodiment in FIG. 1. FIG. 5 is a cross-sectional schematic view of the leadframe 110 along a 5-5' line in FIG. 4. In FIGS. 4 and 5, a plastic package material 120 covers on the leadframe 110 before the laser step.

Figure 6:
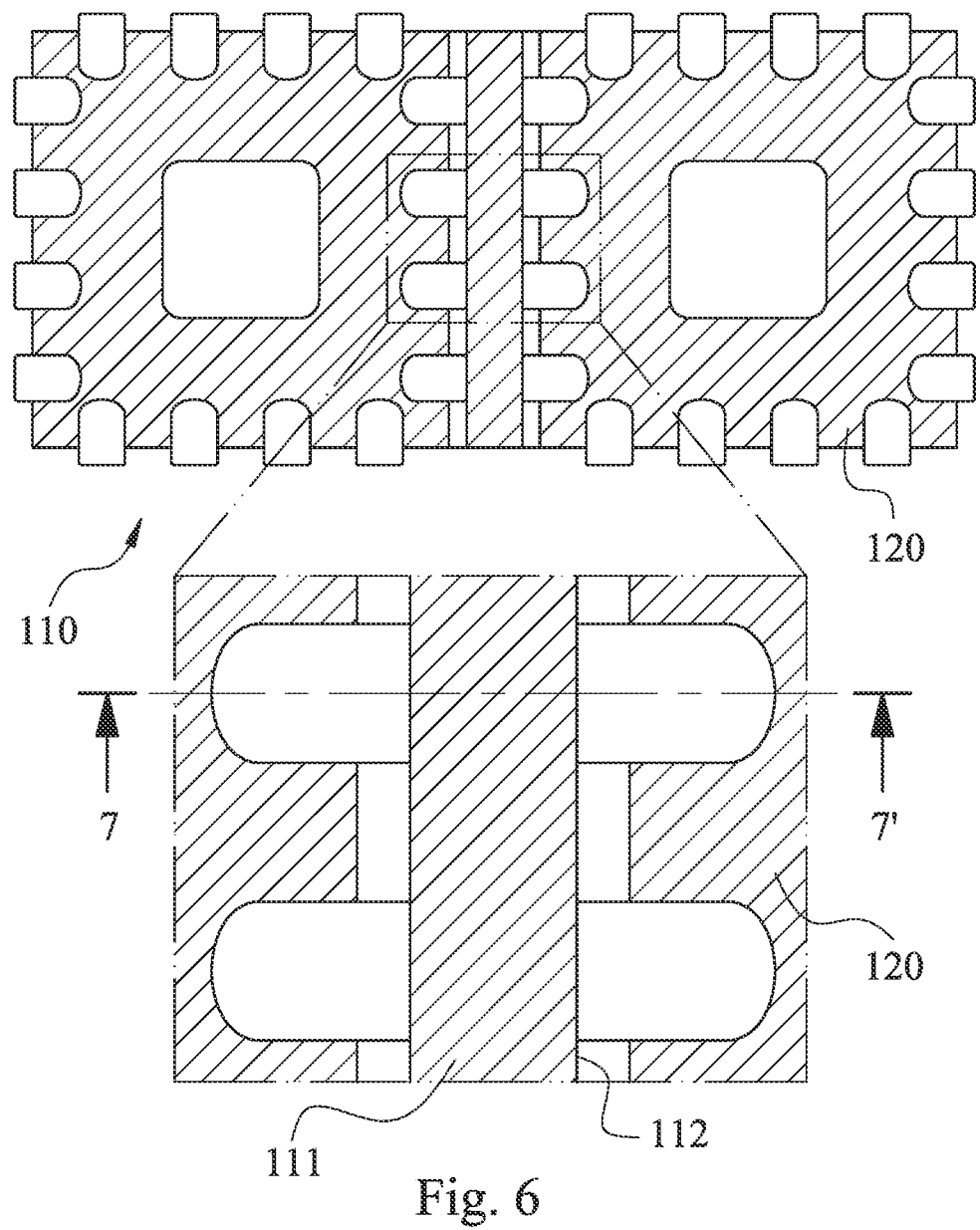
FIG. 6 is a schematic view of the first laser step according to the 1st embodiment in FIG. 1.
Figure 7:
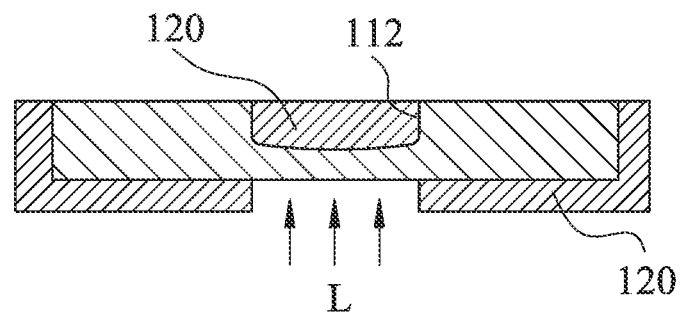
FIG. 7 is a cross-sectional schematic view of the leadframe along a 7-7' line in FIG. 6.

FIG. 6 is a schematic view of the first laser step S103 according to the 1st embodiment in FIG. 1. FIG. 7 is a cross-sectional schematic view of the leadframe 110 along a 7-7' line in FIG. 6. In FIGS. 6 and 7, the plastic package material 120 covering on each of the cutting streets 111 is removed via a laser beam L in the laser step. In particular, according to the 1st embodiment, the plastic package material 120 covering on an upper surface of each of the cutting streets 111 is removed via the laser beam L in the first laser step S103, and the plastic package material 120 is only partially removed. It should be mentioned that the upper surface of each of the cutting streets 111 is irradiated via the laser beam L to remove the plastic package material 120, and the plastic package material 120 disposed in each of the etching grooves 112 is not irradiated via the laser beam L. Hence, the plastic package material 120 disposed in each of the etching grooves 112 is remained thereof.

Figure 8:
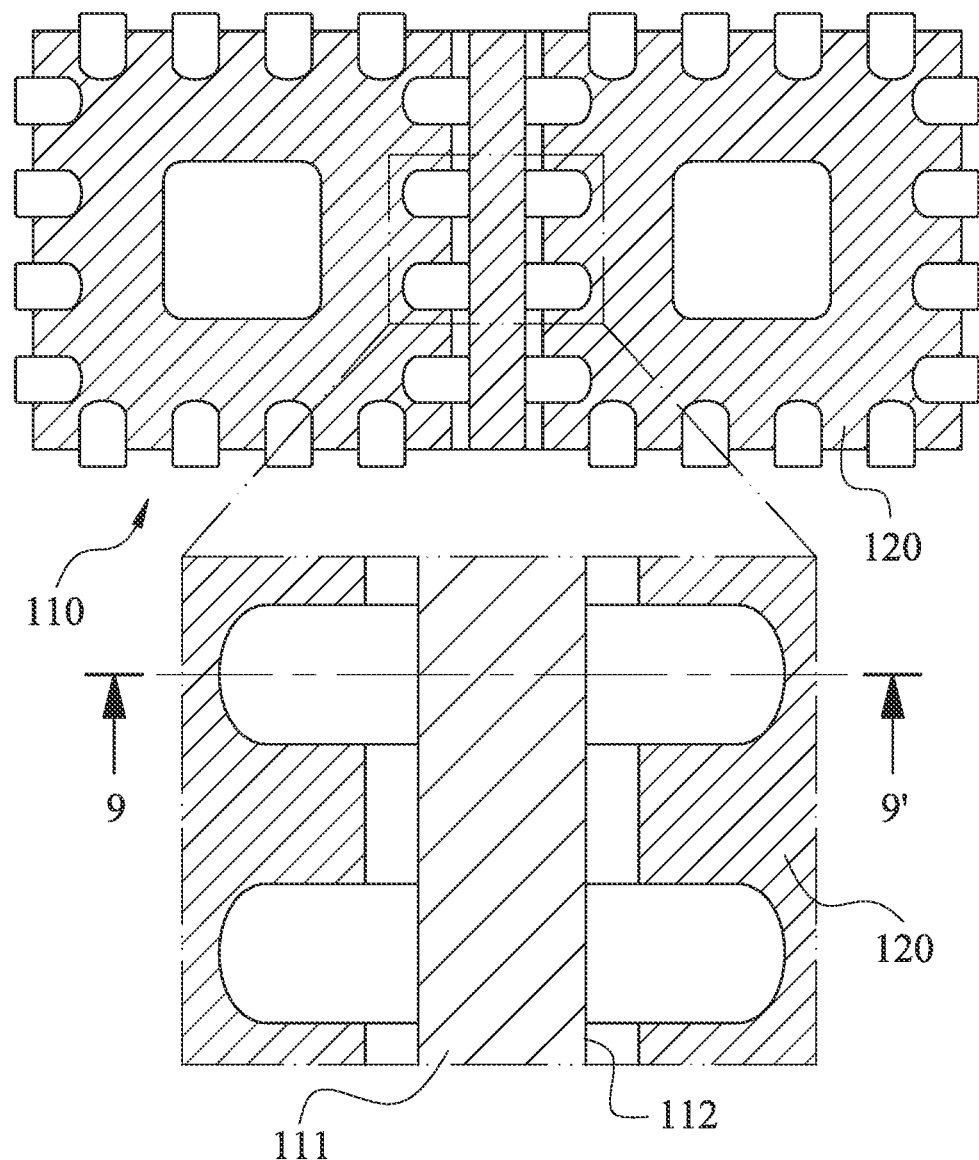
FIG. 8 is a schematic view of the second laser step according to the 1st embodiment in FIG. 1.
Figure 9:
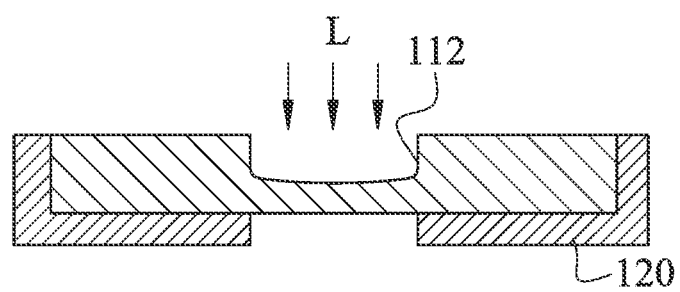
FIG. 9 is a cross-sectional schematic view of the leadframe along a 9-9' line in FIG. 8.

FIG. 8 is a schematic view of the second laser step S104 according to the 1st embodiment in FIG. 1. FIG. 9 is a cross-sectional schematic view of the leadframe 110 along a 9-9' line in FIG. 8. In FIGS. 8 and 9, the plastic package material 120 covering on a lower surface of each of the cutting streets 111 is removed via the laser beam L in the second laser step S104, and the plastic package material 120 is only partially removed.

Table 1 shows parameters of the laser beam L in the first laser step S103 and the second laser step S104 according to the 1st embodiment, but the present disclosure is not limited to the parameters in Table 1.

TABLE 1

| | |
|---|---|
| Laser type | diode end-pumped Nd: YVO$_4$ |
| Output power | 10 W-40 W |
| Wavelength | 355 nm, 532 nm, 1064 nm |
| Pulse frequency | 60 kHz-200 kHz, and CW (continuous-wave) |

Furthermore, the removing targets (for example, a portion of the plastic package material 120) and the depth thereof can be chosen via the first laser step S103 and the second laser step S104. Therefore, the removing range can be effectively controlled. In particular, both of the first laser step S103 and the second laser step S104 can be made up of one or multiple laser beams L, and it depends on the energy and the parameters of the laser beam L. For example, a roughing treatment can be firstly performed via the laser beam L with smaller wavelength (such as 355 nm) to quickly remove the portion of the plastic package material 120, and then a fine treatment is performed via the laser beam L with lager wavelength (such as 532 nm or 1064 nm) to precisely remove the portion of the plastic package material 120, but is not limited thereto.

Figure 10:
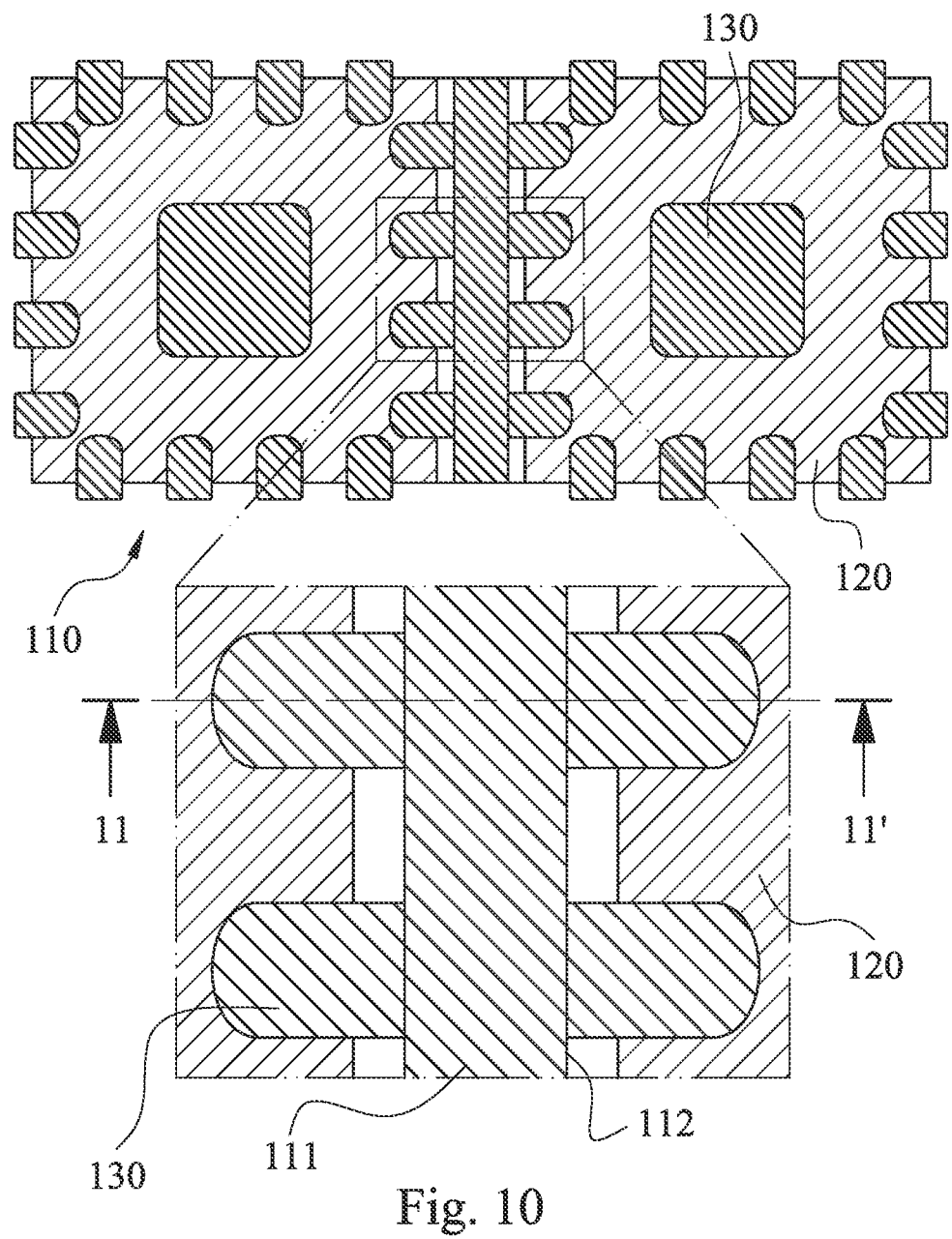
FIG. 10 is a schematic view of the plating step according to the 1st embodiment in FIG. 1.
Figure 11:
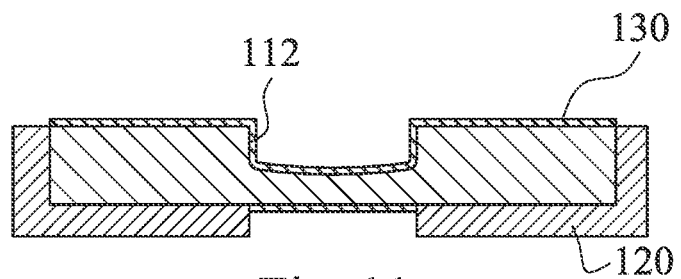
FIG. 11 is a cross-sectional schematic view of the leadframe along an 11-11' line in FIG. 10.

FIG. 10 is a schematic view of the plating step S105 according to the 1st embodiment in FIG. 1. FIG. 11 is a cross-sectional schematic view of the leadframe 110 along an 11-11' line in FIG. 10. In FIGS. 10 and 11, a plurality of plating surfaces 130 are disposed on a plurality of areas of the leadframe 110 without the plastic package material 120.

Figure 12:
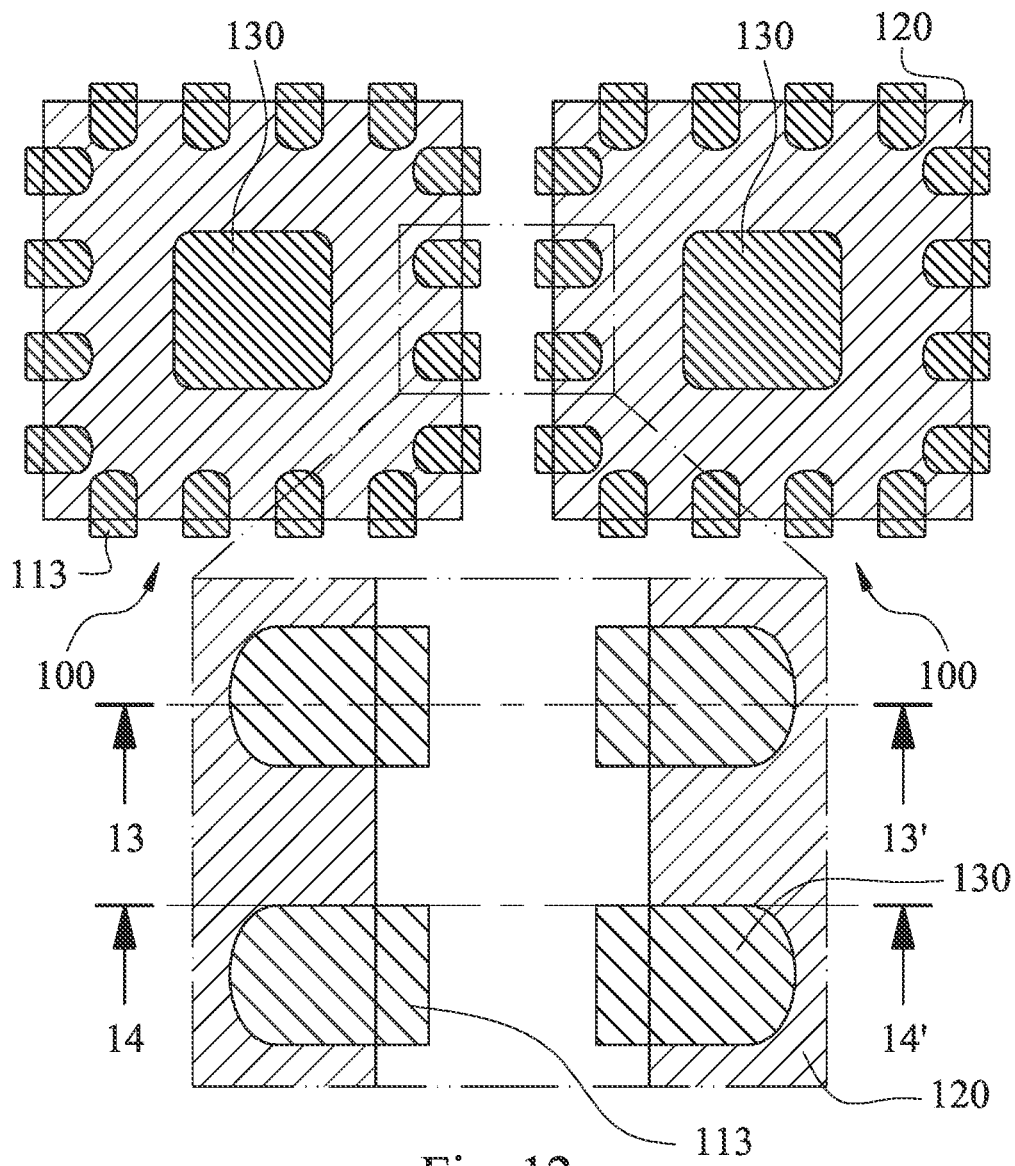
FIG. 12 is a schematic view of the singulation step according to the 1st embodiment in FIG. 1.
Figure 13:
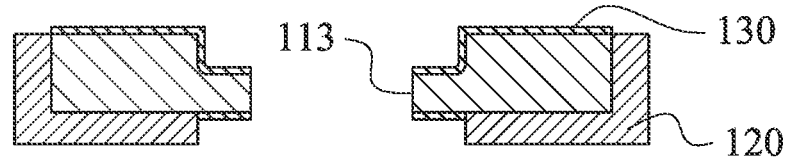
FIG. 13 is a cross-sectional schematic view of the package structure along a 13-13' line in FIG. 12.
Figure 14:
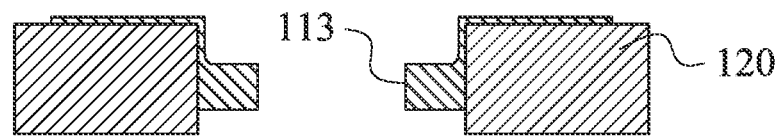
FIG. 14 is a cross-sectional schematic view of the package structure along a 14-14' line in FIG. 12.

FIG. 12 is a schematic view of the singulation step S106 according to the 1st embodiment in FIG. 1. FIG. 13 is a cross-sectional schematic view of the package structure 100 along a 13-13' line in FIG. 12. FIG. 14 is a cross-sectional schematic view of the package structure 100 along a 14-14' line in FIG. 12. In FIGS. 12 to 14, the cutting streets 111 of the leadframe 110 are cut to form the package structure 100 in the singulation step S106. In detail, the cutting streets 111 of the leadframe 110 are cut via a blade, and a cutting width of the blade is smaller than an etching width (that is, a width of each of the etching grooves 112) provided in the etching step S101. Hence, step-shaped leads 113 are formed, and the plating surfaces 130 are disposed on outer surfaces of each of the step-shaped leads 113. Furthermore, a thickness of each of the cutting streets 111 is thinner in the etching step S101, so the burr can be reduced in the singulation step S106.

Figure 15:
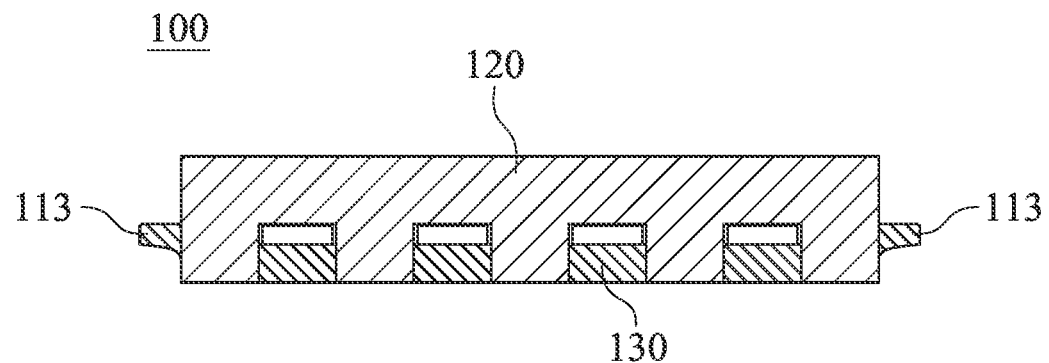
FIG. 15 is a side view of the package structure according to the 1st embodiment in FIG. 1.
Figure 16:
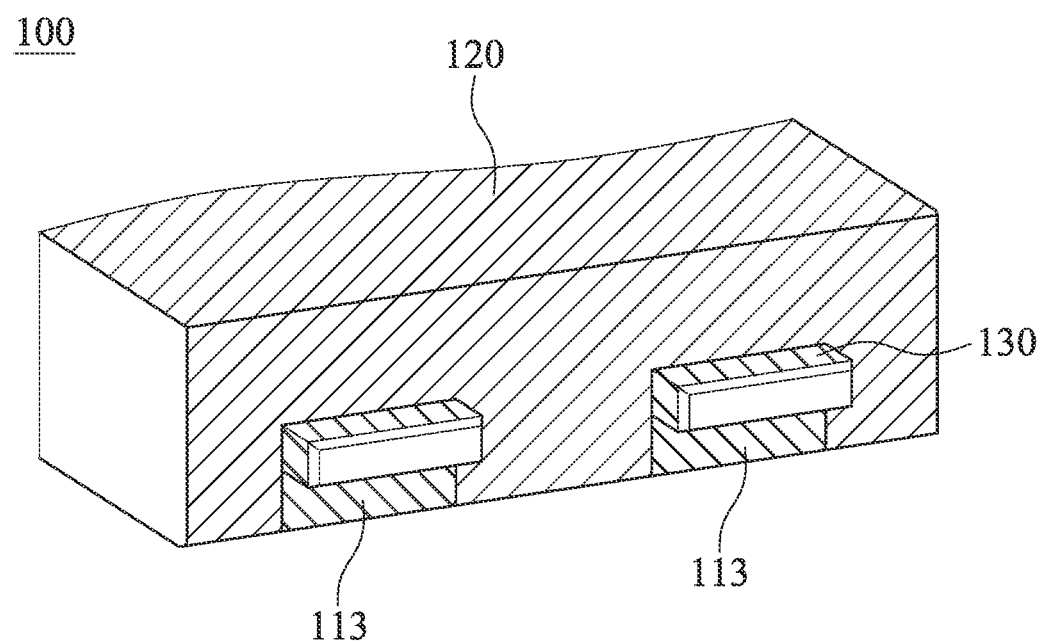
FIG. 16 is a partial schematic view of the package structure according to the 1st embodiment in FIG. 1.

FIG. 15 is a side view of the package structure 100 according to the 1st embodiment in FIG. 1. FIG. 16 is a partial schematic view of the package structure 100 according to the 1st embodiment in FIG. 1. In FIGS. 15 and 16, the package structure 100 includes the step-shaped leads 113, the step-shaped leads 113 protrude an edge of the plastic package material 120, each of the step-shaped leads 113 includes five plating surfaces 130, and each of the step-shaped leads 113 close to a lower surface of the package structure 100 does not protrude and is aligned to the edge of the plastic package material 120.

Hence, according to the 1st embodiment, by the method of forming the package structure S100, the solderable area of each of the sides of the package structure 100 can be increased, and the package outline drawing (POD) does not need to be changed to reduce the process of redrawing the POD. Therefore, the connection strength between the step-shaped leads 113 and the circuit board can be enhanced to maintain and increase the lifetime of the package structure 100 disposed on the circuit board, and the reliability of the board level can be further enhanced.

Figure 17:
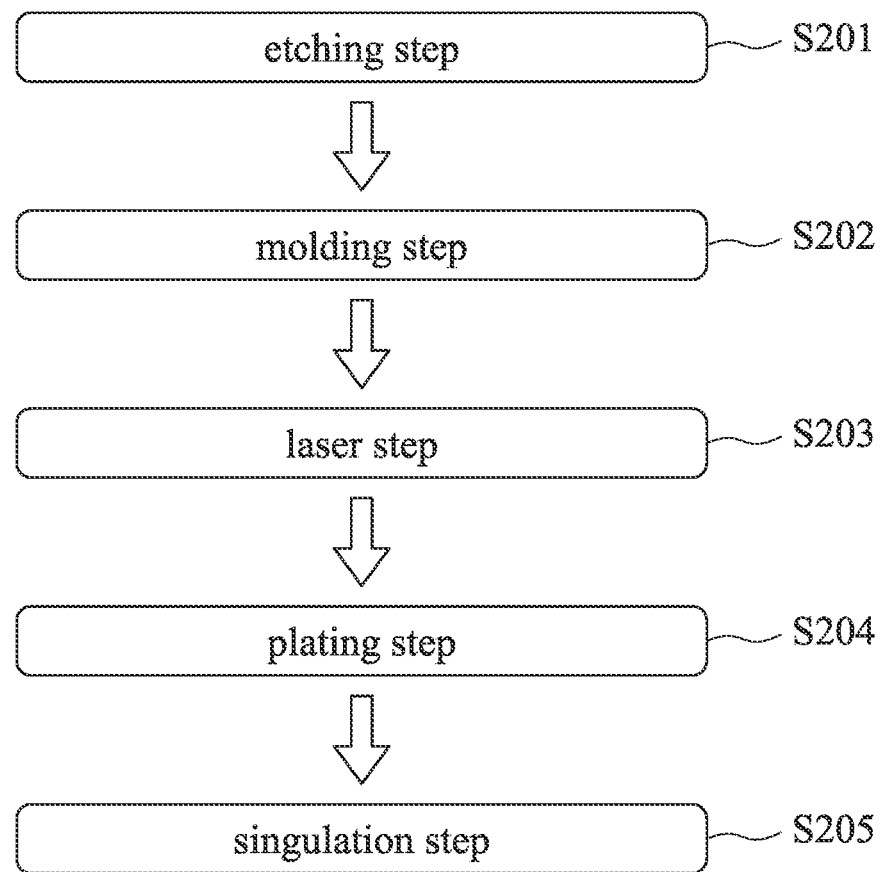
FIG. 17 is a step flow chart of a method of forming a package structure according to the 2nd embodiment of the present disclosure.

FIG. 17 is a step flow chart of a method of forming a package structure S200 according to the 2nd embodiment of the present disclosure. In FIG. 17, the method of forming the package structure S200 includes an etching step S201, a molding step S202, a laser step S203, a plating step S204 and a singulation step S205.

Figure 18:
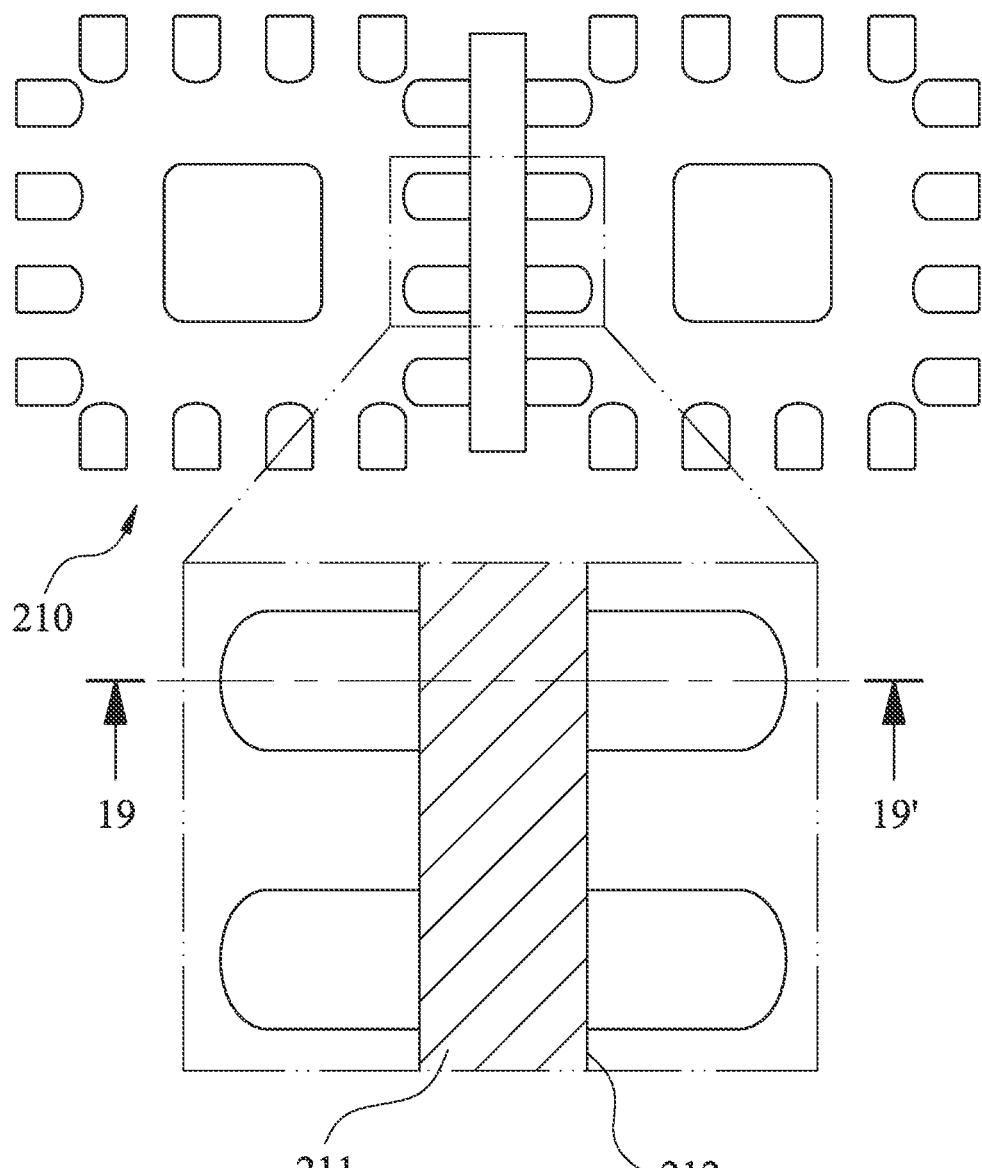
FIG. 18 is a schematic view of the etching step according to the 2nd embodiment in FIG. 17.
Figure 19:
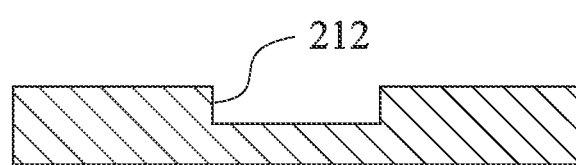
FIG. 19 is a cross-sectional schematic view of the leadframe along a 19-19' line in FIG. 18.

FIG. 18 is a schematic view of the etching step S201 according to the 2nd embodiment in FIG. 17. FIG. 19 is a cross-sectional schematic view of the leadframe 210 along a 19-19' line in FIG. 18. In FIGS. 18 and 19, a plurality of cutting streets 211 of the leadframe 210 are etched in the etching step S201. According to the 2nd embodiment, a lower surface of each of the cutting streets 211 of the leadframe 210 is etched to form an etching groove 212, and an etching depth can be equal to half of a thickness of the leadframe 210, but is not limited thereto.

Figure 20:
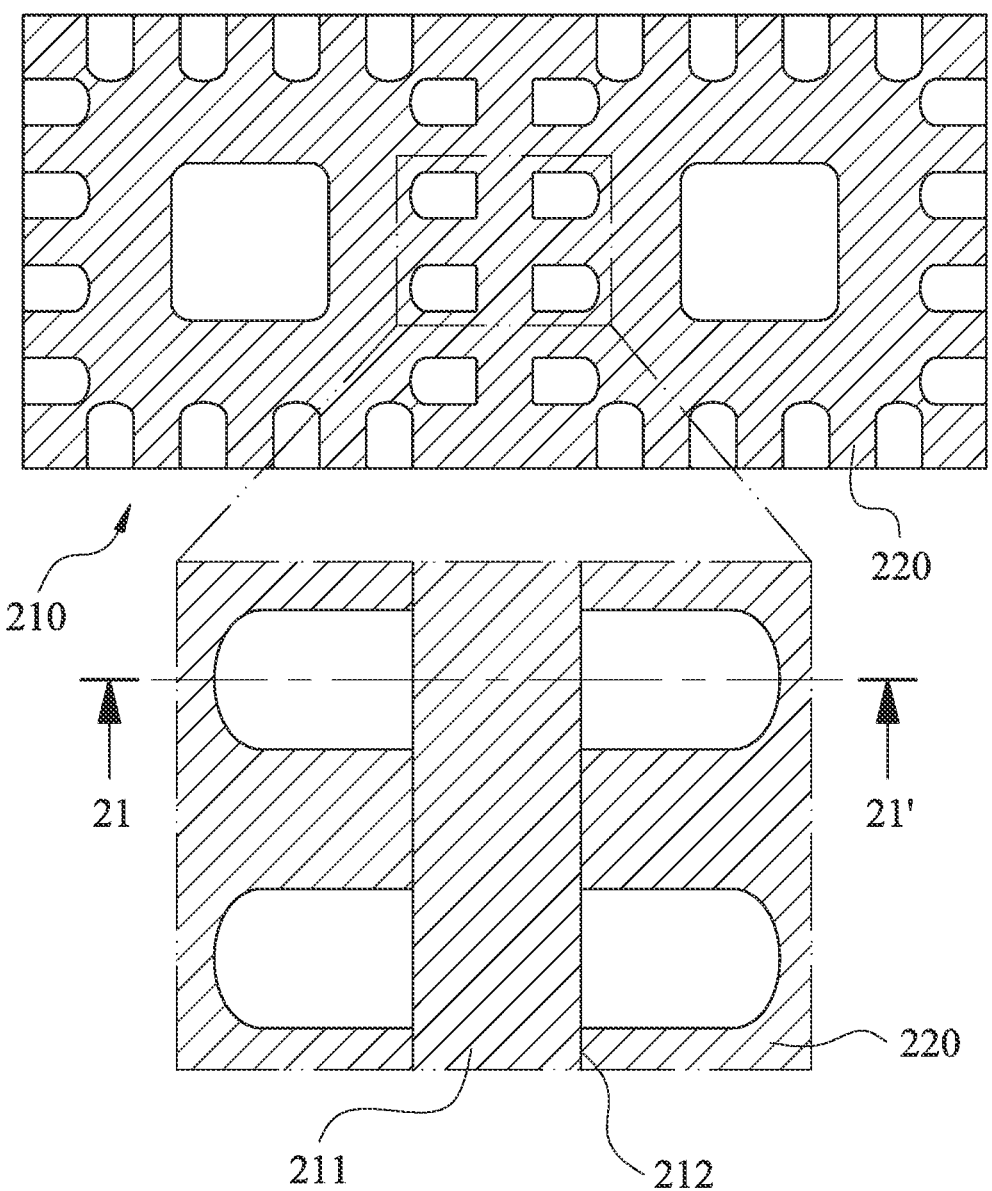
FIG. 20 is a schematic view of the molding step according to the 2nd embodiment in FIG. 17.
Figure 21:
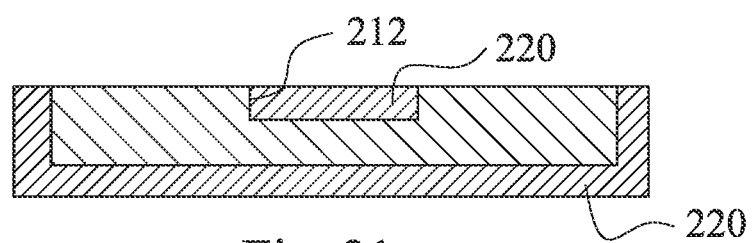
FIG. 21 is a cross-sectional schematic view of the leadframe along a 21-21' line in FIG. 20.

FIG. 20 is a schematic view of the molding step S202 according to the 2nd embodiment in FIG. 17. FIG. 21 is a cross-sectional schematic view of the leadframe 210 along a 21-21' line in FIG. 20. In FIGS. 20 and 21, a plastic package material 220 covers on the leadframe 210 before the laser step S203.

Figure 22:
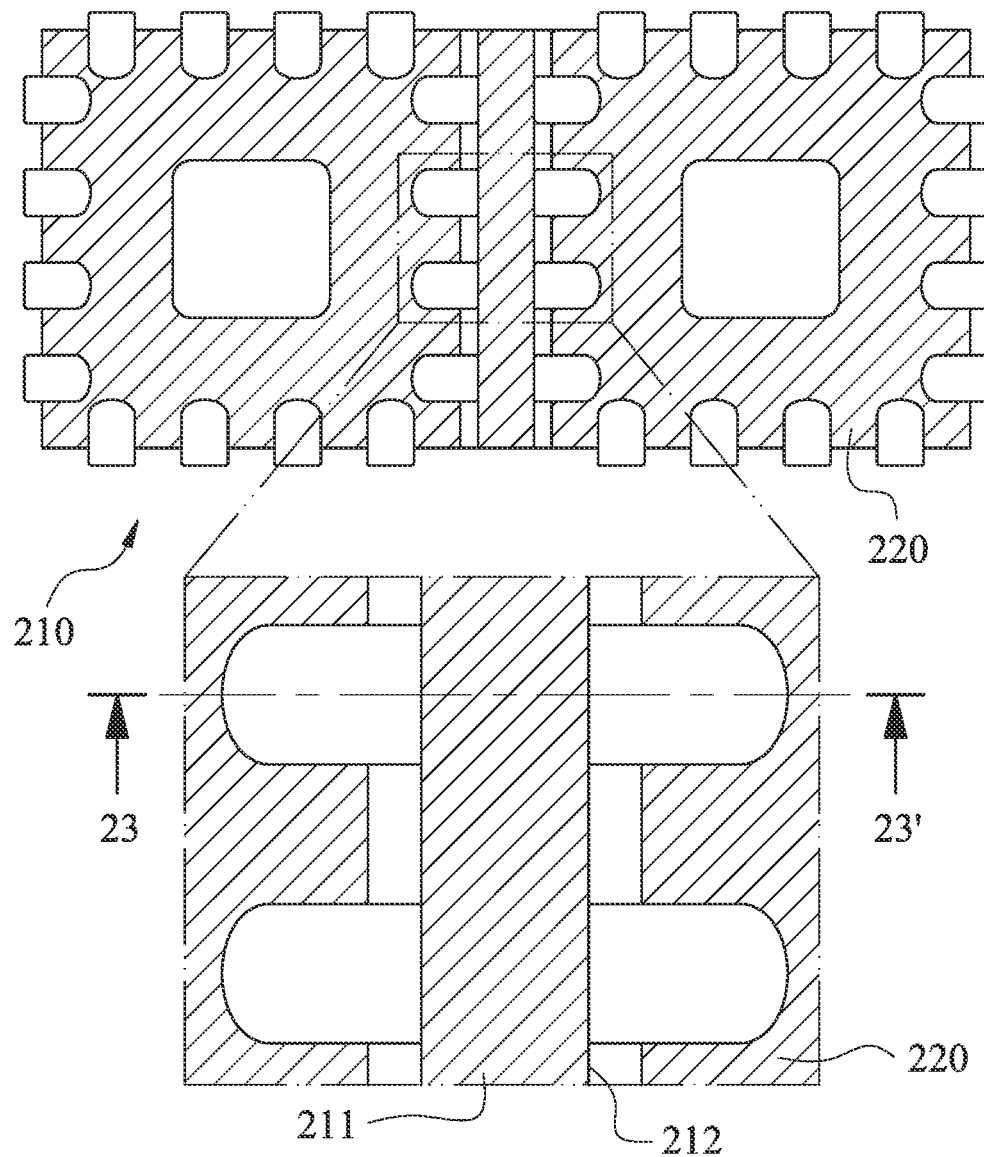
FIG. 22 is a schematic view of the laser step according to the 2nd embodiment in FIG. 17.
Figure 23:
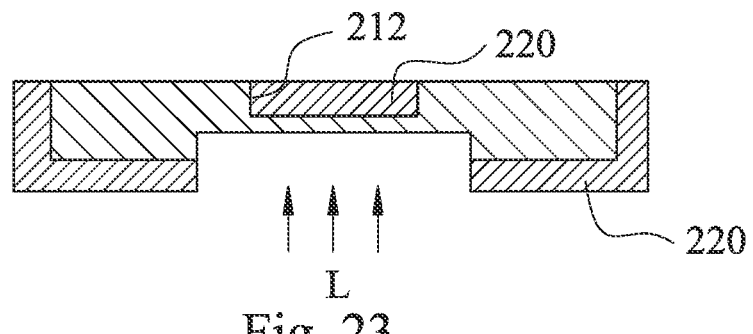
FIG. 23 is a cross-sectional schematic view of the leadframe along a 23-23' line in FIG. 22.

FIG. 22 is a schematic view of the laser step S203 according to the 2nd embodiment in FIG. 17. FIG. 23 is a cross-sectional schematic view of the leadframe 210 along a 23-23' line in FIG. 22. In FIGS. 22 and 23, the plastic package material 220 covering on each of the cutting streets 211 is removed via a laser beam L in the laser step S203. In particular, according to the 2nd embodiment, the plastic package material 220 covering on an upper surface of each of the cutting streets 211 is removed via the laser beam L in the laser step S203, and the plastic package material 220 is only partially removed. It should be mentioned that the upper surface of each of the cutting streets 211 is irradiated via the laser beam L to remove the plastic package material 220, and the plastic package material 220 disposed in each of the etching grooves 212 is not irradiated via the laser beam L. Hence, the plastic package material 220 disposed in each of the etching grooves 212 is remained thereof.

Table 2 shows parameters of the laser beam L in the laser step S203 according to the 2nd embodiment, but the present disclosure is not limited to the parameters in Table 2.

TABLE 2

| | |
|---|---|
| Laser type | diode end-pumped Nd: $YVO_4$ |
| Output power | 10 W-40 W |
| Wavelength | 355 nm, 532 nm, 1064 nm |
| Pulse frequency | 60 kHz-200 kHz, and CW (continuous-wave) |

Furthermore, the removing targets (for example, a portion of the plastic package material 220 and a portion of the leadframe 210) and the depth thereof can be chosen via the laser step S203. In particular, the laser step S203 can be made up of one or multiple laser beams L, and it depends on the energy and the parameters of the laser beam L. Therefore, the removing range can be effectively controlled. For example, a roughing treatment can be firstly performed via the laser beam L with smaller wavelength (such as 355 nm) to quickly remove the portion of the plastic package material 220 and the portion of the leadframe 210, and then a fine treatment is performed via the laser beam L with lager wavelength (such as 532 nm or 1064 nm) to precisely remove the portion of the plastic package material 220 and the portion of the leadframe 210, but is not limited thereto.

Figure 24:
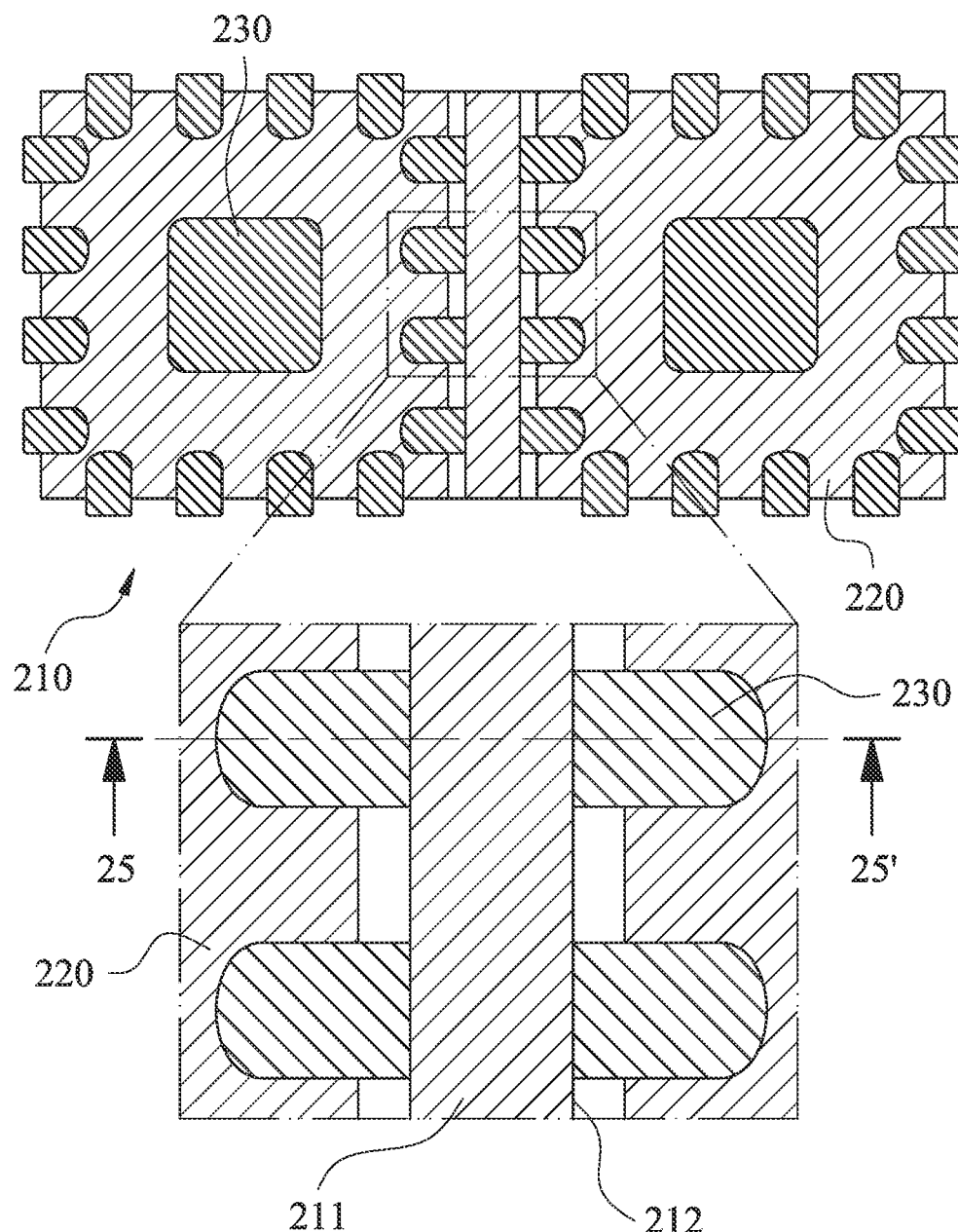
FIG. 24 is a schematic view of the plating step according to the 2nd embodiment in FIG. 17.
Figure 25:
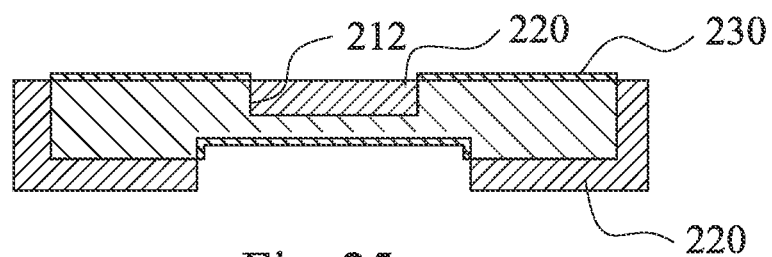
FIG. 25 is a cross-sectional schematic view of the leadframe along a 25-25' line in FIG. 24.

FIG. 24 is a schematic view of the plating step S204 according to the 2nd embodiment in FIG. 17. FIG. 25 is a cross-sectional schematic view of the leadframe 210 along a 25-25' line in FIG. 24. In FIGS. 24 and 25, a plurality of plating surfaces 230 are disposed on a plurality of areas of the leadframe 210 without the plastic package material 220.

Figure 26:
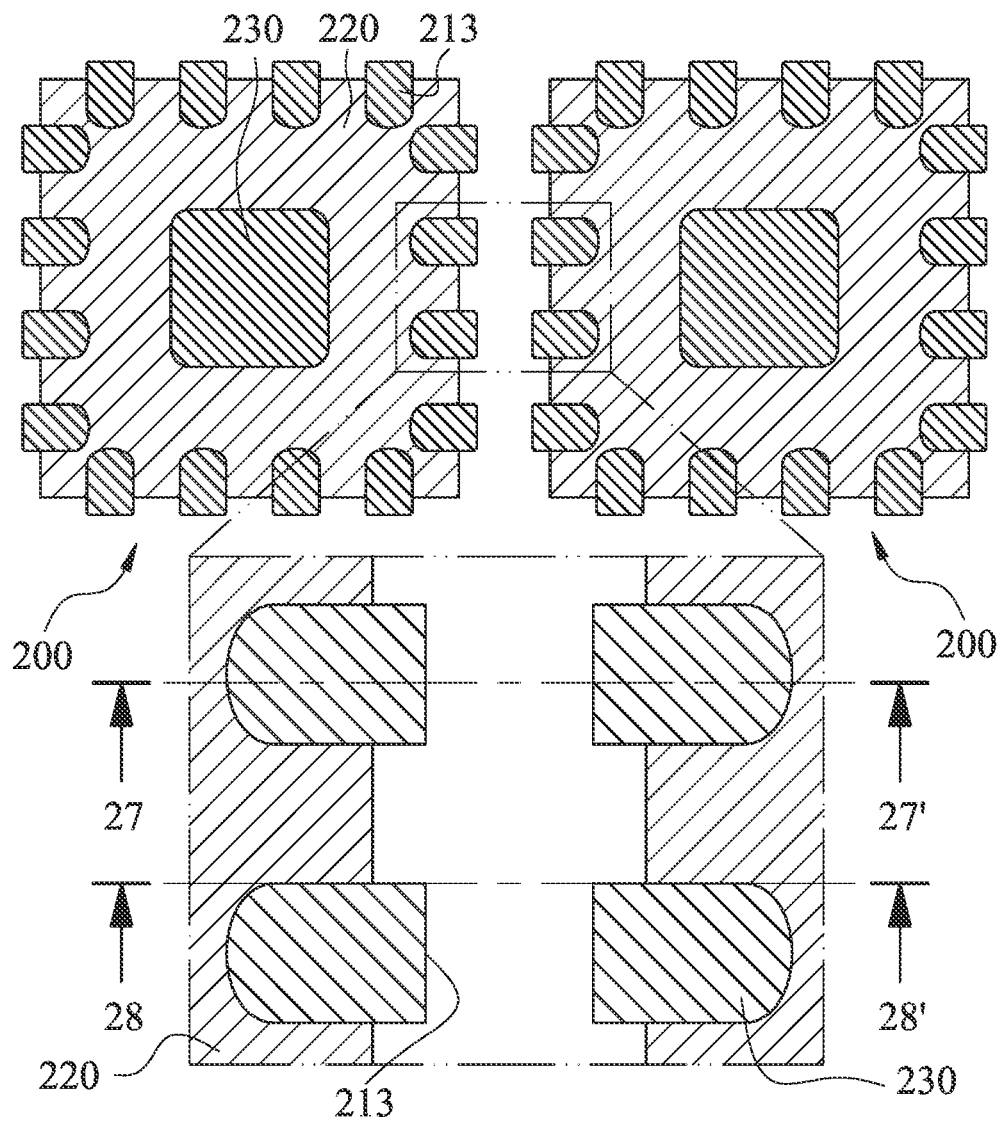
FIG. 26 is a schematic view of the singulation step according to the 2nd embodiment in FIG. 17.
Figure 27:
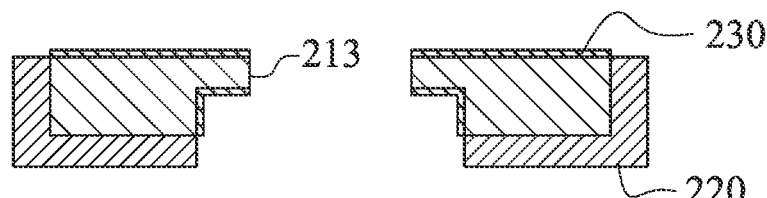
FIG. 27 is a cross-sectional schematic view of the package structure along a 27-27' line in FIG. 26.
Figure 28:
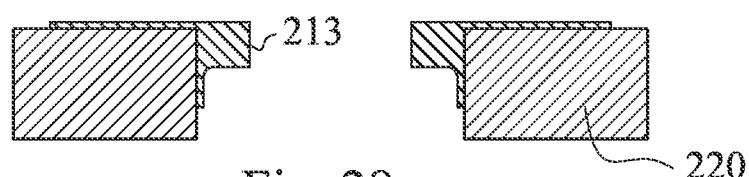
FIG. 28 is a cross-sectional schematic view of the package structure along a 28-28' line in FIG. 26.

FIG. 26 is a schematic view of the singulation step S205 according to the 2nd embodiment in FIG. 17. FIG. 27 is a cross-sectional schematic view of the package structure 200 along a 27-27' line in FIG. 26. FIG. 28 is a cross-sectional schematic view of the package structure 200 along a 28-28' line in FIG. 26. In FIGS. 26 to 28, the cutting streets 211 of the leadframe 210 are cut to form the package structure 200 in the singulation step S205. In detail, the cutting streets 211 of the leadframe 210 are cut via a blade, and a cutting width of the blade is equal to an etching width (that is, a width of each of the etching grooves 212) provided in the etching step S201. Hence, step-shaped leads 213 are formed, and the plating surfaces 230 are disposed on outer surfaces of each of the step-shaped leads 213. Furthermore, a thickness of each of the cutting streets 211 is thinner in the etching step S201, so the burr can be reduced in the singulation step S205.

Figure 29:
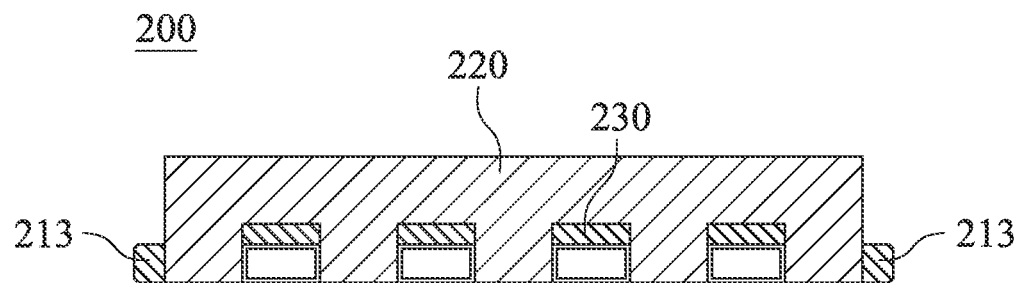
FIG. 29 is a side view of the package structure according to the 2nd embodiment in FIG. 17.
Figure 30:
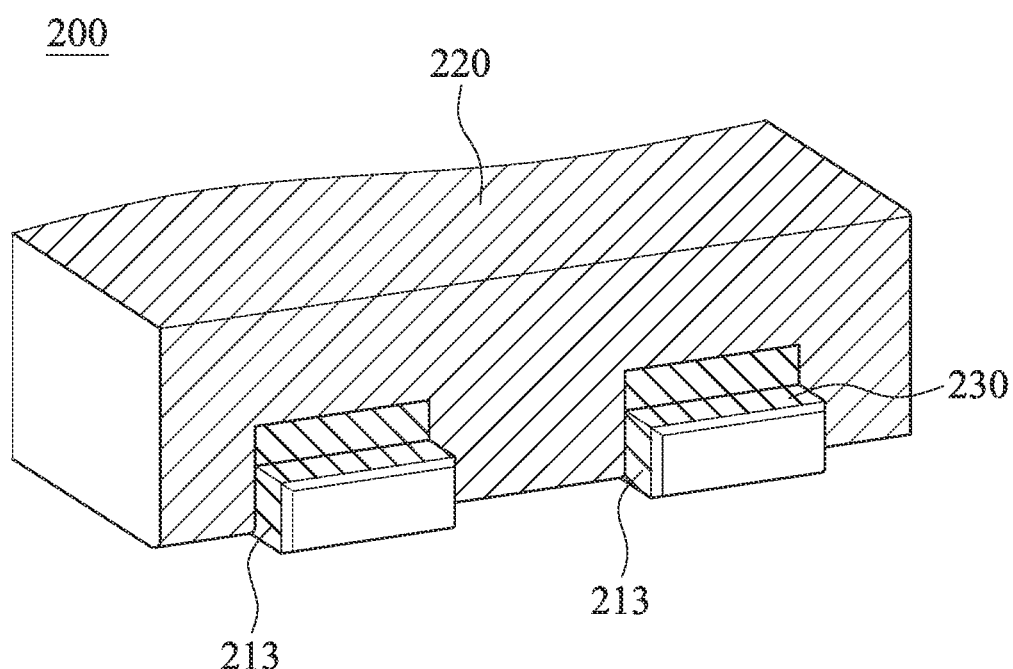
FIG. 30 is a partial schematic view of the package structure according to the 2nd embodiment in FIG. 17.

FIG. 29 is a side view of the package structure 200 according to the 2nd embodiment in FIG. 17. FIG. 30 is a partial schematic view of the package structure 200 according to the 2nd embodiment in FIG. 17. In FIGS. 29 and 30, the package structure 200 includes the step-shaped leads 213, the step-shaped leads 213 protrude an edge of the plastic package material 220, each of the step-shaped leads 213 includes five plating surfaces 230, and each of the step-shaped leads 213 close to a lower surface of the package structure 200 protrudes the edge of the plastic package material 220.

Hence, according to the 2nd embodiment, by the method of forming the package structure S200, the solderable area of each of the sides of the package structure 200 can be increased. Therefore, the connection strength between the step-shaped leads 213 and the circuit board can be enhanced to maintain and increase the lifetime of the package structure 200 disposed on the circuit board, and the reliability of the board level can be further enhanced.

Figure 31:
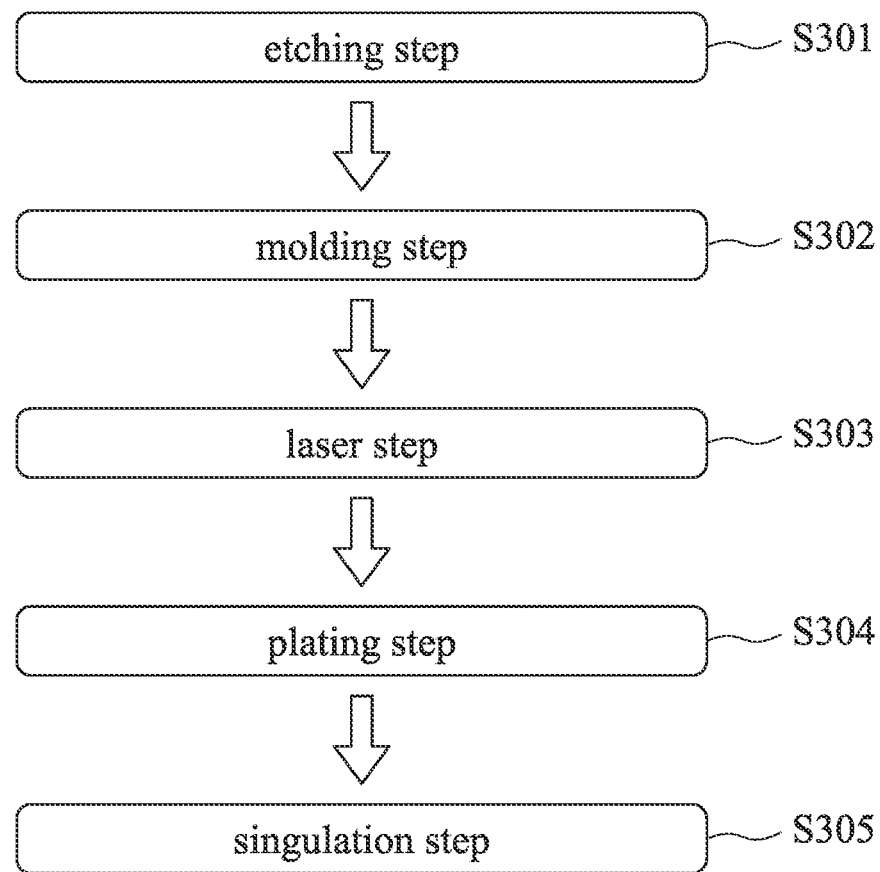
FIG. 31 is a step flow chart of a method of forming a package structure according to the 3rd embodiment of the present disclosure.

FIG. 31 is a step flow chart of a method of forming a package structure S300 according to the 3rd embodiment of the present disclosure. In FIG. 31, the method of forming the package structure S300 includes an etching step S301, a molding step S302, a laser step S303, a plating step S304 and a singulation step S305.

Figure 32:
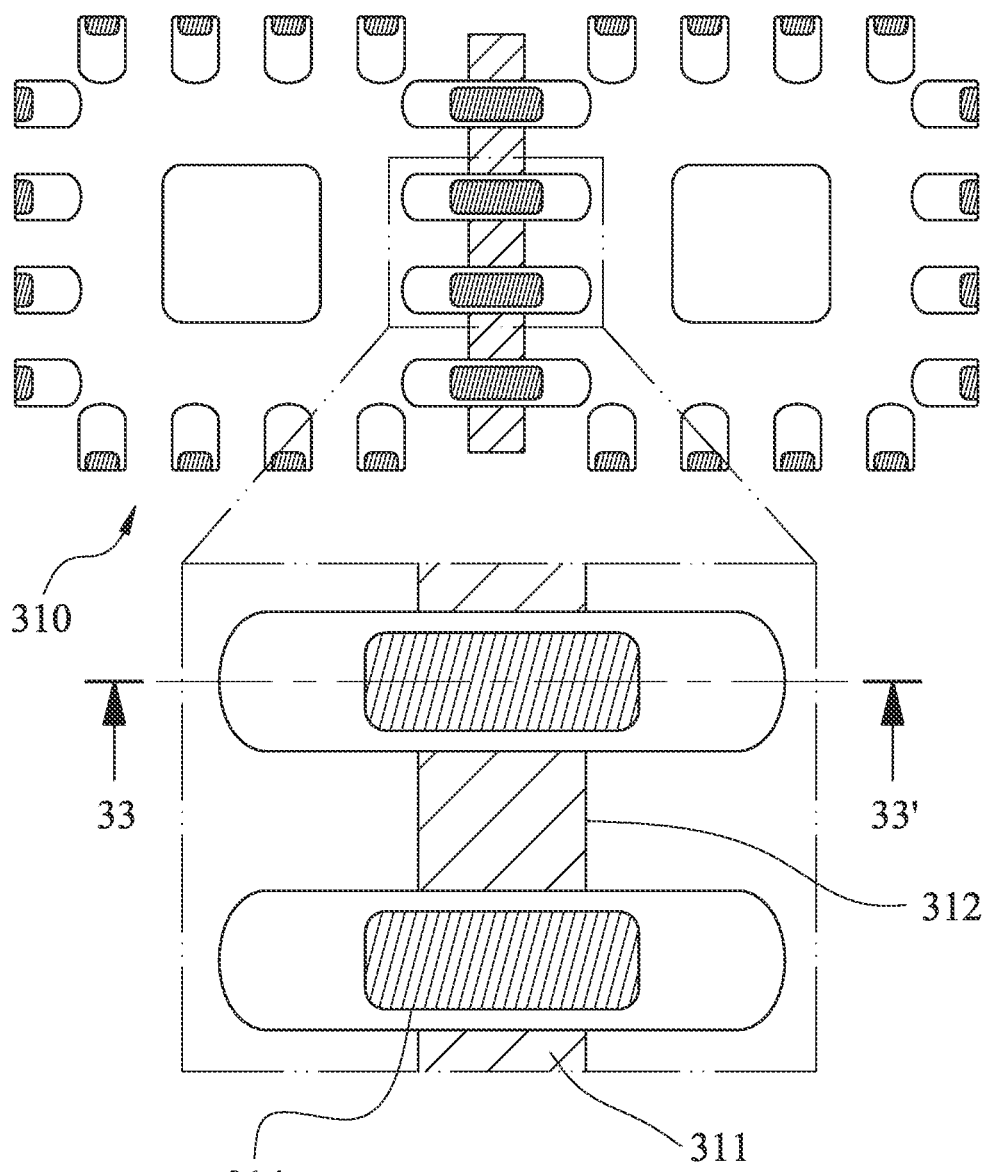
FIG. 32 is a schematic view of the etching step according to the 3rd embodiment in FIG. 31.
Figure 33:
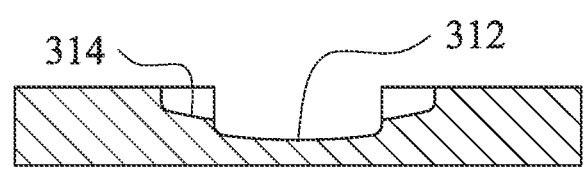
FIG. 33 is a cross-sectional schematic view of the leadframe along a 33-33' line in FIG. 32.

FIG. 32 is a schematic view of the etching step S301 according to the 3rd embodiment in FIG. 31. FIG. 33 is a cross-sectional schematic view of the leadframe 310 along a 33-33' line in FIG. 32. In FIGS. 32 and 33, a plurality of cutting streets 311 of the leadframe 310 are etched in the etching step S301. According to the 3rd embodiment, a lower surface of each of the cutting streets 311 of the leadframe 310 is etched to form an etching groove 312, and an etching depth can be smaller than half of a thickness of the leadframe 310, but is not limited thereto. Further, each of the cutting streets 311 can have a plurality of concave portions 314, a concave depth of each of the concave portions 314 can be equal to half of the thickness of the leadframe 310, a width of each of the concave portions 314 can be larger than a width of each of the etching grooves 312, and each of the concave portions 314 is located on a center of each of the cutting streets 311.

Figure 34:
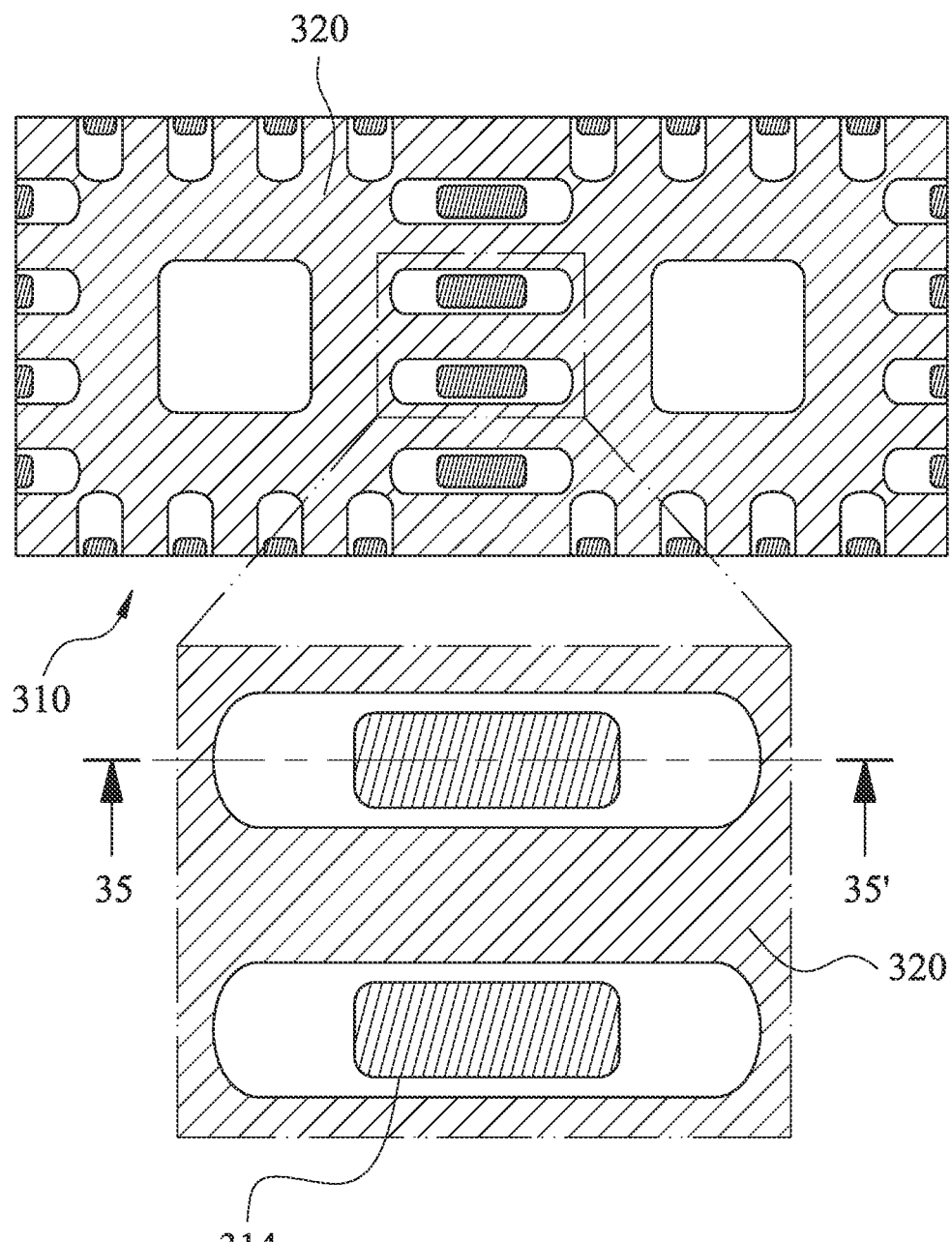
FIG. 34 is a schematic view of the molding step according to the 3rd embodiment in FIG. 31.
Figure 35:
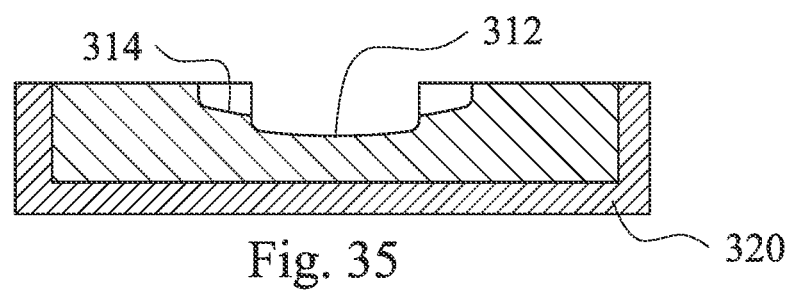
FIG. 35 is a cross-sectional schematic view of the leadframe along a 35-35' line in FIG. 34.

FIG. 34 is a schematic view of the molding step S302 according to the 3rd embodiment in FIG. 31. FIG. 35 is a cross-sectional schematic view of the leadframe 310 along a 35-35' line in FIG. 34. In FIGS. 34 and 35, a plastic package material 320 covers on the leadframe 310 before the laser step S303. It should be mentioned that the plastic package material 320 is not disposed in the concave portions 314.

Figure 36:
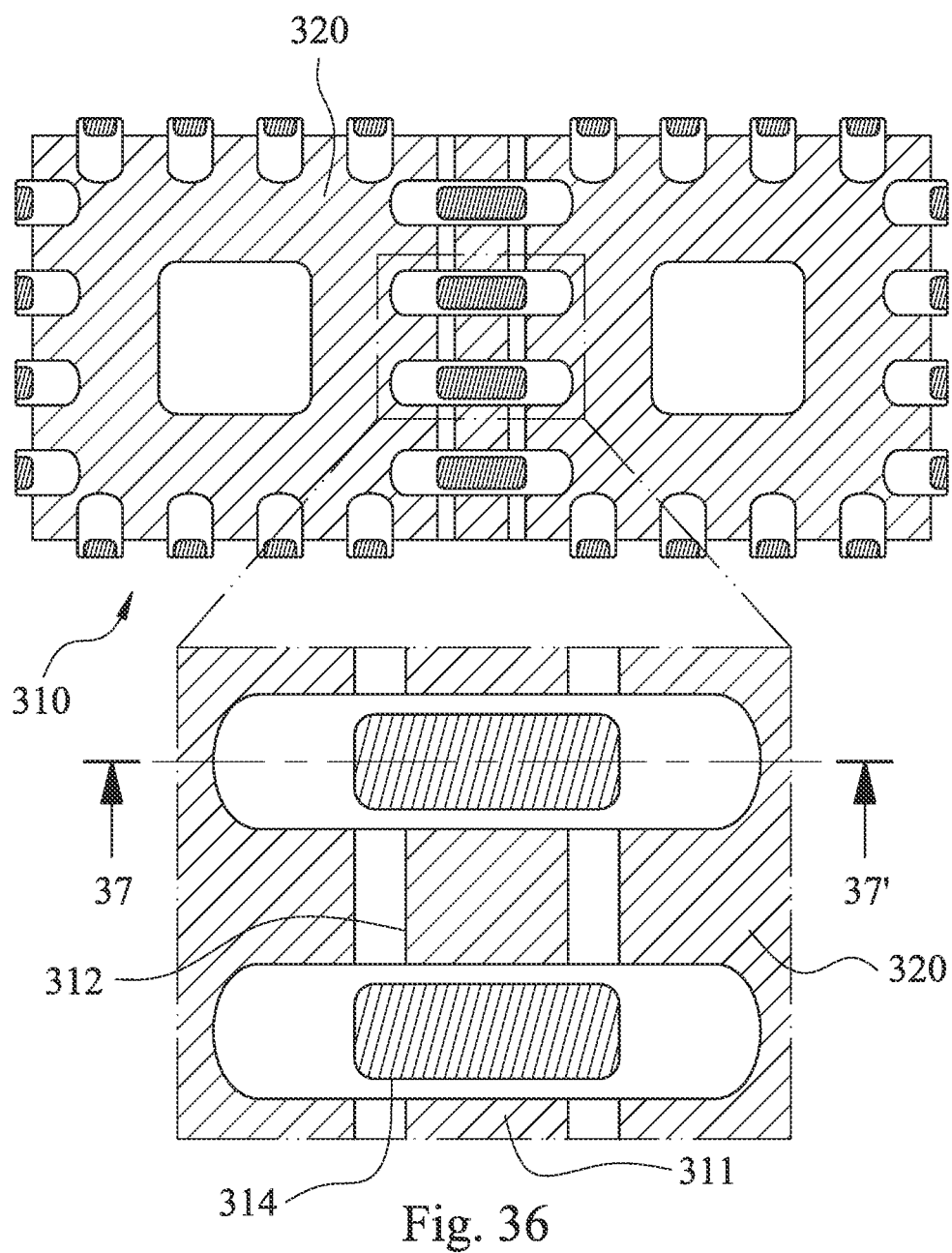
FIG. 36 is a schematic view of the laser step according to the 3rd embodiment in FIG. 31.
Figure 37:
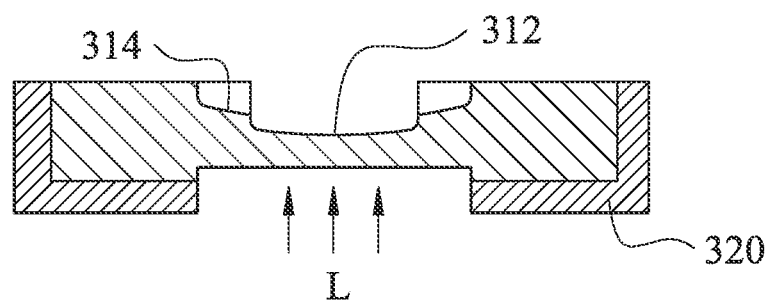
FIG. 37 is a cross-sectional schematic view of the leadframe along a 37-37' line in FIG. 36.

FIG. 36 is a schematic view of the laser step S303 according to the 3rd embodiment in FIG. 31. FIG. 37 is a cross-sectional schematic view of the leadframe 310 along a 37-37' line in FIG. 36. In FIGS. 36 and 37, the plastic package material 320 covering on each of the cutting streets 311 is removed via a laser beam L in the laser step S303. In particular, according to the 3rd embodiment, the plastic package material 320 covering on an upper surface of each of the cutting streets 311 is removed via the laser beam L in the laser step S303, and a portion of the upper surface of each of the cutting streets 311 of the leadframe 310 is removed via the laser beam L, wherein the plastic package material 320 is only partially removed.

Table 3 shows parameters of the laser beam L in the laser step S303 according to the 3rd embodiment, but the present disclosure is not limited to the parameters in Table 3.

TABLE 3

| Laser type | diode end-pumped Nd: YVO$_4$ |
|---|---|
| Output power | 10 W-40 W |
| Wavelength | 355 nm, 532 nm, 1064 nm |
| Pulse frequency | 60 kHz-200 kHz, and CW (continuous-wave) |

Furthermore, the removing targets (for example, a portion of the plastic package material 320 and a portion of the leadframe 310) and the depth thereof can be chosen via the laser step S303. In particular, the laser step S303 can be made up of one or multiple laser beams L, and it depends on the energy and the parameters of the laser beam L. Therefore, the removing range can be effectively controlled. For example, a roughing treatment can be firstly performed via the laser beam L with smaller wavelength (such as 355 nm) to quickly remove the portion of the plastic package material 320 and the portion of the leadframe 310, and then a fine treatment is performed via the laser beam L with lager wavelength (such as 532 nm or 1064 nm) to precisely remove the portion of the plastic package material 320 and the portion of the leadframe 310, but is not limited thereto.

Figure 38:
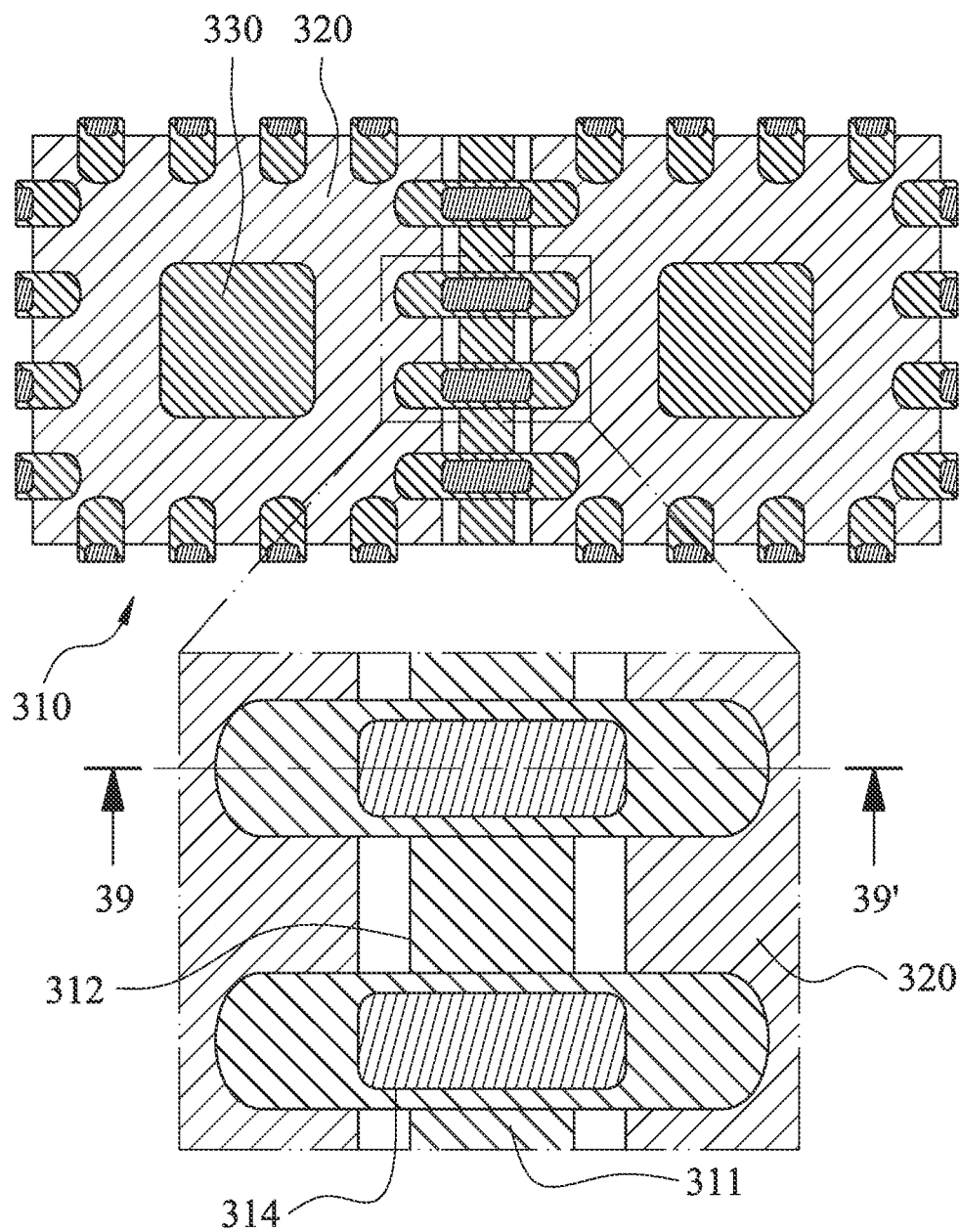
FIG. 38 is a schematic view of the plating step according to the 3rd embodiment in FIG. 31.
Figure 39:
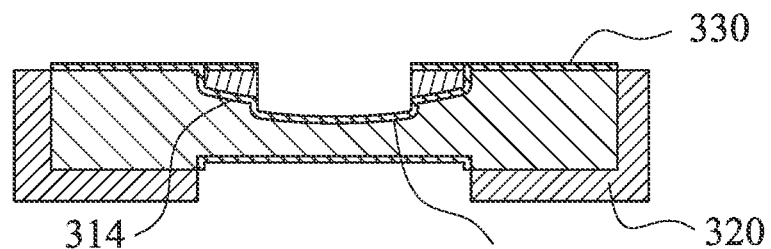
FIG. 39 is a cross-sectional schematic view of the leadframe along a 39-39' line in FIG. 38.

FIG. 38 is a schematic view of the plating step S304 according to the 3rd embodiment in FIG. 31. FIG. 39 is a cross-sectional schematic view of the leadframe 310 along a 39-39' line in FIG. 38. In FIGS. 38 and 39, a plurality of plating surfaces 330 are disposed on a plurality of areas of the leadframe 310 without the plastic package material 320.

Figures 40, 41, 42:
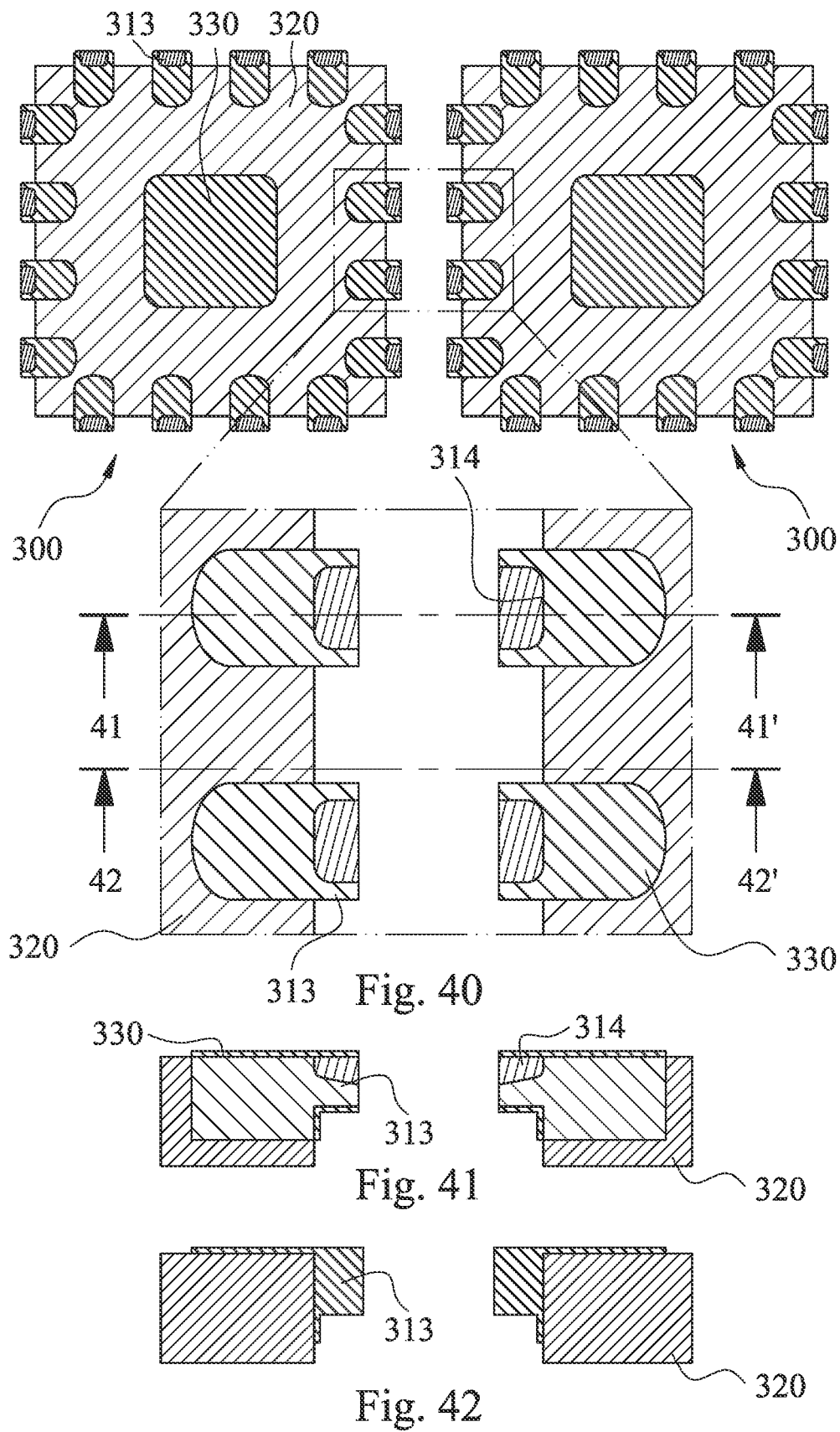
FIG. 40 is a schematic view of the singulation step according to the 3rd embodiment in FIG. 31.
FIG. 41 is a cross-sectional schematic view of the package structure along a 41-41' line in FIG. 40.
FIG. 42 is a cross-sectional schematic view of the package structure along a 42-42' line in FIG. 40.

FIG. 40 is a schematic view of the singulation step S305 according to the 3rd embodiment in FIG. 31. FIG. 41 is a cross-sectional schematic view of the package structure 300 along a 41-41' line in FIG. 40. FIG. 42 is a cross-sectional schematic view of the package structure 300 along a 42-42' line in FIG. 40. In FIGS. 40 to 42, the cutting streets 311 of the leadframe 310 are cut to form the package structure 300 in the singulation step S305. In detail, the cutting streets 311 of the leadframe 310 are cut via a blade, and a cutting width of the blade is equal to an etching width (that is, a width of each of the etching grooves 312) provided in the etching step S301. Hence, step-shaped leads 313 are formed, and the plating surfaces 330 are disposed on outer surfaces of each of the step-shaped leads 313. Furthermore, a thickness of each of the cutting streets 311 is thinner in the etching step S301, so the burr can be reduced in the singulation step S305.

Figure 43:
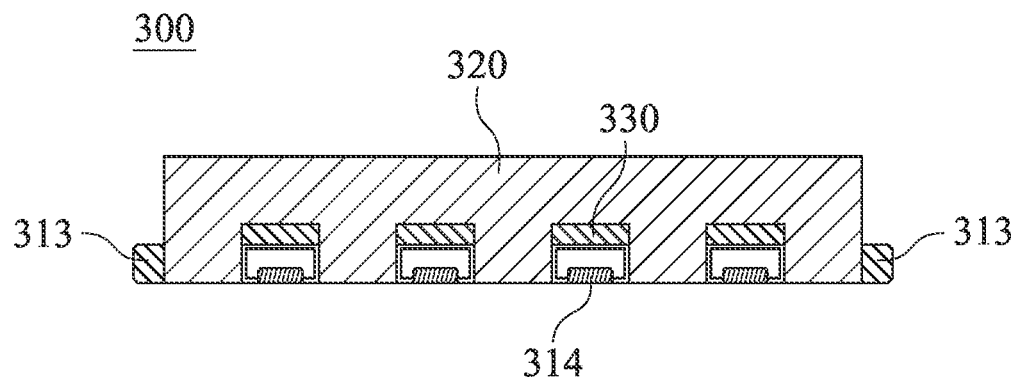
FIG. 43 is a side view of the package structure according to the 3rd embodiment in FIG. 31.
Figure 44:
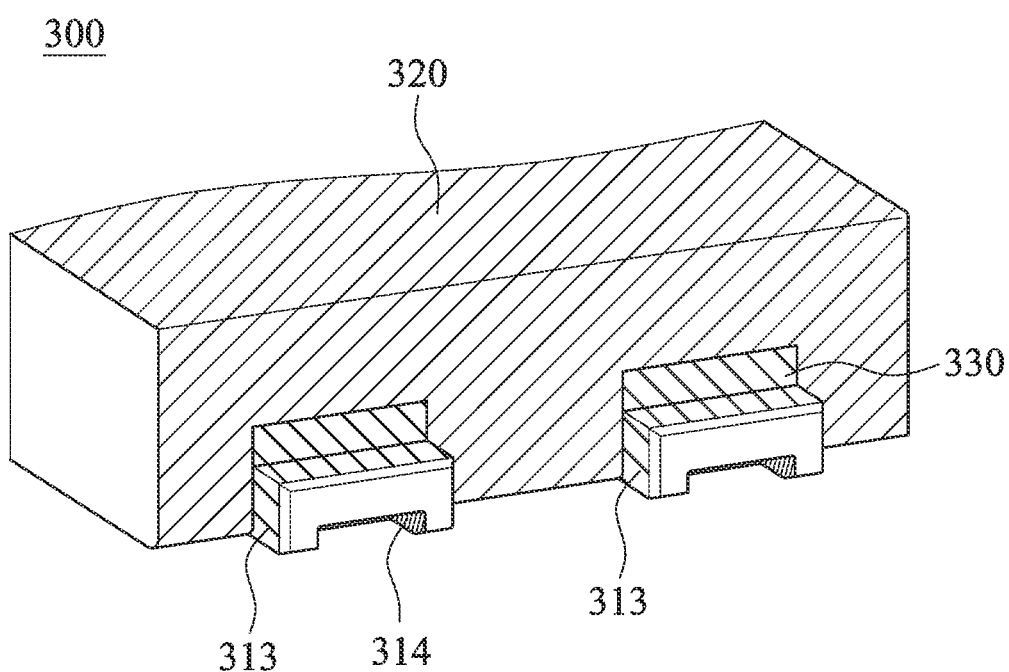
FIG. 44 is a partial schematic view of the package structure according to the 3rd embodiment in FIG. 31.

FIG. 43 is a side view of the package structure 300 according to the 3rd embodiment in FIG. 31. FIG. 44 is a partial schematic view of the package structure 300 according to the 3rd embodiment in FIG. 31. In FIGS. 43 and 44, the package structure 300 includes the step-shaped leads 313, the step-shaped leads 313 protrude an edge of the plastic package material 320, each of the step-shaped leads 313 includes eight plating surfaces 330, and each of the step-shaped leads 313 close to a lower surface of the package structure 300 protrudes the edge of the plastic package material 320.

Hence, according to the 3rd embodiment, by the method of forming the package structure S300, the solderable area of each of the sides of the package structure 300 can be increased. Therefore, the connection strength between the step-shaped leads 313 and the circuit board can be enhanced to maintain and increase the lifetime of the package structure 300 disposed on the circuit board, and the reliability of the board level can be further enhanced.

Figure 45:
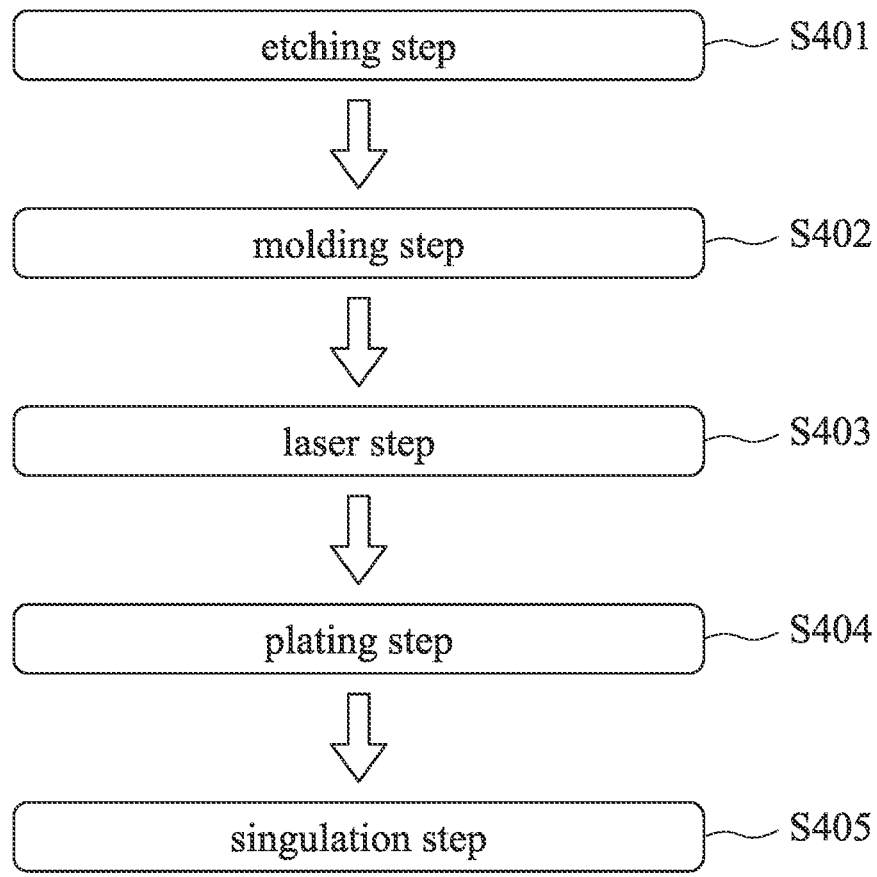
FIG. 45 is a step flow chart of a method of forming a package structure according to the 4th embodiment of the present disclosure.

FIG. 45 is a step flow chart of a method of forming a package structure S400 according to the 4th embodiment of the present disclosure. In FIG. 45, the method of forming the package structure S400 includes an etching step S401, a molding step S402, a laser step S403, a plating step S404 and a singulation step S405.

Figure 46:
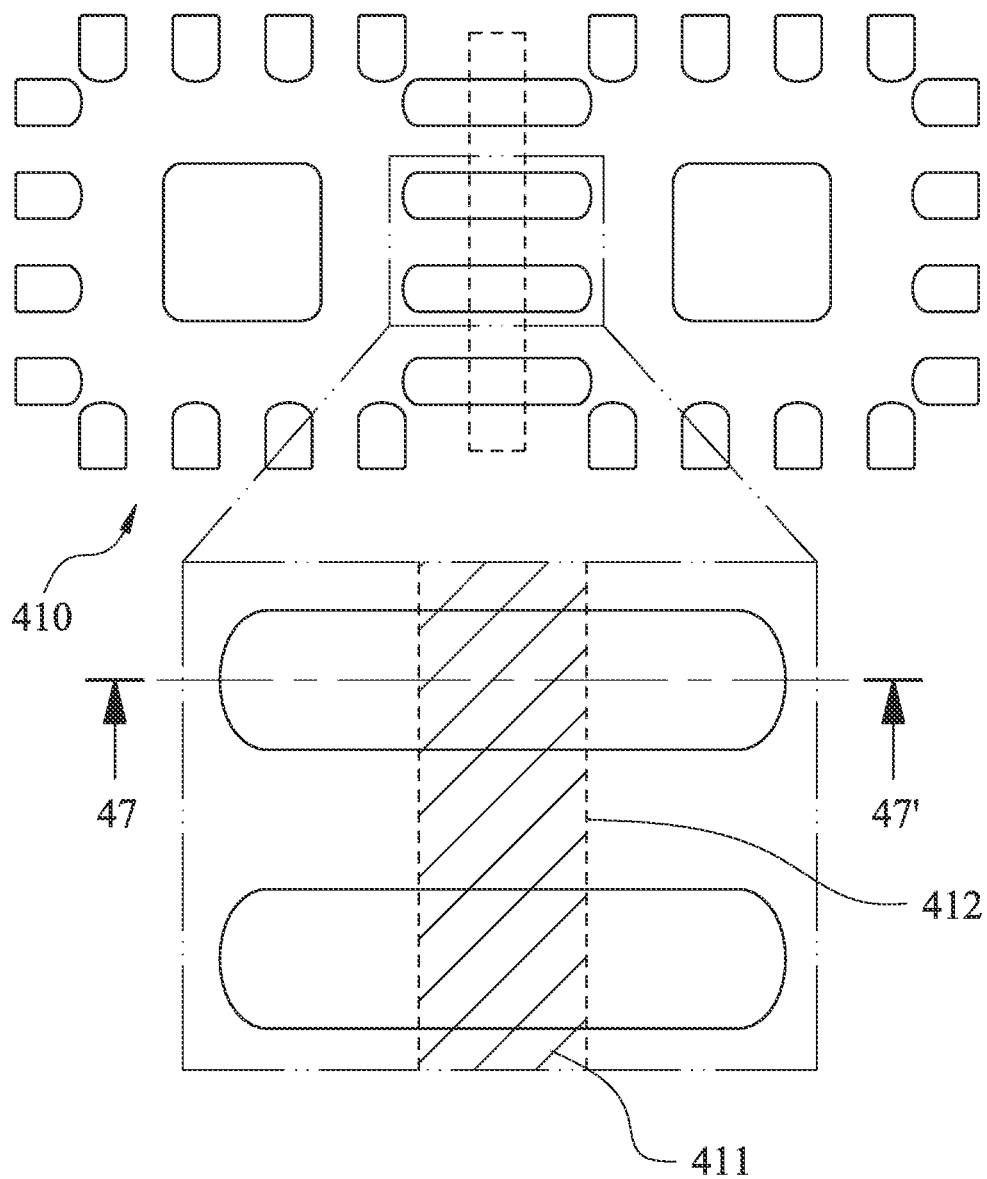
FIG. 46 is a schematic view of the etching step according to the 4th embodiment in FIG. 45.
Figure 47:
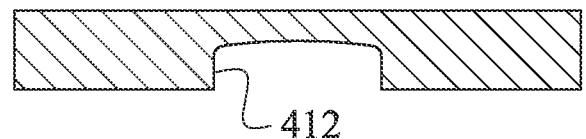
FIG. 47 is a cross-sectional schematic view of the leadframe along a 47-47' line in FIG. 46.

FIG. 46 is a schematic view of the etching step S401 according to the 4th embodiment in FIG. 45. FIG. 47 is a cross-sectional schematic view of the leadframe 410 along a 47-47' line in FIG. 46. In FIGS. 46 and 47, a plurality of cutting streets 411 of the leadframe 410 are etched in the etching step S401. According to the 4th embodiment, an upper surface of each of the cutting streets 411 of the leadframe 410 is etched to form an etching groove 412, and an etching depth can be equal to half of a thickness of the leadframe 410, but is not limited thereto.

Figure 48:
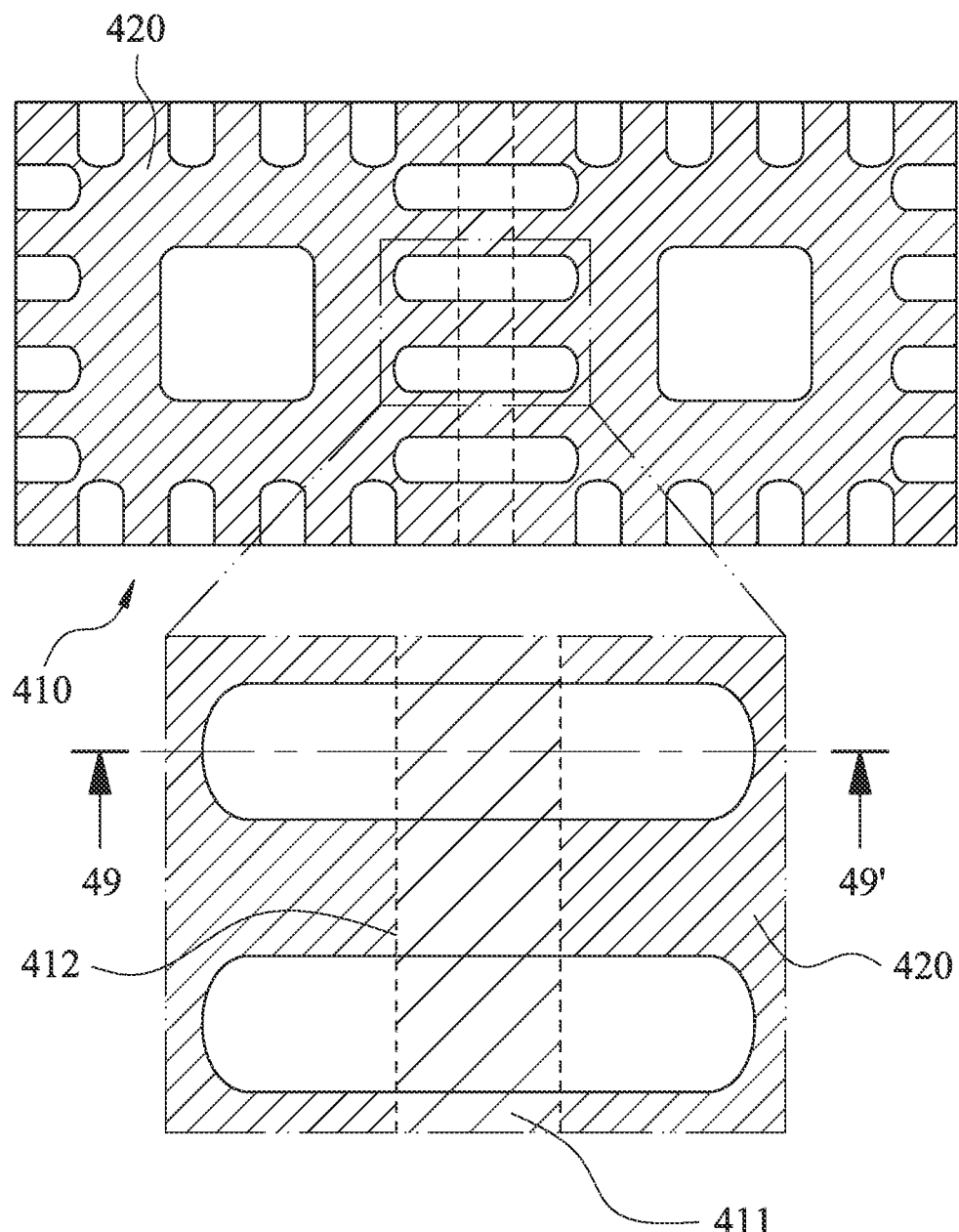
FIG. 48 is a schematic view of the molding step according to the 4th embodiment in FIG. 45.
Figure 49:
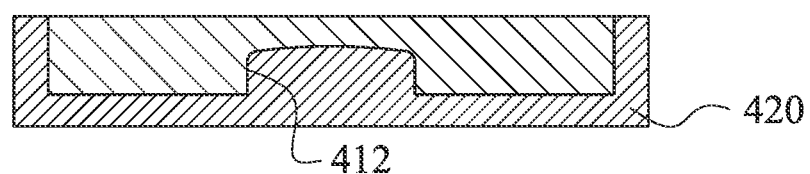
FIG. 49 is a cross-sectional schematic view of the leadframe along a 49-49' line in FIG. 48.

FIG. 48 is a schematic view of the molding step S402 according to the 4th embodiment in FIG. 45. FIG. 49 is a cross-sectional schematic view of the leadframe 410 along a 49-49' line in FIG. 48. In FIGS. 48 and 49, a plastic package material 420 covers on the leadframe 410 before the laser step S403.

Figure 50:
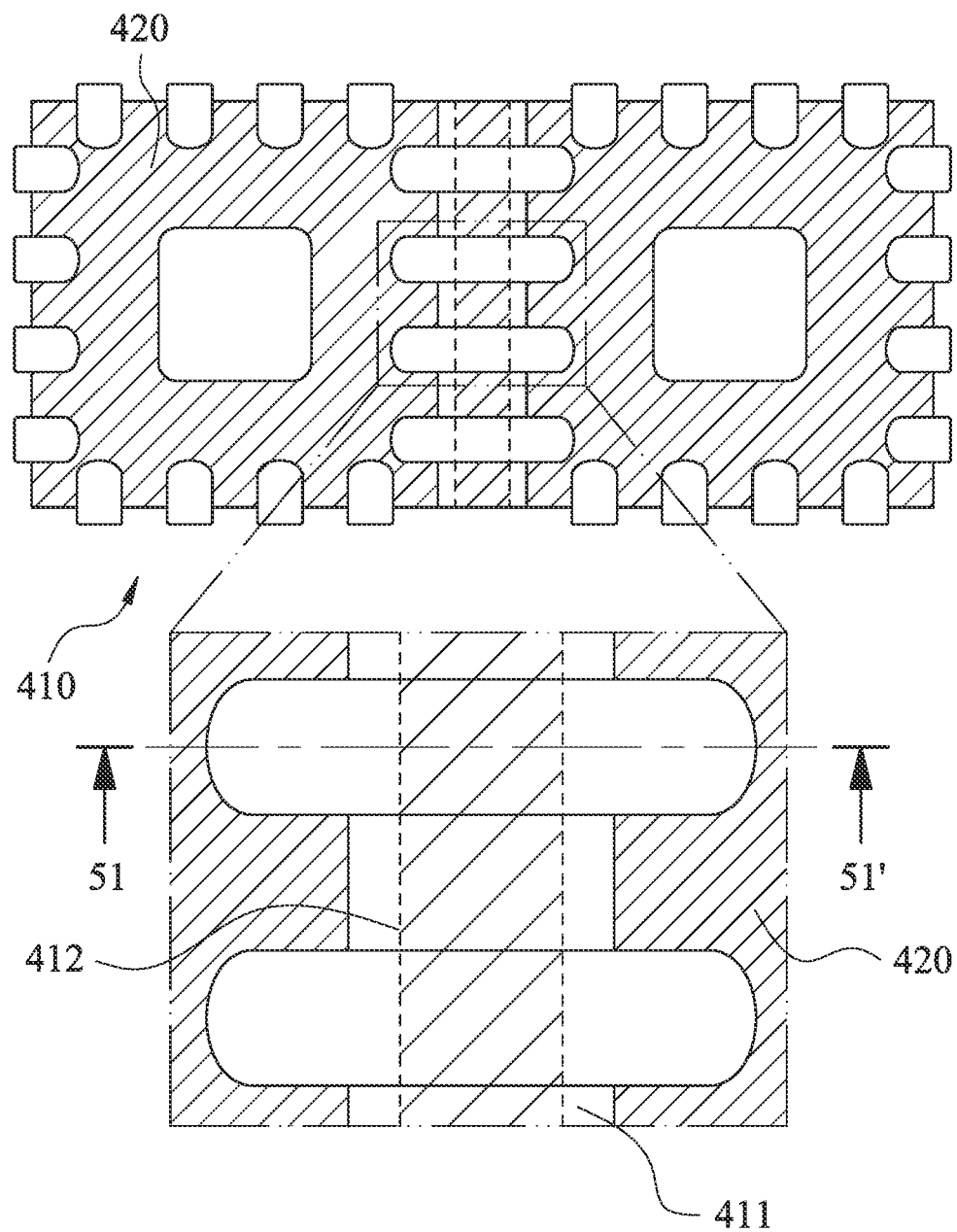
FIG. 50 is a schematic view of the laser step according to the 4th embodiment in FIG. 45.
Figure 51:
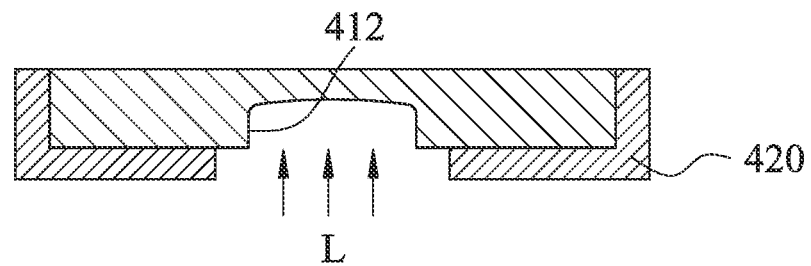
FIG. 51 is a cross-sectional schematic view of the leadframe along a 51-51' line in FIG. 50.

FIG. 50 is a schematic view of the laser step S403 according to the 4th embodiment in FIG. 45. FIG. 51 is a cross-sectional schematic view of the leadframe 410 along a 51-51' line in FIG. 50. In FIGS. 50 and 51, the plastic package material 420 covering on each of the cutting streets 411 is removed via a laser beam L in the laser step S403. In particular, according to the 4th embodiment, the plastic package material 420 covering on the upper surface of each of the cutting streets 411 is removed via the laser beam L in the laser step S403, and the plastic package material 420 is only partially removed.

Table 4 shows parameters of the laser beam L in the laser step S403 according to the 4th embodiment, but the present disclosure is not limited to the parameters in Table 4.

TABLE 4

| Laser type | diode end-pumped Nd: YVO$_4$ |
|---|---|
| Output power | 10 W-40 W |
| Wavelength | 355 nm, 532 nm, 1064 nm |
| Pulse frequency | 60 kHz-200 kHz, and CW (continuous-wave) |

Furthermore, the removing targets (for example, a portion of the plastic package material 420) and the depth thereof can be chosen via the laser step S403. In particular, the laser step S403 can be made up of one or multiple laser beams L, and it depends on the energy and the parameters of the laser beam L. Therefore, the removing range can be effectively controlled. For example, a roughing treatment can be firstly performed via the laser beam L with smaller wavelength (such as 355 nm) to quickly remove the portion of the plastic package material 420, and then a fine treatment is performed via the laser beam L with lager wavelength (such as 532 nm or 1064 nm) to precisely remove the portion of the plastic package material 420, but is not limited thereto.

Figure 52:
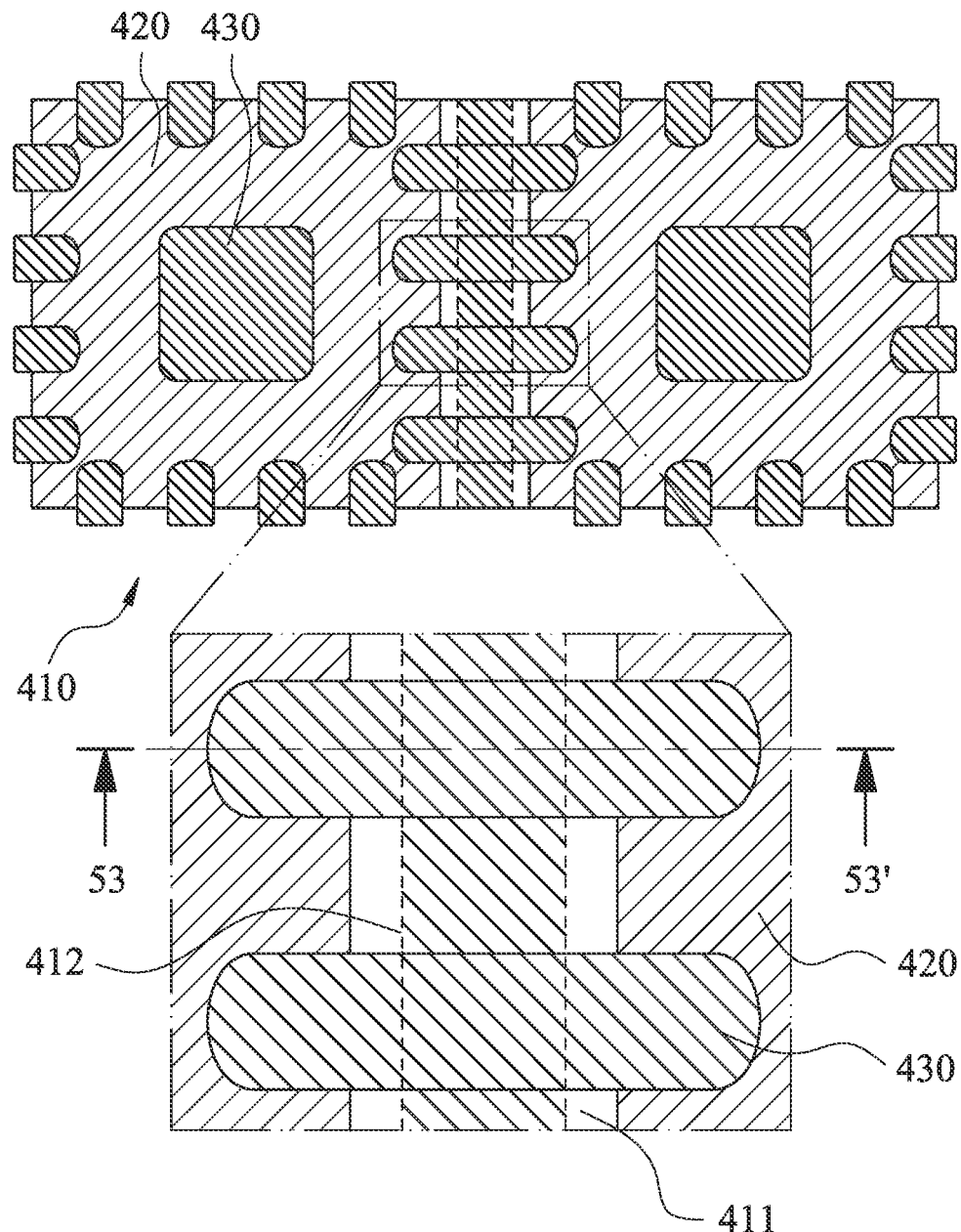
FIG. 52 is a schematic view of the plating step according to the 4th embodiment in FIG. 45.
Figure 53:
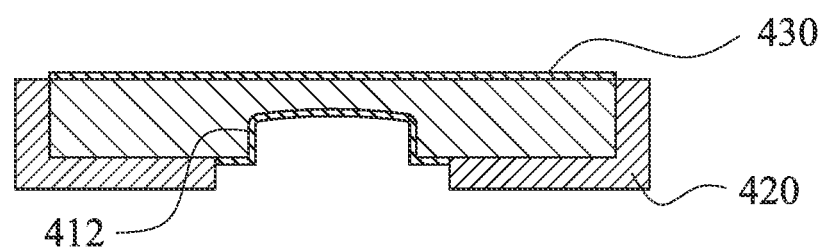
FIG. 53 is a cross-sectional schematic view of the leadframe along a 53-53' line in FIG. 52.

FIG. 52 is a schematic view of the plating step S404 according to the 4th embodiment in FIG. 45. FIG. 53 is a cross-sectional schematic view of the leadframe 410 along a 53-53' line in FIG. 52. In FIGS. 52 and 53, a plurality of plating surfaces 430 are disposed on a plurality of areas of the leadframe 410 without the plastic package material 420.

Figure 54:
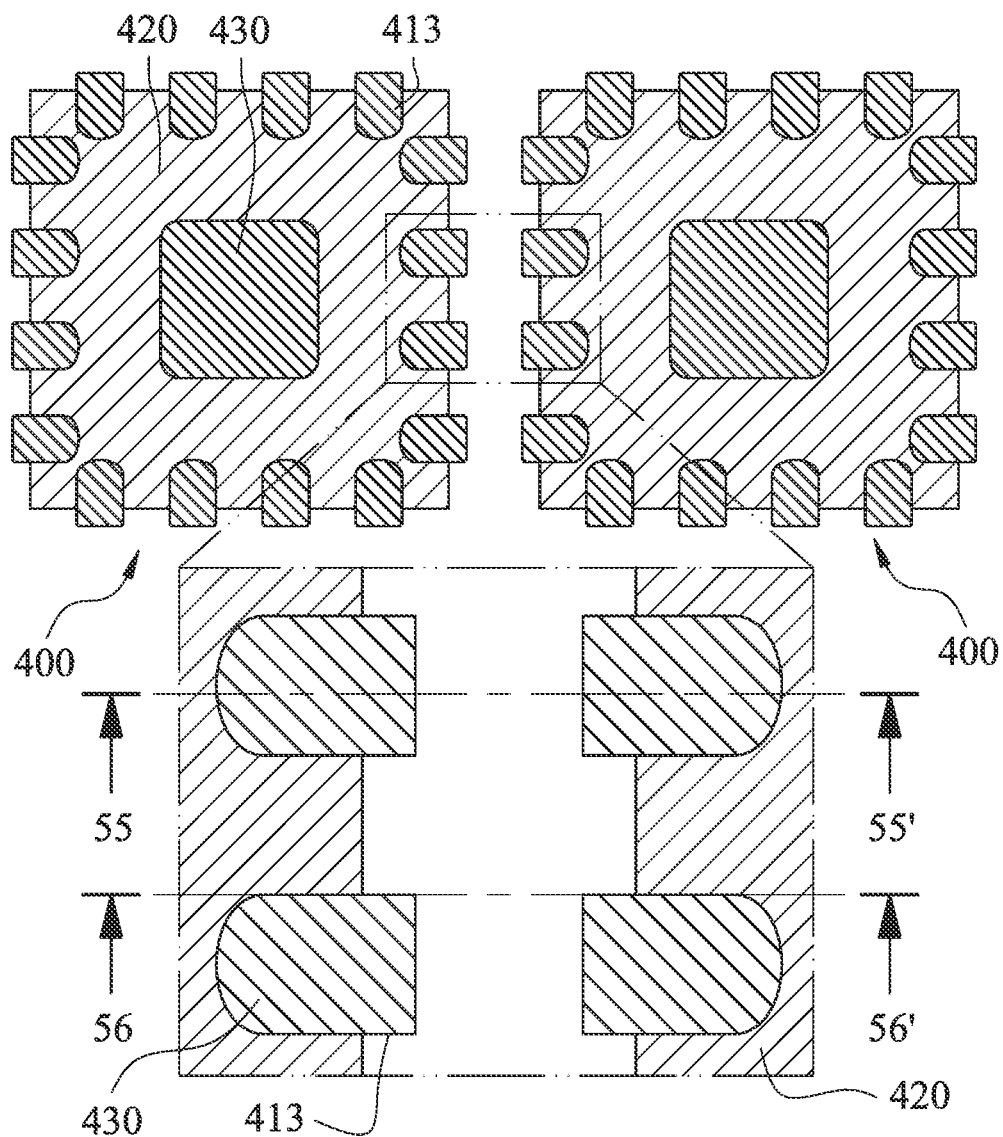
FIG. 54 is a schematic view of the singulation step according to the 4th embodiment in FIG. 45.
Figure 55:
FIG. 55 is a cross-sectional schematic view of the package structure along a 55-55' line in FIG. 54.
Figure 56:
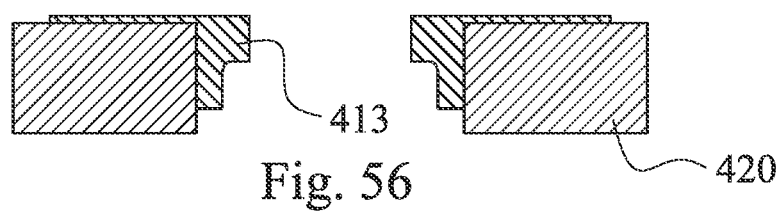
FIG. 56 is a cross-sectional schematic view of the package structure along a 56-56' line in FIG. 54.

FIG. 54 is a schematic view of the singulation step S405 according to the 4th embodiment in FIG. 45. FIG. 55 is a cross-sectional schematic view of the package structure 400 along a 55-55' line in FIG. 54. FIG. 56 is a cross-sectional schematic view of the package structure 400 along a 56-56' line in FIG. 54. In FIGS. 54 to 56, the cutting streets 411 of the leadframe 410 are cut to form the package structure 400 in the singulation step S405. In detail, the cutting streets 411 of the leadframe 410 are cut via a blade, and a cutting width of the blade is equal to an etching width (that is, a width of each of the etching grooves 412) provided in the etching step S401. Hence, step-shaped leads 413 are formed, and the plating surfaces 430 are disposed on outer surfaces of each of the step-shaped leads 413. Furthermore, a thickness of each of the cutting streets 411 is thinner in the etching step S401, so the burr can be reduced in the singulation step S405.

Figure 57:
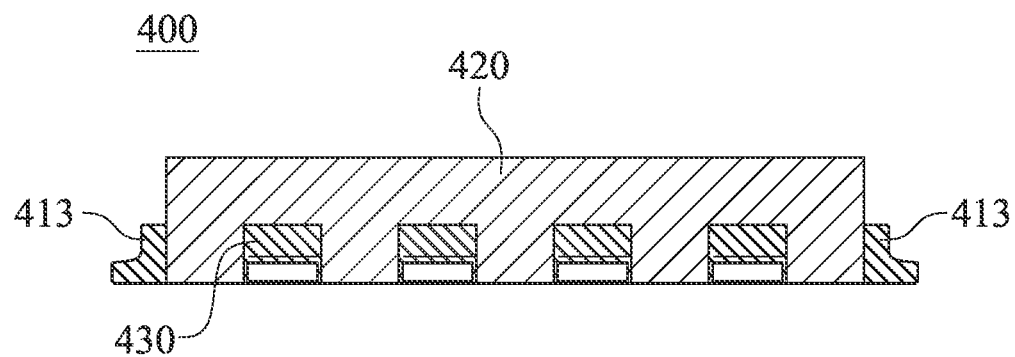
FIG. 57 is a side view of the package structure according to the 4th embodiment in FIG. 45.
Figure 58:
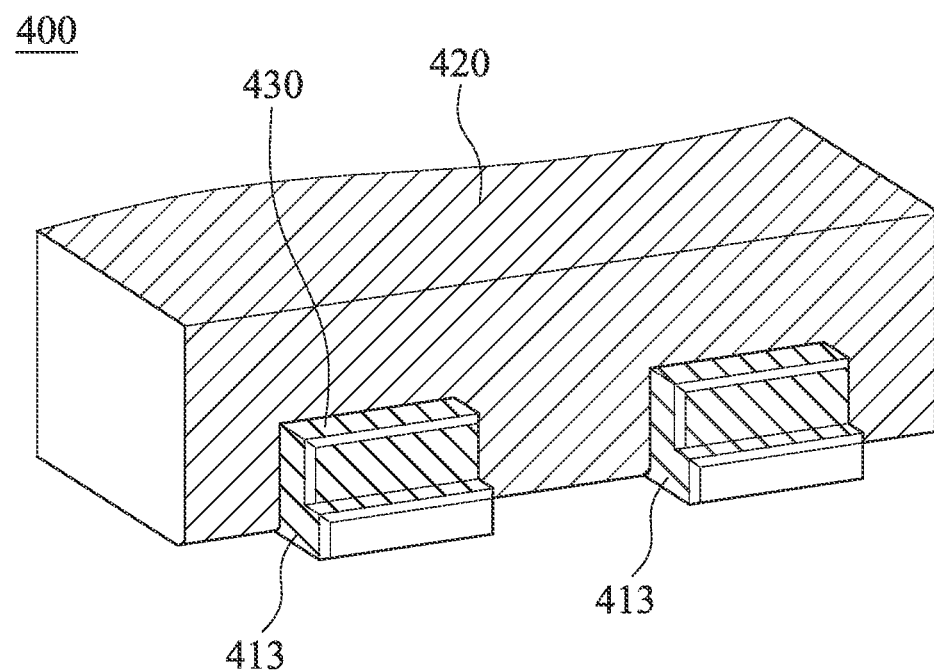
FIG. 58 is a partial schematic view of the package structure according to the 4th embodiment in FIG. 45.

FIG. 57 is a side view of the package structure 400 according to the 4th embodiment in FIG. 45. FIG. 58 is a partial schematic view of the package structure 400 according to the 4th embodiment in FIG. 45. In FIGS. 57 and 58, the package structure 400 includes the step-shaped leads 413, the step-shaped leads 413 protrude an edge of the plastic package material 420, each of the step-shaped leads 413 includes six plating surfaces 430, and each of the step-shaped leads 413 close to a lower surface of the package structure 400 protrudes the edge of the plastic package material 420.

Hence, according to the 4th embodiment, by the method of forming the package structure S400, the solderable area of each of the sides of the package structure 400 can be increased. Therefore, the connection strength between the step-shaped leads 413 and the circuit board can be enhanced to maintain and increase the lifetime of the package structure 400 disposed on the circuit board, and the reliability of the board level can be further enhanced.

Figure 59:
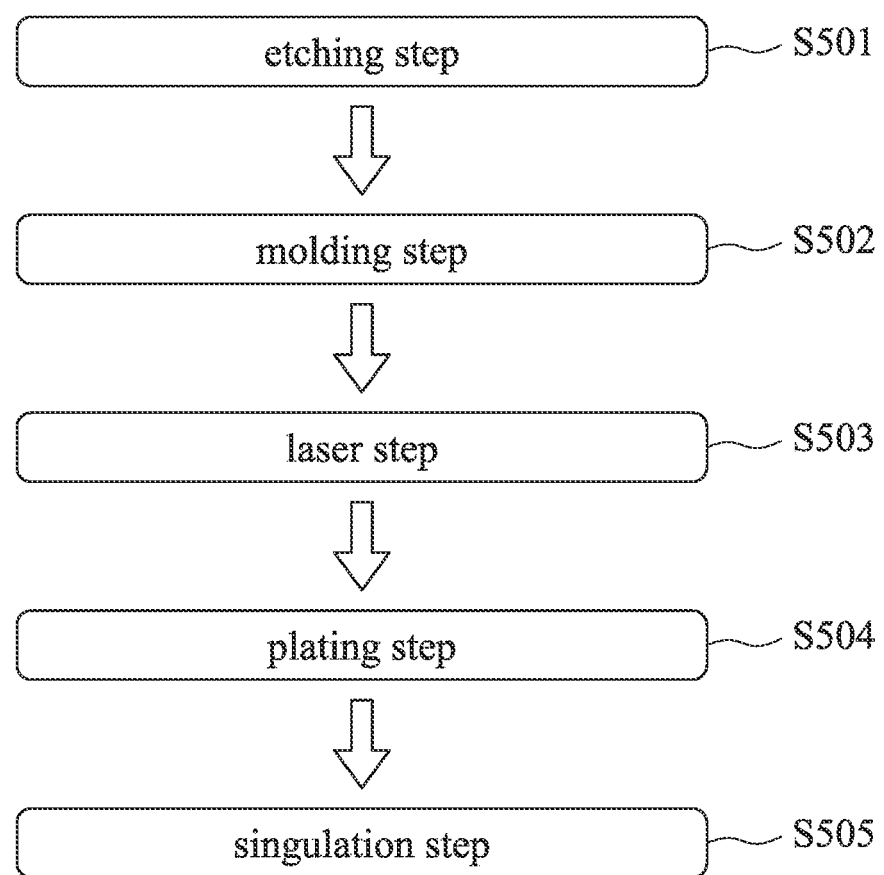
FIG. 59 is a step flow chart of a method of forming a package structure according to the 5th embodiment of the present disclosure.

FIG. 59 is a step flow chart of a method of forming a package structure S500 according to the 5th embodiment of the present disclosure. In FIG. 59, the method of forming the package structure S500 includes an etching step S501, a molding step S502, a laser step S503, a plating step S504 and a singulation step S505.

Figure 60:
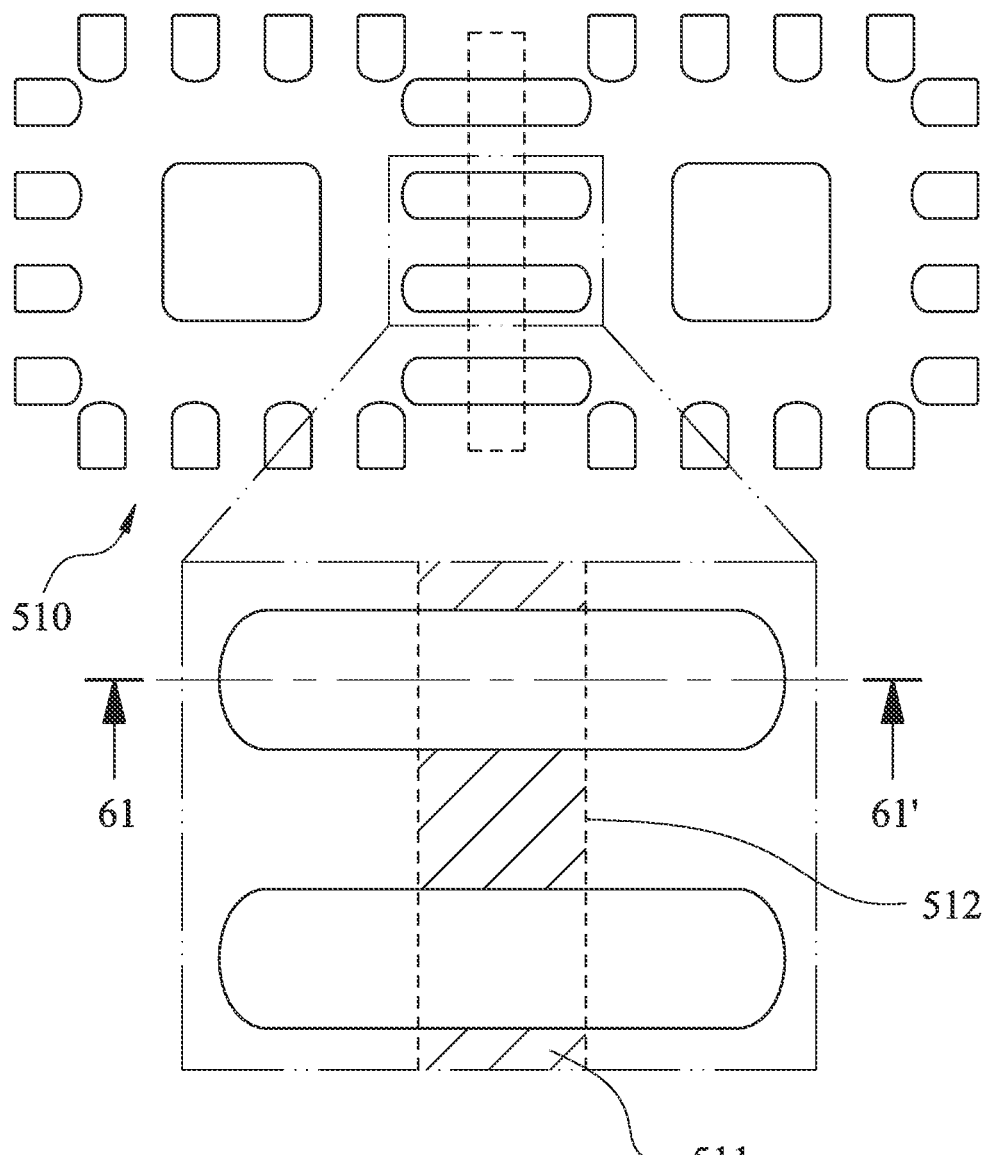
FIG. 60 is a schematic view of the etching step according to the 5th embodiment in FIG. 59.
Figure 61:
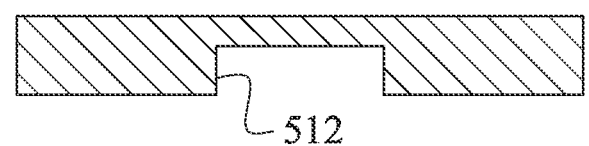
FIG. 61 is a cross-sectional schematic view of the leadframe along a 61-61' line in FIG. 60.

FIG. 60 is a schematic view of the etching step S501 according to the 5th embodiment in FIG. 59. FIG. 61 is a cross-sectional schematic view of the leadframe 510 along a 61-61' line in FIG. 60. In FIGS. 60 and 61, a plurality of cutting streets 511 of the leadframe 510 are etched in the etching step S501. According to the 5th embodiment, an upper surface of each of the cutting streets 511 of the leadframe 510 is etched to form an etching groove 512, and an etching depth can be equal to half of a thickness of the leadframe 510, but is not limited thereto.

Figure 62:
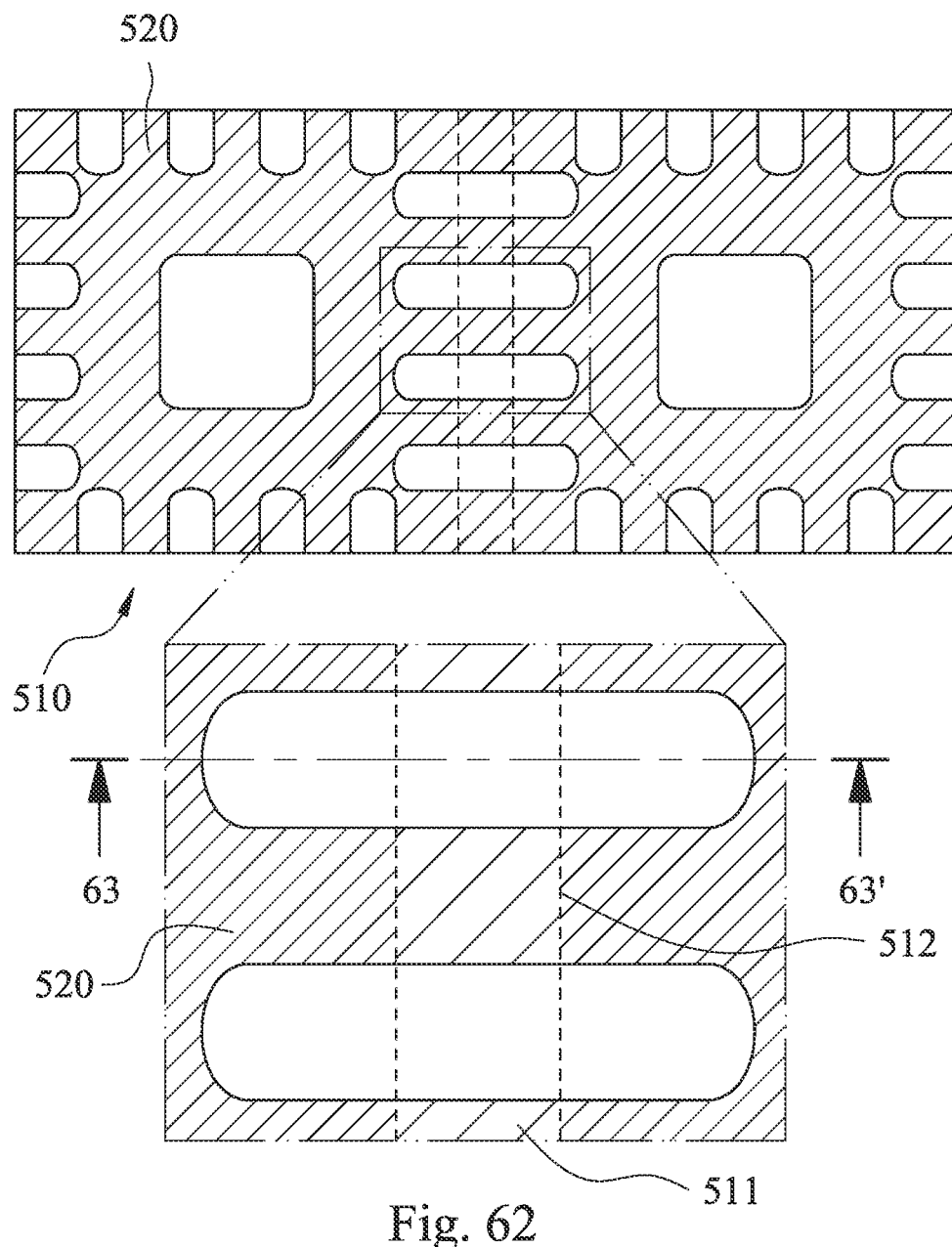
FIG. 62 is a schematic view of the molding step according to the 5th embodiment in FIG. 59.
Figure 63:
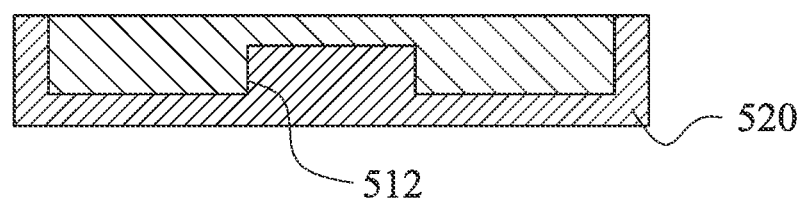
FIG. 63 is a cross-sectional schematic view of the leadframe along a 63-63' line in FIG. 62.

FIG. 62 is a schematic view of the molding step S502 according to the 5th embodiment in FIG. 59. FIG. 63 is a cross-sectional schematic view of the leadframe 510 along a 63-63' line in FIG. 62. In FIGS. 62 and 63, a plastic package material 520 covers on the leadframe 510 before the laser step S503.

Figure 64:
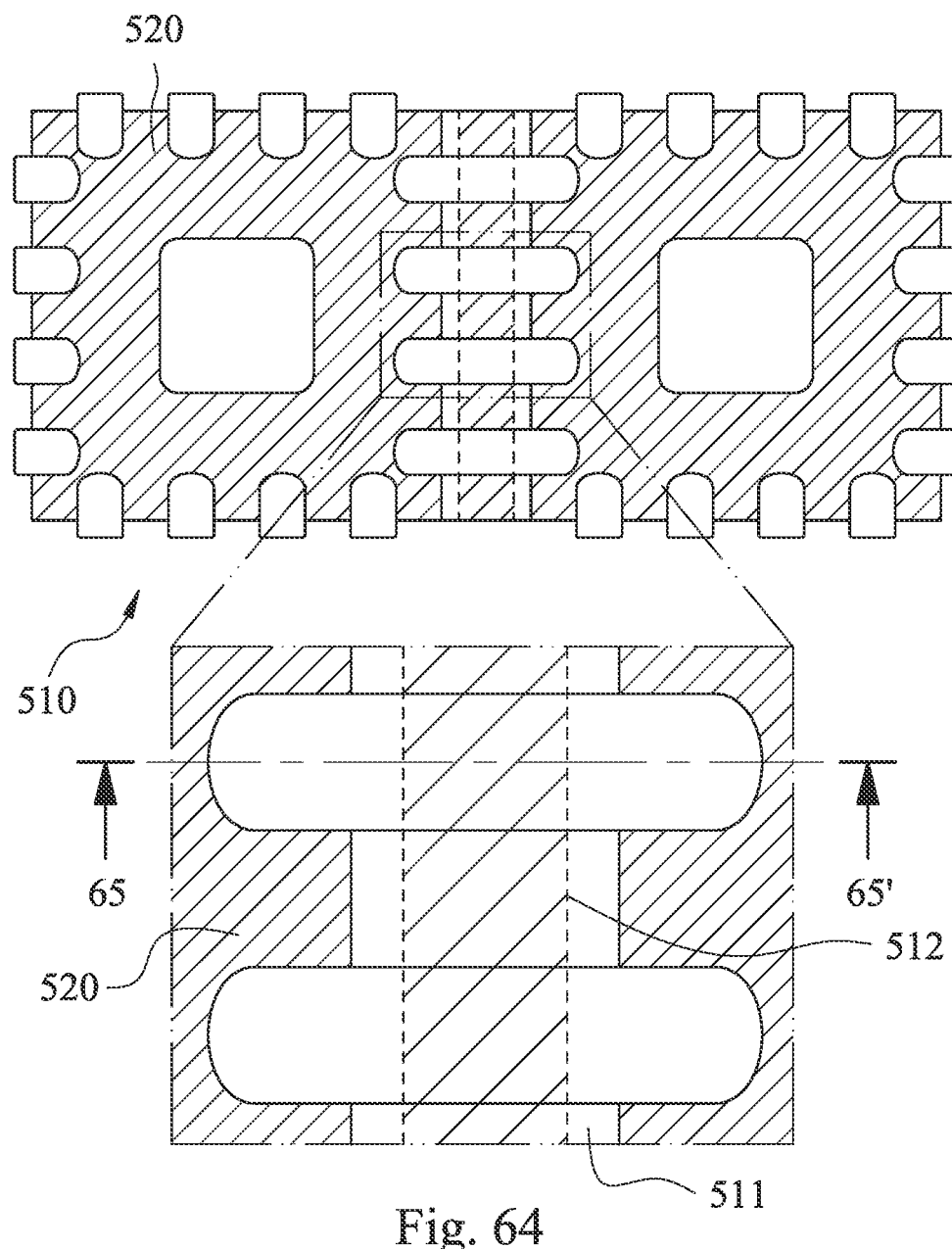
FIG. 64 is a schematic view of the laser step according to the 5th embodiment in FIG. 59.
Figure 65:
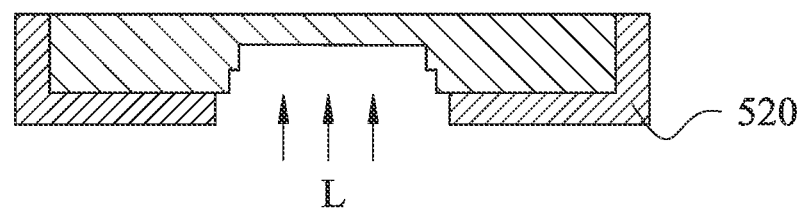
FIG. 65 is a cross-sectional schematic view of the leadframe along a 65-65' line in FIG. 64.

FIG. 64 is a schematic view of the laser step S503 according to the 5th embodiment in FIG. 59. FIG. 65 is a cross-sectional schematic view of the leadframe 510 along a 65-65' line in FIG. 64. In FIGS. 64 and 65, the plastic package material 520 covering on each of the cutting streets 511 is removed via a laser beam L in the laser step S503. In particular, according to the 5th embodiment, the plastic package material 520 covering on the upper surface of each of the cutting streets 511 is removed via the laser beam L in the laser step S503, and the plastic package material 520 is only partially removed.

Table 5 shows parameters of the laser beam L in the laser step S503 according to the 5th embodiment, but the present disclosure is not limited to the parameters in Table 5.

TABLE 5

| Laser type | diode end-pumped Nd: YVO$_4$ |
|---|---|
| Output power | 10 W-40 W |
| Wavelength | 355 nm, 532 nm, 1064 nm |
| Pulse frequency | 60 kHz-200 kHz, and CW (continuous-wave) |

Furthermore, the removing targets (for example, a portion of the plastic package material 520 and a portion of the leadframe 510) and the depth thereof can be chosen via the laser step S503. In particular, the laser step S503 can be made up of one or multiple laser beams L, and it depends on the energy and the parameters of the laser beam L. Therefore, the removing range can be effectively controlled. For example, a roughing treatment can be firstly performed via the laser beam L with smaller wavelength (such as 355 nm) to quickly remove the portion of the plastic package material 520 and the portion of the leadframe 510, and then a fine treatment is performed via the laser beam L with lager wavelength (such as 532 nm or 1064 nm) to precisely remove the portion of the plastic package material 520 and the portion of the leadframe 510, but is not limited thereto.

Figure 66:
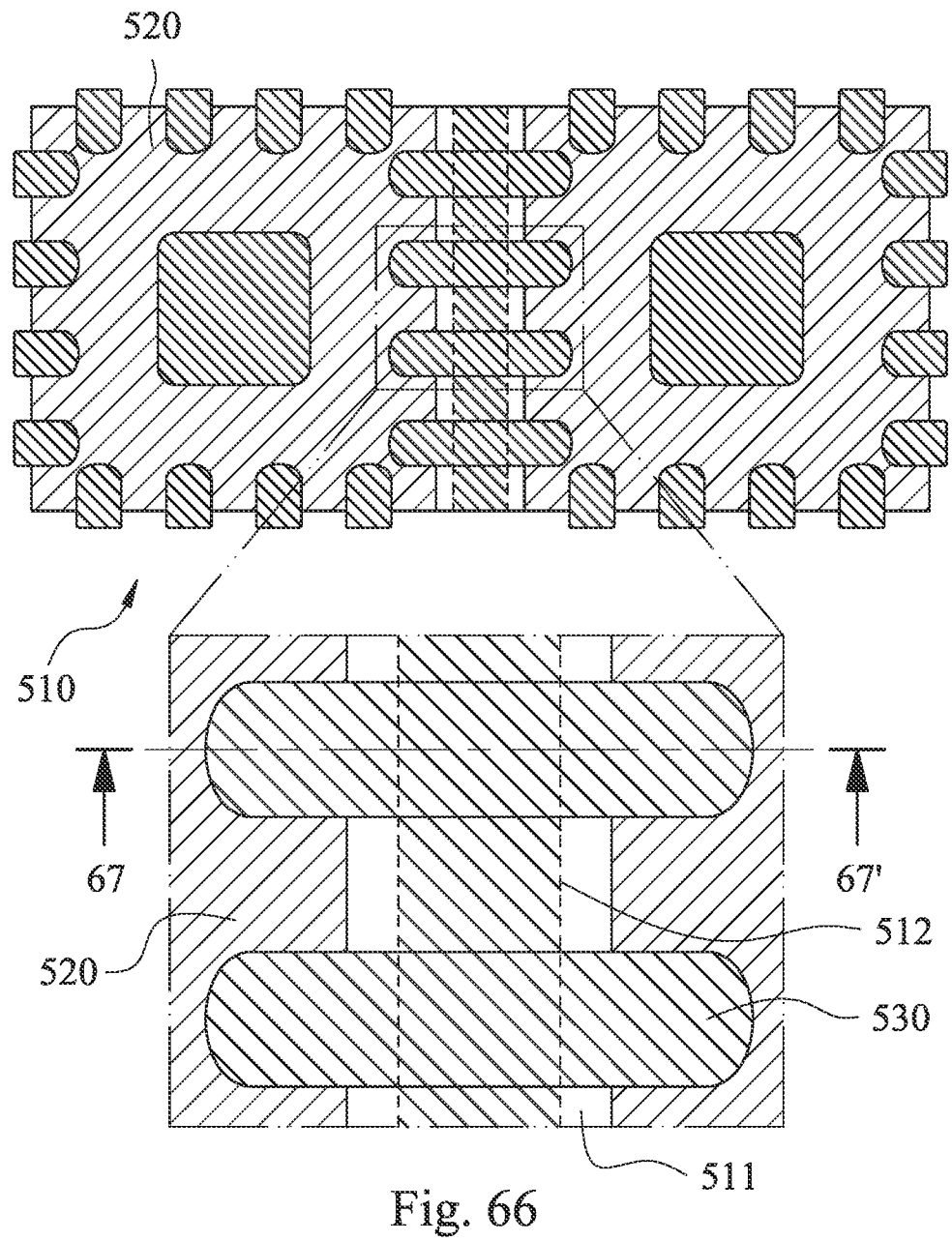
FIG. 66 is a schematic view of the plating step according to the 5th embodiment in FIG. 59.
Figure 67:
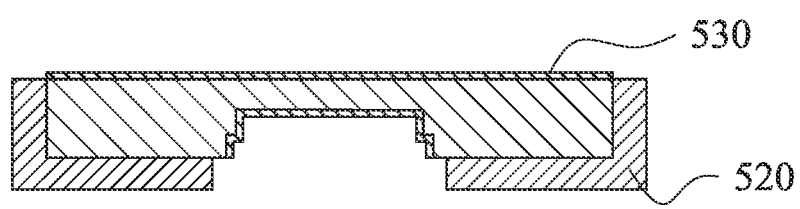
FIG. 67 is a cross-sectional schematic view of the leadframe along a 67-67' line in FIG. 66.

FIG. 66 is a schematic view of the plating step S504 according to the 5th embodiment in FIG. 59. FIG. 67 is a cross-sectional schematic view of the leadframe 510 along a 67-67' line in FIG. 66. In FIGS. 66 and 67, a plurality of plating surfaces 530 are disposed on a plurality of areas of the leadframe 510 without the plastic package material 520.

Figure 68:
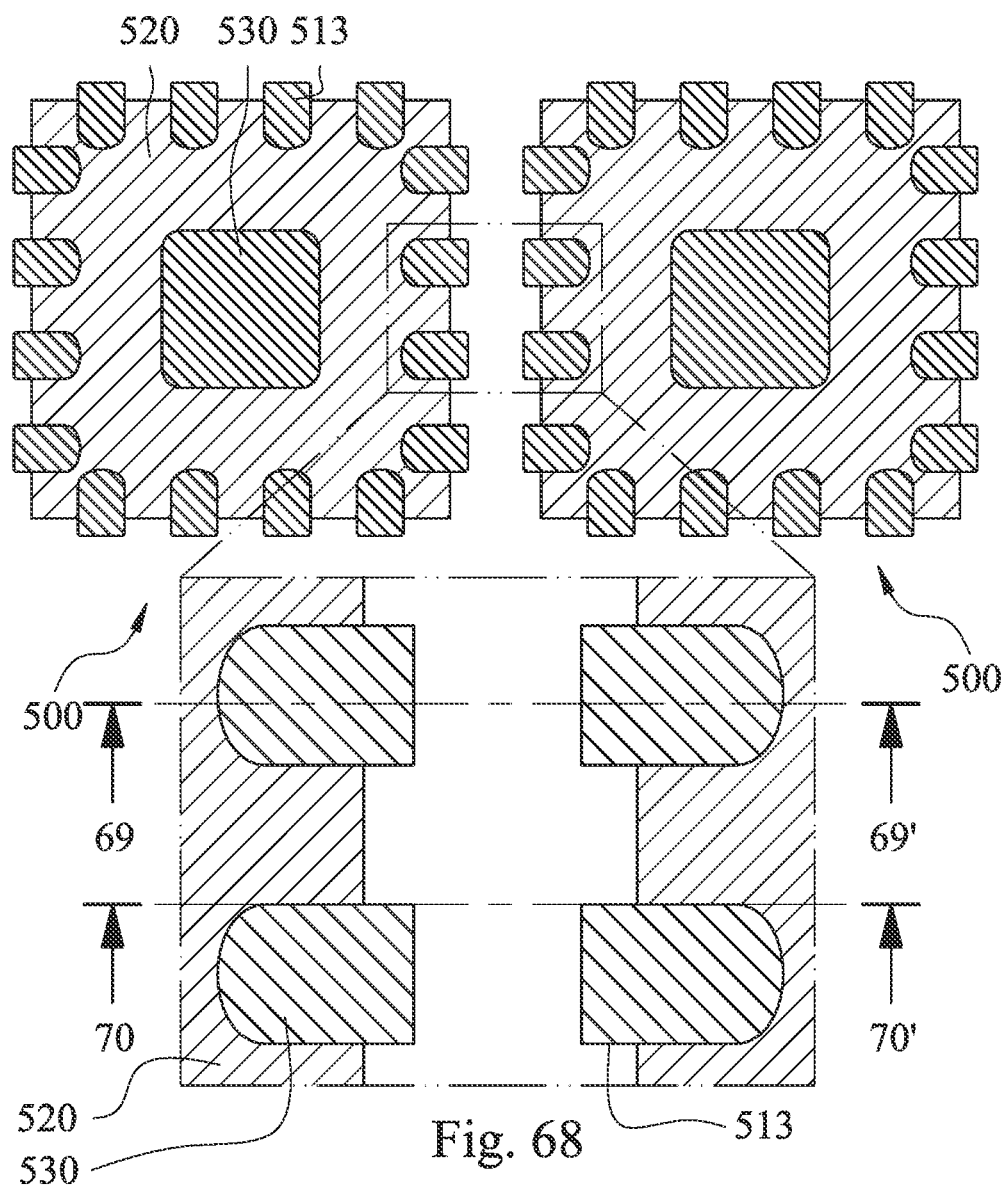
FIG. 68 is a schematic view of the singulation step according to the 5th embodiment in FIG. 59.
Figure 69:
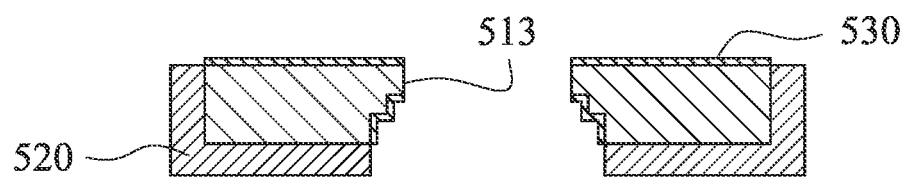
FIG. 69 is a cross-sectional schematic view of the package structure along a 69-69' line in FIG. 68.
Figure 70:
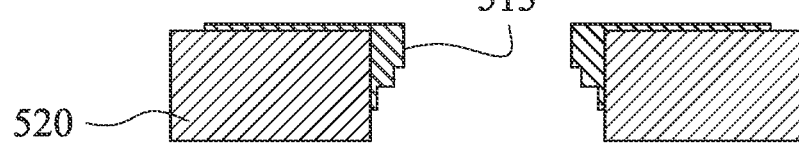
FIG. 70 is a cross-sectional schematic view of the package structure along a 70-70' line in FIG. 68.

FIG. 68 is a schematic view of the singulation step S505 according to the embodiment in FIG. 59. FIG. 69 is a cross-sectional schematic view of the package structure 500 along a 69-69' line in FIG. 68. FIG. 70 is a cross-sectional schematic view of the package structure 500 along a 70-70' line in FIG. 68. In FIGS. 68 to 70, the cutting streets 511 of the leadframe 510 are cut to form the package structure 500 in the singulation step S505. In detail, the cutting streets 511 of the leadframe 510 are cut via a blade, and a cutting width of the blade is equal to an etching width (that is, a width of each of the etching grooves 512) provided in the etching step S501. Hence, step-shaped leads 513 are formed, and the plating surfaces 530 are disposed on outer surfaces of each of the step-shaped leads 513. Furthermore, a thickness of each of the cutting streets 511 is thinner in the etching step S501, so the burr can be reduced in the singulation step S505.

Figure 71:
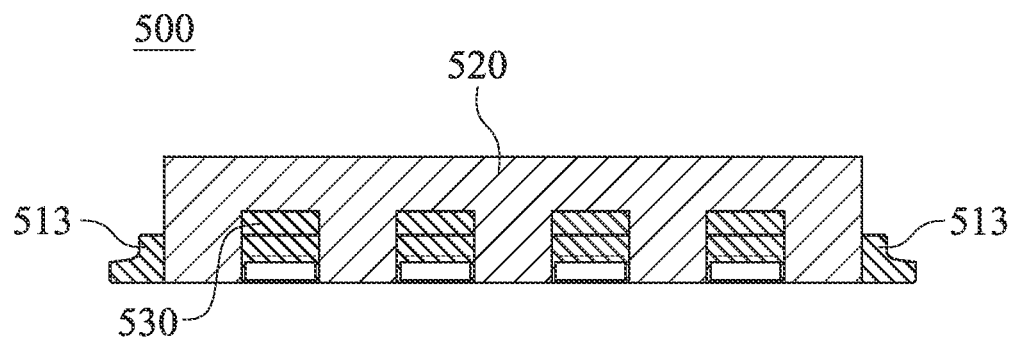
FIG. 71 is a side view of the package structure according to the 5th embodiment in FIG. 59.
Figure 72:
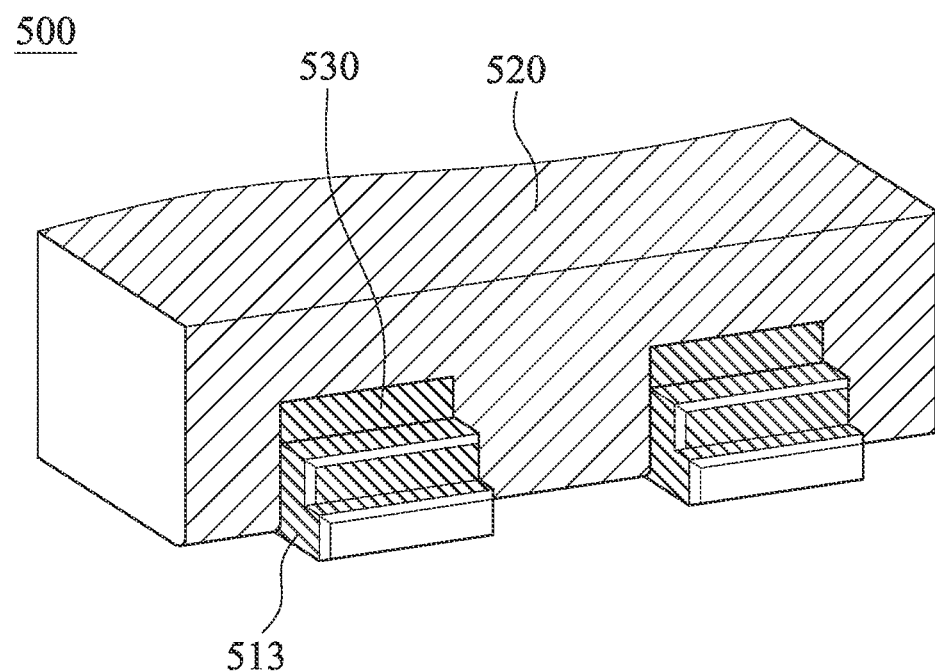
FIG. 72 is a partial schematic view of the package structure according to the 5th embodiment in FIG. 59.

FIG. 71 is a side view of the package structure 500 according to the 5th embodiment in FIG. 59. FIG. 72 is a partial schematic view of the package structure 500 according to the 5th embodiment in FIG. 59. In FIGS. 71 and 72, the package structure 500 includes the step-shaped leads 513, the step-shaped leads 513 protrude an edge of the plastic package material 520, each of the step-shaped leads 513 includes seven plating surfaces 530, and each of the step-shaped leads 513 close to a lower surface of the package structure 500 protrudes the edge of the plastic package material 520.

Hence, according to the 5th embodiment, by the method of forming the package structure S500, the solderable area of each of the sides of the package structure 500 can be increased. Therefore, the connection strength between the step-shaped leads 513 and the circuit board can be enhanced to maintain and increase the lifetime of the package structure 500 disposed on the circuit board, and the reliability of the board level can be further enhanced.

Figure 73:
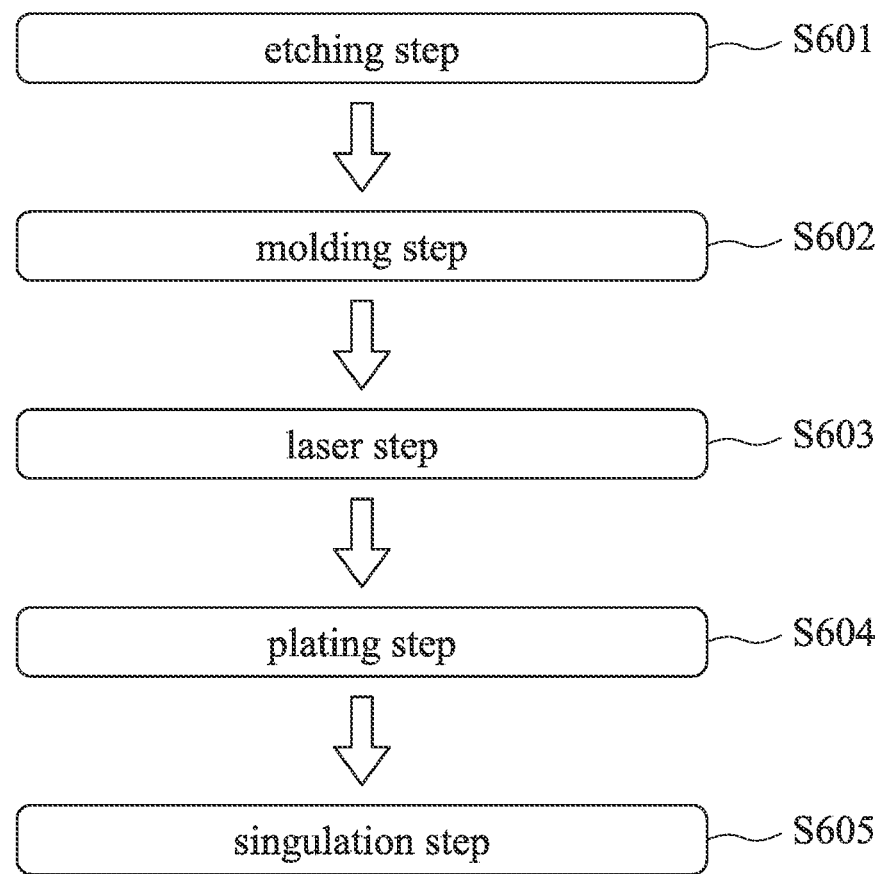
FIG. 73 is a step flow chart of a method of forming a package structure according to the 6th embodiment of the present disclosure.

FIG. 73 is a step flow chart of a method of forming a package structure S600 according to the 6th embodiment of the present disclosure. In FIG. 73, the method of forming the package structure S600 includes an etching step S601, a molding step S602, a laser step S603, a plating step S604 and a singulation step S605.

Figure 74:
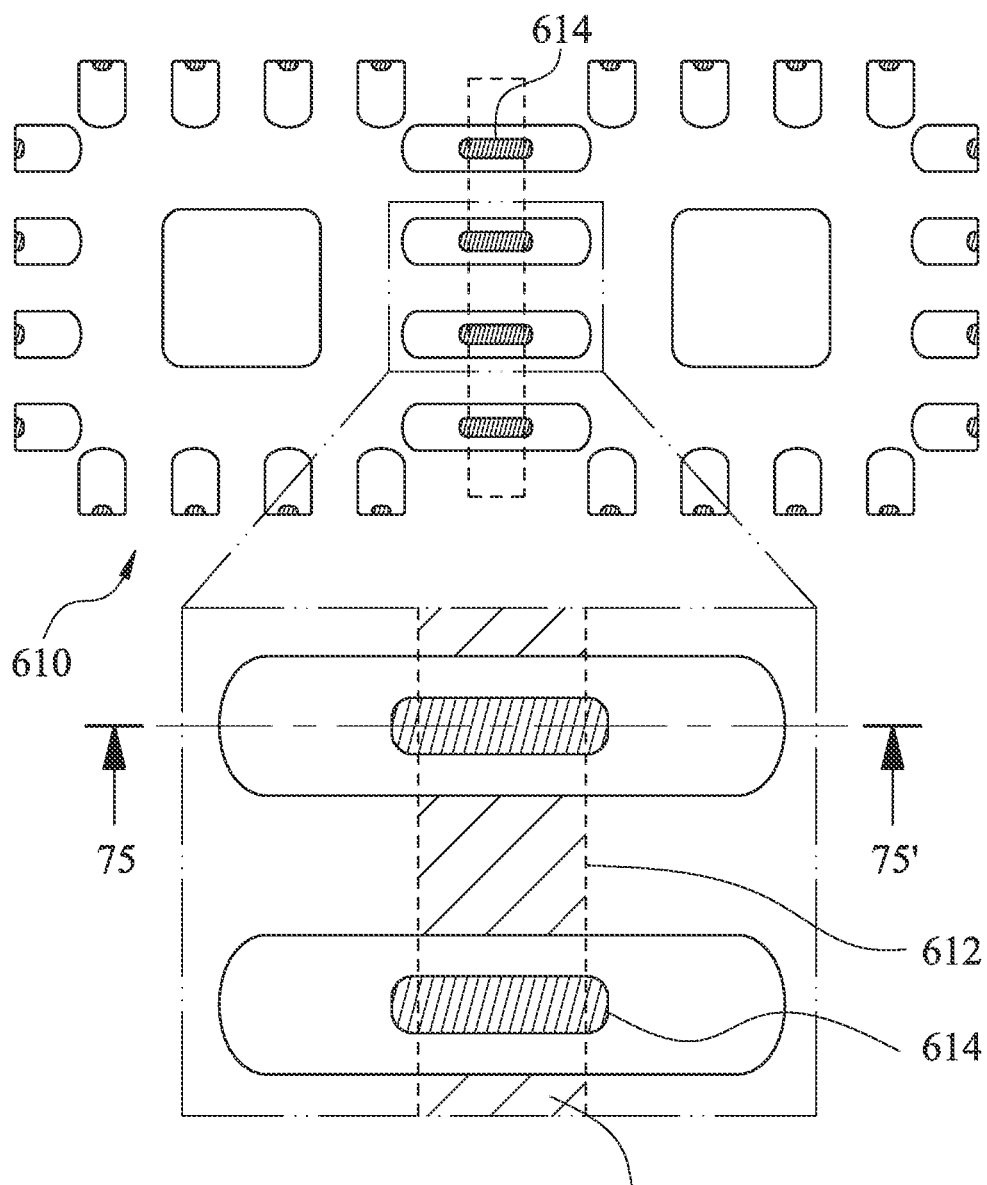
FIG. 74 is a schematic view of the etching step according to the 6th embodiment in FIG. 73.
Figure 75:
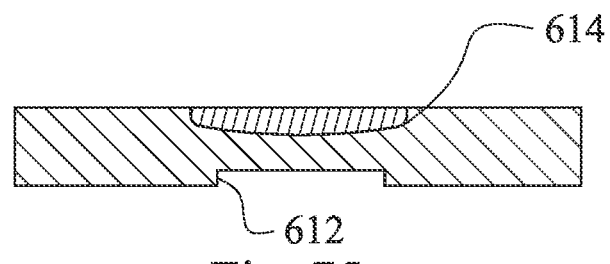
FIG. 75 is a cross-sectional schematic view of the leadframe along a 75-75' line in FIG. 74.

FIG. 74 is a schematic view of the etching step S601 according to the 6th embodiment in FIG. 73. FIG. 75 is a cross-sectional schematic view of the leadframe 610 along a 75-75' line in FIG. 74. In FIGS. 74 and 75, a plurality of cutting streets 611 of the leadframe 610 are etched in the etching step S601. According to the 6th embodiment, an upper surface of each of the cutting streets 611 of the leadframe 610 is etched to form an etching groove 612, and an etching depth can be smaller than half of a thickness of the leadframe 610, but is not limited thereto. Further, each of the cutting streets 611 can have a plurality of concave portions 614, a concave depth of each of the concave portions 614 can be smaller than half of the thickness of the leadframe 610, a width of each of the concave portions 614 can be larger than a width of each of the etching grooves 612, and each of the concave portions 614 is located on a center of each of the cutting streets 611.

Figure 76:
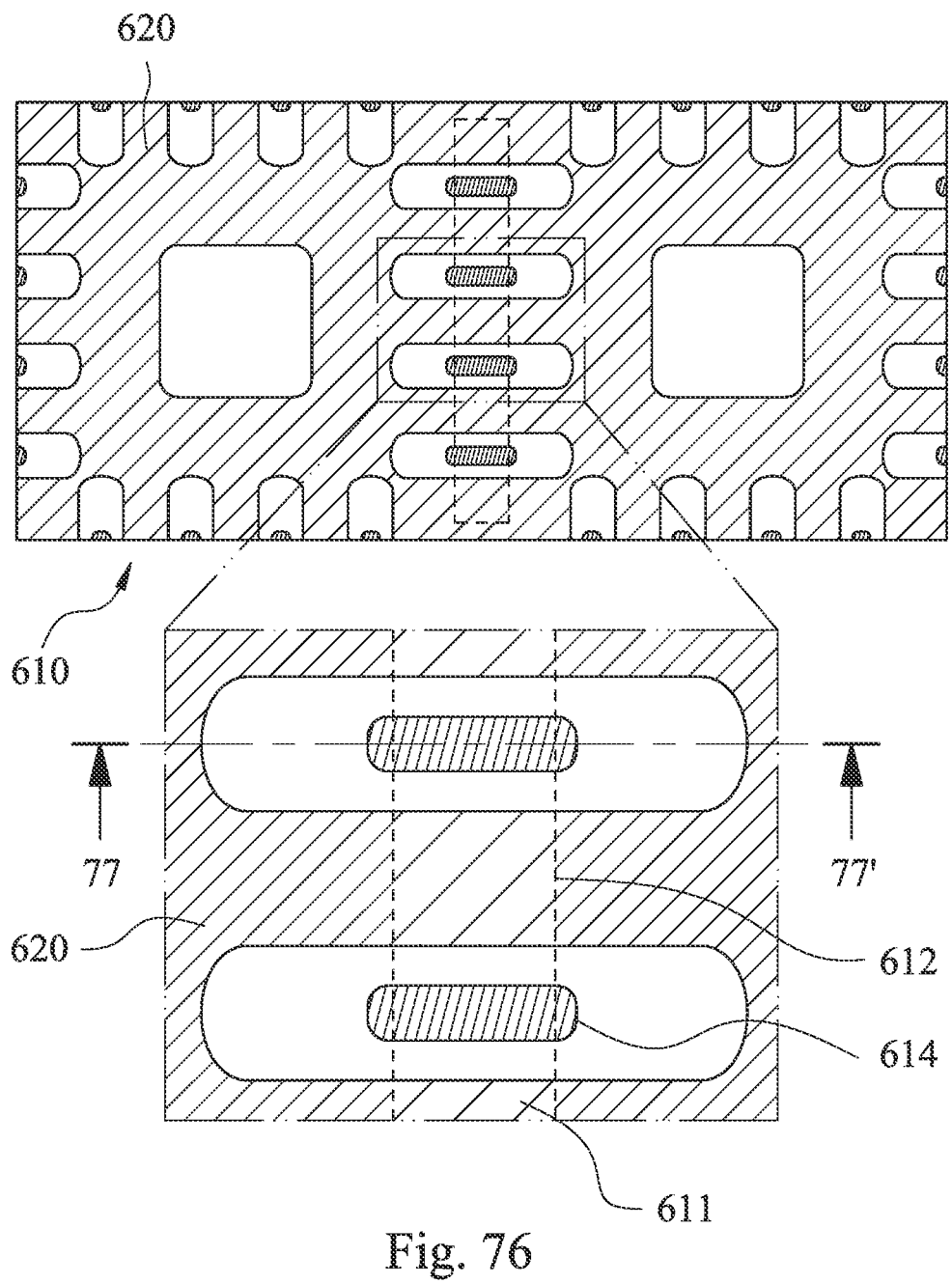
FIG. 76 is a schematic view of the molding step according to the 6th embodiment in FIG. 73.
Figure 77:
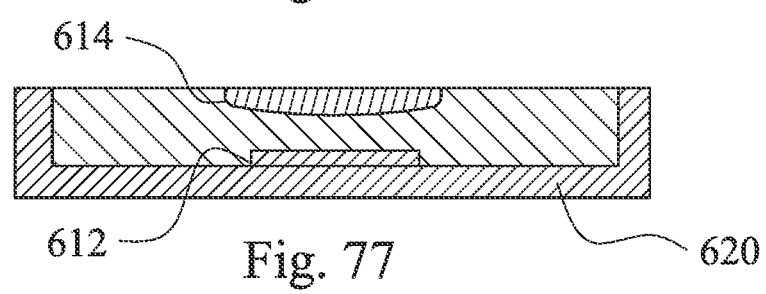
FIG. 77 is a cross-sectional schematic view of the leadframe along a 77-77' line in FIG. 76.

FIG. 76 is a schematic view of the molding step S602 according to the 6th embodiment in FIG. 73. FIG. 77 is a cross-sectional schematic view of the leadframe 610 along a 77-77' line in FIG. 76. In FIGS. 76 and 77, a plastic package material 620 covers on the leadframe 610 before the laser step S603. It should be mentioned that the plastic package material 620 is not disposed in the concave portions 614.

Figure 78:
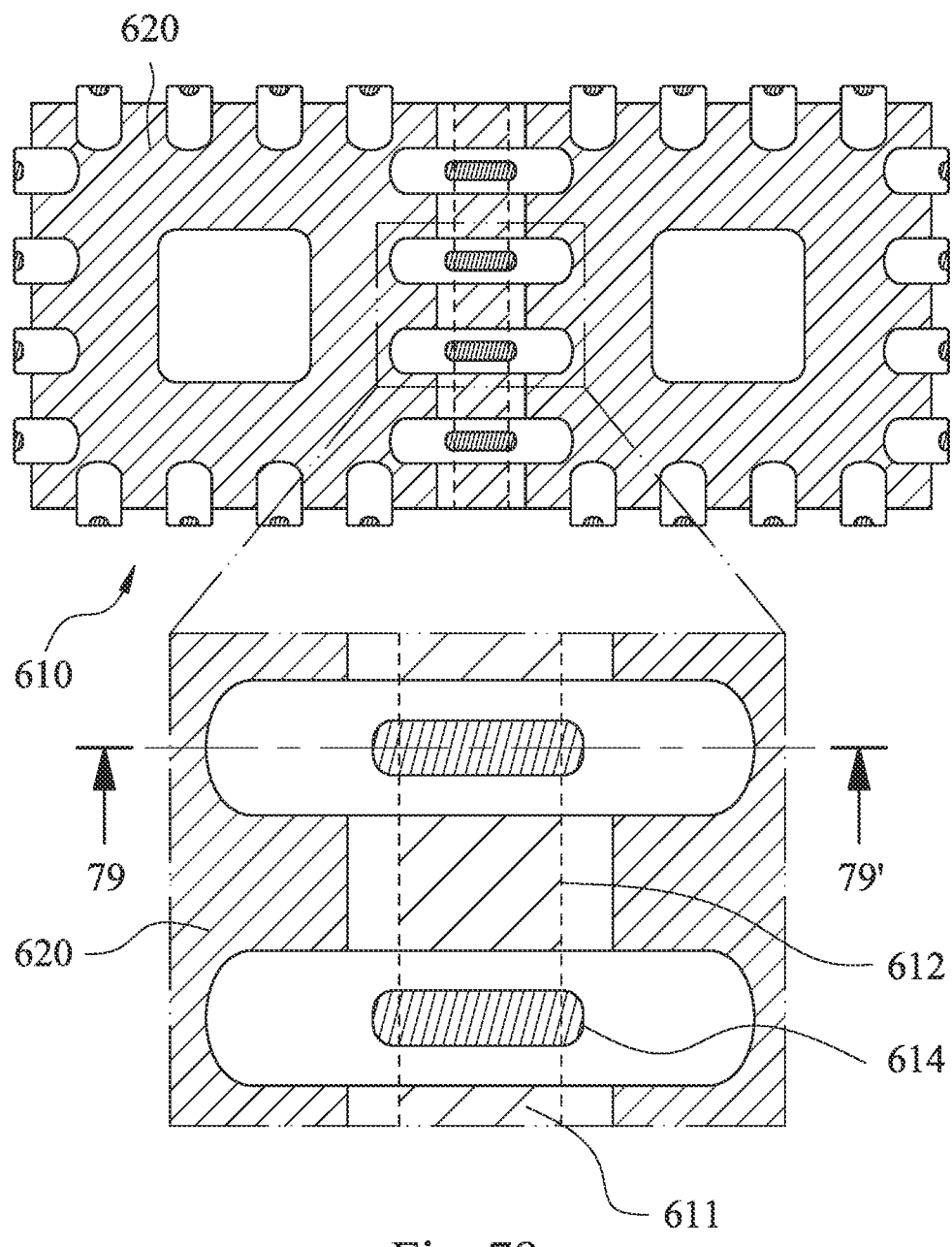
FIG. 78 is a schematic view of the laser step according to the 6th embodiment in FIG. 73.
Figure 79:
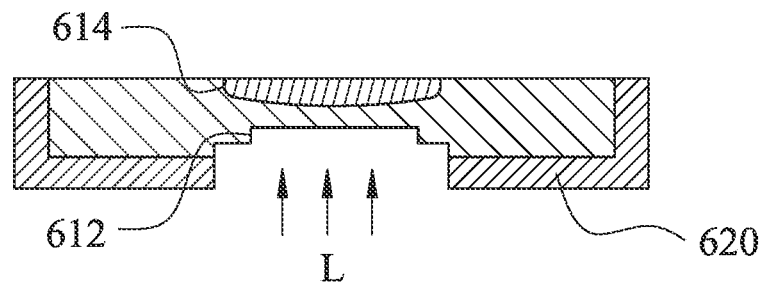
FIG. 79 is a cross-sectional schematic view of the leadframe along a 79-79' line in FIG. 78.

FIG. 78 is a schematic view of the laser step S603 according to the 6th embodiment in FIG. 73. FIG. 79 is a cross-sectional schematic view of the leadframe 610 along a 79-79' line in FIG. 78. In FIGS. 78 and 79, the plastic package material 620 covering on each of the cutting streets 611 is removed via a laser beam L in the laser step S603. In particular, according to the 6th embodiment, the plastic package material 620 covering on an upper surface of each of the cutting streets 611 is removed via the laser beam L in the laser step S603, and a portion of the upper surface of each of the cutting streets 611 of the leadframe 610 is removed via the laser beam L, wherein the plastic package material 620 is only partially removed.

Table 6 shows parameters of the laser beam L in the laser step S603 according to the 6th embodiment, but the present disclosure is not limited to the parameters in Table 6.

TABLE 6

| Laser type | diode end-pumped Nd: YVO$_4$ |
|---|---|
| Output power | 10 W-40 W |
| Wavelength | 355 nm, 532 nm, 1064 nm |
| Pulse frequency | 60 kHz-200 kHz, and CW (continuous-wave) |

Furthermore, the removing targets (for example, a portion of the plastic package material 620 and a portion of the leadframe 610) and the depth thereof can be chosen via the laser step S603. In particular, the laser step S603 can be made up of one or multiple laser beams L, and it depends on the energy and the parameters of the laser beam L. Therefore, the removing range can be effectively controlled. For example, a roughing treatment can be firstly performed via the laser beam L with smaller wavelength (such as 355 nm) to quickly remove the portion of the plastic package material 620 and the portion of the leadframe 610, and then a fine treatment is performed via the laser beam L with lager wavelength (such as 532 nm or 1064 nm) to precisely remove the portion of the plastic package material 620 and the portion of the leadframe 610, but is not limited thereto.

Figure 80:
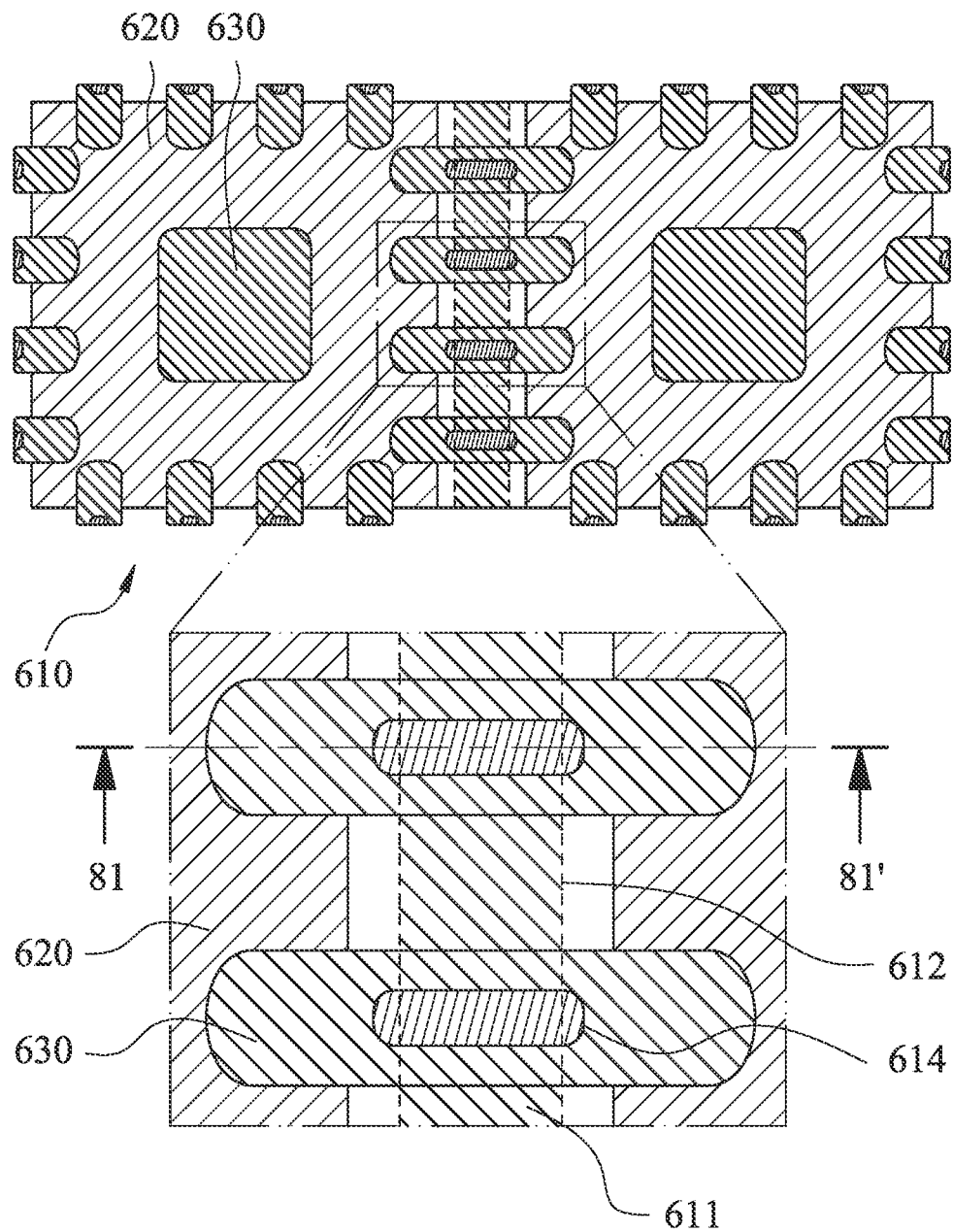
FIG. 80 is a schematic view of the plating step according to the 6th embodiment in FIG. 73.
Figure 81:
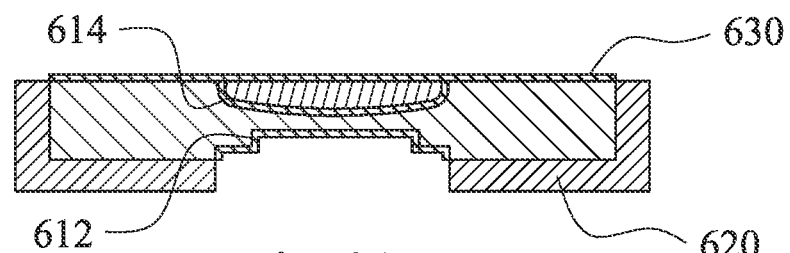
FIG. 81 is a cross-sectional schematic view of the leadframe along an 81-81' line in FIG. 80.

FIG. 80 is a schematic view of the plating step S604 according to the 6th embodiment in FIG. 73. FIG. 81 is a cross-sectional schematic view of the leadframe 610 along an 81-81' line in FIG. 80. In FIGS. 80 and 81, a plurality of plating surfaces 630 are disposed on a plurality of areas of the leadframe 610 without the plastic package material 620.

Figures 82, 83, 84:
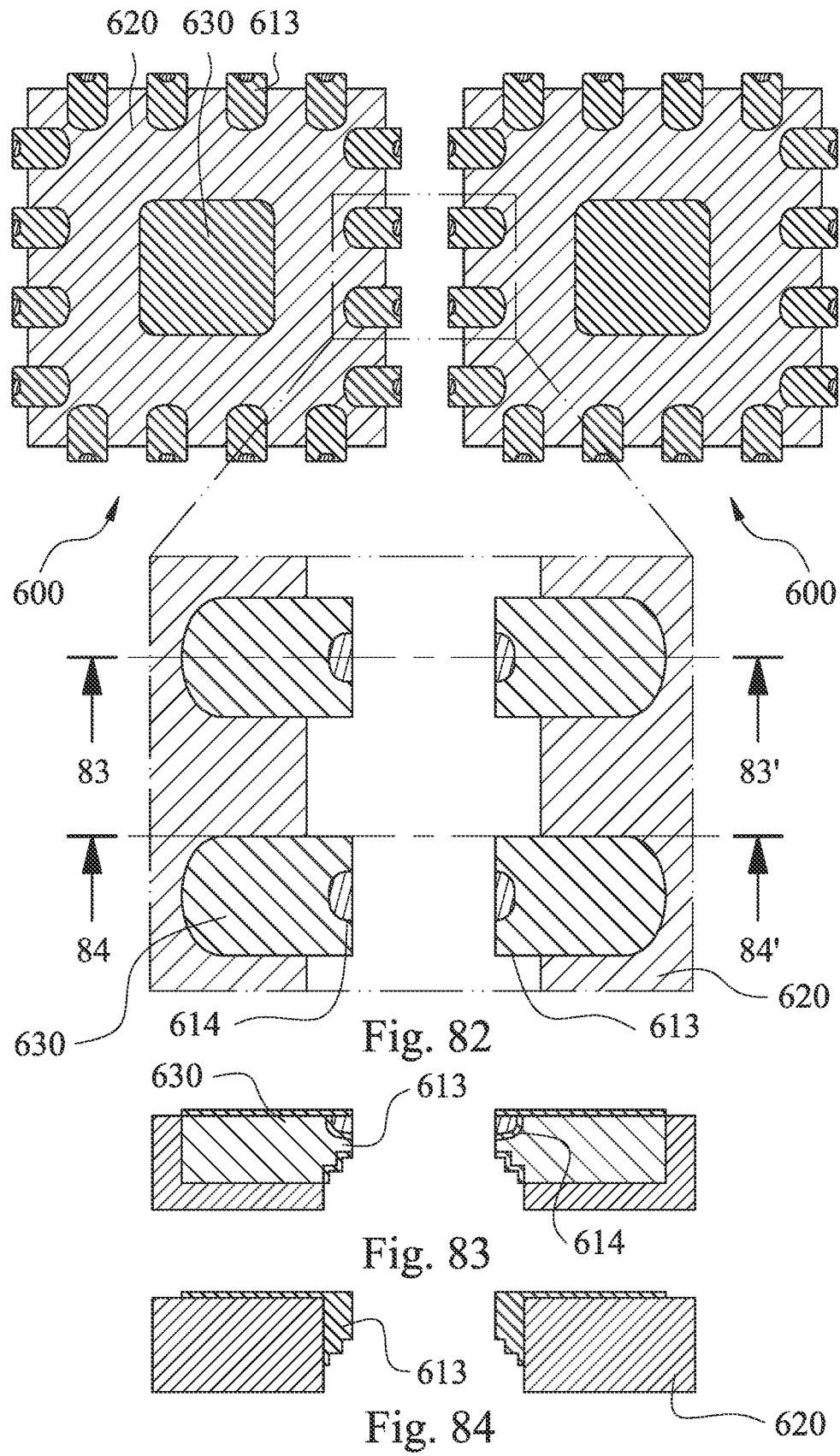
FIG. 82 is a schematic view of the singulation step according to the 6th embodiment in FIG. 73.
FIG. 83 is a cross-sectional schematic view of the package structure along an 83-83' line in FIG. 82.
FIG. 84 is a cross-sectional schematic view of the package structure along an 84-84' line in FIG. 82.

FIG. 82 is a schematic view of the singulation step S605 according to the 6th embodiment in FIG. 73. FIG. 83 is a cross-sectional schematic view of the package structure 600 along an 83-83' line in FIG. 82. FIG. 84 is a cross-sectional schematic view of the package structure 600 along an 84-84' line in FIG. 82. In FIGS. 82 to 84, the cutting streets 611 of the leadframe 610 are cut to form the package structure 600 in the singulation step S605. In detail, the cutting streets 611 of the leadframe 610 are cut via a blade, and a cutting width of the blade is equal to an etching width (that is, a width of each of the etching grooves 612) provided in the etching step S601. Hence, step-shaped leads 613 are formed, and the plating surfaces 630 are disposed on outer surfaces of each of the step-shaped leads 613. Furthermore, a thickness of each of the cutting streets 611 is thinner in the etching step S601, so the burr can be reduced in the singulation step S605.

Figure 85:
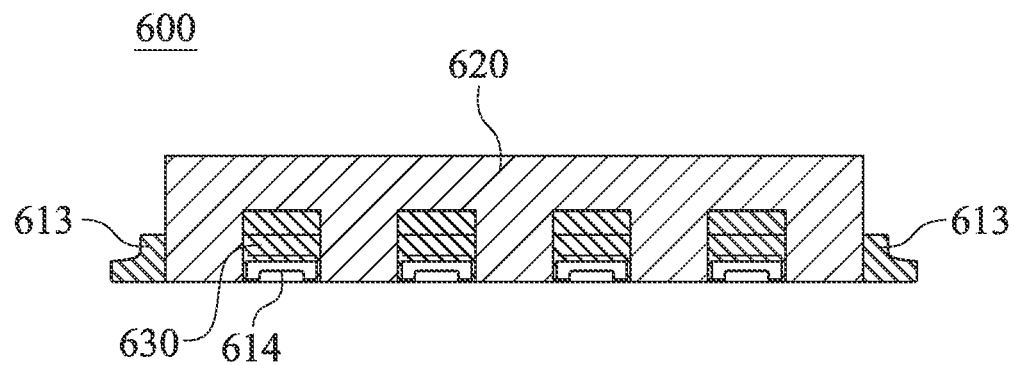
FIG. 85 is a side view of the package structure according to the 6th embodiment in FIG. 73.
Figure 86:
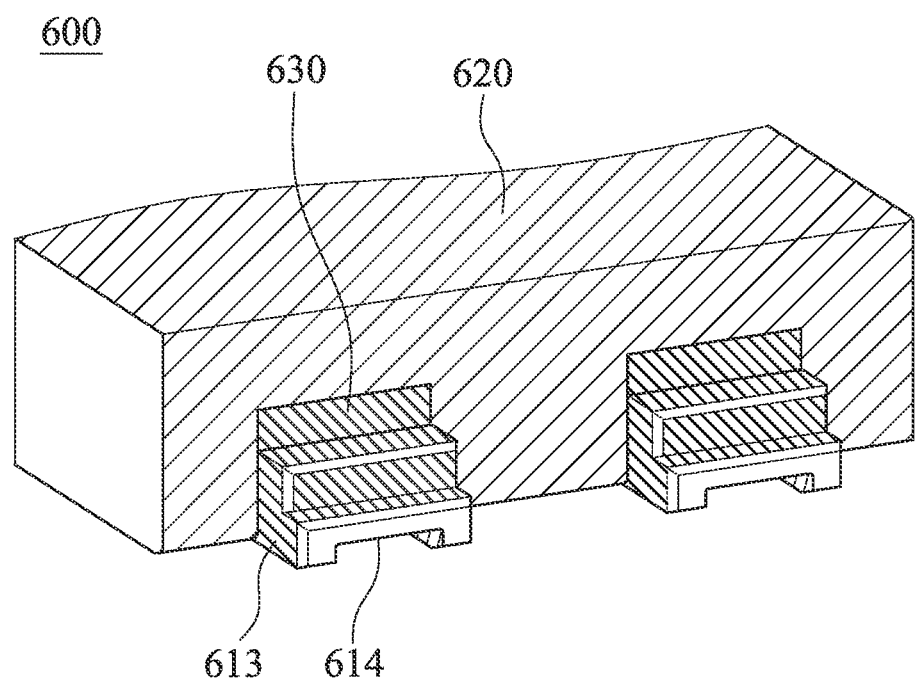
FIG. 86 is a partial schematic view of the package structure according to the 6th embodiment in FIG. 73.

FIG. 85 is a side view of the package structure 600 according to the 6th embodiment in FIG. 73. FIG. 86 is a partial schematic view of the package structure 600 according to the 6th embodiment in FIG. 73. In FIGS. 85 and 86, the package structure 600 includes the step-shaped leads 613, the step-shaped leads 613 protrude an edge of the plastic package material 620, each of the step-shaped leads 613 includes ten plating surfaces 630, and each of the step-shaped leads 613 close to a lower surface of the package structure 600 protrudes the edge of the plastic package material 620.

Hence, according to the 6th embodiment, by the method of forming the package structure S600, the solderable area of each of the sides of the package structure 600 can be increased. Therefore, the connection strength between the step-shaped leads 613 and the circuit board can be enhanced to maintain and increase the lifetime of the package structure 600 disposed on the circuit board, and the reliability of the board level can be further enhanced.

Figure 87:
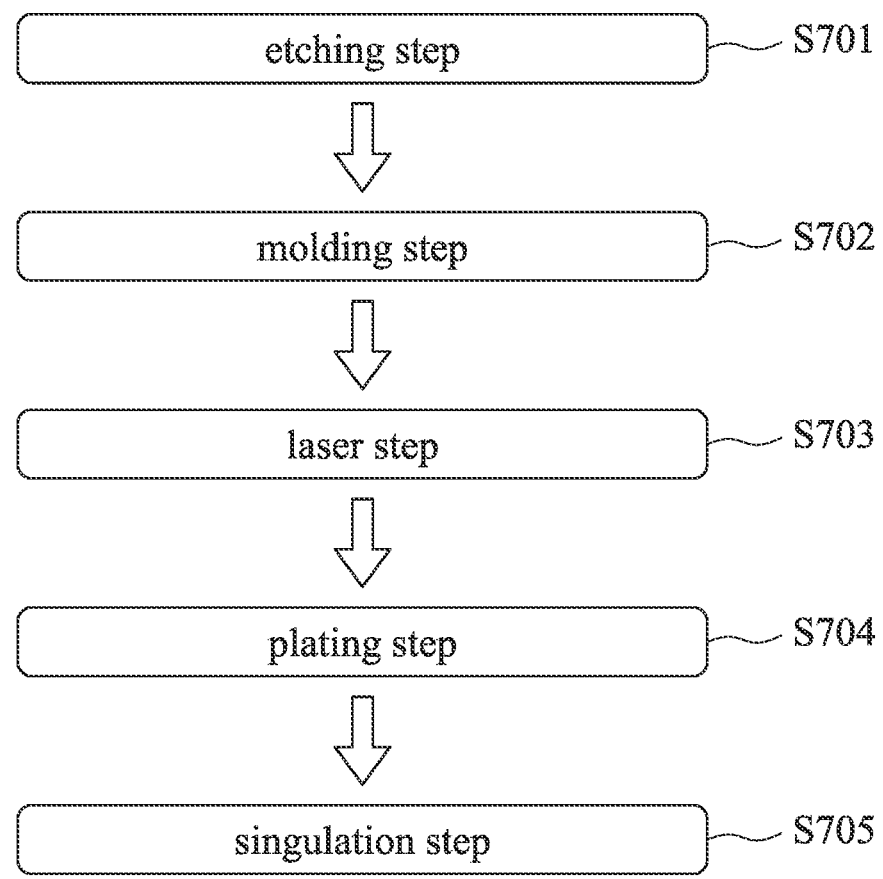
FIG. 87 is a step flow chart of a method of forming a package structure according to the 7th embodiment of the present disclosure.

FIG. 87 is a step flow chart of a method of forming a package structure S700 according to the 7th embodiment of the present disclosure. In FIG. 87, the method of forming the package structure S700 includes an etching step S701, a molding step S702, a laser step S703, a plating step S704 and a singulation step S705.

Figure 88:
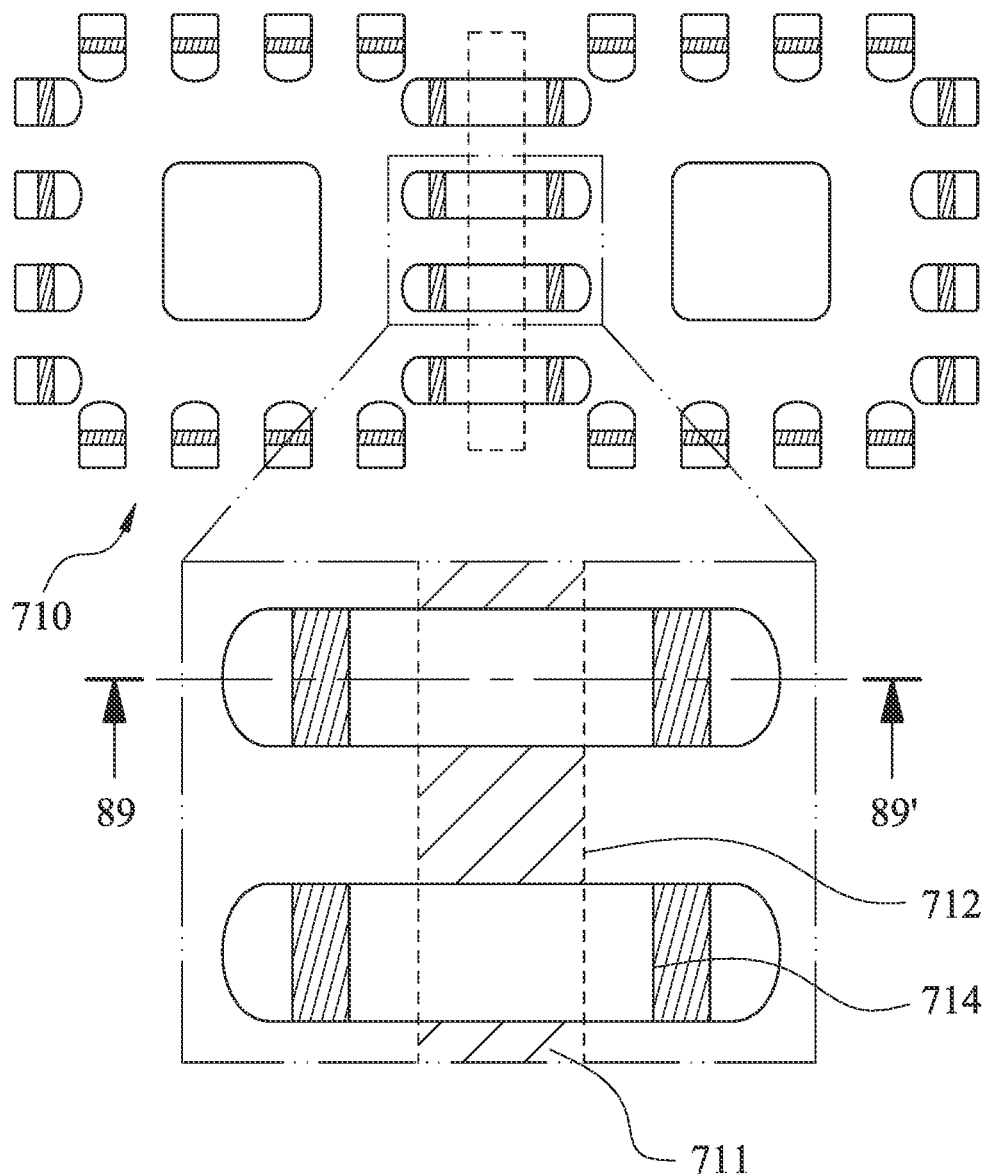
FIG. 88 is a schematic view of the etching step according to the 7th embodiment in FIG. 87.
Figure 89:
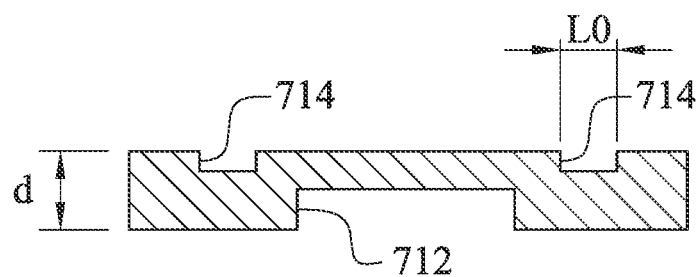
FIG. 89 is a cross-sectional schematic view of the leadframe along an 89-89' line in FIG. 88.

FIG. 88 is a schematic view of the etching step S701 according to the 7th embodiment in FIG. 87. FIG. 89 is a cross-sectional schematic view of the leadframe 710 along an 89-89' line in FIG. 88. In FIGS. 88 and 89, a plurality of cutting streets 711 of the leadframe 710 are etched in the etching step S701. According to the 7th embodiment, an upper surface of each of the cutting streets 711 of the leadframe 710 is etched to form an etching groove 712, and an etching depth can be equal to half of a thickness of the leadframe 710, but is not limited thereto. Further, each of the cutting streets 711 can have a plurality of concave portions 714, a concave depth of each of the concave portions 714 can be smaller than half of the thickness of the leadframe 710, a width of each of the concave portions 714 can be smaller than a width of each of the etching grooves 712, and each of the concave portions 714 are located on two sides of each of the cutting streets 711. In particular, when the width of each of the concave portions 714 is L0, and the thickness of the leadframe 710 is d, the following condition can be satisfied: 0.5 d≤L0, but is not limited thereto.

Figure 90:
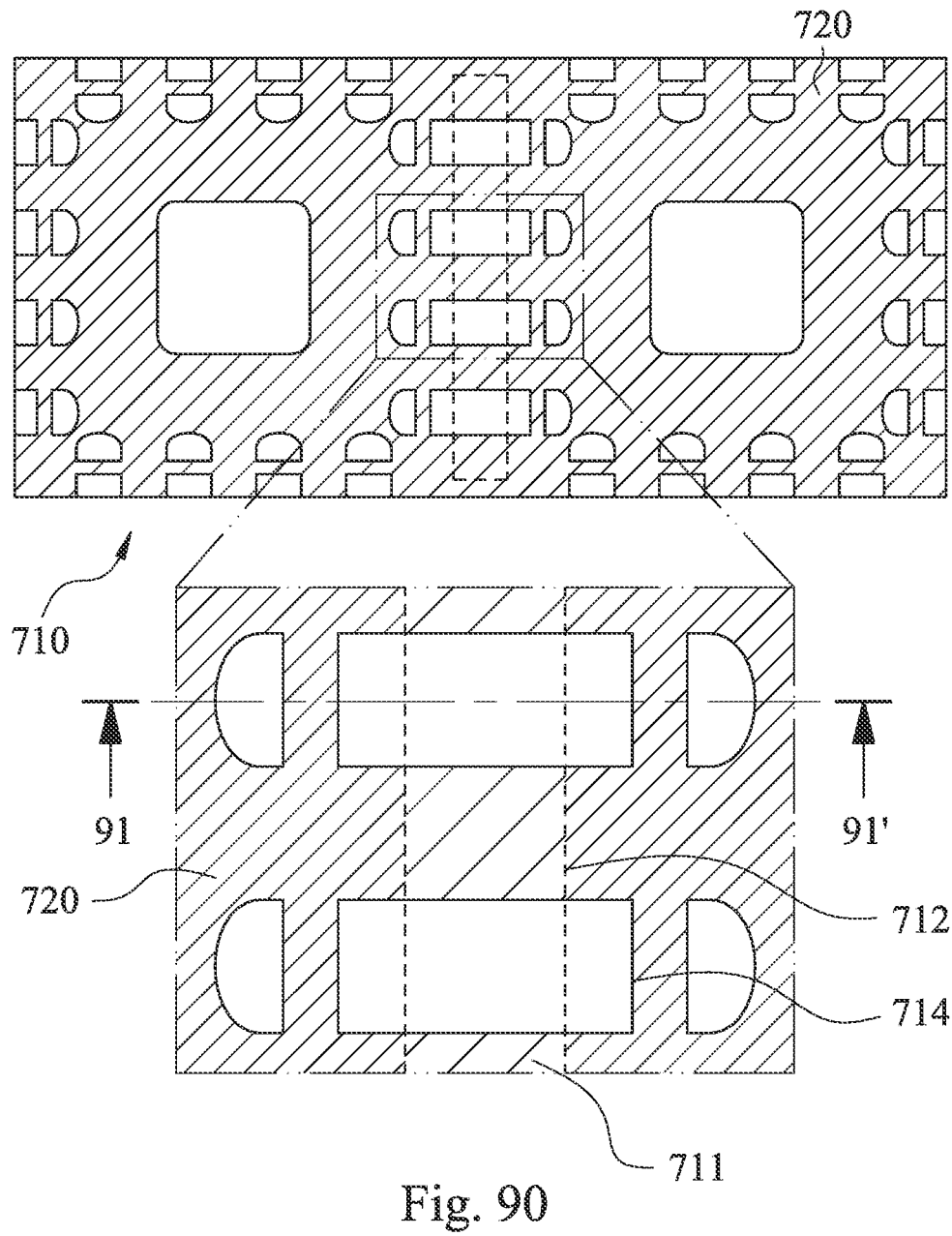
FIG. 90 is a schematic view of the molding step according to the 7th embodiment in FIG. 87.
Figure 91:
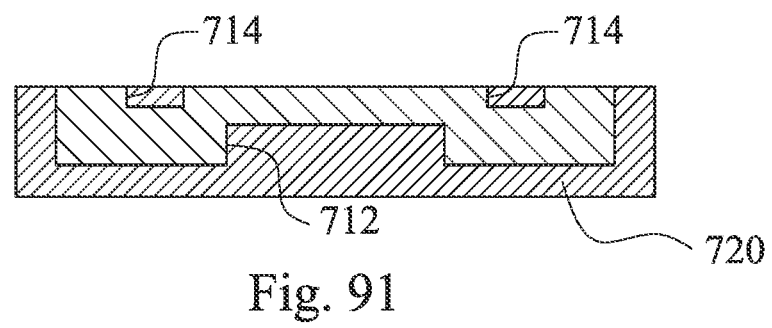
FIG. 91 is a cross-sectional schematic view of the leadframe along a 91-91' line in FIG. 90.

FIG. 90 is a schematic view of the molding step S702 according to the 7th embodiment in FIG. 87. FIG. 91 is a cross-sectional schematic view of the leadframe 710 along a 91-91' line in FIG. 90. In FIGS. 90 and 91, a plastic package material 720 covers on the leadframe 710 before the laser step S703.

Figure 92:
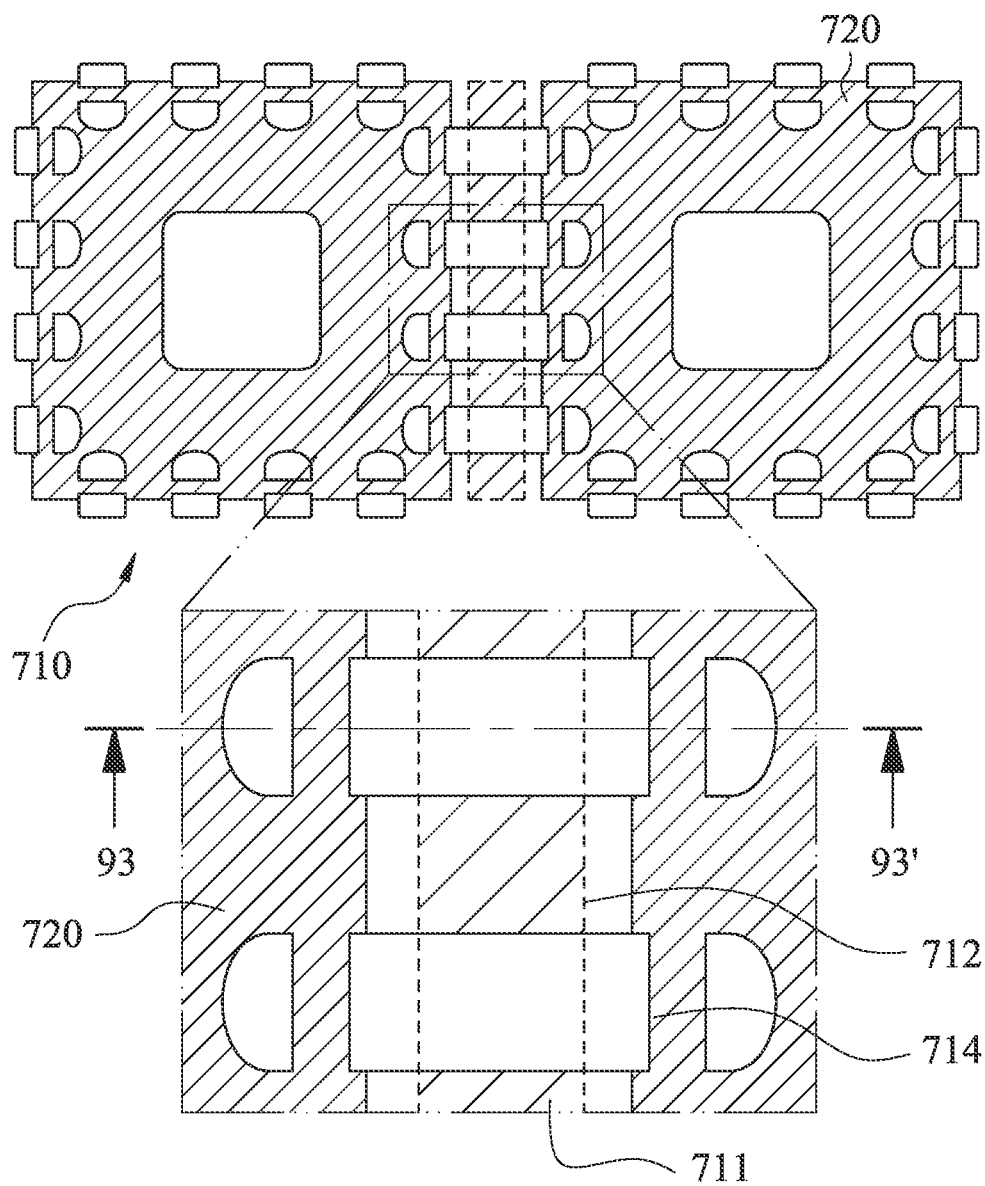
FIG. 92 is a schematic view of the laser step according to the 7th embodiment in FIG. 87.
Figure 93:
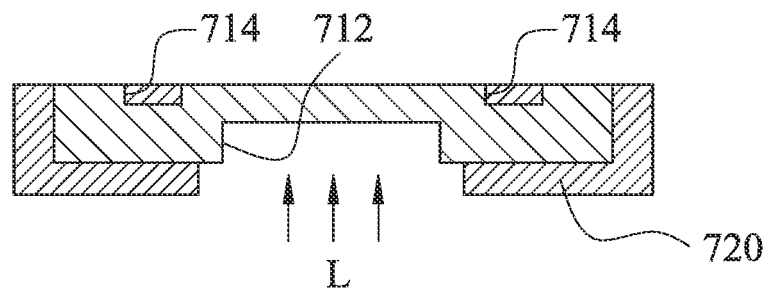
FIG. 93 is a cross-sectional schematic view of the leadframe along a 93-93' line in FIG. 92.

FIG. 92 is a schematic view of the laser step S703 according to the 7th embodiment in FIG. 87. FIG. 93 is a cross-sectional schematic view of the leadframe 710 along a 93-93' line in FIG. 92. In FIGS. 92 and 93, the plastic package material 720 covering on each of the cutting streets 711 is removed via a laser beam L in the laser step S703. In particular, according to the 7th embodiment, the plastic package material 720 covering on the upper surface of each of the cutting streets 711 is removed via the laser beam L in the laser step S703, and the plastic package material 720 is only partially removed. It should be mentioned that the upper surface of each of the cutting streets 711 is irradiated via the laser beam L to remove the plastic package material 720, and the plastic package material 720 disposed in each of the concave portions 714 is not irradiated via the laser beam L. Hence, the plastic package material 720 disposed in each of the concave portions 714 is remained thereof.

Table 7 shows parameters of the laser beam L in the laser step S703 according to the 7th embodiment, but the present disclosure is not limited to the parameters in Table 7.

TABLE 7

| | |
|---|---|
| Laser type | diode end-pumped Nd: YVO$_4$ |
| Output power | 10 W-40 W |
| Wavelength | 355 nm, 532 nm, 1064 nm |
| Pulse frequency | 60 kHz-200 kHz, and CW (continuous-wave) |

Furthermore, the removing targets (for example, a portion of the plastic package material 720) and the depth thereof can be chosen via the laser step S703. In particular, the laser step S703 can be made up of one or multiple laser beams L, and it depends on the energy and the parameters of the laser beam L. Therefore, the removing range can be effectively controlled. For example, a roughing treatment can be firstly performed via the laser beam L with smaller wavelength (such as 355 nm) to quickly remove the portion of the plastic package material 720, and then a fine treatment is performed via the laser beam L with lager wavelength (such as 532 nm or 1064 nm) to precisely remove the portion of the plastic package material 720, but is not limited thereto.

Figure 94:
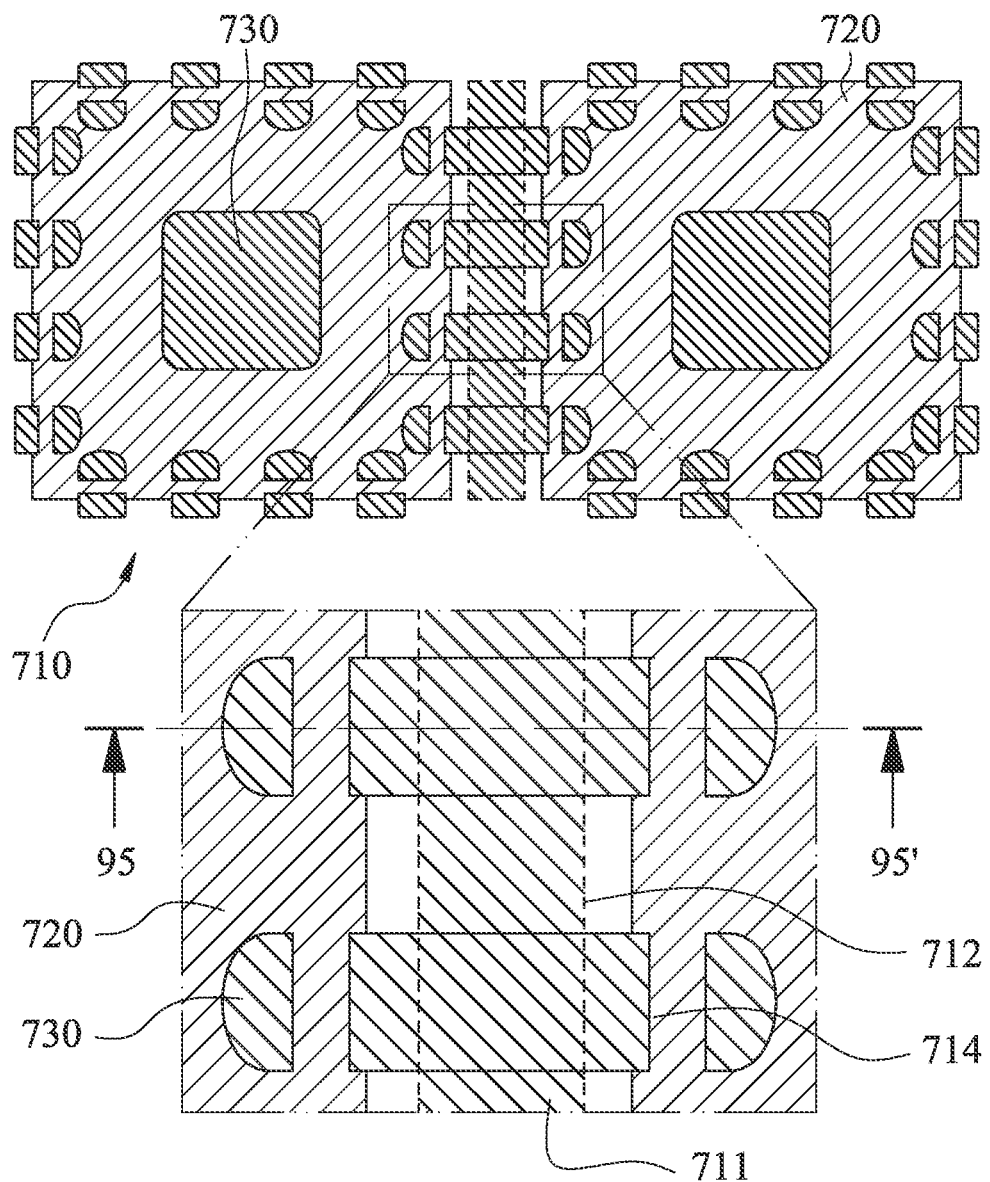
FIG. 94 is a schematic view of the plating step according to the 7th embodiment in FIG. 87.
Figure 95:
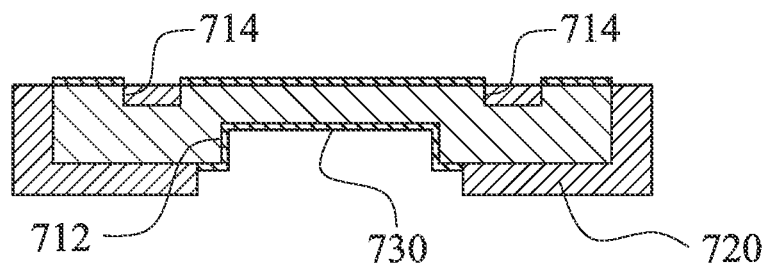
FIG. 95 is a cross-sectional schematic view of the leadframe along a 95-95' line in FIG. 94.

FIG. 94 is a schematic view of the plating step S704 according to the 7th embodiment in FIG. 87. FIG. 95 is a cross-sectional schematic view of the leadframe 710 along a 95-95' line in FIG. 94. In FIGS. 94 and 95, a plurality of plating surfaces 730 are disposed on a plurality of areas of the leadframe 710 without the plastic package material 720.

Figure 96:
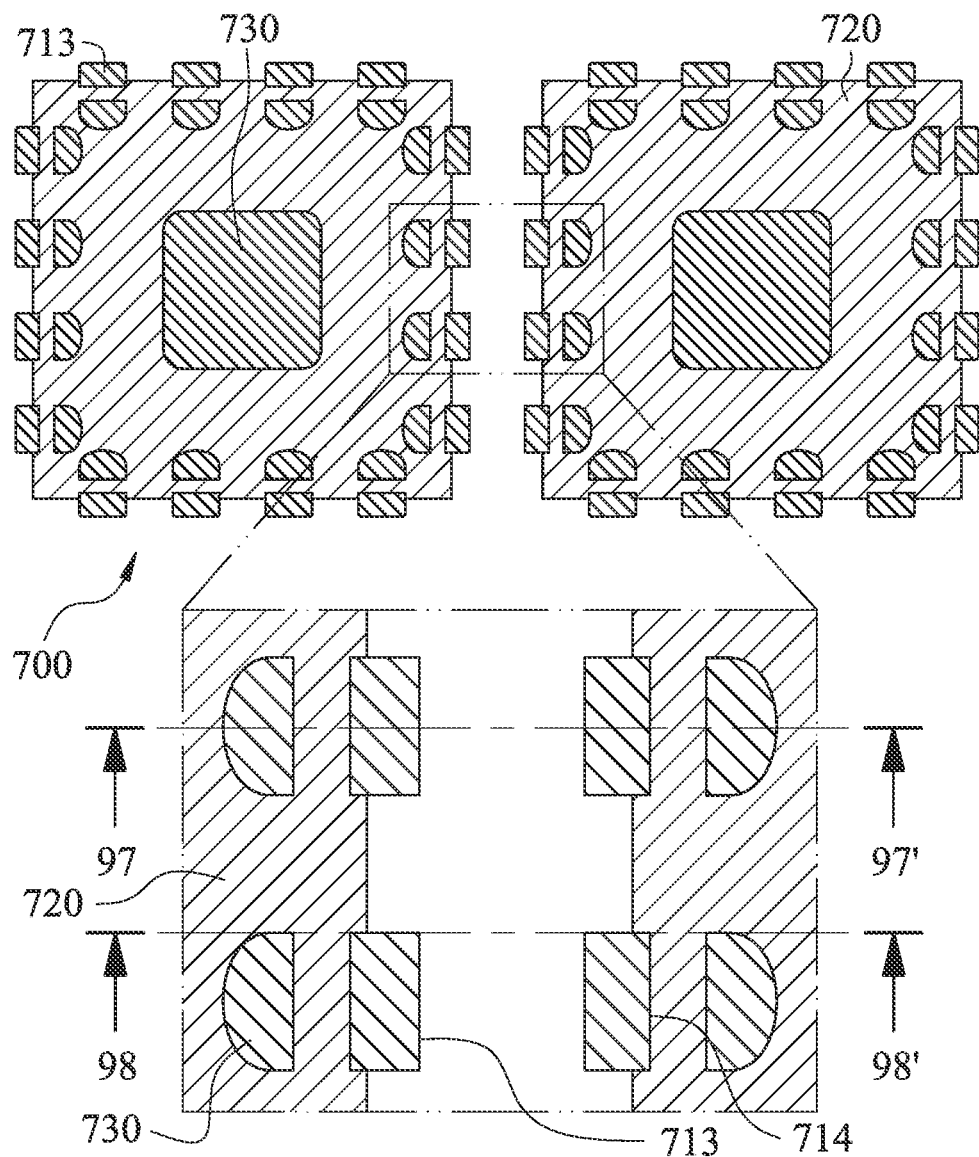
FIG. 96 is a schematic view of the singulation step according to the 7th embodiment in FIG. 87.
Figure 97:
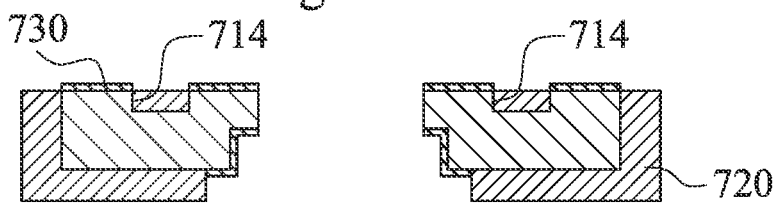
FIG. 97 is a cross-sectional schematic view of the package structure along a 97-97' line in FIG. 96.
Figure 98:
FIG. 98 is a cross-sectional schematic view of the package structure along a 98-98' line in FIG. 96.

FIG. 96 is a schematic view of the singulation step S705 according to the 7th embodiment in FIG. 87. FIG. 97 is a cross-sectional schematic view of the package structure 700 along a 97-97' line in FIG. 96. FIG. 98 is a cross-sectional schematic view of the package structure 700 along a 98-98' line in FIG. 96. In FIGS. 96 to 98, the cutting streets 711 of the leadframe 710 are cut to form the package structure 700 in the singulation step S705. In detail, the cutting streets 711 of the leadframe 710 are cut via a blade, and a cutting width of the blade is smaller than an etching width (that is, a width of each of the etching grooves 712) provided in the etching step S701. Hence, protruding leads 713 are formed, and the plating surfaces 730 are disposed on outer surfaces of each of the protruding leads 713. Furthermore, a thickness of each of the cutting streets 711 is thinner in the etching step S701, so the burr can be reduced in the singulation step S705.

Figure 99:
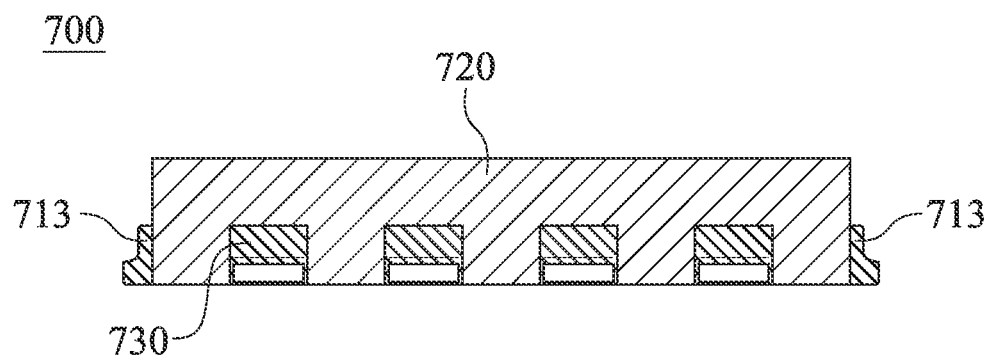
FIG. 99 is a side view of the package structure according to the 7th embodiment in FIG. 87.
Figure 100:
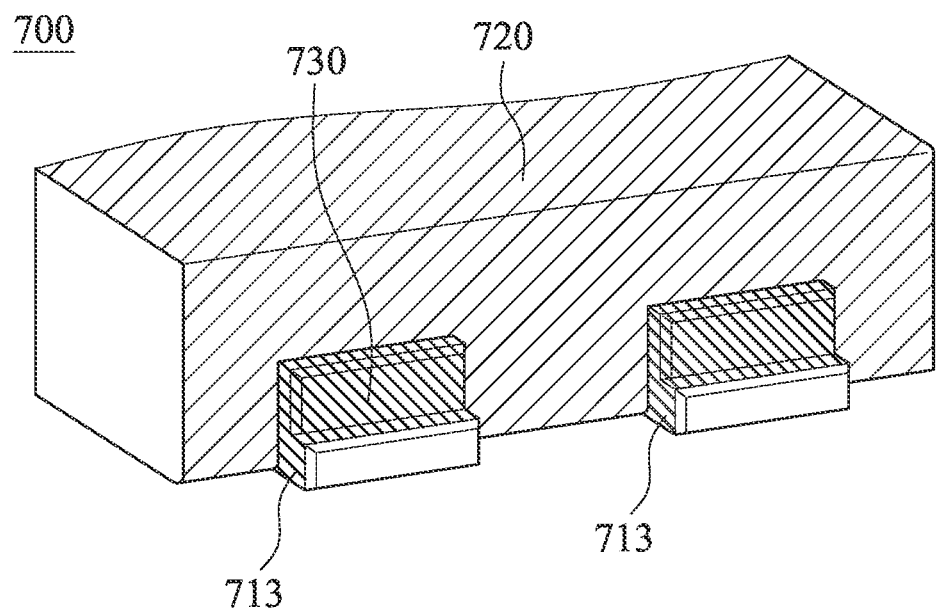
FIG. 100 is a partial schematic view of the package structure according to the 7th embodiment in FIG. 87.

FIG. 99 is a side view of the package structure 700 according to the 7th embodiment in FIG. 87. FIG. 100 is a partial schematic view of the package structure 700 according to the 7th embodiment in FIG. 87. In FIGS. 99 and 100, the package structure 700 includes the protruding leads 713, the protruding leads 713 protrude an edge of the plastic package material 720, each of the protruding leads 713 includes seven plating surfaces 730, and each of the protruding leads 713 close to a lower surface of the package structure 700 protrudes the edge of the plastic package material 720.

Hence, according to the 7th embodiment, by the method of forming the package structure S700, the solderable area of each of the sides of the package structure 700 can be increased. Furthermore, in FIG. 97, a portion of each of the protruding leads 713 protruding the plastic package material 720 and covered via the plastic package material 720 is like gull-wing shape, so the mechanical strength of the protruding leads 713 can be more robust. Therefore, the connection strength between the protruding leads 713 and the circuit board can be enhanced to maintain and increase the lifetime of the package structure 700 disposed on the circuit board, and the reliability of the board level can be further enhanced.

Figure 101:
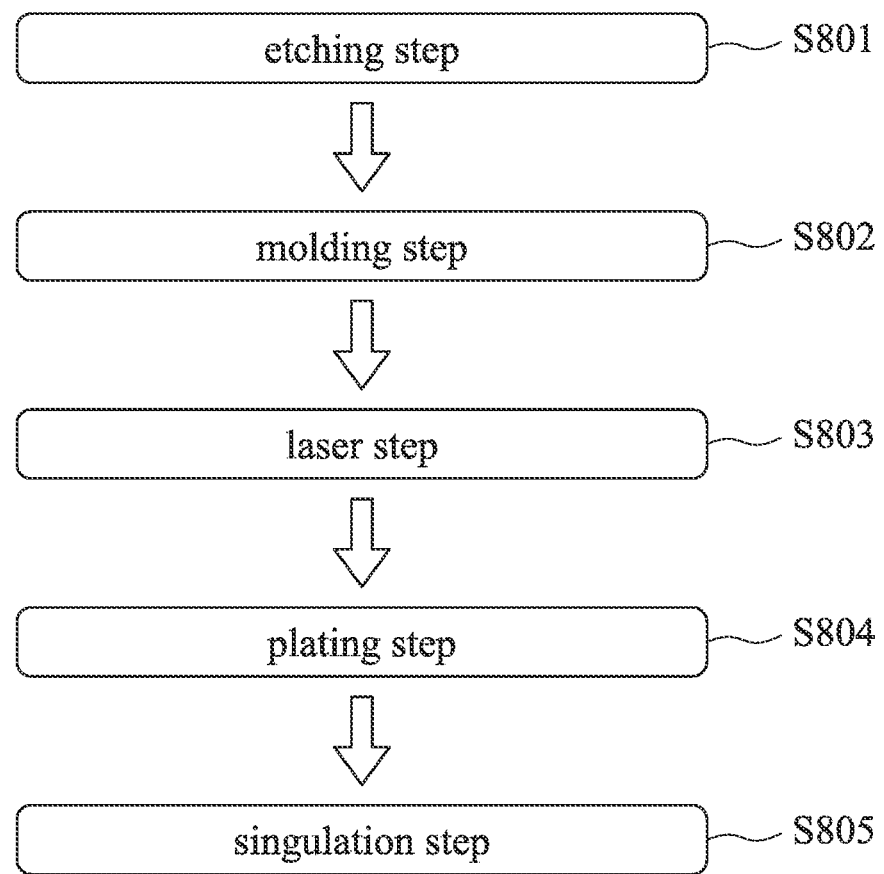
FIG. 101 is a step flow chart of a method of forming a package structure according to the 8th embodiment of the present disclosure.

FIG. 101 is a step flow chart of a method of forming a package structure S800 according to the 8th embodiment of the present disclosure. In FIG. 101, the method of forming the package structure S800 includes an etching step S801, a molding step S802, a laser step S803, a plating step S804 and a singulation step S805.

Figure 102:
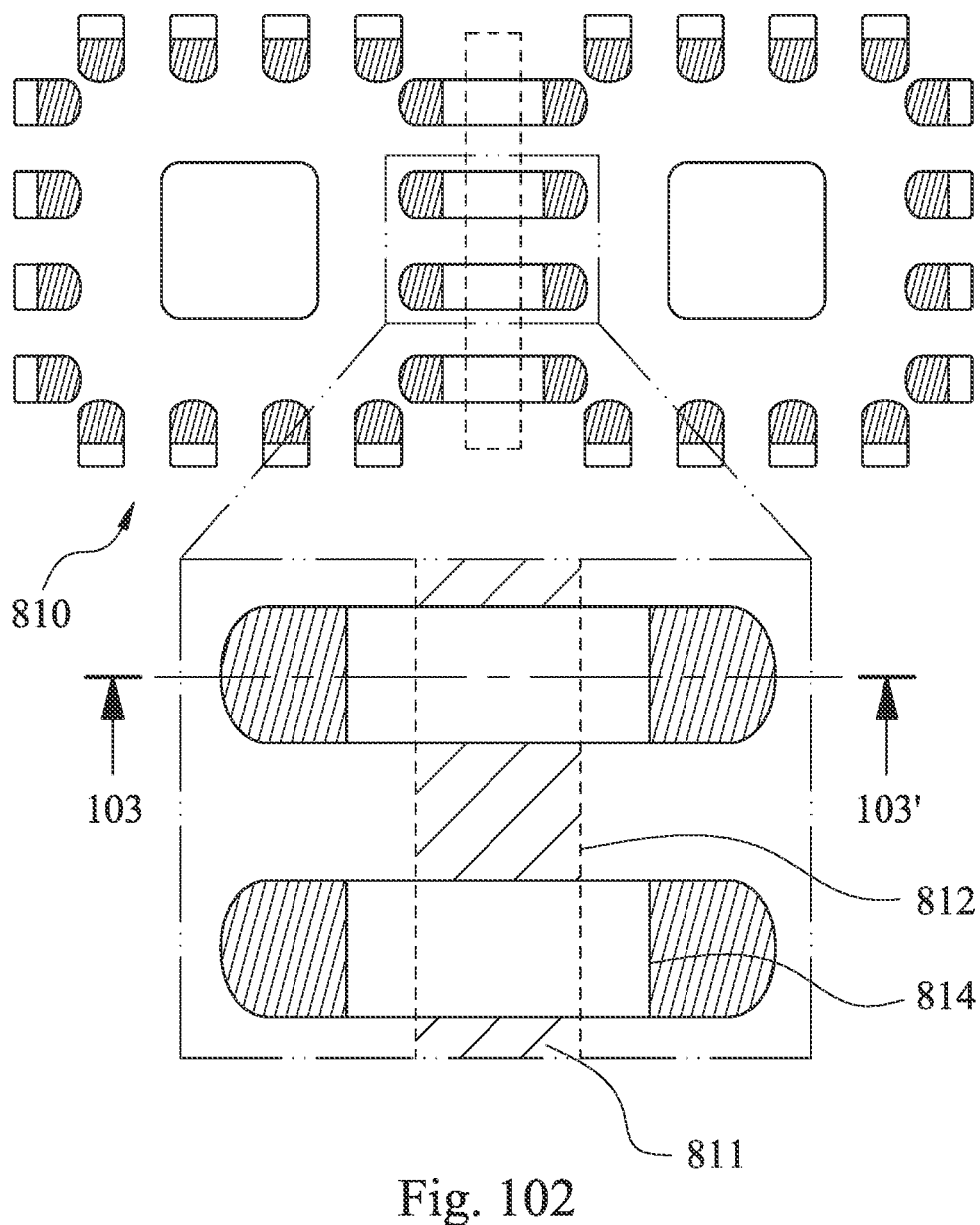
FIG. 102 is a schematic view of the etching step according to the 8th embodiment in FIG. 101.
Figure 103:
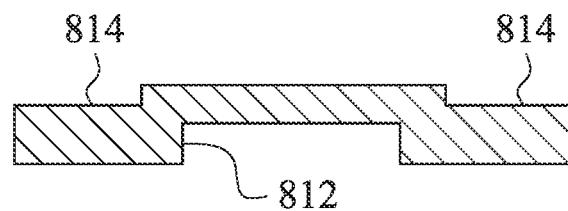
FIG. 103 is a cross-sectional schematic view of the leadframe along a 103-103' line in FIG. 102.

FIG. 102 is a schematic view of the etching step S801 according to the 8th embodiment in FIG. 101. FIG. 103 is a cross-sectional schematic view of the leadframe 810 along a 103-103' line in FIG. 102. In FIGS. 102 and 103, a plurality of cutting streets 811 of the leadframe 810 are etched in the etching step S801. According to the 8th embodiment, an upper surface of each of the cutting streets 811 of the leadframe 810 is etched to form an etching groove 812, and an etching depth can be equal to half of a thickness of the leadframe 810, but is not limited thereto. Further, each of the cutting streets 811 can have a plurality of concave portions 814, a concave depth of each of the concave portions 814 can be smaller than half of the thickness of the leadframe 810, a width of each of the concave portions 814 can be smaller than a width of each of the etching grooves 812, and each of the concave portions 814 are located on two sides of each of the cutting streets 811.

Figure 104:
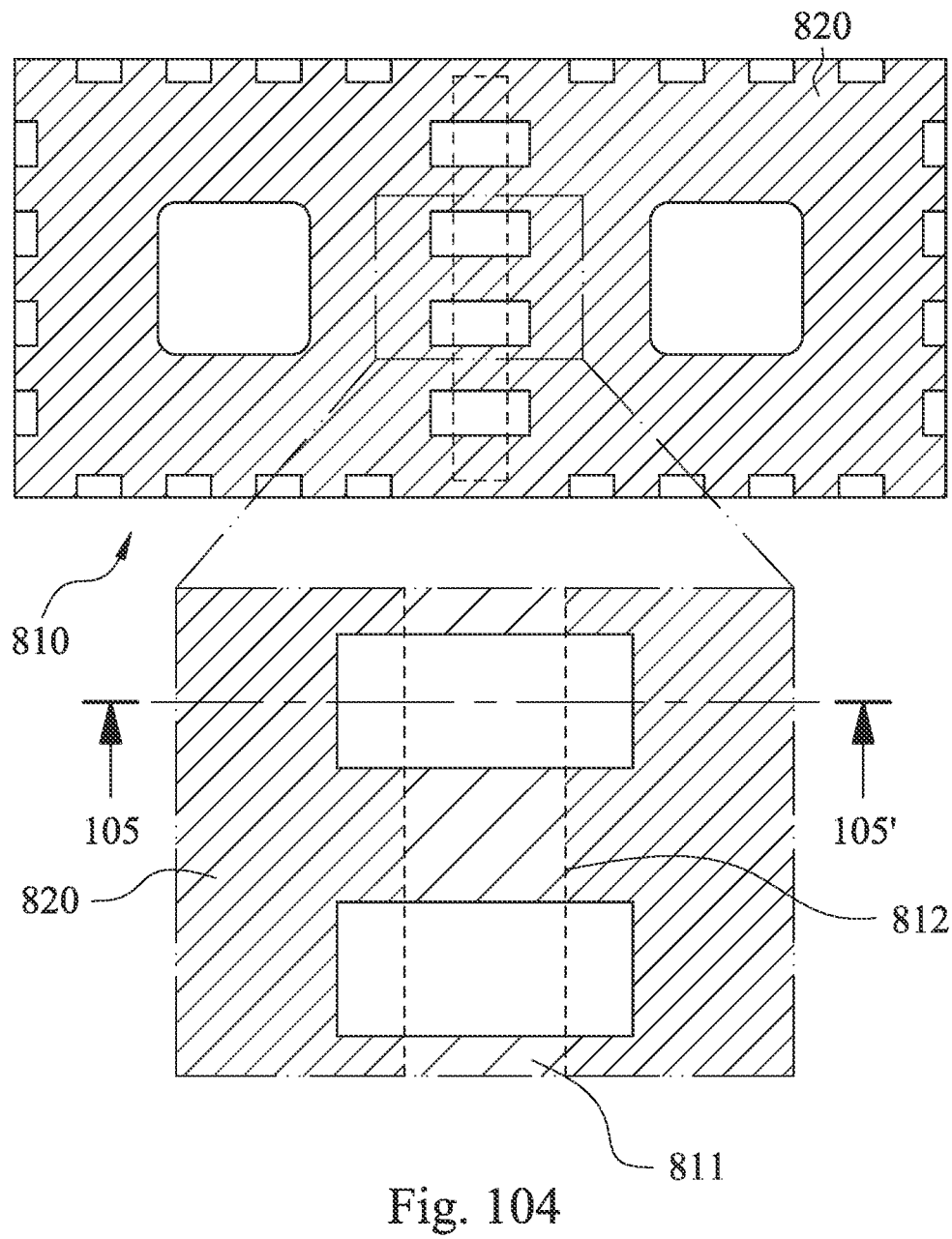
FIG. 104 is a schematic view of the molding step according to the 8th embodiment in FIG. 101.
Figure 105:
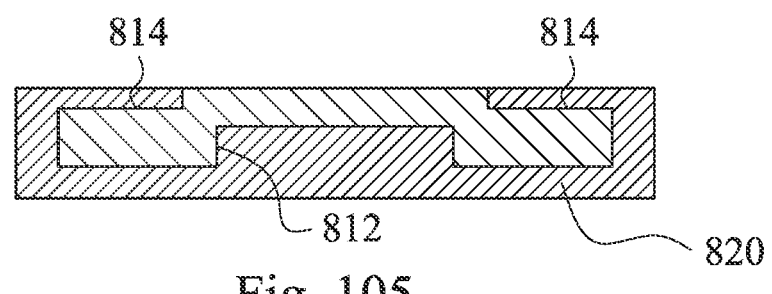
FIG. 105 is a cross-sectional schematic view of the leadframe along a 105-105' line in FIG. 104.

FIG. 104 is a schematic view of the molding step S802 according to the 8th embodiment in FIG. 101. FIG. 105 is a cross-sectional schematic view of the leadframe 810 along a 105-105' line in FIG. 104. In FIGS. 104 and 105, a plastic package material 820 covers on the leadframe 810 before the laser step S803.

Figure 106:
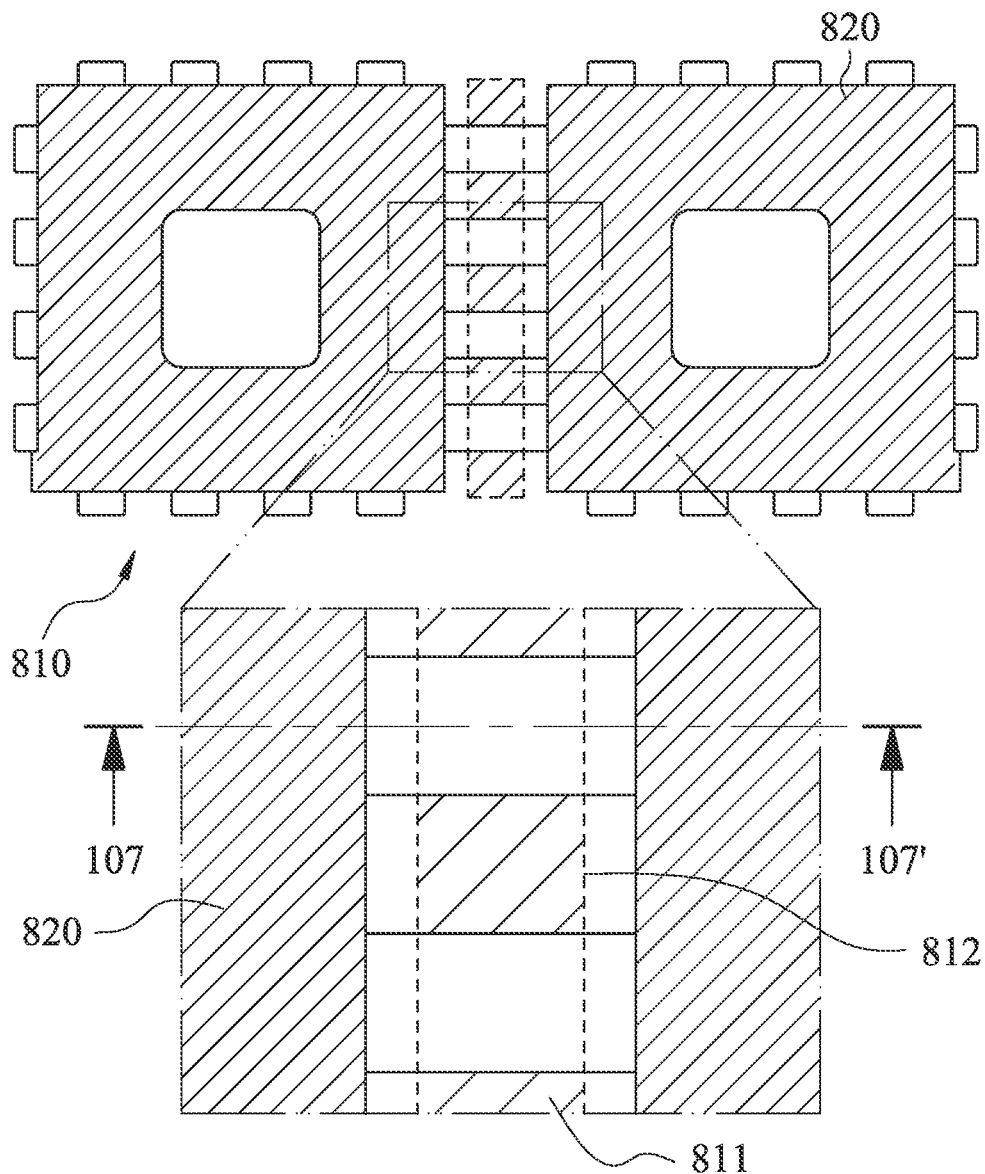
FIG. 106 is a schematic view of the laser step according to the 8th embodiment in FIG. 101.
Figure 107:
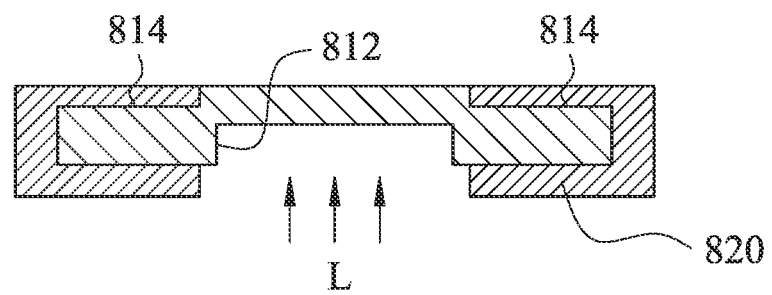
FIG. 107 is a cross-sectional schematic view of the leadframe along a 107-107' line in FIG. 106.

FIG. 106 is a schematic view of the laser step S803 according to the 8th embodiment in FIG. 101. FIG. 107 is a cross-sectional schematic view of the leadframe 810 along a 107-107' line in FIG. 106. In FIGS. 106 and 107, the plastic package material 820 covering on each of the cutting streets 811 is removed via a laser beam L in the laser step S803. In particular, according to the 8th embodiment, the plastic package material 820 covering on the upper surface of each of the cutting streets 811 is removed via the laser beam L in the laser step S803, and the plastic package material 820 is only partially removed. It should be mentioned that the upper surface of each of the cutting streets 811 is irradiated via the laser beam L to remove the plastic package material 820, and the plastic package material 820 disposed in each of the concave portions 814 is not irradiated via the laser beam L. Hence, the plastic package material 820 disposed in each of the concave portions 814 is remained thereof.

Table 8 shows parameters of the laser beam L in the laser step S803 according to the 8th embodiment, but the present disclosure is not limited to the parameters in Table 8.

TABLE 8

| Laser type | diode end-pumped Nd: $YVO_4$ |
|---|---|
| Output power | 10 W-40 W |
| Wavelength | 355 nm, 532 nm, 1064 nm |
| Pulse frequency | 60 kHz-200 kHz, and CW (continuous-wave) |

Furthermore, the removing targets (for example, a portion of the plastic package material 820) and the depth thereof can be chosen via the laser step S803. In particular, the laser step S803 can be made up of one or multiple laser beams L, and it depends on the energy and the parameters of the laser beam L. Therefore, the removing range can be effectively controlled. For example, a roughing treatment can be firstly performed via the laser beam L with smaller wavelength (such as 355 nm) to quickly remove the portion of the plastic package material 820, and then a fine treatment is performed via the laser beam L with lager wavelength (such as 532 nm or 1064 nm) to precisely remove the portion of the plastic package material 820, but is not limited thereto.

Figure 108:
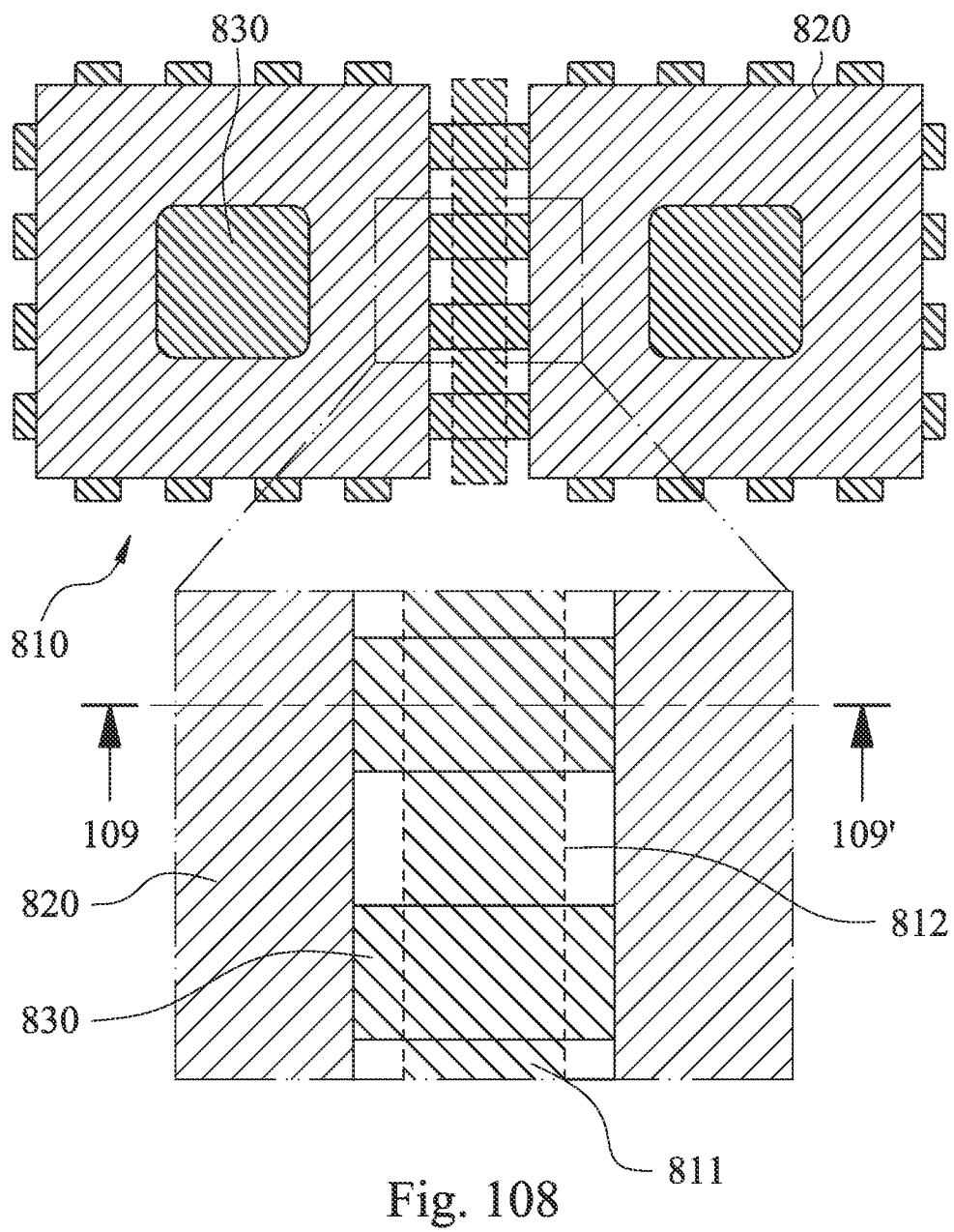
FIG. 108 is a schematic view of the plating step according to the 8th embodiment in FIG. 101.
Figure 109:
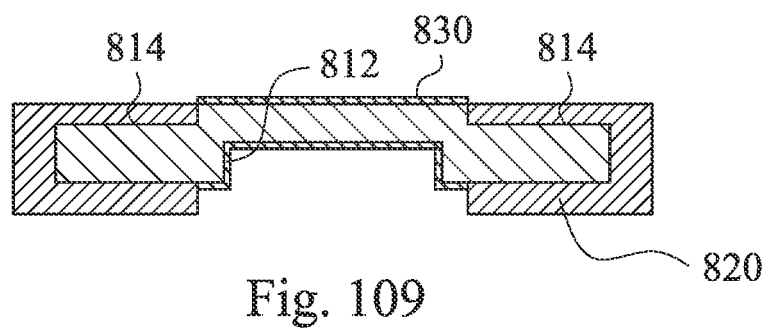
FIG. 109 is a cross-sectional schematic view of the leadframe along a 109-109' line in FIG. 108.

FIG. 108 is a schematic view of the plating step S804 according to the 8th embodiment in FIG. 101. FIG. 109 is a cross-sectional schematic view of the leadframe 810 along a 109-109' line in FIG. 108. In FIGS. 108 and 109, a plurality of plating surfaces 830 are disposed on a plurality of areas of the leadframe 810 without the plastic package material 820.

Figure 110:
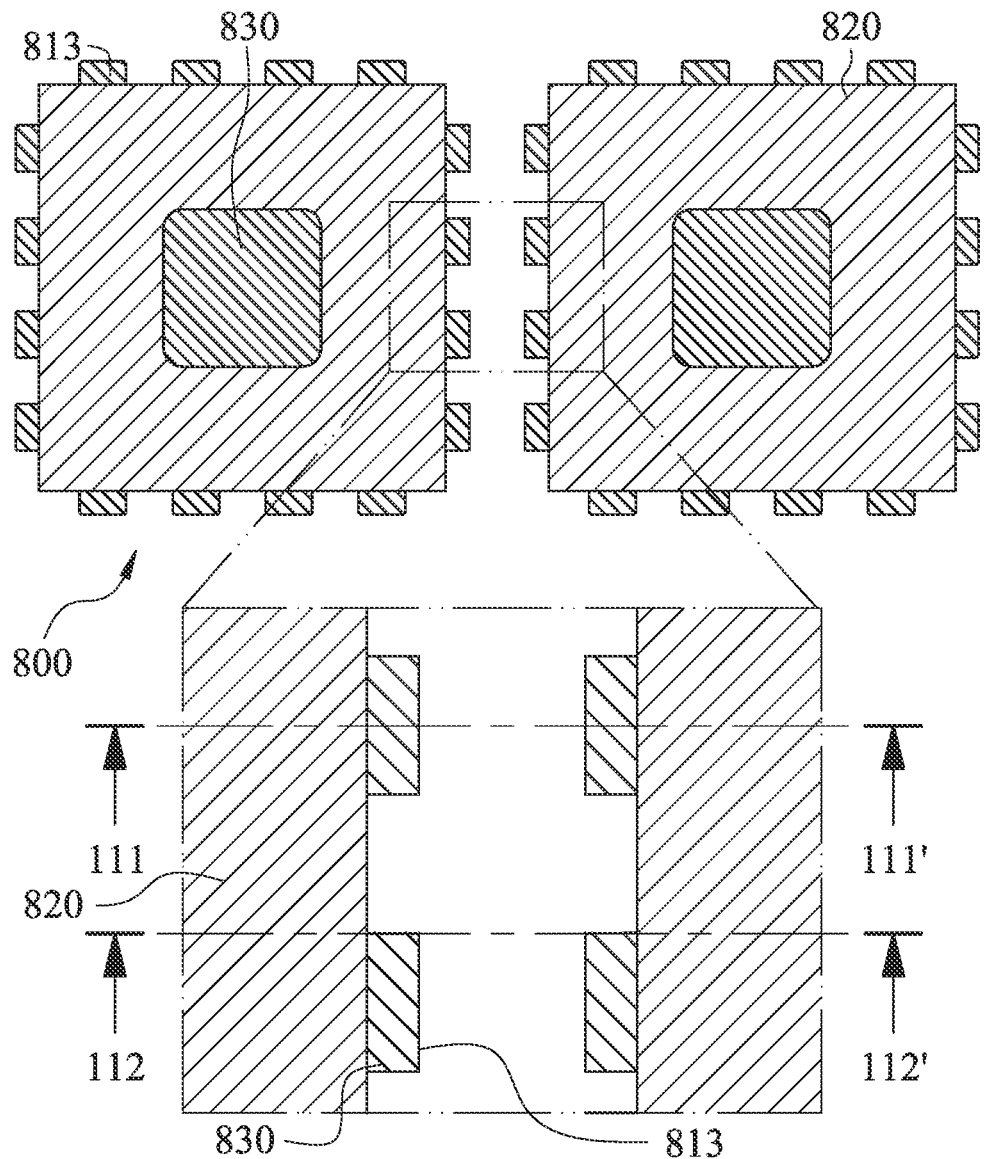
FIG. 110 is a schematic view of the singulation step according to the 8th embodiment in FIG. 101.
Figure 111:
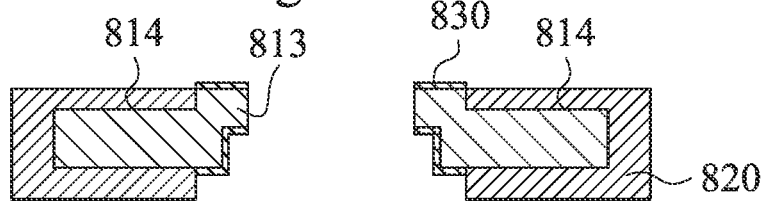
FIG. 111 is a cross-sectional schematic view of the package structure along a 111-111' line in FIG. 110.
Figure 112:
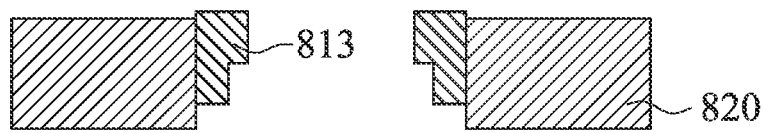
FIG. 112 is a cross-sectional schematic view of the package structure along a 112-112' line in FIG. 110.

FIG. 110 is a schematic view of the singulation step S805 according to the 8th embodiment in FIG. 101. FIG. 111 is a cross-sectional schematic view of the package structure 800 along a 111-111' line in FIG. 110. FIG. 112 is a cross-sectional schematic view of the package structure 800 along a 112-112' line in FIG. 110. In FIGS. 110 to 112, the cutting streets 811 of the leadframe 810 are cut to form the package structure 800 in the singulation step S805. In detail, the cutting streets 811 of the leadframe 810 are cut via a blade, and a cutting width of the blade is smaller than an etching width (that is, a width of each of the etching grooves 812) provided in the etching step S801. Hence, step-shaped leads 813 are formed, and the plating surfaces 830 are disposed on outer surfaces of each of the step-shaped leads 813. Furthermore, a thickness of each of the cutting streets 811 is thinner in the etching step S801, so the burr can be reduced in the singulation step S805.

Figure 113:
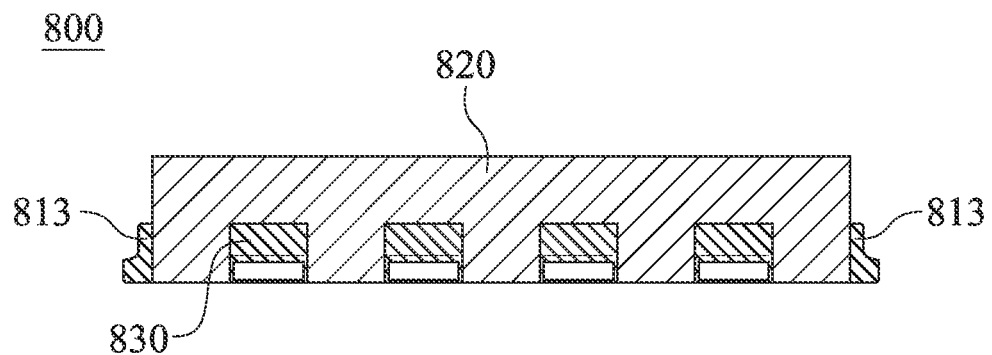
FIG. 113 is a side view of the package structure according to the 8th embodiment in FIG. 101.
Figure 114:
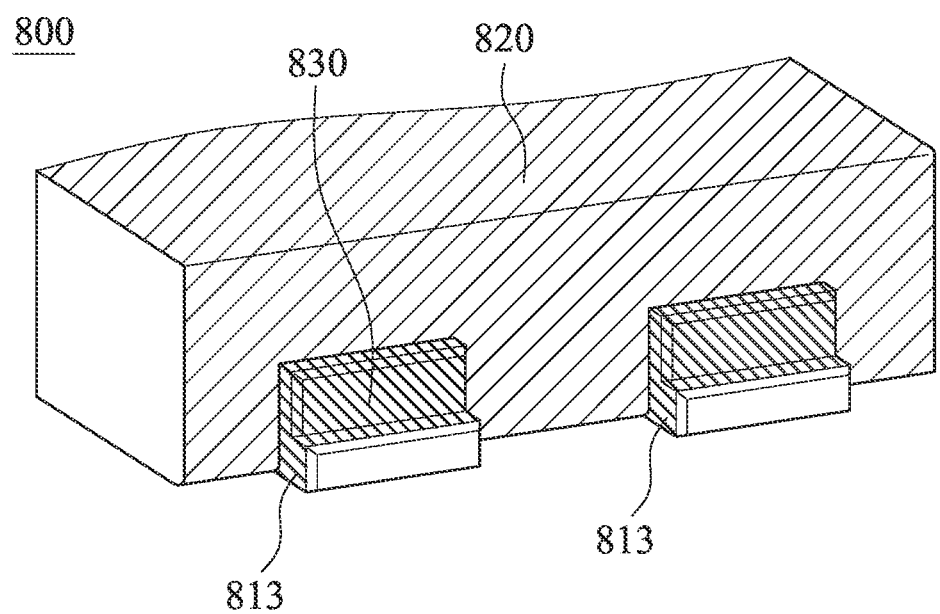
FIG. 114 is a partial schematic view of the package structure according to the 8th embodiment in FIG. 101.

FIG. 113 is a side view of the package structure 800 according to the 8th embodiment in FIG. 101. FIG. 114 is a partial schematic view of the package structure 800 according to the 8th embodiment in FIG. 101. In FIGS. 113 and 114, the package structure 800 includes the step-shaped leads 813, the step-shaped leads 813 protrude an edge of the plastic package material 820, each of the step-shaped leads 813 includes six plating surfaces 830, and each of the step-shaped leads 813 close to a lower surface of the package structure 800 protrudes the edge of the plastic package material 820.

Hence, according to the 8th embodiment, by the method of forming the package structure S800, the solderable area of each of the sides of the package structure 800 can be increased. Furthermore, in FIG. 111, a portion of each of the step-shaped leads 813 protruding the plastic package material 820 and covered via the plastic package material 820 is like gull-wing shape, so the mechanical strength of the step-shaped leads 813 can be more robust. Therefore, the connection strength between the step-shaped leads 813 and the circuit board can be enhanced to maintain and increase the lifetime of the package structure 800 disposed on the circuit board, and the reliability of the board level can be further enhanced.

Figure 115:
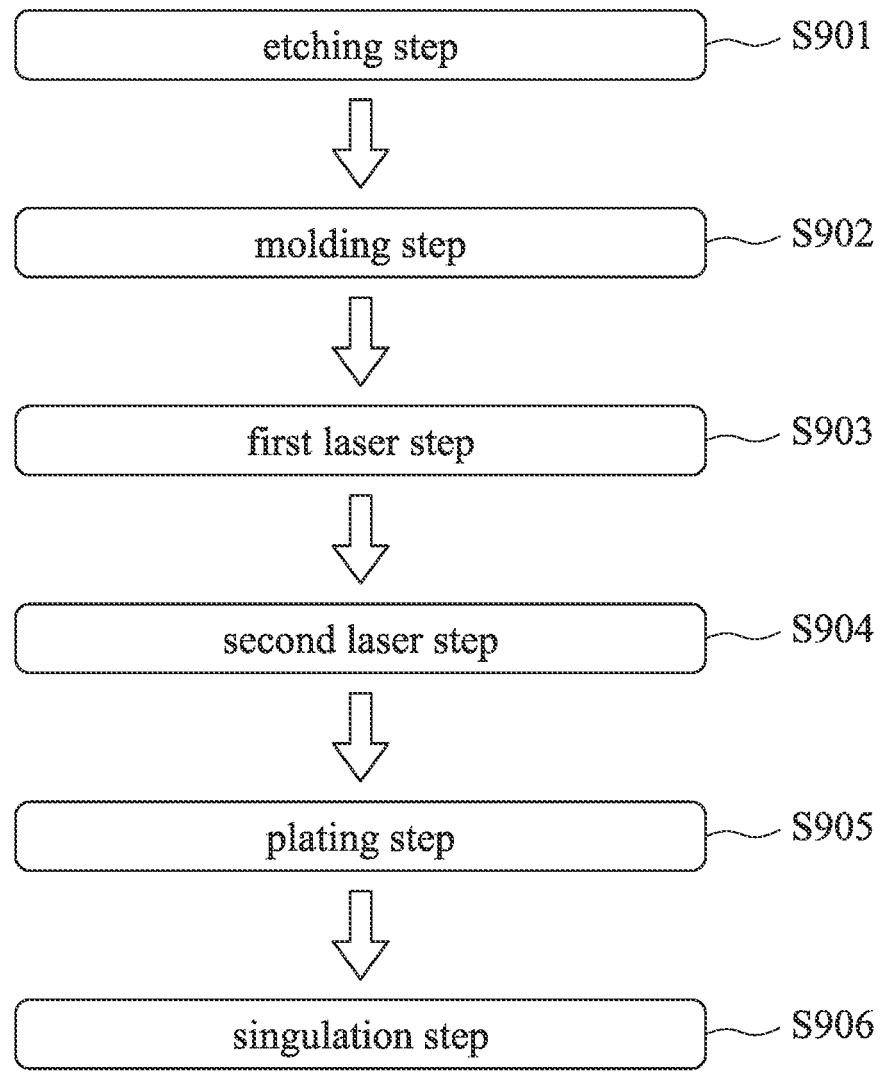
FIG. 115 is a step flow chart of a method of forming a package structure according to the 9th embodiment of the present disclosure.

FIG. 115 is a step flow chart of a method of forming a package structure S900 according to the 9th embodiment of the present disclosure. In FIG. 115, the method of forming the package structure S900 includes an etching step S901, a molding step S902, a laser step, a plating step S905 and a singulation step S906, wherein the laser step includes a first laser step S903 and a second laser step S904, and the second laser step S904 is performed after the first laser step S903.

Figure 116:
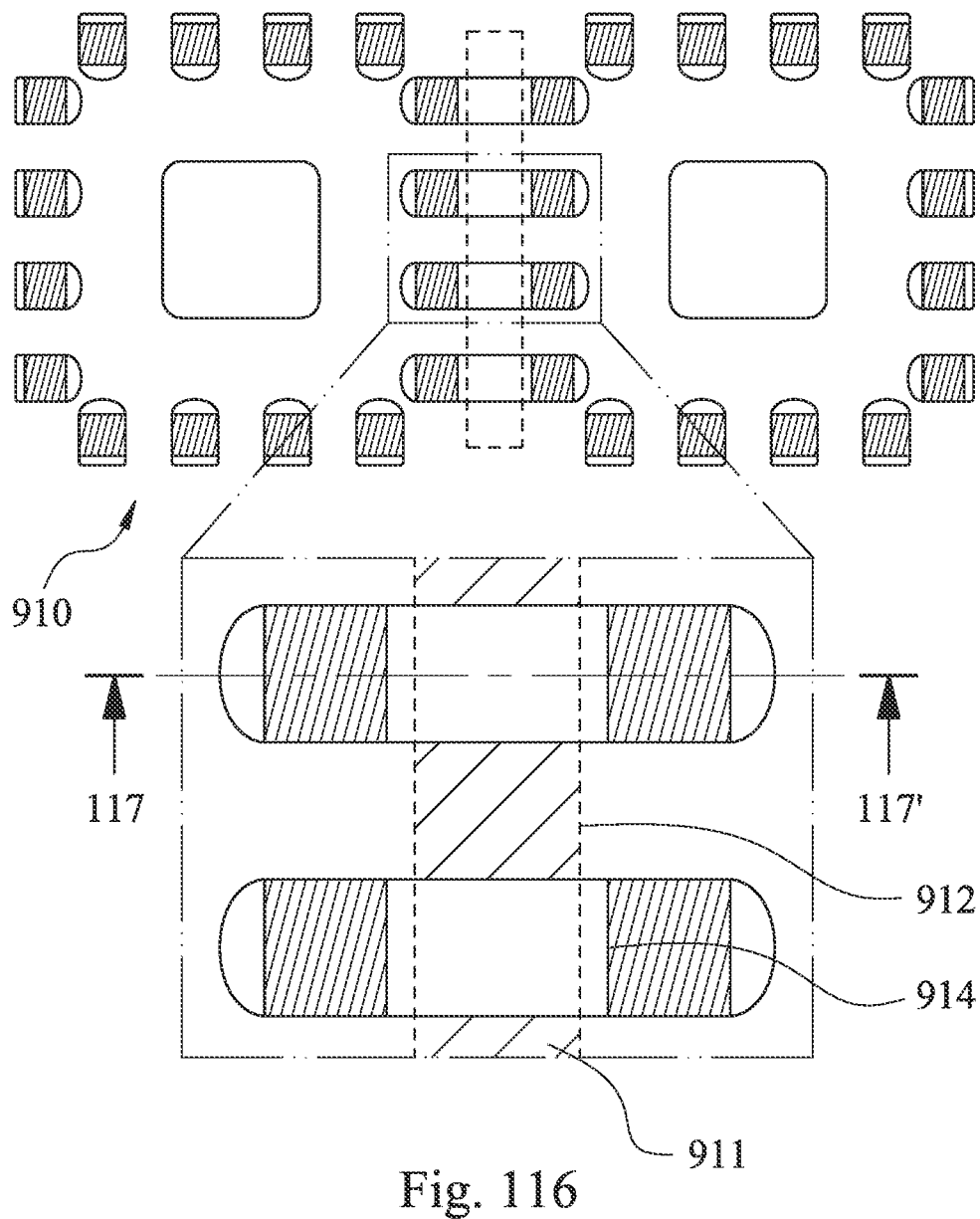
FIG. 116 is a schematic view of the etching step according to the 9th embodiment in FIG. 115.
Figure 117:
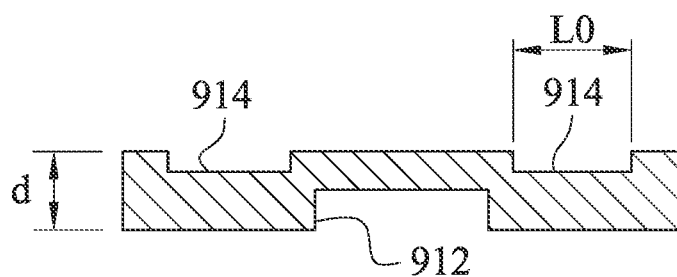
FIG. 117 is a cross-sectional schematic view of the leadframe along a 117-117' line in FIG. 116.

FIG. 116 is a schematic view of the etching step S901 according to the 9th embodiment in FIG. 115. FIG. 117 is a cross-sectional schematic view of the leadframe 910 along a 117-117' line in FIG. 116. In FIGS. 116 and 117, a plurality of cutting streets 911 of the leadframe 910 are etched in the etching step S901. According to the 9th embodiment, an upper surface of each of the cutting streets 911 of the leadframe 910 is etched to form an etching groove 912, and an etching depth can be equal to half of a thickness of the leadframe 910, but is not limited thereto. Further, each of the cutting streets 911 can have a plurality of concave portions 914, a concave depth of each of the concave portions 914 can be smaller than half of the thickness of the leadframe 910, a width of each of the concave portions 914 can be equal to a width of each of the etching grooves 912, and each of the concave portions 914 are located on two sides of each of the cutting streets 911. In particular, when the width of each of the concave portions 914 is L0, and the thickness of the leadframe 910 is d, the following condition can be satisfied: $0.5 \ d \leq L0$, but is not limited thereto.

Figure 118:
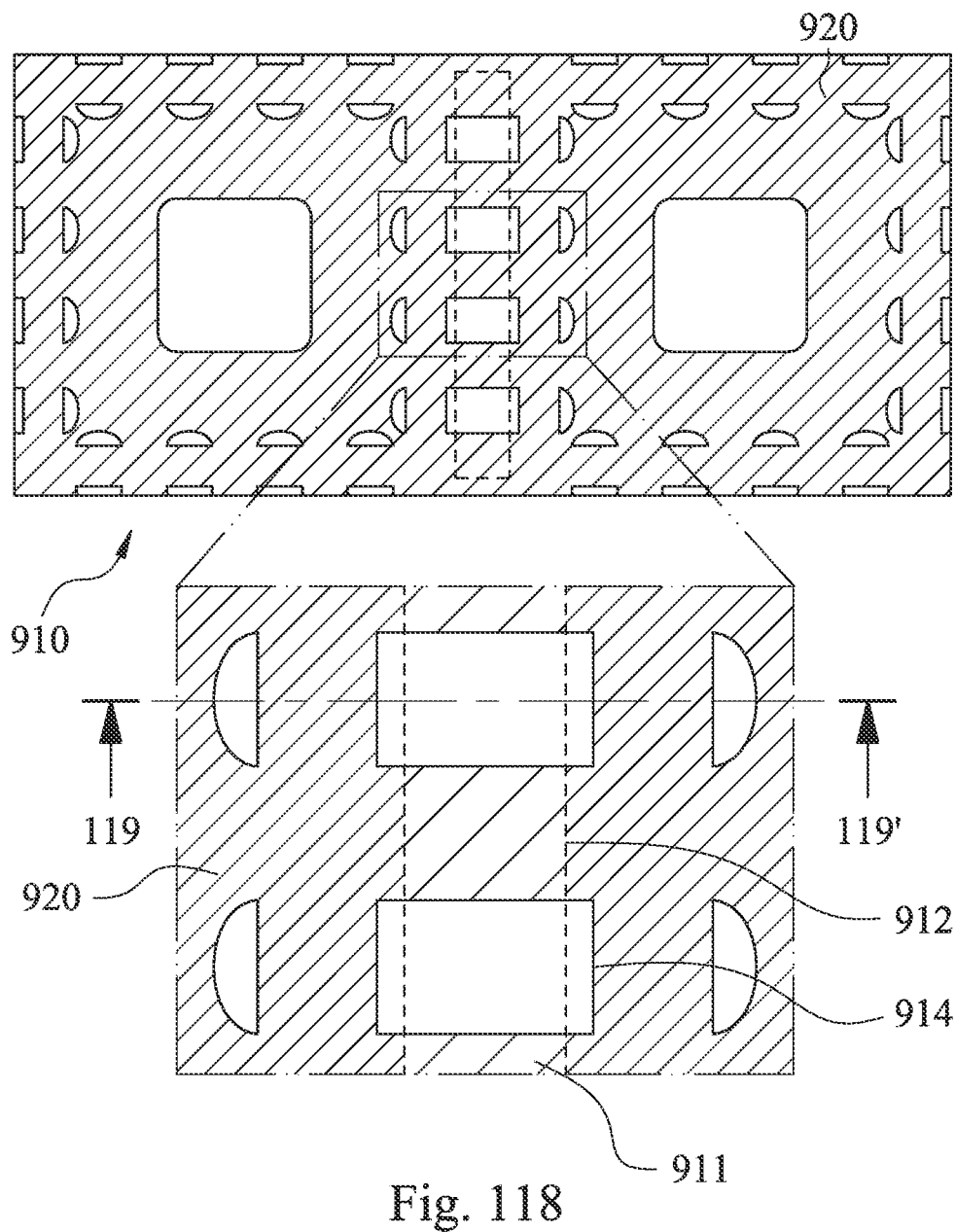
FIG. 118 is a schematic view of the molding step according to the 9th embodiment in FIG. 115.
Figure 119:
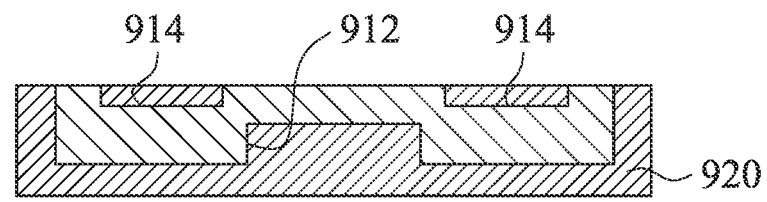
FIG. 119 is a cross-sectional schematic view of the leadframe along a 119-119' line in FIG. 118.

FIG. 118 is a schematic view of the molding step S902 according to the 9th embodiment in FIG. 115. FIG. 119 is a cross-sectional schematic view of the leadframe 910 along a 119-119' line in FIG. 118. In FIGS. 118 and 119, a plastic package material 920 covers on the leadframe 910 before the laser step.

Figure 120:
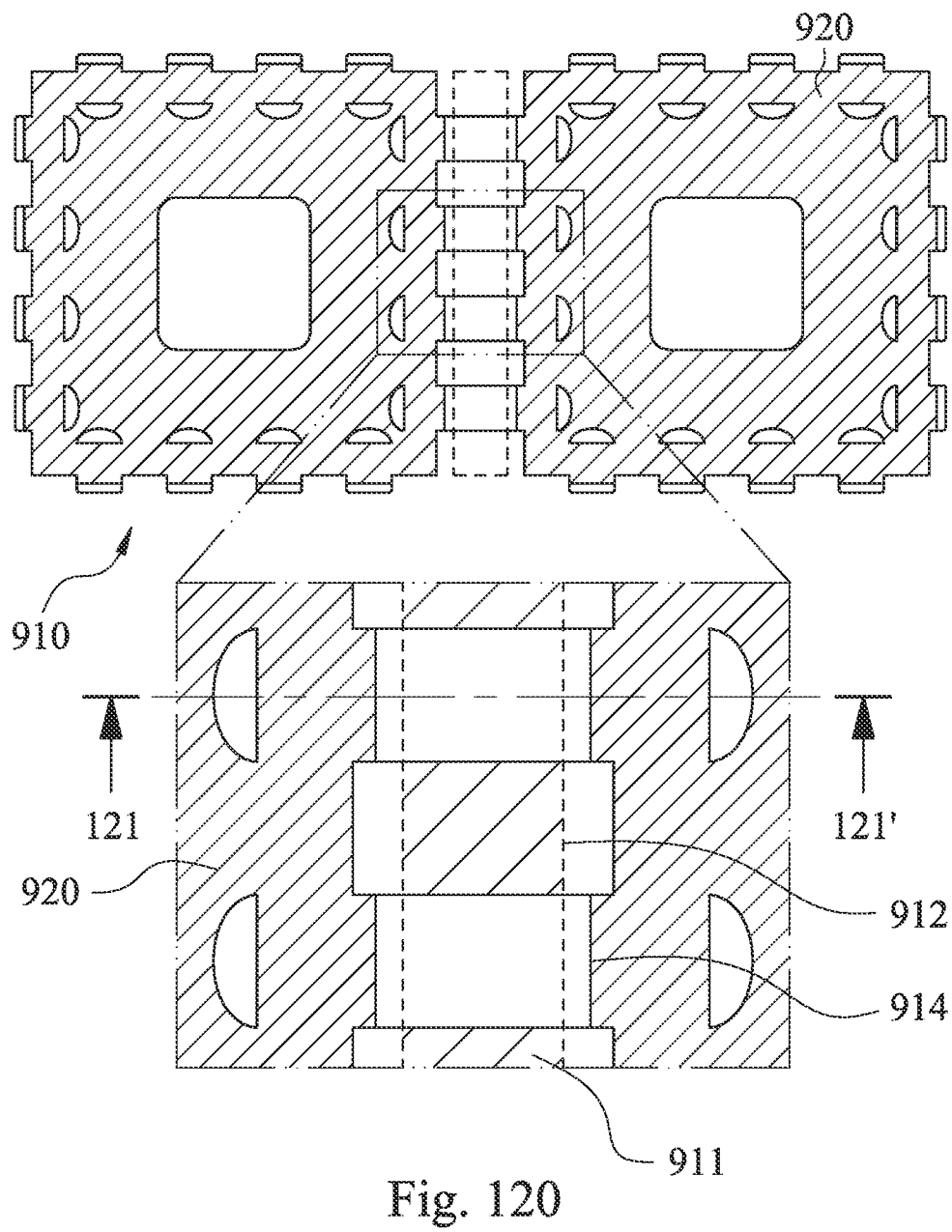
Figure 121:
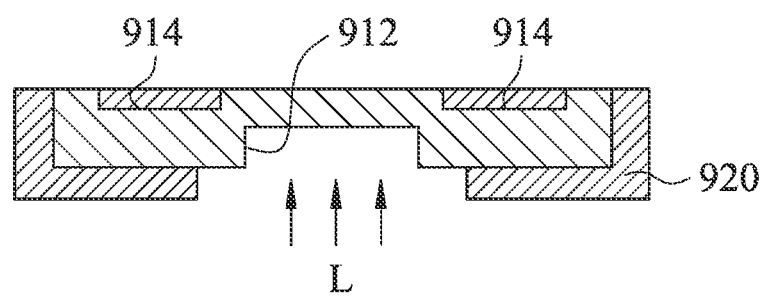

FIG. 120 is a schematic view of the first laser step S903 according to the 9th embodiment in FIG. 115. FIG. 121 is a cross-sectional schematic view of the leadframe 910 along a 121-121' line in FIG. 120. In FIGS. 120 and 121, the plastic package material 920 covering on each of the cutting streets 911 is removed via a laser beam L in the laser step. In particular, according to the 9th embodiment, the plastic package material 920 covering on an upper surface of each of the cutting streets 911 is removed via the laser beam L in the first laser step S903, and the plastic package material 920 is only partially removed. It should be mentioned that the upper surface of each of the cutting streets 911 is irradiated via the laser beam L to remove the plastic package material 920, and the plastic package material 920 disposed in each of the concave portions 914 is not irradiated via the laser beam L. Hence, the plastic package material 920 disposed in each of the concave portions 914 is remained thereof.

Figure 122:
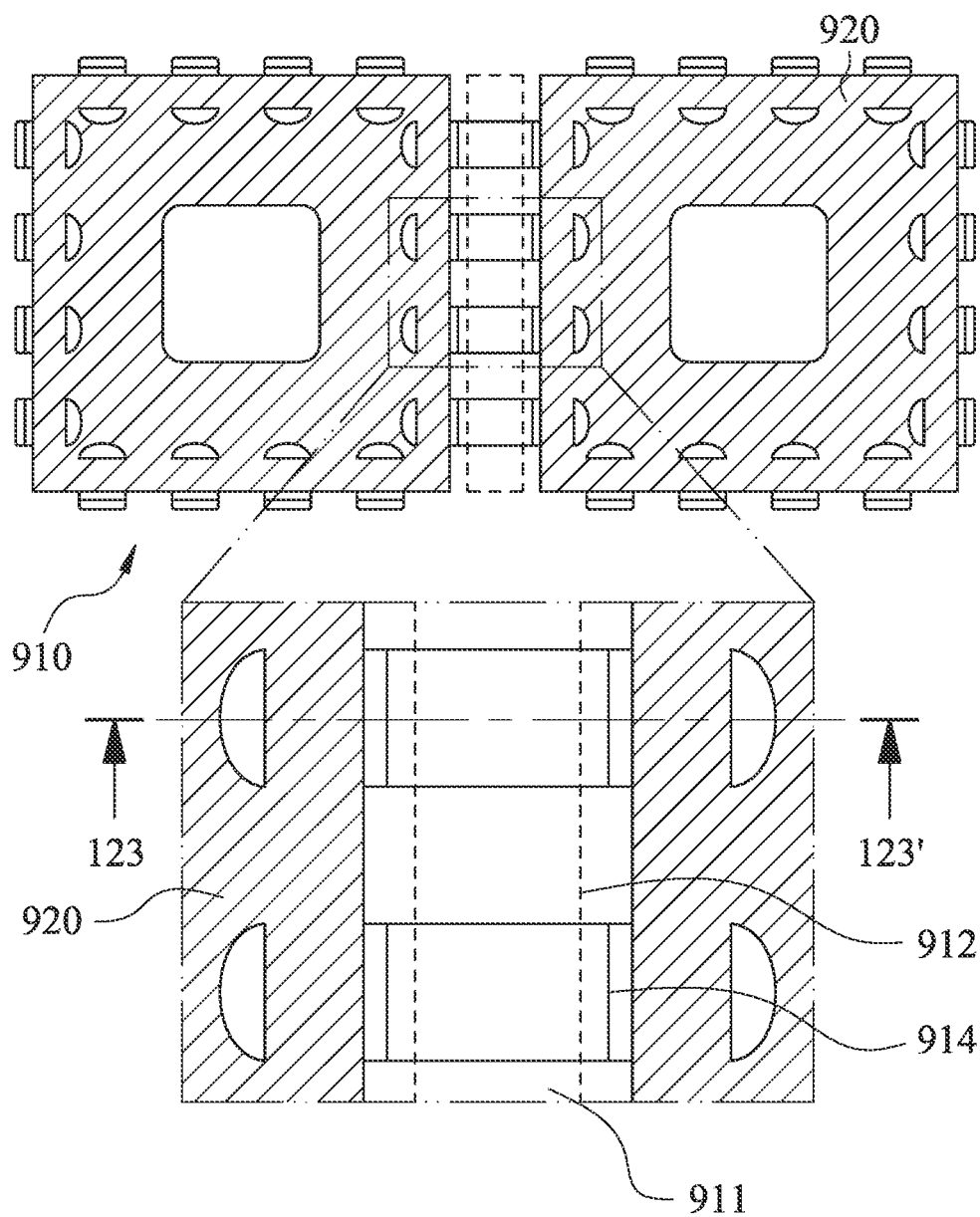
Figure 123:
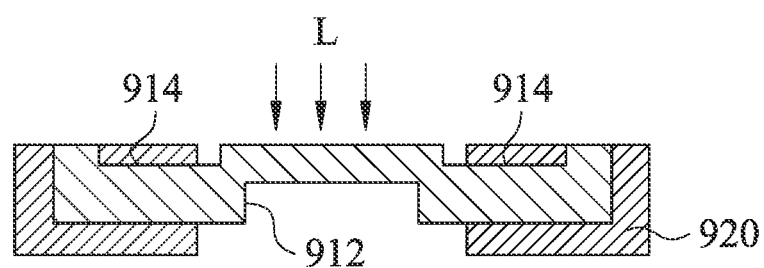

FIG. 122 is a schematic view of the second laser step S904 according to the 9th embodiment in FIG. 115. FIG. 123 is a cross-sectional schematic view of the leadframe 910 along a 123-123' line in FIG. 122. In FIGS. 122 and 123, the plastic package material 920 covering on a lower surface of each of the cutting streets 911 is removed via the laser beam L in the second laser step S904, and the plastic package material 920 is only partially removed.

Table 9 shows parameters of the laser beam L in the first laser step S903 and the second laser step S904 according to the 9th embodiment, but the present disclosure is not limited to the parameters in Table 9.

TABLE 9

| Laser type | diode end-pumped Nd: $YVO_4$ |
|---|---|
| Output power | 10 W-40 W |
| Wavelength | 355 nm, 532 nm, 1064 nm |
| Pulse frequency | 60 kHz-200 kHz, and CW (continuous-wave) |

Furthermore, the removing targets (for example, a portion of the plastic package material 920) and the depth thereof can be chosen via the first laser step S903 and the second laser step S904. In particular, both of the first laser step S903 and the second laser step S904 can be made up of one or multiple laser beams L, and it depends on the energy and the parameters of the laser beam L. Therefore, the removing range can be effectively controlled. For example, a roughing treatment can be firstly performed via the laser beam L with smaller wavelength (such as 355 nm) to quickly remove the portion of the plastic package material 920, and then a fine treatment is performed via the laser beam L with lager wavelength (such as 532 nm or 1064 nm) to precisely remove the portion of the plastic package material 920, but is not limited thereto.

Figure 124:
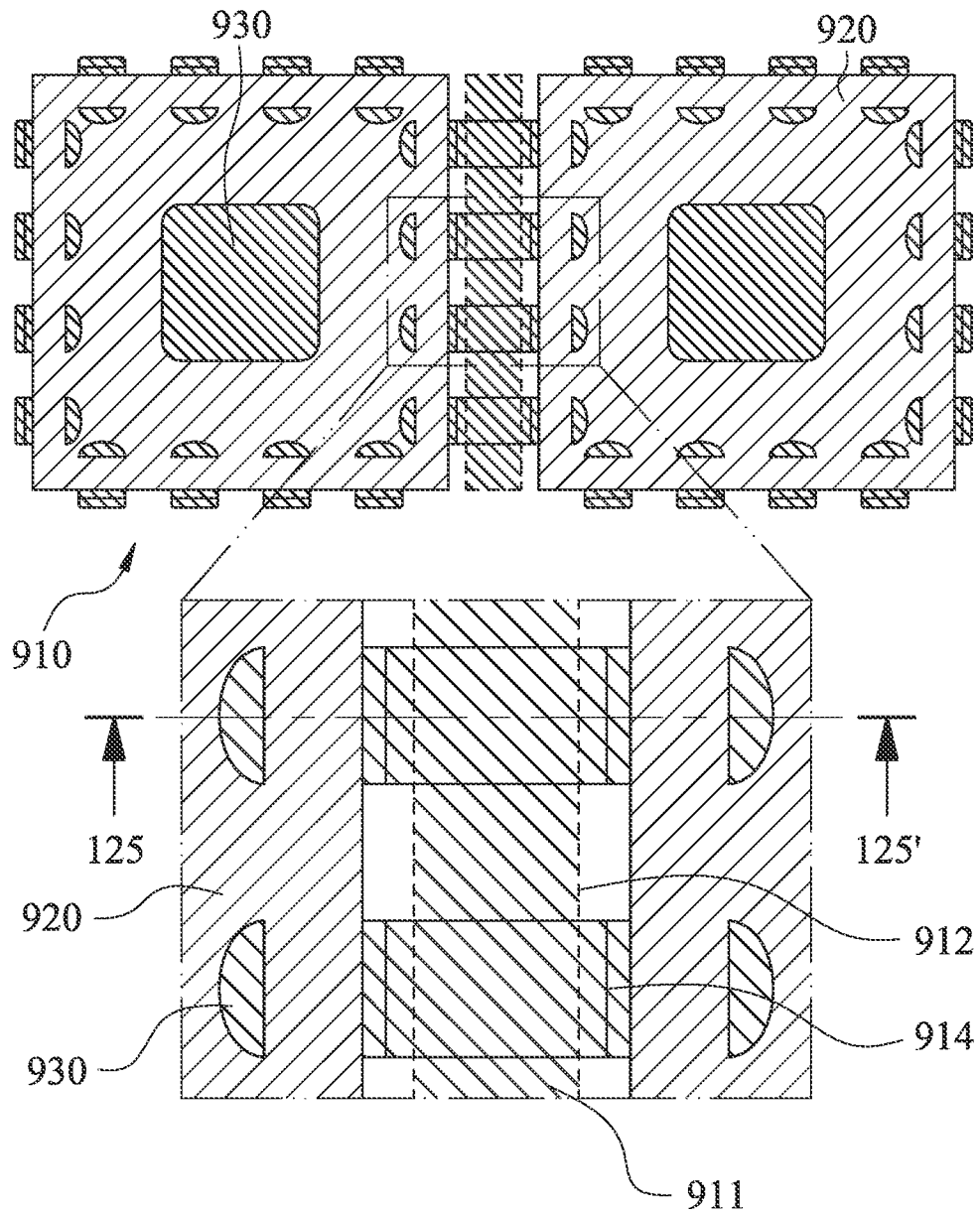
Figure 125:
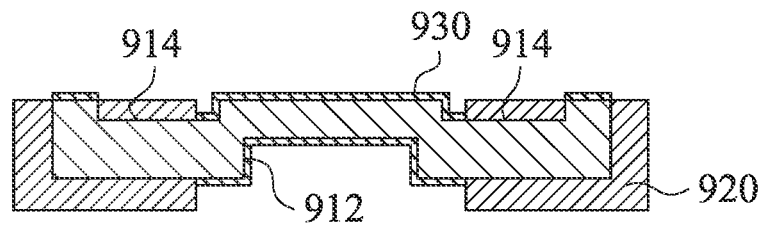
Figure 126:
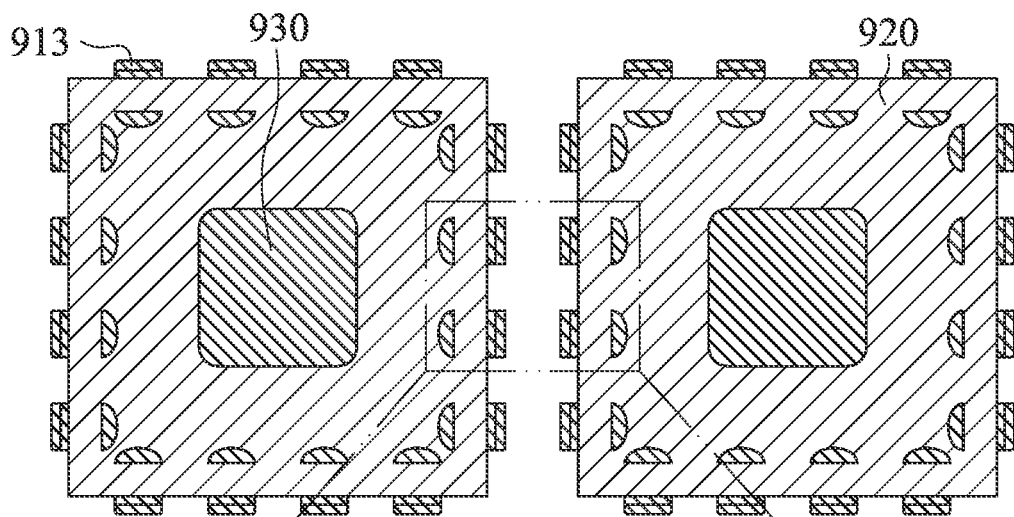
Figure 126:
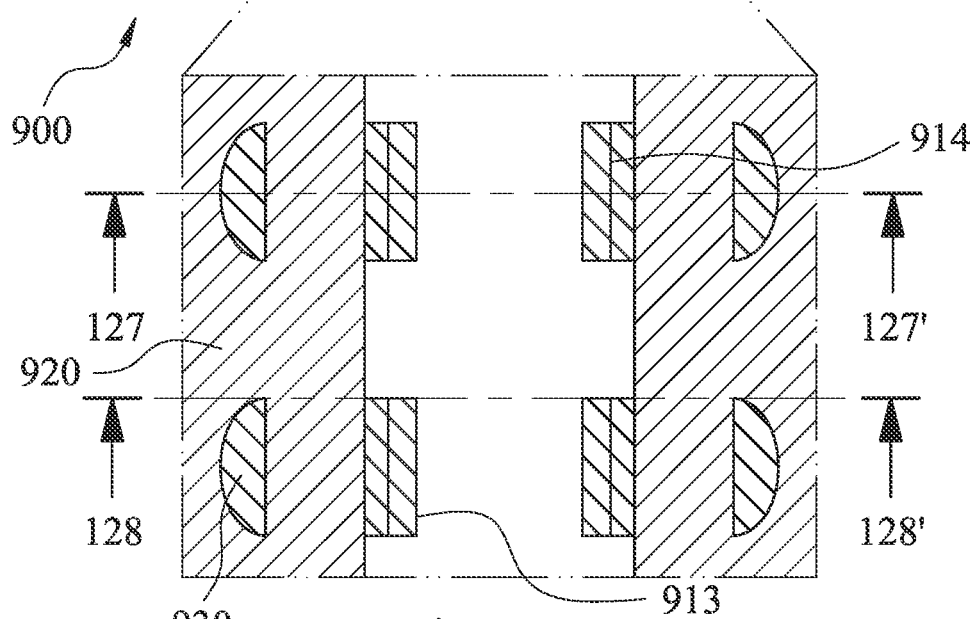
Figure 127:
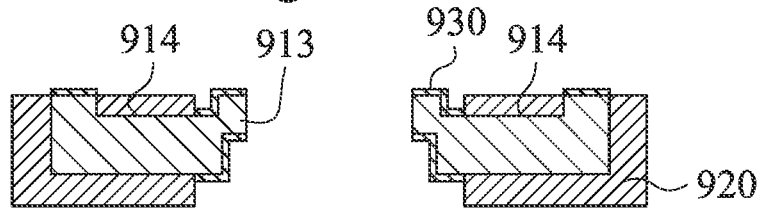
Figure 128:
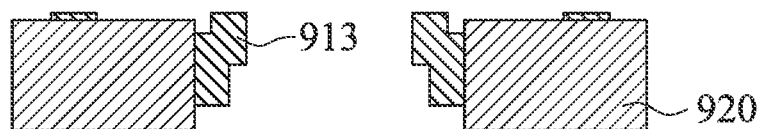

FIG. 124 is a schematic view of the plating step S905 according to the 9th embodiment in FIG. 115. FIG. 125 is a cross-sectional schematic view of the leadframe 910 along a 125-125' line in FIG. 124. In FIGS. 124 and 125, a plurality of plating surfaces 930 are disposed on a plurality of areas of the leadframe 910 without the plastic package material 920. FIG. 126 is a schematic view of the singulation step S906 according to the 9th embodiment in FIG. 115. FIG. 127 is a cross-sectional schematic view of the package structure 900 along a 127-127' line in FIG. 126. FIG. 128 is a cross-sectional schematic view of the package structure 900 along a 128-128' line in FIG. 126. In FIGS. 126 to 128, the cutting streets 911 of the leadframe 910 are cut to form the package structure 900 in the singulation step S906. In detail, the cutting streets 911 of the leadframe 910 are cut via a blade, and a cutting width of the blade is smaller than an etching width (that is, a width of each of the etching grooves 912) provided in the etching step S901. Hence, protruding leads 913 are formed, and the plating surfaces 930 are disposed on outer surfaces of each of the protruding leads 913. Furthermore, a thickness of each of the cutting streets 911 is thinner in the etching step S901, so the burr can be reduced in the singulation step S906.

Figure 129:
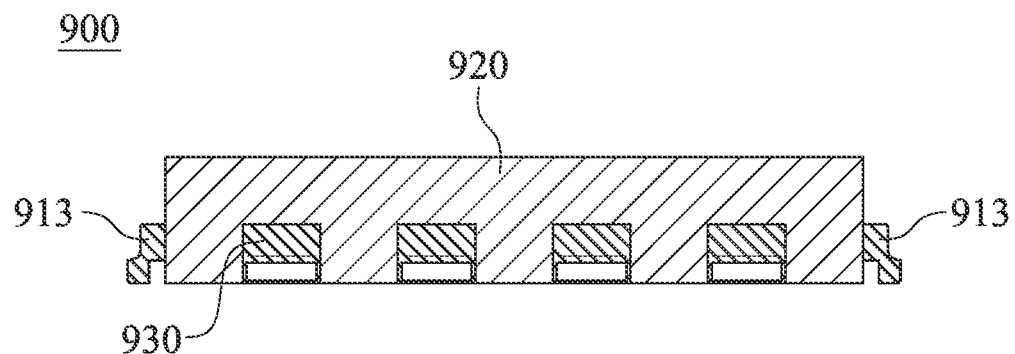
Figure 130:
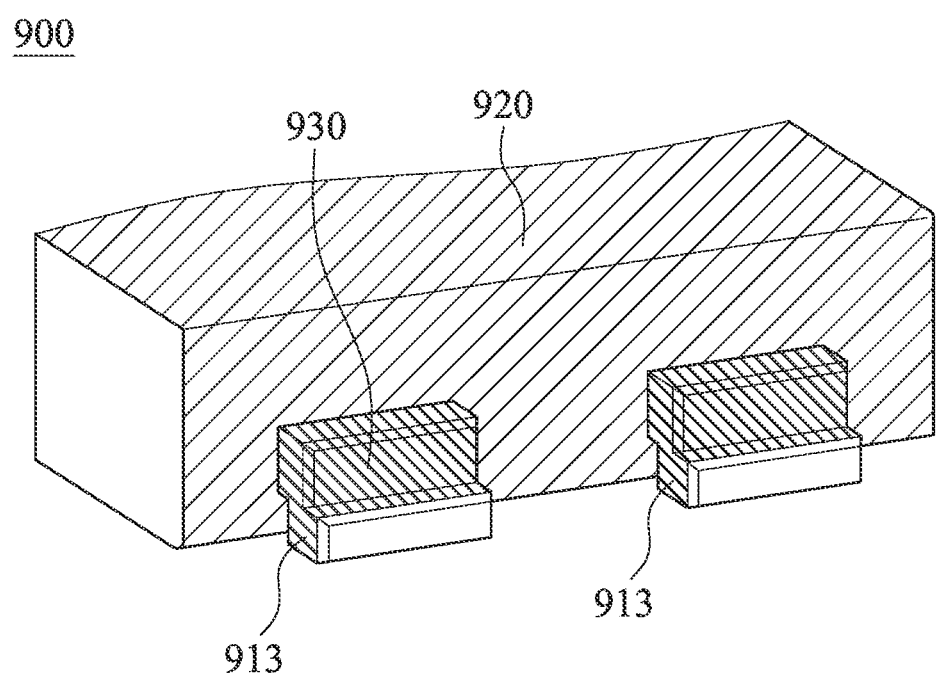

FIG. 129 is a side view of the package structure 900 according to the 9th embodiment in FIG. 115. FIG. 130 is a partial schematic view of the package structure 900 according to the 9th embodiment in FIG. 115. In FIGS. 129 and 130, the package structure 900 includes the protruding leads 913, the protruding leads 913 protrude an edge of the plastic package material 920, each of the protruding leads 913 includes nine plating surfaces 930, and each of the protruding leads 913 close to a lower surface of the package structure 900 protrudes the edge of the plastic package material 920.

Hence, according to the 9th embodiment, by the method of forming the package structure S900, the solderable area of each of the sides of the package structure 900 can be increased. Furthermore, in FIG. 127, a portion of each of the protruding leads 913 protruding the plastic package material 920 and covered via the plastic package material 920 is like gull-wing shape, so the mechanical strength of the protruding leads 913 can be more robust. Therefore, the connection strength between the protruding leads 913 and the circuit board can be enhanced to maintain and increase the lifetime of the package structure 900 disposed on the circuit board, and the reliability of the board level can be further enhanced.

FIG. 131 is a step flow chart of a method of forming a package structure S1000 according to the 10th embodiment of the present disclosure. In FIG. 131, the method of forming the package structure S1000 includes an etching step S1001, a molding step S1002, a laser step, a plating step S1005 and a singulation step S1006, wherein the laser step includes a first laser step S1003 and a second laser step S1004, and the second laser step S1004 is performed after the first laser step S1003.

FIG. 132 is a schematic view of the etching step S1001 according to the embodiment in FIG. 131. FIG. 133 is a cross-sectional schematic view of the leadframe 1010 along a 133-133' line in FIG. 132. In FIGS. 132 and 133, a plurality of cutting streets 1011 of the leadframe 1010 are etched in the etching step S1001. According to the 10th embodiment, an upper surface of each of the cutting streets 1011 of the leadframe 1010 is etched to form an etching groove 1012, and an etching depth can be equal to half of a thickness of the leadframe 1010, but is not limited thereto. Further, each of the cutting streets 1011 can have a plurality of concave portions 1014, a concave depth of each of the concave portions 1014 can be smaller than half of the thickness of the leadframe 1010, a width of each of the concave portions 1014 can be equal to a width of each of the etching grooves 1012, and each of the concave portions 1014 are located on two sides of each of the cutting streets 1011.

FIG. 134 is a schematic view of the molding step S1002 according to the embodiment in FIG. 131. FIG. 135 is a cross-sectional schematic view of the leadframe 1010 along a 135-135' line in FIG. 134. In FIGS. 134 and 135, a plastic package material 1020 covers on the leadframe 1010 before the laser step.

FIG. 136 is a schematic view of the first laser step S1003 according to the embodiment in FIG. 131. FIG. 137 is a cross-sectional schematic view of the leadframe 1010 along a 137-137' line in FIG. 136. In FIGS. 136 and 137, the plastic package material 1020 covering on each of the cutting streets 1011 is removed via a laser beam L in the laser step. In particular, according to the 10th embodiment, the plastic package material 1020 covering on an upper surface of each of the cutting streets 1011 is removed via the laser beam L in the first laser step S1003, and the plastic package material 1020 is only partially removed. It should be mentioned that the upper surface of each of the cutting streets 1011 is irradiated via the laser beam L to remove the plastic package material 1020, and the plastic package material 1020 disposed in each of the concave portions 1014 is not irradiated via the laser beam L. Hence, the plastic package material 1020 disposed in each of the concave portions 1014 is remained thereof.

FIG. 138 is a schematic view of the second laser step S1004 according to the 10th embodiment in FIG. 131. FIG. 139 is a cross-sectional schematic view of the leadframe 1010 along a 139-139' line in FIG. 138. In FIGS. 138 and 139, the plastic package material 1020 covering on a lower surface of each of the cutting streets 1011 is removed via the laser beam L in the second laser step S1004, and the plastic package material 1020 is only partially removed.

Table 10 shows parameters of the laser beam L in the first laser step S1003 and the second laser step S1004 according to the 10th embodiment, but the present disclosure is not limited to the parameters in Table 10.

TABLE 10

| Laser type | diode end-pumped Nd: YVO$_4$ |
|---|---|
| Output power | 10 W-40 W |
| Wavelength | 355 nm, 532 nm, 1064 nm |
| Pulse frequency | 60 kHz-200 kHz, and CW (continuous-wave) |

Furthermore, the removing targets (for example, a portion of the plastic package material 1020) and the depth thereof can be chosen via the first laser step S1003 and the second laser step S1004. In particular, both of the first laser step S1003 and the second laser step S1004 can be made up of one or multiple laser beams L, and it depends on the energy and the parameters of the laser beam L. Therefore, the removing range can be effectively controlled. For example, a roughing treatment can be firstly performed via the laser beam L with smaller wavelength (such as 355 nm) to quickly remove the portion of the plastic package material 1020, and then a fine treatment is performed via the laser beam L with lager wavelength (such as 532 nm or 1064 nm) to precisely remove the portion of the plastic package material 1020, but is not limited thereto.

FIG. 140 is a schematic view of the plating step S1005 according to the embodiment in FIG. 131. FIG. 141 is a cross-sectional schematic view of the leadframe 1010 along a 141-141' line in FIG. 140. In FIGS. 140 and 141, a plurality of plating surfaces 1030 are disposed on a plurality of areas of the leadframe 1010 without the plastic package material 1020.

FIG. 142 is a schematic view of the singulation step S1006 according to the 10th embodiment in FIG. 131. FIG. 143 is a cross-sectional schematic view of the package structure 1000 along a 143-143' line in FIG. 142. FIG. 144 is a cross-sectional schematic view of the package structure 1000 along a 144-144' line in FIG. 142. In FIGS. 142 to 144, the cutting streets 1011 of the leadframe 1010 are cut to form the package structure 1000 in the singulation step S1006. In detail, the cutting streets 1011 of the leadframe 1010 are cut via a blade, and a cutting width of the blade is smaller than an etching width (that is, a width of each of the etching grooves 1012) provided in the etching step S1001. Hence, protruding leads 1013 are formed, and the plating surfaces 1030 are disposed on outer surfaces of each of the protruding leads 1013. Furthermore, a thickness of each of the cutting streets 1011 is thinner in the etching step S1001, so the burr can be reduced in the singulation step S1006.

FIG. 145 is a side view of the package structure 1000 according to the 10th embodiment in FIG. 131. FIG. 146 is a partial schematic view of the package structure 1000 according to the 10th embodiment in FIG. 131. In FIGS. 145 and 146, the package structure 1000 includes the protruding leads 1013, the protruding leads 1013 protrude an edge of the plastic package material 1020, each of the protruding leads 1013 includes eight plating surfaces 1030, and each of the protruding leads 1013 close to a lower surface of the package structure 1000 protrudes the edge of the plastic package material 1020.

Hence, according to the 10th embodiment, by the method of forming the package structure S1000, the solderable area of each of the sides of the package structure 1000 can be increased. Furthermore, in FIG. 143, a portion of each of the protruding leads 1013 protruding the plastic package material 1020 and covered via the plastic package material 1020 is like gull-wing shape, so the mechanical strength of the protruding leads 1013 can be more robust. Therefore, the connection strength between the protruding leads 1013 and the circuit board can be enhanced to maintain and increase the lifetime of the package structure 1000 disposed on the circuit board, and the reliability of the board level can be further enhanced.

FIG. 147 is a step flow chart of a method of forming a package structure S1100 according to the 11th embodiment of the present disclosure. In FIG. 147, the method of forming the package structure S1100 includes an etching step S1101, a molding step S1102, a laser step, a plating step S1105 and a singulation step S1106, wherein the laser step includes a first laser step S1103 and a second laser step S1104, and the second laser step S1104 is performed after the first laser step S1103.

FIG. 148 is a schematic view of the etching step S1101 according to the 11th embodiment in FIG. 147. FIG. 149 is a cross-sectional schematic view of the leadframe 1110 along a 149-149' line in FIG. 148. In FIGS. 148 and 149, a plurality of cutting streets 1111 of the leadframe 1110 are etched in the etching step S1101. According to the 11th embodiment, a lower surface of each of the cutting streets 1111 of the leadframe 1110 is etched to form two etching grooves 1112, and an etching depth can be equal to half of a thickness of the leadframe 1110, but is not limited thereto.

FIG. 150 is a schematic view of the molding step S1102 according to the 11th embodiment in FIG. 147. FIG. 151 is a cross-sectional schematic view of the leadframe 1110 along a 151-151' line in FIG. 150. In FIGS. 150 and 151, a plastic package material 1120 covers on the leadframe 1110 before the laser step.

FIG. 152 is a schematic view of the first laser step S1103 according to the 11th embodiment in FIG. 147. FIG. 153 is a cross-sectional schematic view of the leadframe 1110 along a 153-153' line in FIG. 152. In FIGS. 152 and 153, the plastic package material 1120 covering on each of the cutting streets 1111 is removed via a laser beam L in the laser step. In particular, according to the 11th embodiment, the plastic package material 1120 covering on an upper surface of each of the cutting streets 1111 is removed via the laser beam L in the first laser step S1103, and the plastic package material 1120 is only partially removed. It should be mentioned that the upper surface of each of the cutting streets 1111 is irradiated via the laser beam L to remove the plastic package material 1120, and the plastic package material 1120 disposed in each of the etching grooves 1112 is not irradiated via the laser beam L. Hence, the plastic package material 1120 disposed in each of the etching grooves 1112 is remained thereof.

FIG. 154 is a schematic view of the second laser step S1104 according to the 11th embodiment in FIG. 147. FIG. 155 is a cross-sectional schematic view of the leadframe 1110 along a 155-155' line in FIG. 154. In FIGS. 154 and 155, the plastic package material 1120 covering on a lower surface of each of the cutting streets 1111 is removed via the laser beam L in the second laser step S1104, and the plastic package material 1120 is only partially removed.

Table 11 shows parameters of the laser beam L in the first laser step S1103 and the second laser step S1104 according to the 11th embodiment, but the present disclosure is not limited to the parameters in Table 11.

TABLE 11

| | |
|---|---|
| Laser type | diode end-pumped Nd: YVO$_4$ |
| Output power | 10 W-40 W |
| Wavelength | 355 nm, 532 nm, 1064 nm |
| Pulse frequency | 60 kHz-200 kHz, and CW (continuous-wave) |

Furthermore, the removing targets (for example, a portion of the plastic package material 1120) and the depth thereof can be chosen via the first laser step S1103 and the second laser step S1104. In particular, both of the first laser step S1103 and the second laser step S1104 can be made up of one or multiple laser beams L, and it depends on the energy and the parameters of the laser beam L. Therefore, the removing range can be effectively controlled. For example, a roughing treatment can be firstly performed via the laser beam L with smaller wavelength (such as 355 nm) to quickly remove the portion of the plastic package material 1120, and then a fine treatment is performed via the laser beam L with lager wavelength (such as 532 nm or 1064 nm) to precisely remove the portion of the plastic package material 1120, but is not limited thereto.

FIG. 156 is a schematic view of the plating step S1105 according to the 11th embodiment in FIG. 147. FIG. 157 is a cross-sectional schematic view of the leadframe 1110 along a 157-157' line in FIG. 156. In FIGS. 156 and 157, a plurality of plating surfaces 1130 are disposed on a plurality of areas of the leadframe 1110 without the plastic package material 1120.

FIG. 158 is a schematic view of the singulation step S1106 according to the 11th embodiment in FIG. 147. FIG. 159 is a cross-sectional schematic view of the package structure 1100 along a 159-159' line in FIG. 158. FIG. 160 is a cross-sectional schematic view of the package structure 1100 along a 160-160' line in FIG. 158. In FIGS. 158 to 160, the cutting streets 1111 of the leadframe 1110 are cut to form the package structure 1100 in the singulation step S1106. In detail, the cutting streets 1111 of the leadframe 1110 are cut via a blade. Hence, protruding leads 1113 are formed, and the plating surfaces 1130 are disposed on outer surfaces of each of the protruding leads 1113. Furthermore, a width of each of the protruding leads 1113 is wider, so the burr can be reduced in the singulation step S1106.

FIG. 161 is a side view of the package structure 1100 according to the 11th embodiment in FIG. 147. FIG. 162 is a partial schematic view of the package structure 1100 according to the 11th embodiment in FIG. 147. In FIGS. 161 and 162, the package structure 1100 includes the protruding leads 1113, the protruding leads 1113 protrude an edge of the plastic package material 1120, each of the protruding leads 1113 includes six plating surfaces 1130, and each of the protruding leads 1113 close to a lower surface of the package structure 1100 protrudes the edge of the plastic package material 1120.

Hence, according to the 11th embodiment, by the method of forming the package structure S1100, the solderable area of each of the sides of the package structure 1100 can be increased. Furthermore, in FIG. 159, a portion of each of the protruding leads 1113 protruding the plastic package material 1120 and covered via the plastic package material 1120 is like gull-wing shape, so the mechanical strength of the protruding leads 1113 can be more robust. Therefore, the connection strength between the protruding leads 1113 and the circuit board can be enhanced to maintain and increase the lifetime of the package structure 1100 disposed on the circuit board, and the reliability of the board level can be further enhanced.

FIG. 163 is a step flow chart of a method of forming a package structure S1200 according to the 12th embodiment of the present disclosure. In FIG. 163, the method of forming the package structure S1200 includes an etching step S1201, a molding step S1202, a laser step S1203, a plating step S1204 and a singulation step S1205.

FIG. 164 is a schematic view of the etching step S1201 according to the 12th embodiment in FIG. 163. FIG. 165 is a cross-sectional schematic view of the leadframe 1210 along a 165-165' line in FIG. 164. In FIGS. 164 and 165, a plurality of cutting streets 1211 of the leadframe 1210 are etched in the etching step S1201. According to the 12th embodiment, a lower surface of each of the cutting streets 1211 of the leadframe 1210 is etched to form two etching grooves 1212, and an etching depth can be smaller than half of a thickness of the leadframe 1210, but is not limited thereto.

FIG. 166 is a schematic view of the molding step S1202 according to the 12th embodiment in FIG. 163. FIG. 167 is a cross-sectional schematic view of the leadframe 1210 along a 167-167' line in FIG. 166. In FIGS. 166 and 167, a plastic package material 1220 covers on the leadframe 1210 before the laser step S1203.

FIG. 168 is a schematic view of the laser step S1203 according to the 12th embodiment in FIG. 163. FIG. 169 is a cross-sectional schematic view of the leadframe 1210 along a 169-169' line in FIG. 168. In FIGS. 168 and 169, the plastic package material 1220 covering on each of the cutting streets 1211 is removed via a laser beam L in the laser step S1203. In particular, according to the 12th embodiment, the plastic package material 1220 covering on an upper surface of each of the cutting streets 1211 is removed via the laser beam L in the laser step S1203, and the plastic package material 1220 is only partially removed. It should be mentioned that the upper surface of each of the cutting streets 1211 is irradiated via the laser beam L to remove the plastic package material 1220, and the plastic package material 1220 disposed in each of the etching grooves 1212 is not irradiated via the laser beam L. Hence, the plastic package material 1220 disposed in each of the etching grooves 1212 is remained thereof.

Table 12 shows parameters of the laser beam L in the laser step S1203 according to the 12th embodiment, but the present disclosure is not limited to the parameters in Table 12.

TABLE 12

| | |
|---|---|
| Laser type | diode end-pumped Nd: YVO$_4$ |
| Output power | 10 W-40 W |
| Wavelength | 355 nm, 532 nm, 1064 nm |
| Pulse frequency | 60 kHz-200 kHz, and CW (continuous-wave) |

Furthermore, the removing targets (for example, a portion of the plastic package material 1220) and the depth thereof can be chosen via the laser step S1203. In particular, the laser step S1203 can be made up of one or multiple laser beams L, and it depends on the energy and the parameters of the laser beam L. Therefore, the removing range can be effectively controlled. For example, a roughing treatment can be firstly performed via the laser beam L with smaller wavelength (such as 355 nm) to quickly remove the portion of the plastic package material 1220, and then a fine treatment is performed via the laser beam L with lager wavelength (such as 532 nm or 1064 nm) to precisely remove the portion of the plastic package material 1220, but is not limited thereto.

FIG. 170 is a schematic view of the plating step S1204 according to the 12th embodiment in FIG. 163. FIG. 171 is a cross-sectional schematic view of the leadframe 1210 along a 171-171' line in FIG. 170. In FIGS. 170 and 171, a plurality of plating surfaces 1230 are disposed on a plurality of areas of the leadframe 1210 without the plastic package material 1220.

FIG. 172 is a schematic view of the singulation step S1205 according to the 12th embodiment in FIG. 163. FIG. 173 is a cross-sectional schematic view of the package structure 1200 along a 173-173' line in FIG. 172. FIG. 174 is a cross-sectional schematic view of the package structure 1200 along a 174-174' line in FIG. 172. In FIGS. 172 to 174, the cutting streets 1211 of the leadframe 1210 are cut to form the package structure 1200 in the singulation step S1205. In detail, the cutting streets 1211 of the leadframe 1210 are cut via a blade. Hence, protruding leads 1213 are formed, and the plating surfaces 1230 are disposed on outer surfaces of each of the protruding leads 1213. Furthermore, a width of each of the protruding leads 1213 is wider, so the burr can be reduced in the singulation step S1205.

FIG. 175 is a side view of the package structure 1200 according to the 12th embodiment in FIG. 163. FIG. 176 is a partial schematic view of the package structure 1200 according to the 12th embodiment in FIG. 163. In FIGS. 175 and 176, the package structure 1200 includes the protruding leads 1213, the protruding leads 1213 protrude an edge of the plastic package material 1220, each of the protruding leads 1213 includes four plating surfaces 1230, and each of the protruding leads 1213 close to a lower surface of the package structure 1200 protrudes the edge of the plastic package material 1220.

Hence, according to the 12th embodiment, by the method of forming the package structure S1200, the solderable area of each of the sides of the package structure 1200 can be increased. Furthermore, in FIG. 173, a portion of each of the protruding leads 1213 protruding the plastic package material 1220 and covered via the plastic package material 1220 is like gull-wing shape, so the mechanical strength of the protruding leads 1213 can be more robust. Therefore, the connection strength between the protruding leads 1213 and the circuit board can be enhanced to maintain and increase the lifetime of the package structure 1200 disposed on the circuit board, and the reliability of the board level can be further enhanced.

FIG. 177 is a step flow chart of a method of forming a package structure S1300 according to the 13th embodiment of the present disclosure. In FIG. 177, the method of forming the package structure S1300 includes an etching step S1301, a molding step S1302, a laser step S1303, a plating step S1304 and a singulation step S1305.

FIG. 178 is a schematic view of the etching step S1300 according to the 13th embodiment in FIG. 177. FIG. 179 is a cross-sectional schematic view of the leadframe 1310 along a 179-179' line in FIG. 178. In FIGS. 178 and 179, a plurality of cutting streets 1311 of the leadframe 1310 are etched in the etching step S1301. According to the 13th embodiment, a lower surface of each of the cutting streets 1311 of the leadframe 1310 is etched to form two etching grooves 1312, and an etching depth can be smaller than half of a thickness of the leadframe 1310, but is not limited thereto. Further, each of the cutting streets 1311 can have a plurality of concave portions 1314, a concave depth of each of the concave portions 1314 can be smaller than half of the thickness of the leadframe 1310, a width of each of the concave portions 1314 can be larger than a width of each of the etching grooves 1312, and each of the concave portions 1314 is located on a center of each of the cutting streets 1311.

FIG. 180 is a schematic view of the molding step S1302 according to the 13th embodiment in FIG. 177. FIG. 181 is a cross-sectional schematic view of the leadframe 1310 along a 181-181' line in FIG. 180. In FIGS. 180 and 181, a plastic package material 1320 covers on the leadframe 1310 before the laser step S1303. It should be mentioned that the plastic package material 1320 is not disposed in the concave portions 1314.

FIG. 182 is a schematic view of the laser step S1303 according to the 13th embodiment in FIG. 177. FIG. 183 is a cross-sectional schematic view of the leadframe 1310 along a 183-183' line in FIG. 182. In FIGS. 182 and 183, the plastic package material 1320 covering on each of the cutting streets 1311 is removed via a laser beam L in the laser step S1303. In particular, according to the 13th embodiment, the plastic package material 1320 covering on an upper surface of each of the cutting streets 1311 is removed via the laser beam L in the laser step S1303, and the plastic package material 1320 is only partially removed. It should be mentioned that the upper surface of each of the cutting streets 1311 is irradiated via the laser beam L to remove the plastic package material 1320, and the plastic package material 1320 disposed in each of the etching grooves 1312 is not irradiated via the laser beam L. Hence, the plastic package material 1320 disposed in each of the etching grooves 1312 is remained thereof.

Table 13 shows parameters of the laser beam L in the laser step S1303 according to the 13th embodiment, but the present disclosure is not limited to the parameters in Table 13.

TABLE 13

| Laser type | diode end-pumped Nd: YVO$_4$ |
|---|---|
| Output power | 10 W-40 W |
| Wavelength | 355 nm, 532 nm, 1064 nm |
| Pulse frequency | 60 kHz-200 kHz, and CW (continuous-wave) |

Furthermore, the removing targets (for example, a portion of the plastic package material 1320) and the depth thereof can be chosen via the laser step S1303. In particular, the laser step S1303 can be made up of one or multiple laser beams L, and it depends on the energy and the parameters of the laser beam L. Therefore, the removing range can be effectively controlled. For example, a roughing treatment can be firstly performed via the laser beam L with smaller wavelength (such as 355 nm) to quickly remove the portion of the plastic package material 1320, and then a fine treatment is performed via the laser beam L with lager wavelength (such as 532 nm or 1064 nm) to precisely remove the portion of the plastic package material 1320, but is not limited thereto.

FIG. 184 is a schematic view of the plating step S1304 according to the 13th embodiment in FIG. 177. FIG. 185 is a cross-sectional schematic view of the leadframe 1310 along a 185-185' line in FIG. 184. In FIGS. 184 and 185, a plurality of plating surfaces 1330 are disposed on a plurality of areas of the leadframe 1310 without the plastic package material 1320.

FIG. 186 is a schematic view of the singulation step S1305 according to the 13th embodiment in FIG. 177. FIG. 187 is a cross-sectional schematic view of the package structure 1300 along a 187-187' line in FIG. 186. FIG. 188 is a cross-sectional schematic view of the package structure 1300 along a 188-188' line in FIG. 186. In FIGS. 186 to 188, the cutting streets 1311 of the leadframe 1310 are cut to form the package structure 1300 in the singulation step S1305. In detail, the cutting streets 1311 of the leadframe 1310 are cut via a blade. Hence, protruding leads 1313 are formed, and the plating surfaces 1330 are disposed on outer surfaces of each of the protruding leads 1313. Furthermore, a width of each of the protruding leads 1313 is wider, so the burr can be reduced in the singulation step S1305.

FIG. 189 is a side view of the package structure 1300 according to the 13th embodiment in FIG. 177. FIG. 190 is a partial schematic view of the package structure 1300 according to the 13th embodiment in FIG. 177. In FIGS. 189 and 190, the package structure 1300 includes the protruding leads 1313, the protruding leads 1313 protrude an edge of the plastic package material 1320, each of the protruding leads 1313 includes eight plating surfaces 1330, and each of the protruding leads 1313 close to a lower surface of the package structure 1300 protrudes the edge of the plastic package material 1320.

Hence, according to the 13th embodiment, by the method of forming the package structure S1300, the solderable area of each of the sides of the package structure 1300 can be increased. Furthermore, in FIG. 187, a portion of each of the protruding leads 1313 protruding the plastic package material 1320 and covered via the plastic package material 1320 is like gull-wing shape, so the mechanical strength of the protruding leads 1313 can be more robust. Therefore, the connection strength between the protruding leads 1313 and the circuit board can be enhanced to maintain and increase the lifetime of the package structure 1300 disposed on the circuit board, and the reliability of the board level can be further enhanced.

In summary, the package structure with the step-shaped leads or the protruding leads can be formed via the method of forming the package structure of the present disclosure. The aforementioned structure is favorable for increasing the solderability and the soldering strength between the circuit board and the package structure to enhance the reliability of the board level.

The foregoing description, for purpose of explanation, has been described with reference to specific examples. It is to be noted that Tables show different data of the different examples; however, the data of the different examples are obtained from experiments. The examples were chosen and described in order to best explain the principles of the disclosure and its practical applications, to thereby enable others skilled in the art to best utilize the disclosure and various examples with various modifications as are suited to the particular use contemplated. The examples depicted above and the appended drawings are exemplary and are not intended to be exhaustive or to limit the scope of the present disclosure to the precise forms disclosed. Many modifications and variations are possible in view of the above teachings.

What is claimed is:

1. A method of forming a package structure, comprising:
   an etching step, wherein a plurality of cutting streets of a leadframe are etched;
   a laser step, wherein a plastic package material covering on each of the cutting streets is removed via a laser beam;
   a plating step, wherein a plurality of plating surfaces are disposed on a plurality of areas of the leadframe without the plastic package material; and
   a singulation step, wherein the cutting streets of the leadframe are cut to form the package structure;
   wherein a portion of an upper surface of each of the cutting streets of the leadframe is removed via the laser beam in the laser step.

2. The method of forming the package structure of claim 1, further comprising:

a molding step, wherein the plastic package material covers on the leadframe before the laser step.

3. The method of forming the package structure of claim 1, wherein an etching depth provided in the etching step is smaller than or equal to half of a thickness of the leadframe.

4. The method of forming the package structure of claim 1, wherein the cutting streets of the leadframe are cut via a blade in the singulation step.

5. The method of forming the package structure of claim 4, wherein a cutting width of the blade is smaller than or equal to an etching width provided in the etching step.

6. The method of forming the package structure of claim 1, wherein the laser beam in the laser step is diode end-pumped Nd: $YVO_4$, an output power of the laser beam is 10 W to 40 W, a wavelength of the laser beam is 355 nm, 532 nm or 1064 nm, a pulse mode of the laser beam is continuous-wave, and a pulse frequency of the laser beam is 60 kHz to 200 kHz.

* * * * *